(12) United States Patent
Lu et al.

(10) Patent No.: US 10,847,532 B2
(45) Date of Patent: Nov. 24, 2020

(54) JOINT OPENING STRUCTURES OF THREE-DIMENSIONAL MEMORY DEVICES AND METHODS FOR FORMING THE SAME

(71) Applicant: Yangtze Memory Technologies Co., Ltd., Hubei (CN)

(72) Inventors: Zhenyu Lu, Hubei (CN); Wenguang Shi, Hubei (CN); Guanping Wu, Hubei (CN); Feng Pan, Hubei (CN); Xianjin Wan, Hubei (CN); Baoyou Chen, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 16/046,847

(22) Filed: Jul. 26, 2018

(65) Prior Publication Data

US 2019/0081060 A1 Mar. 14, 2019

Related U.S. Application Data

(63) Continuation of application No. PCT/CN2018/077785, filed on Mar. 1, 2018.

(30) Foreign Application Priority Data

Mar. 8, 2017 (CN) .......................... 2017 1 0134782
Mar. 8, 2017 (CN) .......................... 2017 1 0134783

(51) Int. Cl.
*H01L 21/00* (2006.01)
*H01L 27/11578* (2017.01)
(Continued)

(52) U.S. Cl.
CPC .... *H01L 27/11578* (2013.01); *H01L 27/1157* (2013.01); *H01L 27/11565* (2013.01); *H01L 27/11582* (2013.01)

(58) Field of Classification Search
None
See application file for complete search history.

(56) References Cited

U.S. PATENT DOCUMENTS 9,570,463 B1 2/2017 Zhang et al.
10,229,927 B2 3/2019 Lee et al.
(Continued)

FOREIGN PATENT DOCUMENTS

CN 102543877 A 7/2012
CN 105261617 A 1/2016
(Continued)

OTHER PUBLICATIONS

International Search Report and Written Opinion of the International Searching Authority directed to related International Patent Application No. PCT/CN2018/077785, dated Jun. 8, 2018; 7 pages.
(Continued)

*Primary Examiner* — Reema Patel
(74) *Attorney, Agent, or Firm* — Sterne, Kessler, Goldstein & Fox P.L.L.C.

(57) ABSTRACT

Joint opening structures of 3D memory devices and fabricating method are provided. A joint opening structure comprises a first through hole penetrating a first stacked layer and a first insulating connection layer, a first channel structure at the bottom of the first through hole, a first functional layer on the sidewall of the first through hole, a second channel structure on the sidewall of the first functional layer, a third channel structure over the first through hole, a second stacked layer on the third channel structure, a second insulating connection layer on the second stacked layer, a second through hole penetrating the second stacked layer and the second insulating connection layer, a second functional layer disposed on the sidewall of the second through hole, a fourth channel structure on the sidewall of the second functional
(Continued)

layer, and a fifth channel structure over the second through hole.

20 Claims, 120 Drawing Sheets

(51) Int. Cl.
*H01L 27/1157* (2017.01)
*H01L 27/11582* (2017.01)
*H01L 27/11565* (2017.01)

(56) References Cited

U.S. PATENT DOCUMENTS

| | | | |
|---|---|---|---|
| 10,600,801 | B2 | 3/2020 | Lee et al. |
| 10,644,020 | B2 | 5/2020 | Huo et al. |
| 2010/0019310 | A1 | 1/2010 | Sakamoto |
| 2010/0109065 | A1 | 5/2010 | Oh et al. |
| 2010/0109072 | A1 | 5/2010 | Kidoh et al. |
| 2011/0143524 | A1 | 6/2011 | Son et al. |
| 2011/0151667 | A1 | 6/2011 | Hwang et al. |
| 2013/0109158 | A1* | 5/2013 | Lee .................. H01L 27/11582 438/488 |
| 2013/0203227 | A1 | 8/2013 | Huo et al. |
| 2015/0236038 | A1 | 8/2015 | Pachamuthu et al. |
| 2016/0071793 | A1 | 3/2016 | Shinohara et al. |
| 2016/0163732 | A1 | 6/2016 | Lim et al. |

FOREIGN PATENT DOCUMENTS

| | | |
|---|---|---|
| CN | 105304612 A | 2/2016 |
| CN | 105374826 A | 3/2016 |
| CN | 106653684 A | 5/2017 |
| CN | 106920772 A | 7/2017 |
| KP | 1020120029194 A | 3/2012 |
| KR | 1020110068145 A | 6/2011 |
| KR | 1020160003977 A | 1/2016 |
| KR | 1020160069903 A | 6/2016 |

OTHER PUBLICATIONS

Korean Application No. 10-2019-7029469, Office Action dated Sep. 23, 2020; English Translation from EPO Global Dossier, 16 pages.
Chinese Application No. 201910114048.8, Office Action dated Sep. 27, 2020; English Translation from EPO Global Dossier, 32 pages.

* cited by examiner

US 10,847,532 B2

JOINT OPENING STRUCTURES OF THREE-DIMENSIONAL MEMORY DEVICES AND METHODS FOR FORMING THE SAME

CROSS-REFERENCES TO RELATED APPLICATIONS

This application claims priority to PCT/CN2018/077785 filed on Mar. 1, 2018, which claims the priorities of Chinese Patent Application No. 201710134782.1, filed on Mar. 8, 2017, and Chinese Patent Application No. 201710134783.6, filed on Mar. 8, 2017, the entire contents of which are incorporated herein by reference.

TECHNICAL FIELD

The present disclosure generally relates to the field of semiconductor technology, and more particularly, to joint opening structures of three-dimensional (3D) memory devices and method for forming the same.

BACKGROUND

As semiconductor technology advances, three-dimensional (3D) memory devices, such as 3D NAND memory devices, keep scaling more oxide/nitride (ON) layers. As such, it becomes difficult to use a single etching process to form the channel holes in the 3D memory devices that have a substantial depth. As the channel hole aspect ratio increases, channel hole etching becomes exponentially slower. Further, the process capability control of the formed channel holes, including bow-free, straight profile, critical dimension (CD) uniformity, minimal twisting, etc., tend to be more challenging. Thus, a single etching method may not be efficient in both cost and process capability.

BRIEF SUMMARY

In accordance with some embodiments of the present disclosure, joint opening structures of three-dimensional (3D) memory devices and method for forming the same are provided.

One aspect of the present disclosure provides a method of forming a joint opening structure in a three-dimensional (3D) memory device. The method includes forming a first stacked layer and forming a first insulating connection layer on the first stacked layer, forming a first through hole that penetrates the first stacked layer and the first insulating connection layer, forming a first channel structure overlay the surface of the substrate that is exposed by the first through hole, forming a first functional layer on the sidewall of the first through hole, forming a second channel structure and forming a first filling structure on the sidewall of the first functional layer and the exposed surface of the first channel structure, and forming a third channel structure in contact with the second channel structure above the first through hole. A projection of the third channel structure on the substrate covers a projection of the first through hole on the substrate. The method further includes forming a second stacked layer and forming a second insulating connection layer on the first insulating connection layer, forming a second through hole that penetrates the second stacked layer and the second insulating connection layer. A projection of the second through hole on the substrate at least partially overlaps with the projection of the first through hole on the substrate. The method further includes forming a second functional layer on the sidewall of the second through hole, forming a fourth channel structure and forming a second filling structure on the sidewall of the second functional layer and the exposed surface of the third channel structure, and forming a fifth channel structure in contact with the fourth channel structure above the second through hole.

In some embodiments, the first stacked layer includes a first number of oxide/nitride layer pairs, and the second stacked layer includes a second number of oxide/nitride layer pairs. The first number and the second number are not less than 32.

Forming the first functional layer includes forming a first tunneling layer on the sidewall of the first through hole and the exposed surface of the first channel structure. The first tunneling layer is configured, in operation, to generate charges. Forming the first functional further includes forming a first storage layer on the surface of the first tunneling layer to store the charges generated by the first tunneling layer, forming a first barrier layer on the surface of the first storage layer to block the outflow of charges in the first storage layer, forming a first passivation layer on the surface of the first barrier layer to protect the first barrier layer from being damaged in a subsequent removal process, and removing portions of the first passivation layer, the first barrier layer, the first storage layer, and the first tunneling layer on the surface of the first channel structure. The remaining portions of the first passivation layer, the first barrier layer, the first storage layer, and the first tunneling layer on the sidewall of the first through hole form the first functional layer.

Forming the second channel structure and the first filling structure includes forming a second channel layer that covers the sidewall of the first passivation layer and the exposed surface of the first channel layer, forming the first filling layer that covers the surface of the second channel layer, removing a portion of the first filling layer to form the first filling structure, wherein the top surface of the first filling structure is lower than the top surface of the first insulating connection layer, and removing a portion of the second channel layer to form the second channel structure. A top surface of the second channel structure is lower than a top surface of the first insulating connection layer.

Forming the third channel structure includes etching the first insulating connection layer to form a first groove. In some other embodiments, forming the third channel structure includes etching the first insulating connection layer and at least a portion of the top nitride layer of the first stacked layer to form a first groove. A projection of the first groove on the substrate covers the projection of the first through hole on the substrate. Forming the third channel structure further includes forming a third channel layer in the first groove, wherein the third channel layer is in contact with the second channel structure, and planarizing the top surfaces of the first insulating connection layer and the third channel layer to form the third channel structure.

In some embodiments, the method further includes forming a first mask layer overlaying the first insulating connection layer before forming the first through hole, and removing the first mask layer after forming the third channel structure, and forming a second mask layer on the second insulating connection layer before forming the second through hole, and removing the first mask layer after forming the fifth channel structure Forming the fourth channel structure and the second filling structure includes forming a fourth channel layer that covers the sidewall of the second functional layer and the exposed surface of the third channel layer, forming a second filling layer that covers the surface of the fourth channel layer, removing a portion of the second filling layer to form the second filling structure, and removing a portion of the fourth channel layer to form the fourth channel structure, wherein a top surface of the fourth channel structure is lower than a top surface of the second insulating connection layer. A top surface of the second filling structure is lower than the top surface of the second insulating connection layer.

Forming the fifth channel structure includes etching the second insulating connection layer to form a second groove, forming a fifth channel layer in the second groove, wherein the fifth channel layer is in contact with the fourth channel structure, and planarizing the top surfaces of the second insulating connection layer and the fifth channel layer to form the fifth channel structure. A projection of the second groove on the substrate covers the projection of the second through hole on the substrate.

Another aspect of the present disclosure provides another method of forming a joint opening structure in a three-dimensional (3D) memory device. The method includes forming a first stacked layer and forming a first insulating connection layer on a substrate of the 3D memory device. The 3D memory device includes a first region for forming a plurality of channel holes, a second region for forming a plurality of staircase structure dummy holes, and a third region for forming a plurality of through array contact barriers. The method further includes forming a plurality of first through holes, each penetrating the first stacked layer and the first insulating connection layer in the first region, the second region, and the third region, forming a first channel structure overlaying the surface of the substrate in each first through hole, forming a first functional layer on the sidewall of each first through hole, forming a second channel structure and forming a first filling structure on the sidewall of the first functional layer and the exposed surface of the first channel structure in each first through hole, forming a third channel structure in contact with the second channel structure above each first through hole. A projection of the third channel structure on the substrate covers a projection of the corresponding first through hole on the substrate. The method further includes forming a second stacked layer on the first insulating connection layer, forming a second insulating connection layer on the second stacked layer, forming a plurality of second through holes, each penetrating the second stacked layer and the second insulating connection layer. A projection of each of the plurality of second through holes on the substrate at least partially overlaps with the projection of the corresponding first through hole on the substrate. The method further includes forming a second functional layer on the sidewall of each second through hole, forming a fourth channel structure and forming a second filling structure on the sidewall of the second functional layer and the exposed surface of the third channel structure in each second through hole in the first region, and forming a second filling structure on the sidewall of the second functional layer in each second through hole in the second region and the third region, and forming a fifth channel structure above each second through hole in the first region, the second region, and the third region. Each fifth channel structure is in contact with the corresponding fourth channel structure in each second through hole in the first region.

Forming the fourth channel structure and the second filling structure includes forming a fourth channel layer that covers the sidewall of the first passivation layer and the exposed surface of the third channel layer, forming a third filling layer that covers the surface of the fourth channel layer, forming a third mask layer that covers the third filling layer in the first region, and using the third mask layer as a mask to remove the third filling layer in the second region and the third region, removing the third mask layer; using the third filling layer in the first region as a mask to remove the fourth channel layer in the second region and the third region, forming a fourth filling layer on the surface of the second functional layer in the second region and the third region, removing the third filling layer in the first region, forming a second filling layer in each second through hole in the first region, the second region, and the third region, removing a portion of the second filling layer to form the second filling structure in each second through hole, and removing a portion of the fourth channel layer to form the fourth channel structure in each second through hole. The top surface of the second filling structure is lower than the top surface of the second insulating connection layer, and the top surface of the fourth channel structure is lower than the top surface of the second insulating connection layer.

Another aspect of the present disclosure provides another method of forming a joint opening structure in a three-dimensional (3D) memory device. The method includes forming a first stacked layer and forming a first insulating connection layer on a substrate, forming a first through hole that penetrates the first stacked layer and the first insulating connection layer, forming a first channel structure overlay the surface of the substrate that is exposed by the first through hole, forming a first functional layer on the sidewall of the first through hole, forming a second channel on the sidewall of the first functional layer and the exposed surface of the first channel structure, forming a third channel structure in contact with the second channel structure above the first through hole. A projection of the third channel structure on the substrate covers a projection of the first through hole on the substrate. The method further includes forming a second stacked layer and forming a second insulating connection layer on the third channel structure, forming a second through hole that penetrates the second stacked layer and the second insulating connection layer. A projection of the second through hole on the substrate at least partially overlaps with the projection of the first through hole on the substrate. The method further includes forming a second functional layer on the sidewall of the second through hole, removing portions of the second functional layer and the third channel structure at the bottom of the second through hole to interconnect the second through hole and the first through hole to form a joint through hole, removing the remaining portion of the third channel structure and the second channel structure, forming a fourth channel structure in contact with the first channel structure on the sidewall of the joint through hole and the exposed surface of the first insulating connection layer, forming a first filling structure that covers the surface of the fourth channel structure, and forming a fifth channel structure in contact with the fourth channel structure above the joint through hole.

Another aspect of the present disclosure provides another method of forming a joint opening structure in a three-dimensional (3D) memory device. The method includes forming a first stacked layer and forming a first insulating connection layer on a substrate of the 3D memory device. The 3D memory device includes a first region for forming a plurality of channel holes, a second region for forming a plurality of staircase structure dummy holes, and a third region for forming a plurality of through array contact barriers. The method further includes forming a plurality of first through holes, each penetrating the first stacked layer and the first insulating connection layer in the first region, the second region, and the third region, forming a first channel structure on the surface of the substrate in each first through hole, forming a first functional layer on the sidewall of each first through hole, forming a second channel structure on the sidewall of the first functional layer and the exposed surface of the first channel structure in each first through hole, forming a third channel structure in contact with the second channel structure above each first through hole. A projection of the third channel structure on the substrate covers a projection of the corresponding first through hole on the substrate. The method further includes forming a second stacked layer and forming a second insulating connection layer on the plurality of third channel structures, forming a plurality of second through holes, each penetrating the second stacked layer and the second insulating connection layer. A projection of each of the plurality of second through holes on the substrate at least partially overlaps with the projection of the corresponding first through hole on the substrate. The method further includes forming a second functional layer on the sidewall of each second through hole, removing portions of the second functional layer and the third channel structure at the bottom of each second through hole to interconnect the second through hole and the corresponding first through hole to form a plurality of joint through holes, removing the remaining portions of the third channel structure and the second channel structure in each joint through hole, forming a fourth channel structure in contact with the first channel structure on the sidewall of each joint through hole and the exposed surfaces of the first insulating connection layer, forming a first filling structure that covers the surface of the fourth channel structure in each joint through hole, and forming a fifth channel structure above each joint through hole in the first region, the second region, and the third region. Each fifth channel structure is in contact with the corresponding fourth channel structure in each joint through hole in the first region.

Another aspect of the present disclosure provides a joint opening structure of a three-dimensional (3D) memory device, including a first stacked layer disposed overlaying a substrate, a first insulating connection layer disposed on the first stacked layer, a first through hole penetrating the first stacked layer and the first insulating connection layer, a first channel structure disposed at the bottom of the first through hole and overlaying the surface of the substrate, a first functional layer disposed on the sidewall of the first through hole, a second channel structure in contact with the first channel structure disposed on the sidewall of the first functional layer, a third channel structure in contact with the second channel structure disposed over the first through hole. A projection of the third channel structure on the substrate covers a projection of the first through hole on the substrate. The joint opening structure further includes a second stacked layer disposed on the third channel structure, a second insulating connection layer disposed on the second stacked layer. A second through hole penetrating the second stacked layer and the second insulating connection layer. A projection of the second through hole on the substrate at least partially overlaps with the projection of the first through hole on the substrate. The joint opening structure further includes a second functional layer disposed on the sidewall of the second through hole, a fourth channel structure in contact with the third channel structure disposed on the sidewall of the second functional layer, and a fifth channel structure in contact with the fourth channel structure disposed over the second through hole.

In some embodiments, a first filling structure covers the surface of the second channel structure, and a second filling structure covers the surface of the fourth channel structure. The first through hole is non-interconnected with the second through hole.

In some other embodiments, a first filling structure covers the surfaces of the second channel structure and the fourth channel structure. The first through hole is interconnected with the second through hole.

In some embodiments, the first stacked layer includes a first number of conductor/dielectric layer pairs, and the second stacked layer includes a second number of conductor/dielectric layer pairs.

In some other embodiments, the first stacked layer includes a first number of oxide/nitride layer pairs, and the second stacked layer includes a second number of oxide/nitride layer pairs. The first number and the second number are not less than 32.

A thickness of the third channel structure is in a range between 30 nm and 70 nm. A size difference between a top aperture and a bottom aperture of the first through hole is equal to or less than 30 nm. A size difference between a top aperture and a bottom aperture of the second through hole is equal to or less than 30 nm.

Another aspect of the present disclosure provides a three-dimensional (3D) memory device, including a first stacked layer disposed on a substrate, a first insulating connection layer disposed on the first stacked layer, a second stacked layer disposed on the first insulating connection layer, a second insulating connection layer disposed on the second stacked layer, a plurality of channel holes in a first region of the 3D memory device, a plurality of staircase structure dummy holes in a second region of the 3D memory device, and a plurality of through array contact barriers in a third region of the 3D memory device. Each of the plurality of channel holes includes the disclosed joint opening structure.

Other aspects of the present disclosure can be understood by those skilled in the art in light of the description, the claims, and the drawings of the present disclosure.

BRIEF DESCRIPTION OF THE DRAWINGS

Various objectives, features, and advantages of the present disclosure can be more fully appreciated with reference to the detailed description of the present disclosure when considered in contact with the following drawings, in which like reference numerals identify like elements. It is noted that the following drawings are merely examples for illustrative purposes according to various disclosed embodiments and are not intended to limit the scope of the present disclosure.

Figure 1:
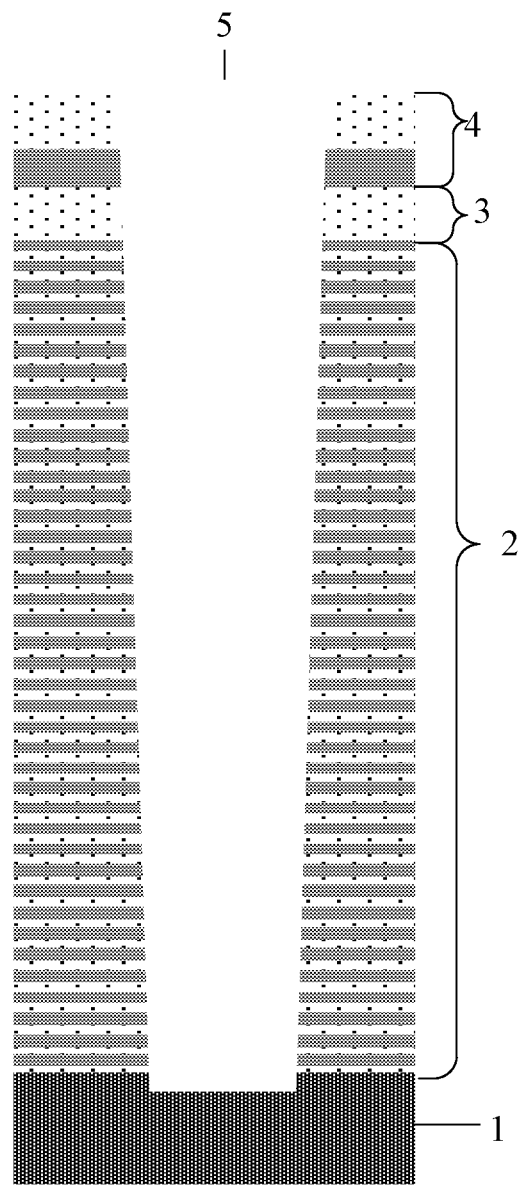
FIGS. 1-6, 7A. 7B, 8A, 8B, 9A, 9B, 10A, 10B, 11A, 11B, 12-20, 21A, 21B, 22A and 22B illustrate schematic structural cross-sectional diagrams of an exemplary joint opening structure of three-dimensional (3D) memory device at certain stages of a fabricating process in accordance with some embodiments of the present disclosure.

Embodiments of the present disclosure will be described with reference to the accompanying drawings.

DETAILED DESCRIPTION

Reference now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in contact with an embodiment, it would be within the knowledge of a person skilled in the pertinent art to effect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In accordance with some embodiments of the present disclosure, joint opening structures of three-dimensional (3D) memory devices and method for forming the same are provided to reduce the process difficulty and cost of the channel hole structures in 3D memory devices.

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate, while the term "horizontal/horizontally" means nominally parallel to the lateral surface of a substrate.

Figure 22A:
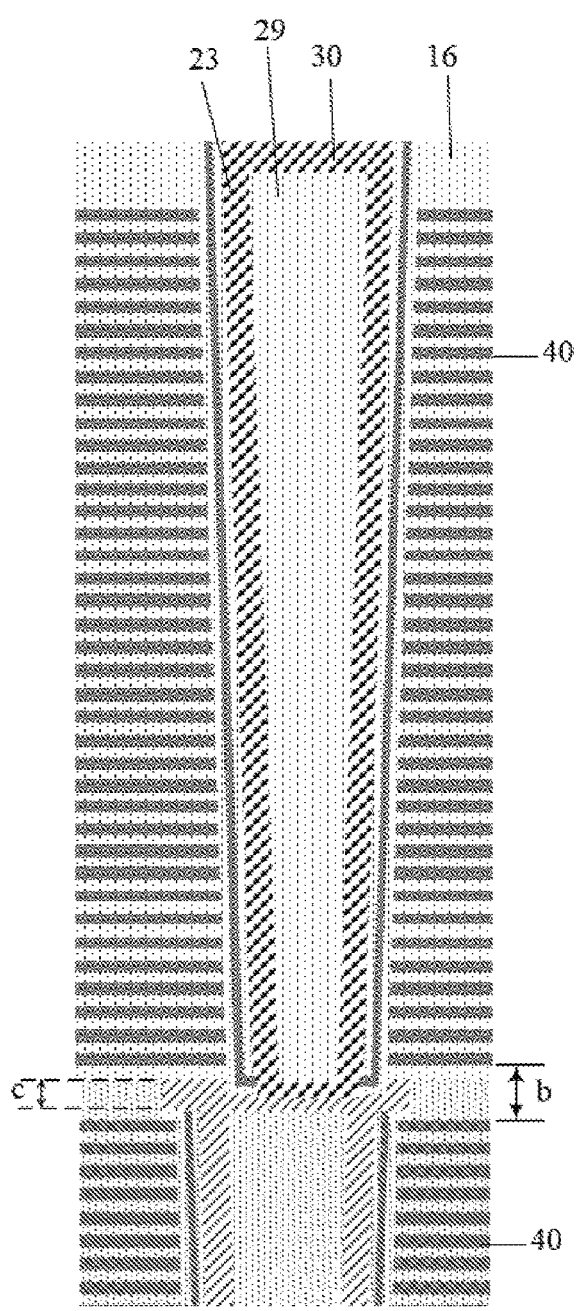
Figure 22B:
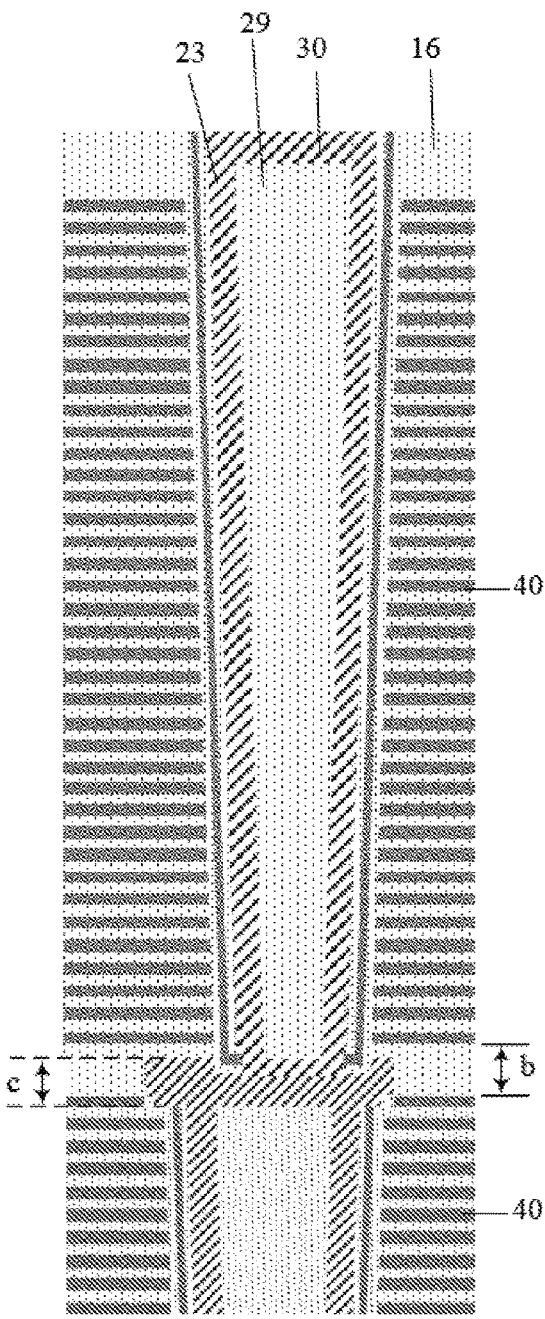
Figure 23A:
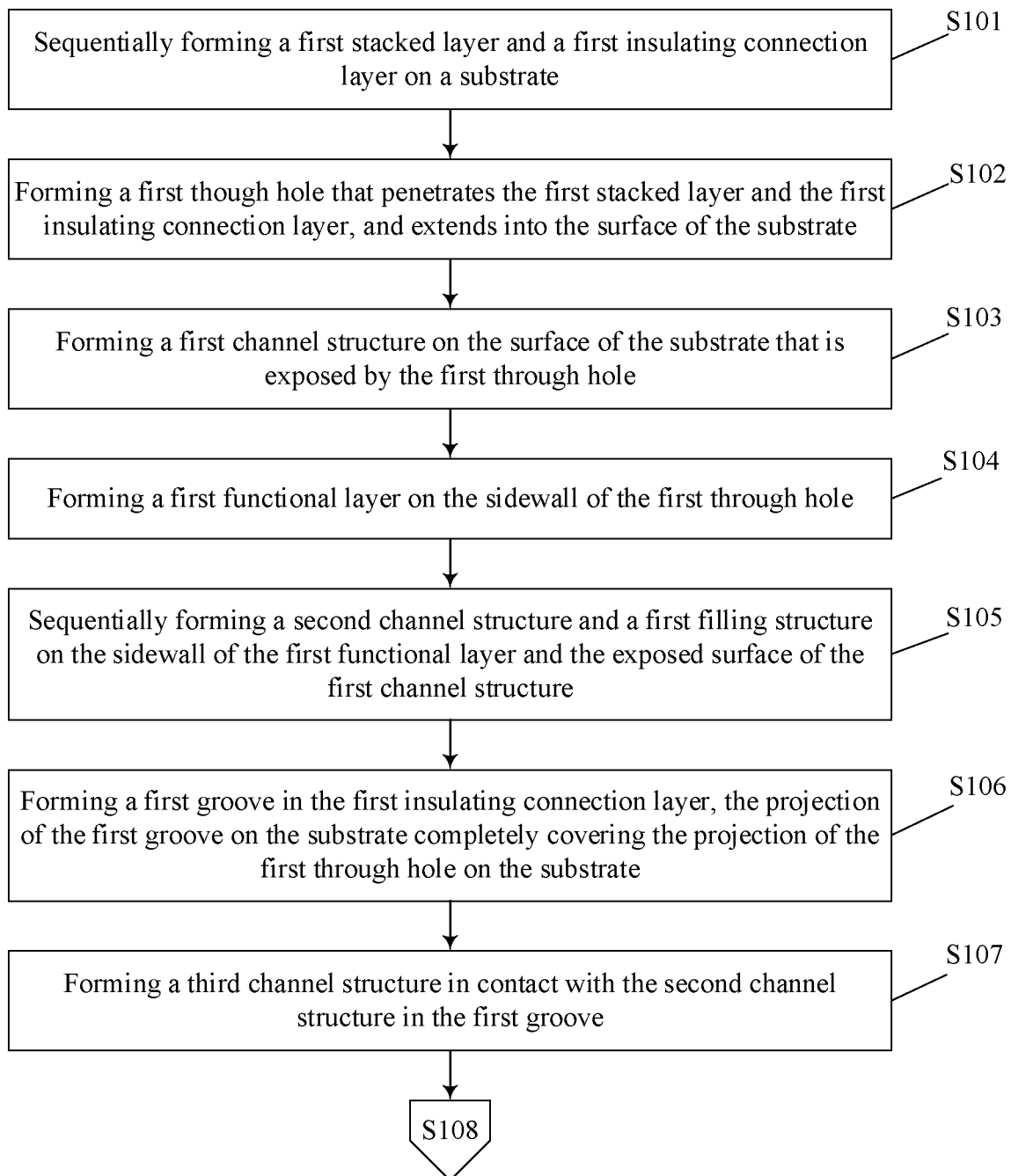
FIGS. 23A and 23B illustrate schematic flow diagrams of an exemplary fabricating process for forming a joint opening structure of three-dimensional (3D) memory device are illustrated in accordance with some embodiments of the present disclosure.
Figure 23B:
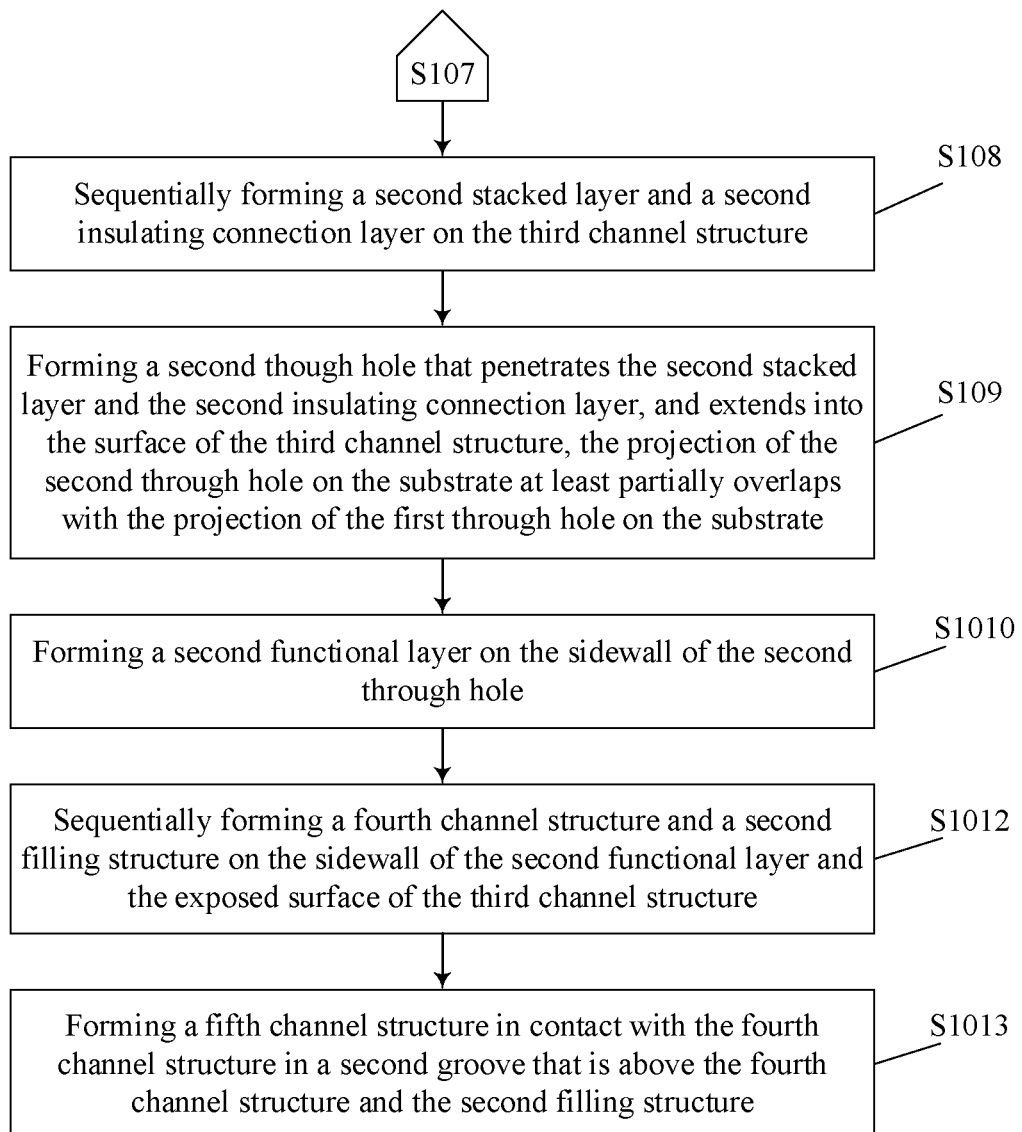

Referring to FIGS. 23A and 23B, schematic flow diagrams of an exemplary fabricating process for forming a joint opening structure of three-dimensional (3D) memory device are illustrated in accordance with some embodiments of the present disclosure. And FIGS. 1-6, 7A, 7B, 8A, 8B, 9A, 9B, 10A, 10B, 11A, 11B, 12-20, 21A, 21B, 22A and 22B illustrate schematic structural cross-sectional diagrams of an exemplary joint opening structure of three-dimensional (3D) memory device at certain stages of the fabricating process shown in FIGS. 23A and 23B.

As shown in FIG. 23A, at S101, a first stacked layer 2 and a first insulating connection layer 3 can be sequentially formed on the surface of a substrate 1.

As shown in FIG. 1, the first stacked layer 2 can be formed on the substrate 1. The first stacked layer 2 can include a plurality of oxide/nitride layer pairs. The plurality of oxide/nitride layer pairs are also referred to herein as an "alternating oxide/nitride stack." That is, in the first stacked layer 2, multiple oxide layers (shown in the areas with dotes) and multiple nitride layers (shown in the areas with meshes) alternate in a vertical direction. In other words, except a top and a bottom layer of a given stack, each of the other oxide layers can be sandwiched by two adjacent nitride layers, and each nitride layer can be sandwiched by two adjacent oxide layers.

Oxide layers can each have the same thickness or have different thicknesses. For example, a thickness of each oxide layer can be in a range from 90 nm to 160 nm, preferably about 150 nm. Similarly, nitride layers can each have the same thickness or have different thicknesses. For example, a thickness of each nitride layer can be in a range from 80 nm to 110 nm, preferably about 100 nm.

It is noted that, in the present disclosure, the oxide layers and/or nitride layers can include any suitable oxide materials and/or nitride materials. For example, the element of the oxide materials and/or nitride materials can include, but not limited to, W, Co, Cu, Al, doped silicon, silicides, or any combination thereof. In some embodiments, the oxide layers can be silicon oxide layers, and the nitride layers can be silicon nitride layer.

The first stacked layer 2 can include any suitable number of layers of the oxide layers and the nitride layers. In some embodiments, a total number of layers of the oxide layers and the nitride layers in the first stacked layer 2 is equal to or larger than 64. In some embodiments, alternating conductor/dielectric stack includes more oxide layers or more nitride layers with different materials and/or thicknesses than the oxide/nitride layer pair.

The first insulating connection layer 3 can be formed on the first stacked layer 2. In some embodiments, the first insulating connection layer 3 can be made by any suitable insulating material and/or dielectric material, such as silicon oxide. It is noted that, the material of the first insulating connection layer 3 can be different from the material of the nitride layer in the first stacked layer 2.

Further, in some embodiments, a first mask layer 4 can be formed on the top surface of the first insulating connection layer 3. The first mask layer 4 can include a nitride layer on the top surface of the first insulating connection layer 3, and an oxide layer on the top surface of such nitride layer.

In some embodiments, the first stacked layer 2, the first insulating connection layer 3, and/or the first mask layer 4 can be formed by using one or more deposition processes. It is noted that, the term "deposition process" used in the present disclosure can be referred to any suitable deposition process including, but not limited to, a chemical vapor deposition (CVD) process, a physical vapor deposition (PVD) process, an atomic layer deposition (ALD) process, and/or any suitable combination thereof.

At S102, a first through hole 5 can be formed. As shown in FIG. 1, the first through hole 5 can completely penetrate the first stacked layer 2 and the first insulating connection layer 3, and can extend into the surface of the substrate 1.

In some embodiments, the first through hole 5 can be formed by etching the first stacked layer 2 and the first insulating connection layer 3 and a subsequent cleaning process. The etching process to form the first through hole 5 can be a wet etching, a dry etching, or a combination thereof.

In some embodiments, when the first mask layer 4 is formed on the top surface of the first insulating connection layer 3, the etching process also etch the first mask layer 4 to form the first through holes 5.

Figure 2:
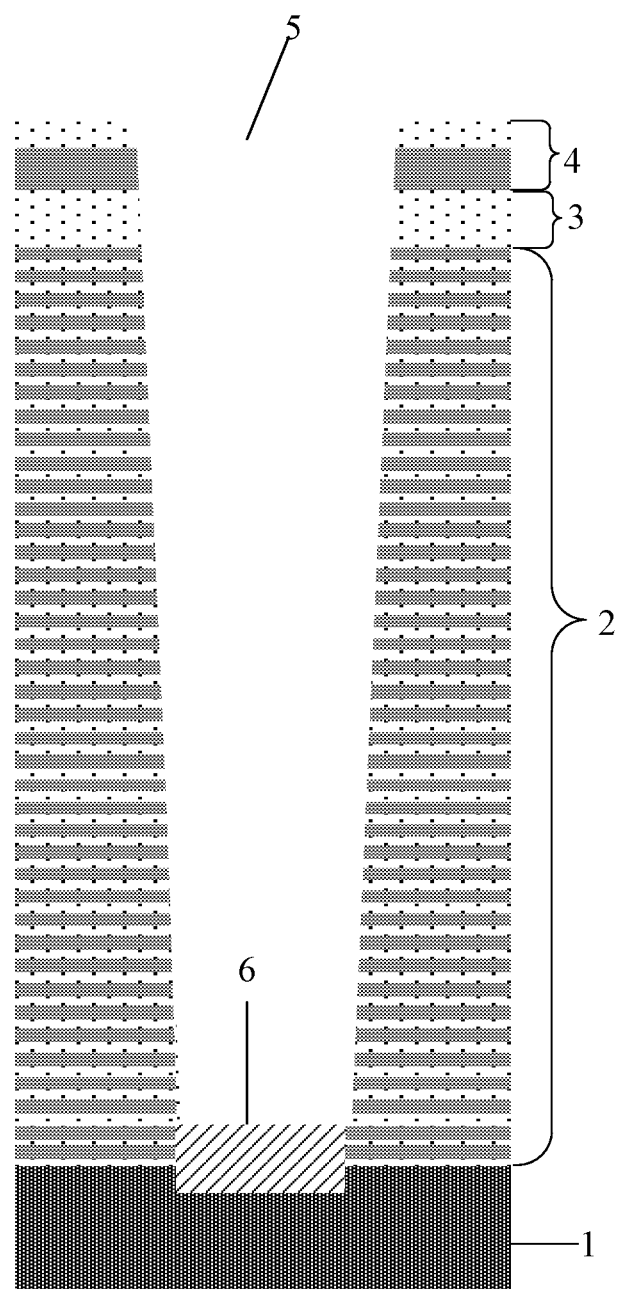

At S103, a first channel structure 6 can be formed on the surface of the substrate 1 that is exposed by the first through hole 5, as shown in FIG. 2. In some embodiments, the first channel structure 6 can be a polycrystalline silicon (polysilicon) layer formed by using a selective epitaxial process.

In some embodiments, the first channel structure 6 may not directly formed on the surface of the substrate 1. One or more layers can be formed between the first channel structure 6 and the substrate 1. That is, the first channel structure 6 is overlay the substrate 1.

At S104, a first functional layer can be formed on the sidewall of the first through hole 5. The first functional layer can include a first tunneling layer 7, a first storage layer 8, a first barrier layer 9, and a first passivation layer 10.

Figure 3:
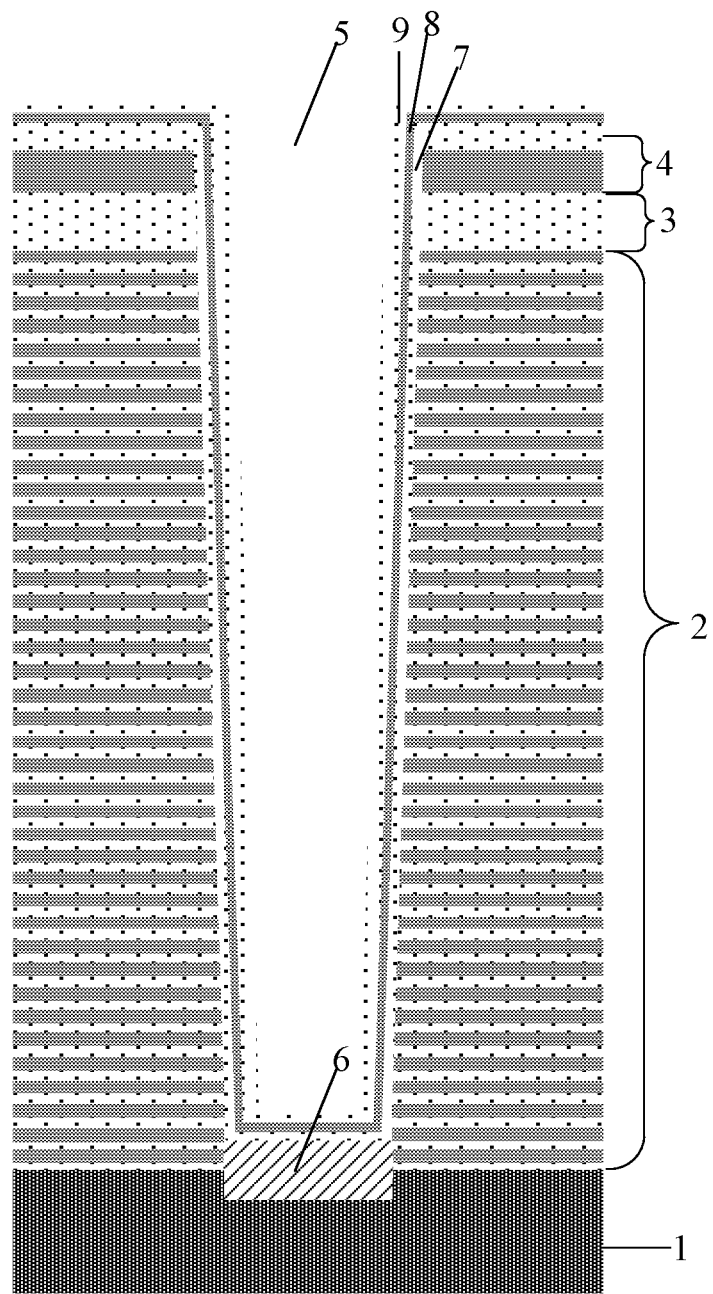

As shown in FIG. 3, the first tunneling layer 7 can be formed on the sidewall of the first through hole 5 and the top surface of the first channel structure 6. The first tunneling layer 7 can be used for generating electronic charges (electrons or holes). In some embodiments, the first tunneling layer 7 can be an oxide layer formed by using a deposition process.

The first storage layer 8 can be formed on the surface of the first tunneling layer 7. The first storage layer 8 can be used for storing electronic charges. The storage or removal of charge in the first storage layer 7 can impact the on/off state and/or a conductance of the semiconductor channel. The first storage layer 7 can include polycrystalline silicon (polysilicon) or silicon nitride. In some embodiments, the first storage layer 8 can be a nitride layer formed by using a deposition process.

The first barrier layer 9 can be formed on the surface of the first storage layer 8. The first barrier layer 9 can be used for blocking the outflow of the electronic charges stored in the first storage layer 8. In some embodiments, the first barrier layer 9 can be a silicon oxide layer or a combination of silicon oxide/silicon nitride/silicon oxide (ONO) layers. In some embodiments, the first barrier layer 9 includes high dielectric constant (high-k) dielectrics (e.g., aluminum oxide). In one example, the first barrier layer 9 is an oxide layer formed by using a deposition process.

Figure 4:
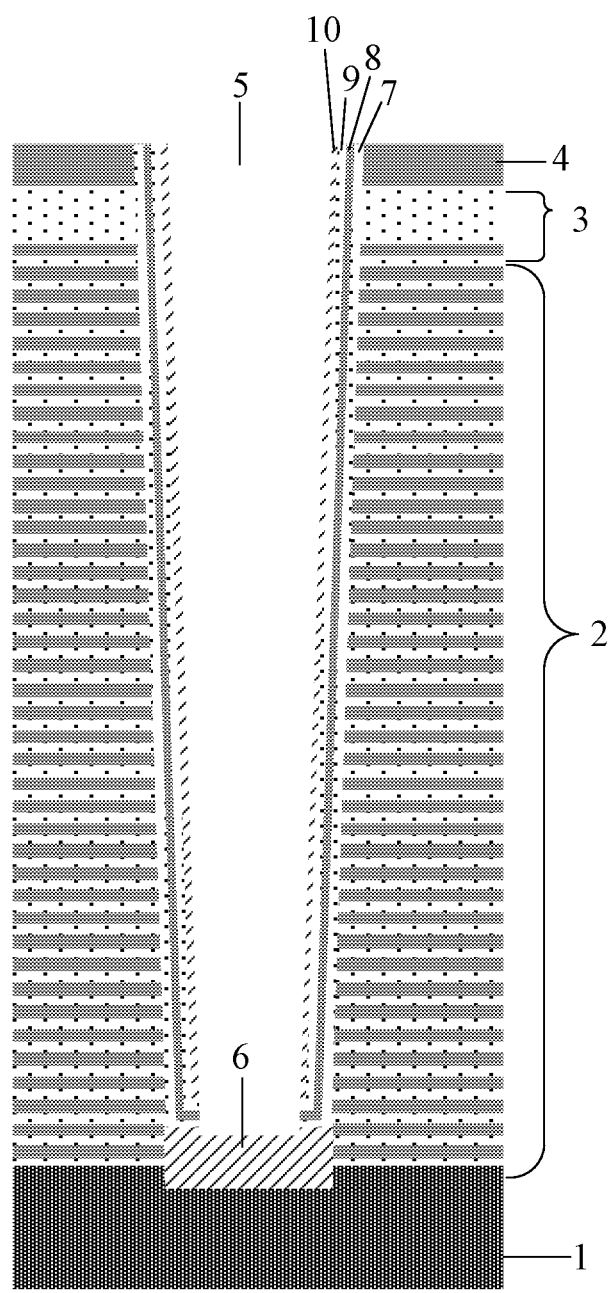

As shown in FIG. 4, a first passivation layer 10 can be formed on the surface of the first barrier layer 9. The first passivation layer 10 can be used for protecting the first barrier layer 9 from being damaged in a subsequent removal process. In some embodiments, the first passivation layer 10 can be an amorphous silicon layer formed by using a deposition process.

The portions of the first passivation layer 10, the first barrier layer 9, the first storage layer 8 and the first tunneling layer 7 located on the top surface of the first channel structure 6 on the bottom of the first through hole 5 can be removed. In some embodiments, the removal process can include an etching process and a cleaning process. As such, the first functional layer can be formed on the sidewall of the first through hole 5.

In some embodiment, in the same removal process, the first barrier layer 9, the first storage layer 8, the first tunneling layer 7, and the oxide layer of the first mask layer 4 located on the surface of the nitride layer of first mask layer 4 can also be removed. As such, the nitride layer of first mask layer 4 is remained on the surface of the first insulating connection layer 3.

At S105, a second channel structure and a first filling structure can be sequentially formed on the sidewall of the first functional layer and the exposed surface of the first channel structure 6. The surfaces of the second channel structure and the first filling structure can be lower than the surface of the first insulating connection layer 3.

Figure 5:
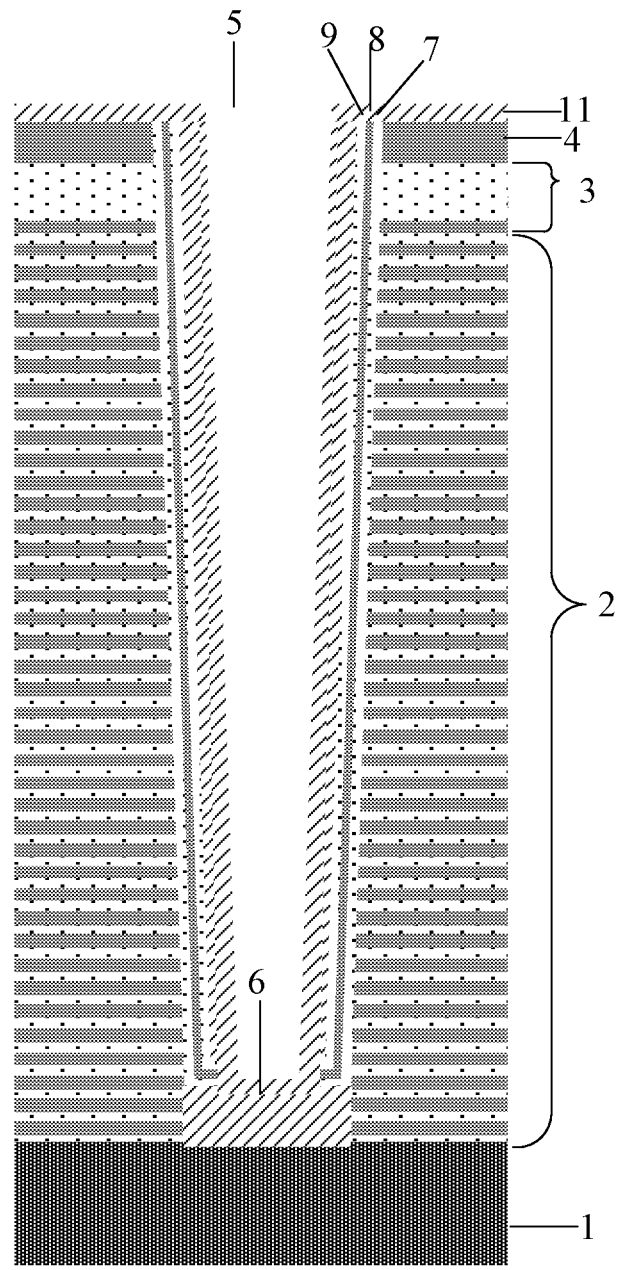

As shown in FIG. 5, a second channel layer 11 can be formed to cover the sidewall of the first passivation layer 10, the bottom surface of the first through hole 5. The second channel layer 11 can also cover the top surface of the first insulating connection layer 3, or cover the top surface of the nitride layer of the first mask layer 4. In some embodiments, the second channel layer 11 can be an amorphous silicon layer formed by using a deposition process.

Figure 6:
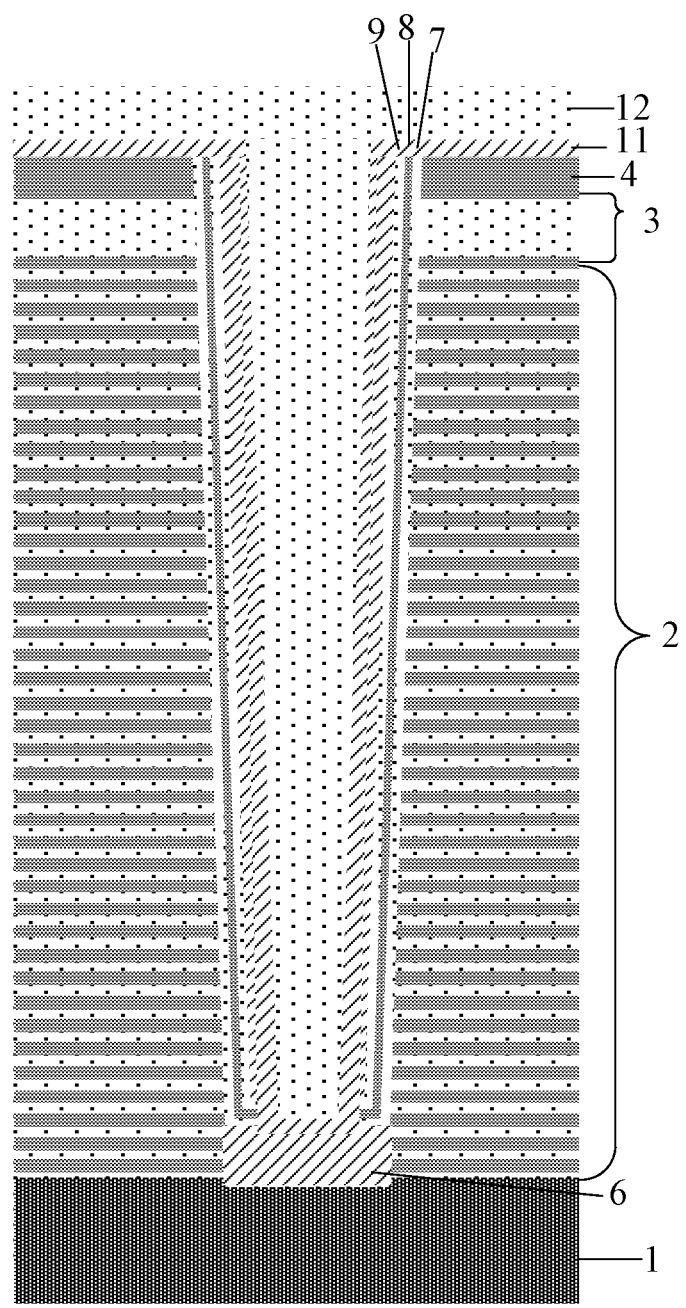

As shown in FIG. 6, a first filling layer 12 can be formed to cover the second channel layer 11 and fill the first through hole 5. In some embodiments, the first filling layer 12 can be an oxide layer formed by using a deposition process. In some embodiments, the first filling layer 12 can include one or more airgaps.

Figure 7A:
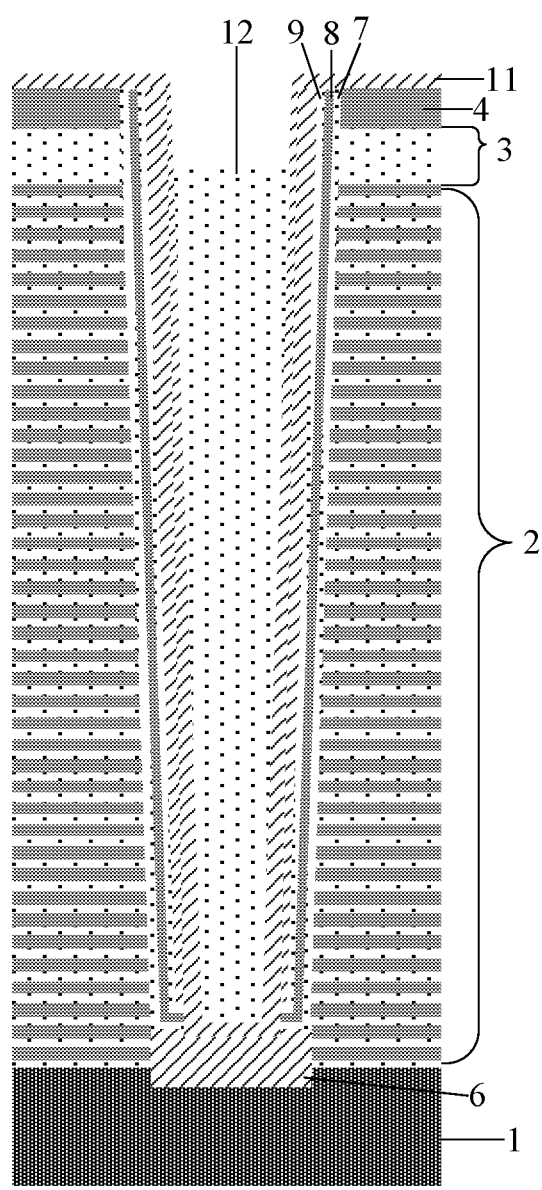
Figure 7B:
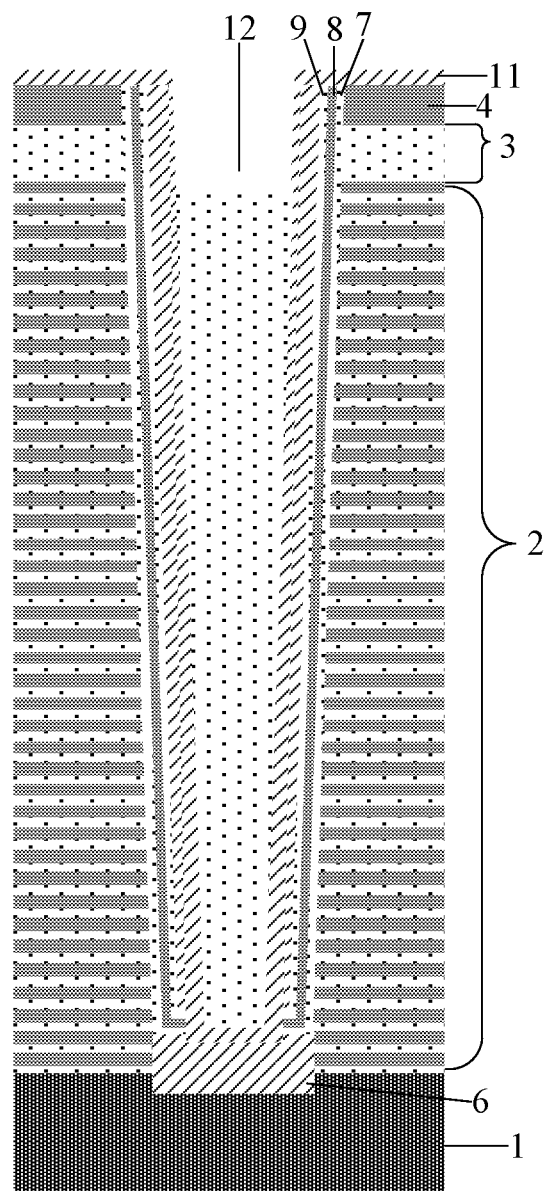

As shown in FIGS. 7A and 7B, a portion of the first filling layer 12 can be removed, so that the top surface of the first filling layer 12 can be lower than the top surface of the first insulating connection layer 3. As such, the remaining portion of the first filling layer 12 in the first through hole 5 can form the first filling structure. In some embodiments, the portion of the first filling layer 12 can be removed by using an etching process. It is noted that, the term "etching process" used in the present disclosure can be referred to any suitable etching process including, but not limit to, a wet etching, a dry etching, or a combination thereof.

In some embodiments, as shown in FIG. 7A, the top surface of the first filling layer 12 can be higher than the top surface of the second stacker layer 2. For example, the top surface of the first filling layer 12 can be 20 nm to 40 nm higher than the top surface of the top nitride layer of the second stacker layer 2. Preferably, the top surface of the first filling layer 12 can be about 30 nm higher than the top surface of the top nitride layer of the second stacker layer 2.

In some alternative embodiments, as shown in FIG. 7B, the top surface of the first filling layer 12 can be lower than the top surface of the second stacker layer 2. For example, the top surface of the first filling layer 12 can be 30 nm to 40 nm lower than the top surface of the top nitride layer of the second stacker layer 2. Preferably, the top surface of the first filling layer 12 can be about 35 nm lower than the top surface of the top nitride layer of the second stacker layer 2.

Figure 8A:
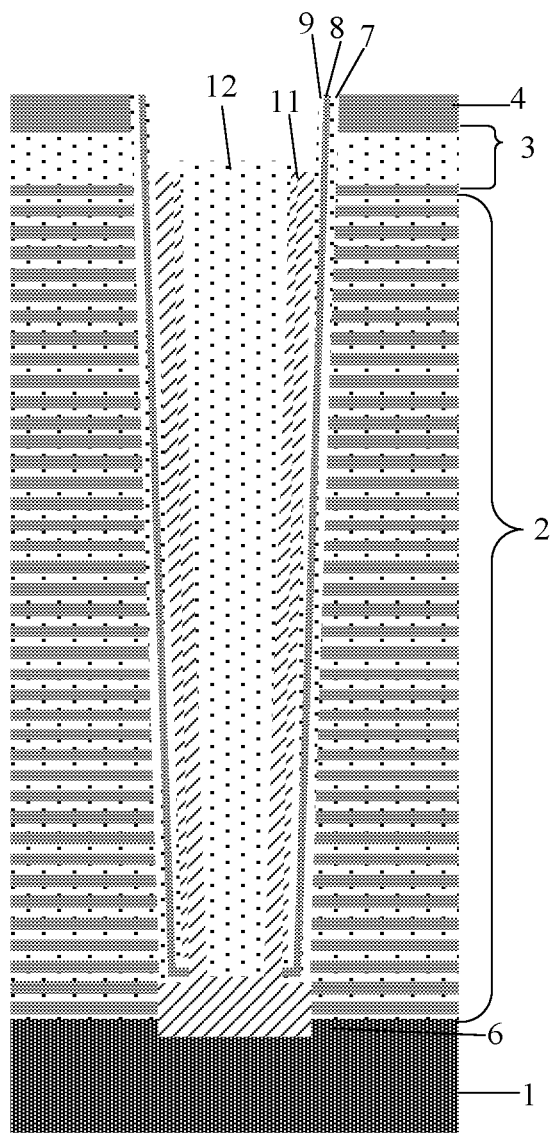
Figure 8B:
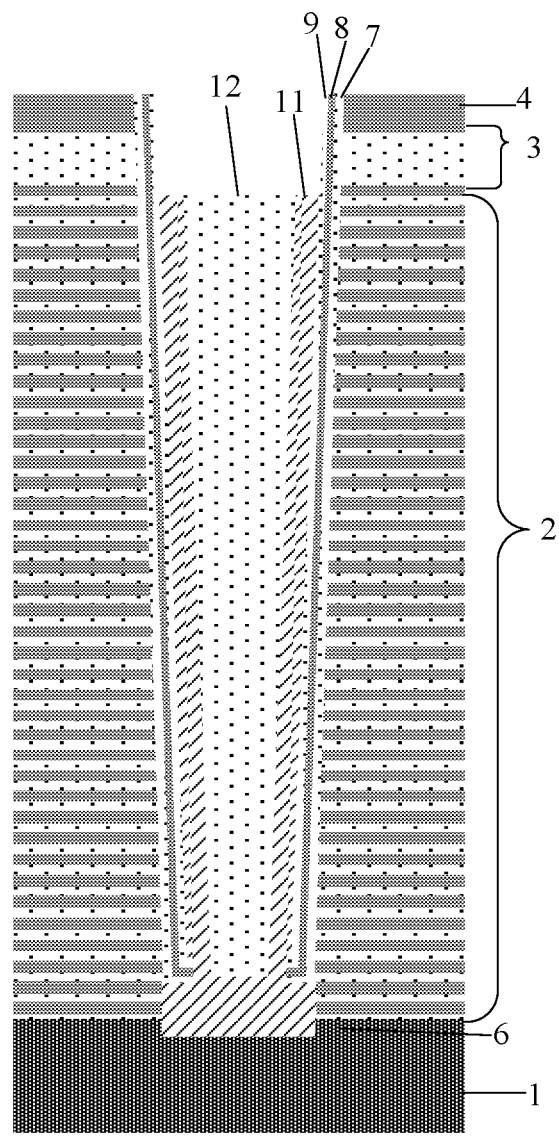

As shown in FIGS. 8A and 8B, a portion of the second channel layer 11 can be removed, such that the surface of the second channel layer 11 is lower than the first insulating connection layer 3. The remaining portion of the second channel layer 11 can form the second channel structure that is in contact with the first channel structure 6. In some embodiments, the portion of the second channel layer 11 can be removed by using an etching process.

It is noted that, in various embodiments, the top surface of the second channel structure can be higher or lower than the top surface of the first stacked layer 2. However, the top surface of the second channel structure is not lower than the top surface of the top oxide layer in the first stacked layer 2. In some embodiments, the top surface of the second channel structure can be higher than the top nitride layer in the first stacked layer 2, as shown in FIG. 8A. In some alternative embodiments, the top surface of the second channel structure is in a same plane of the top surface of the top oxide layer in the first stacked layer 2, as shown in FIG. 8B.

At S106, a first groove can be formed in the first insulating connection layer 3. In some embodiments, the projection of the first groove on the substrate 1 can completely cover the projection of the first through hole 5 on the substrate 1.

Figure 9A:
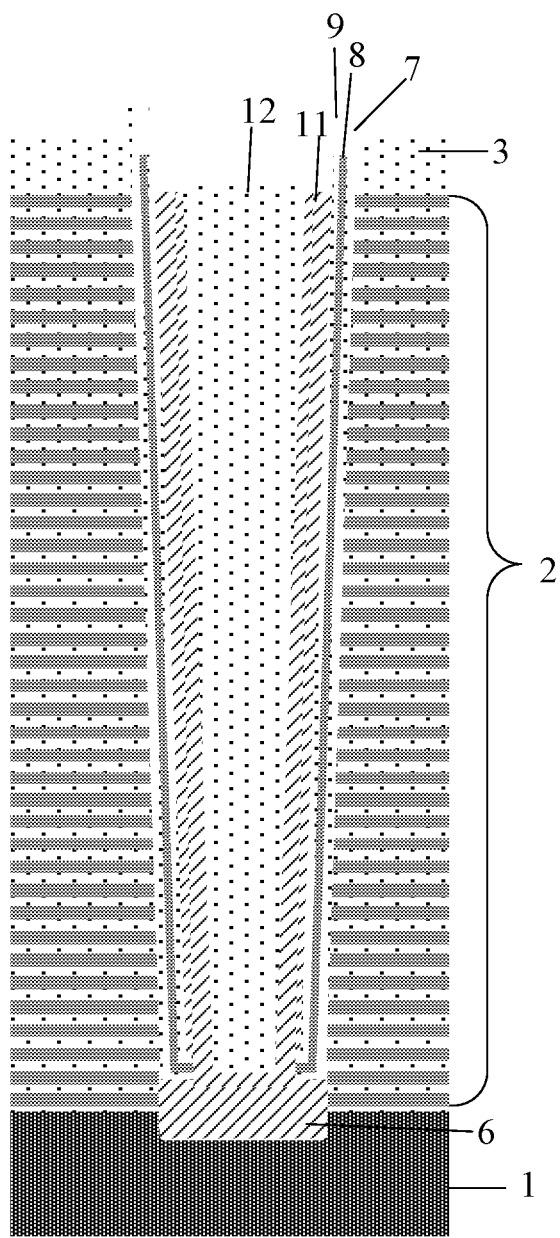
Figure 9B:
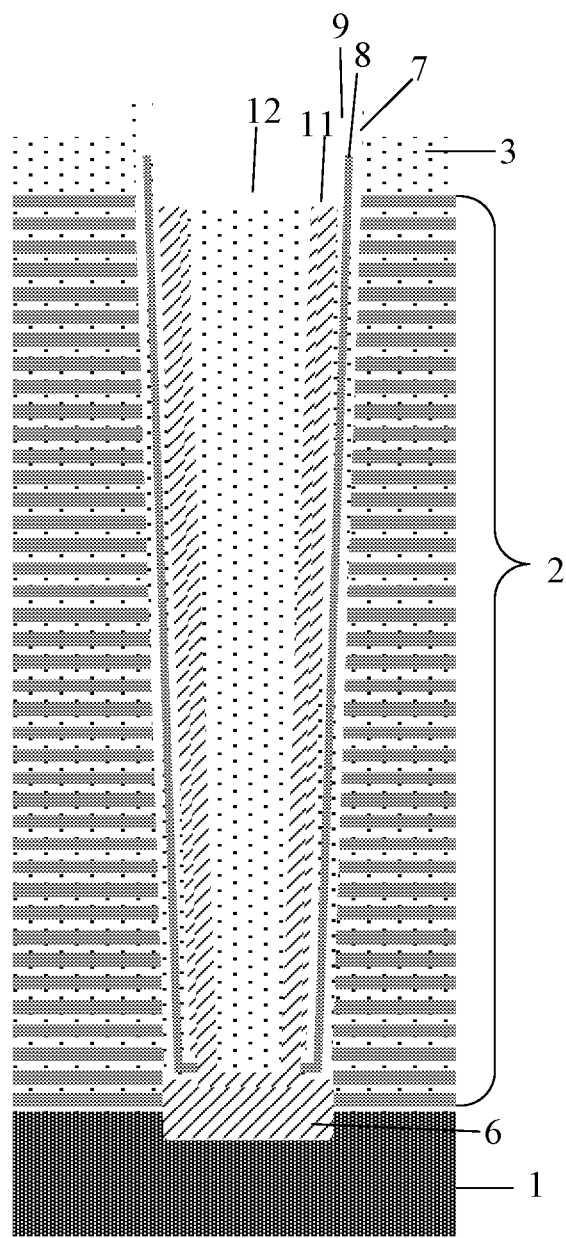

As shown in FIGS. 9A and 9B, the nitride layer of the first mask layer 4 can be removed. In some embodiments, the nitride layer of the first mask layer 4 can be removed by using an etching process.

Figure 10A:
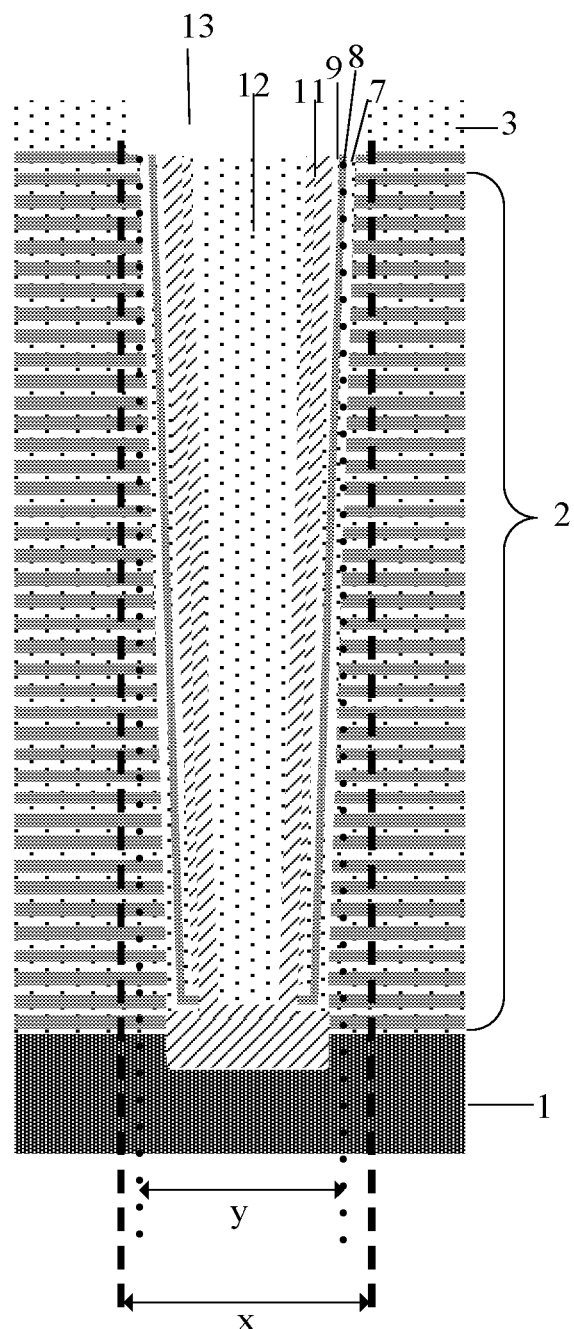
Figure 10B:
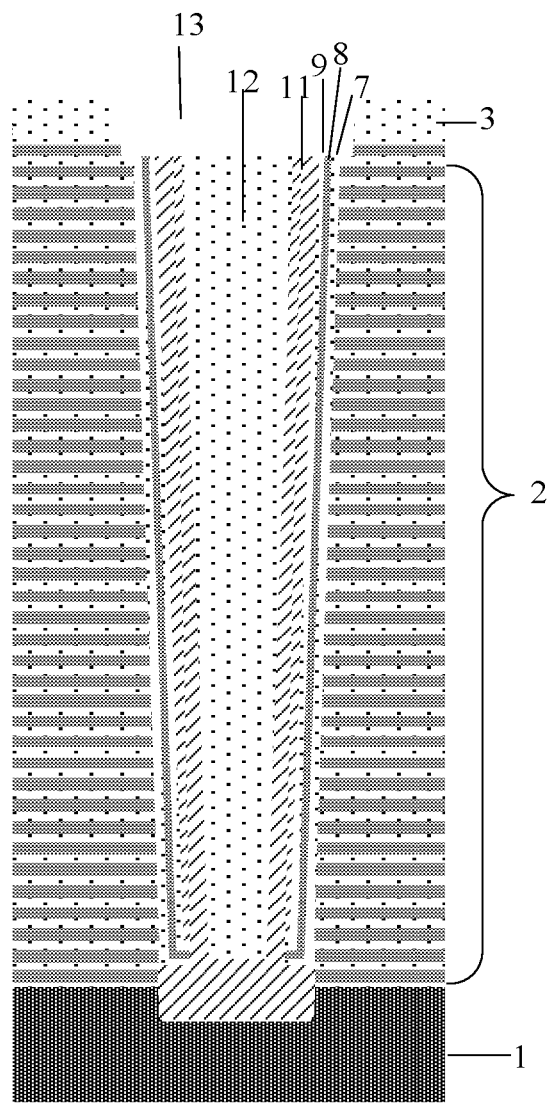

As shown in FIGS. 10A and 10B, the surface of the first insulating connection layer 3 can be planarized by using any suitable techniques, such as backside grinding, and/or chemical mechanical polishing (CMP). A portion of the first insulating connection layer 3 can be removed to form the first groove that penetrates the first insulating connection layer 3. An area of the projection "x" of the first groove on the substrate 1 can be larger than an area of the projection "y" of the first through hole 5 on the substrate 1.

In some embodiments, a depth of the first groove can be equal to or less than the thickness of the planarized first insulating connection layer 3, as shown in FIG. 10A. For example, the depth of the first groove can be in a range between 50 nm and 70 nm. In one embodiment, the thickness of the planarized first insulating connection layer 3 is about 90 nm, while the depth of the first groove is about 60 nm.

In some alternative embodiments, the depth of the first groove can be greater than the thickness of the planarized first insulating connection layer 3, as shown in FIG. 10B. That is, a portion of the top nitride layer in the first stacked layer 2 can also be removed to form the first groove. For example, the depth of the first groove can be in a range between 50 nm and 70 nm. In one embodiment, the thickness of the planarized first insulating connection layer 3 is about 30 nm, while the depth of the first groove is about 60 nm.

Figure 11A:
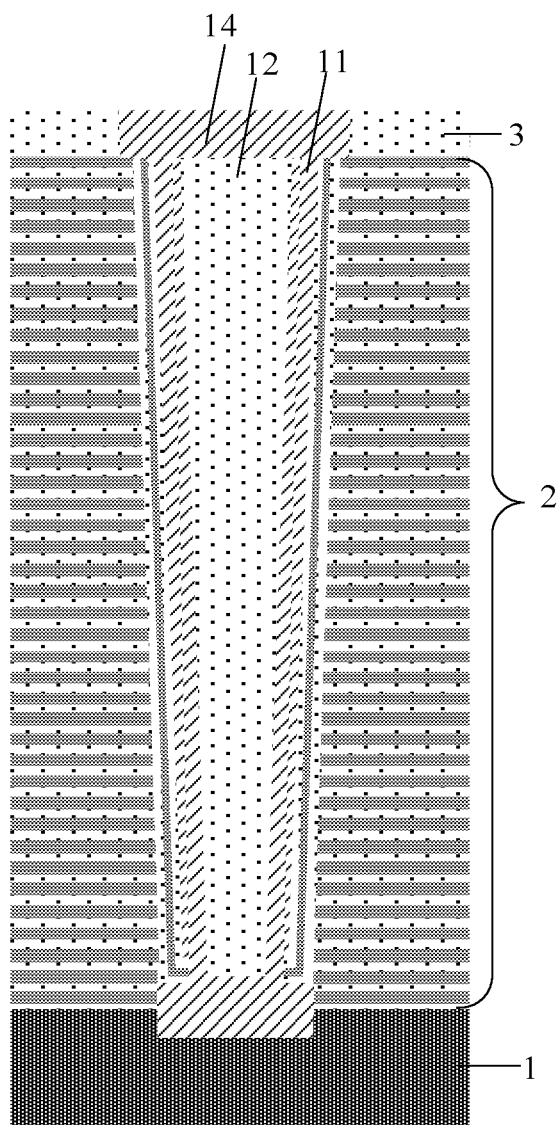
Figure 11B:
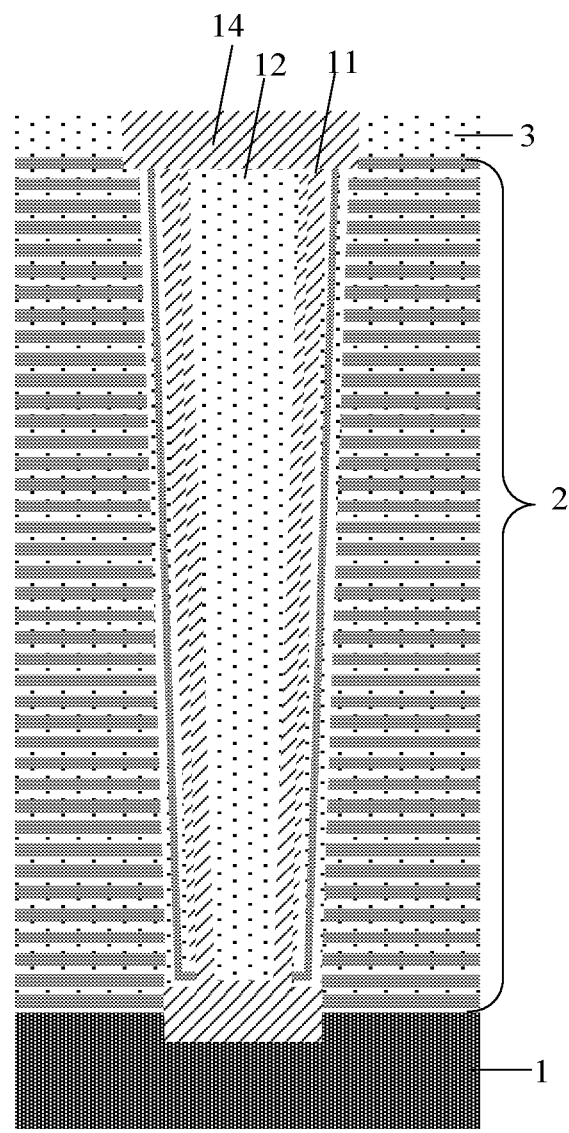

At S107, a third channel structure 14 can be formed in the first groove 13. As shown in FIGS. 11A and 11B, the third channel structure 14 can be in contact with the second channel structure. In some embodiments, the third channel structure can be a polycrystalline silicon player formed by using a deposition process.

A thickness of the third channel structure 14 can be equal to the depth of the first groove 13. As described above, in some embodiments, a thickness of the third channel structure 14 can be equal to or less than the thickness of the planarized first insulating connection layer 3, as shown in FIG. 11A. For example, the thickness of the third channel structure 14 can be in a range between 50 nm and 70 nm, preferably about 60 nm. In some alternative embodiments, the thickness of the third channel structure 14 can be greater than the thickness of the planarized first insulating connection layer 3, as shown in FIG. 11B. For example, the thickness of the third channel structure 14 can be in a range between 60 nm and 80 nm, preferably about 70 nm.

Figure 12:
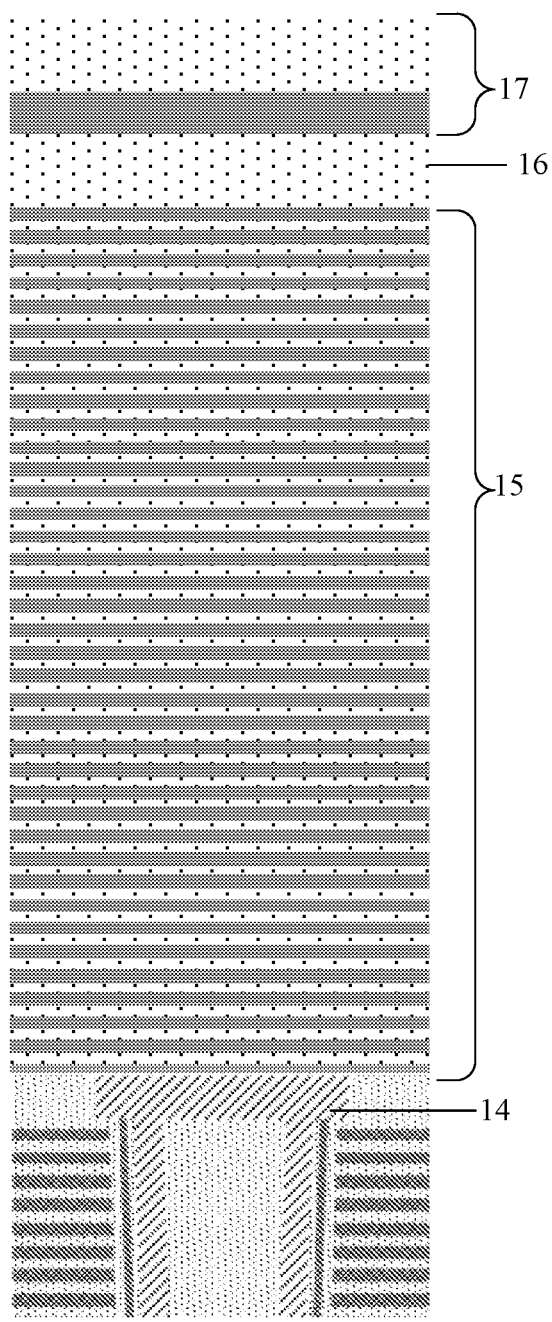

Referring to FIG. 23B, at S108, a second stacked layer 15 and a second insulating connection layer 16 can be sequentially formed on the third channel structure 14. As shown in FIG. 12, the second stacked layer 15 can include a plurality of oxide/nitride layer pairs, such as silicon oxide layer and silicon nitride layer pairs. Similar to the first stacked layer 2 as described above, the multiple oxide layers (shown in the areas with dotes) and multiple nitride layers (shown in the areas with meshes) in the second stacked layer 15 alternate in a vertical direction. The second stacked layer 15 can include any suitable number of layers of the oxide layers and the nitride layers. In some embodiments, a total number of layers of the oxide layers and the nitride layers in the second stacked layer 15 is equal to or larger than 64.

In some embodiments, the second insulating connection layer 16 can be made by any suitable insulating material and/or dielectric material, such as silicon oxide. It is noted that, the material of the second insulating connection layer 16 can be different from the material of the nitride layer in the second stacked layer 15.

Further, in some embodiments, a second mask layer 17 can be formed on the surface of the second insulating connection layer 16. The second mask layer 17 can include a nitride layer on the surface of the second insulating connection layer 16, and an oxide layer on the surface of such nitride layer.

Figure 13:
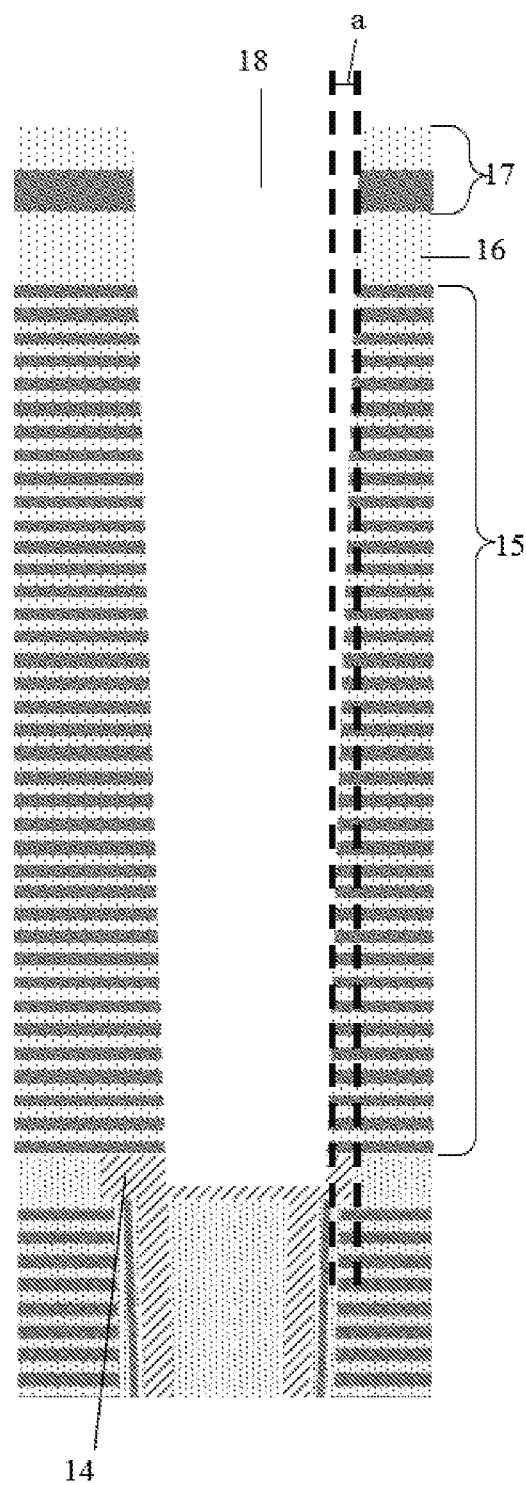

At S109, a second through hole 18 is formed. As shown in FIG. 13, the second through hole 18 can completely penetrate the second stacked layer 15 and the second insulating connection layer 16, and can extend into the surface of the third channel structure 14. The projection of the second through hole 18 on the substrate 1 can at least partially overlap with the projection of the first through hole 5 on the substrate 1.

In some embodiments, the second stacked layer 15, the second insulating connection layer 16, the second mask layer 17, and the third channel structure 14 can be etched to form the second through hole 18. The second stacked layer 15, the second insulating connection layer 16, the second mask layer 17, and/or the third channel structure 14 can be etched by using a dry etching process, a wet etching process, or a combination thereof. A cleaning process can then be performed to clean the second through hole 18.

It is noted that, the second through hole 18 can extend to the surface of the third channel structure 14, or can extend into the third channel structure 14. As such, a fourth channel structure formed subsequently in the second through hole 18 can directly contact the third channel structure.

In some embodiments, a maximum difference between the radius of the top aperture of each second through hole 18 and the radius of the bottom aperture of the second through hole 18 can be 15 nm. That is, as shown in FIG. 13, a distance "a" between the boundary line of the top surface of each second through hole 18 and the boundary of the bottom surface of the second through hole 18 can be no more than 15 nm.

At S1010, a second functional layer can be formed on the sidewall of the second through hole 18. In some embodiments, the second functional layer can include a second tunneling layer 19, a second storage layer 20, a second barrier layer 21, and a second passivation layer 22.

Figure 14:
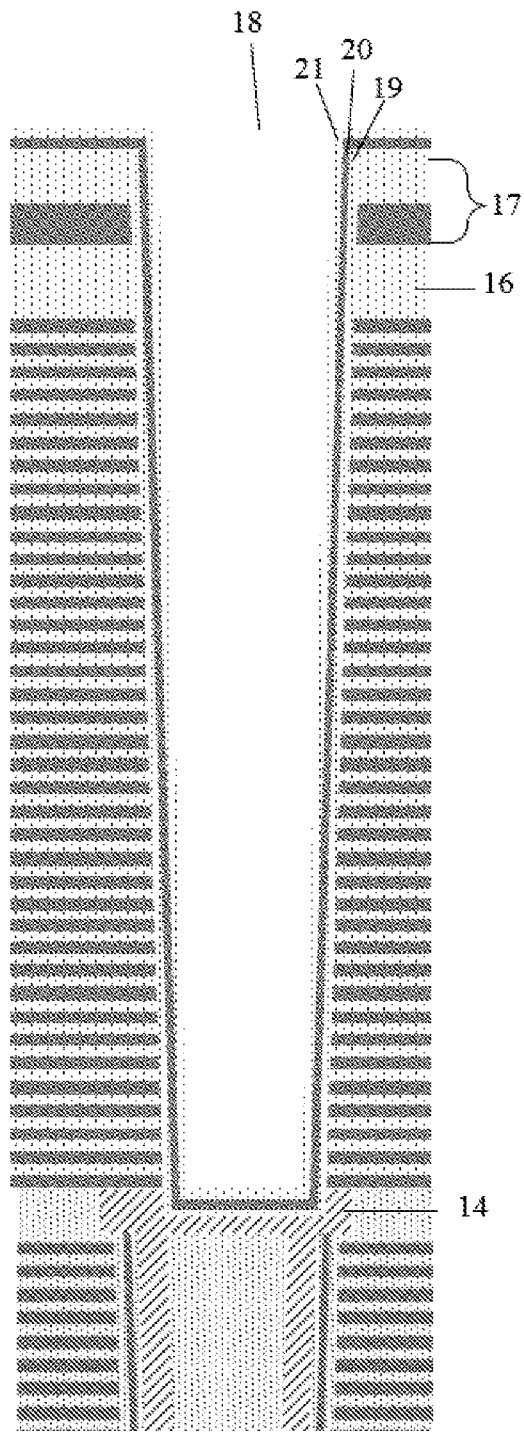

As shown in FIG. 14, the second tunneling layer 19 can be formed on the sidewall of the second through hole 18 and the surface of the second channel structure 14. The second tunneling layer 19 can be used for generating electronic charges. In some embodiments, the second tunneling layer 19 can be an oxide layer formed by using a deposition process.

The second storage layer 20 can be formed on the surface of the second tunneling layer 19. The second storage layer 20 can be used for storing electronic charges. In some embodiments, the second storage layer 20 can be a nitride layer formed by using a deposition process.

The second barrier layer 21 can be formed on the surface of the second storage layer 20. The second barrier layer 21 can be used for blocking the outflow of the electronic charges in the second storage layer 20. In some embodiments, the second barrier layer 21 can be an oxide layer formed by using a deposition process.

Figure 15:
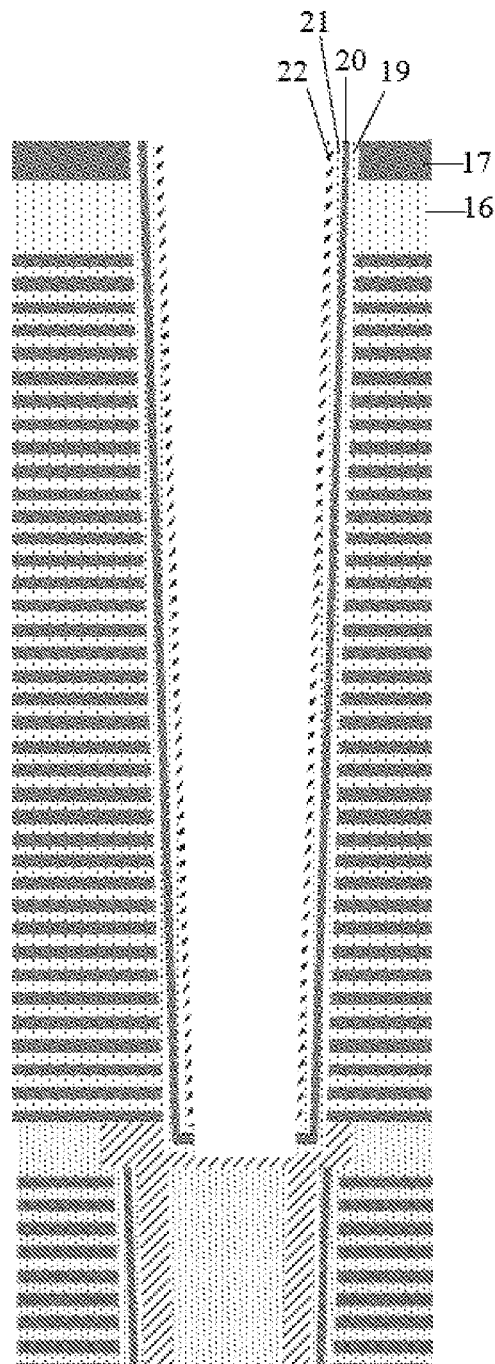

As shown in FIG. 15, a second passivation layer 22 can be formed on the surface of the second barrier layer 21. The second passivation layer 22 can be used for protecting the second barrier layer 21 from being damaged in a subsequent removal process. In some embodiments, the second passivation layer 22 can be an amorphous silicon layer formed by using a deposition process.

As shown in FIG. 15, the portions of the second passivation layer 22, the second barrier layer 21, the second storage layer 20 and the second tunneling layer 19 that are located on the surface of the second channel structure 14 can be removed. In some embodiments, the removal process can include an etching process and a cleaning process. In some embodiments, the portions of the second passivation layer 22, the second barrier layer 21, the second storage layer 20, the second tunneling layer 19, the oxide layer of the second mask layer 17 that are located on the nitride layer of the second mask layer 17 can also be removed by using an etching process. As such, the second functional layer can be formed on the sidewall of the second through hole 18.

At S1012, a fourth channel structure and a second filling structure can be sequentially formed on the sidewall of the second functional layer and the exposed surface of the third channel structure. In some embodiments, the top surface of the fourth channel structure can be higher than the top surface of the second filling structure.

Figure 16:
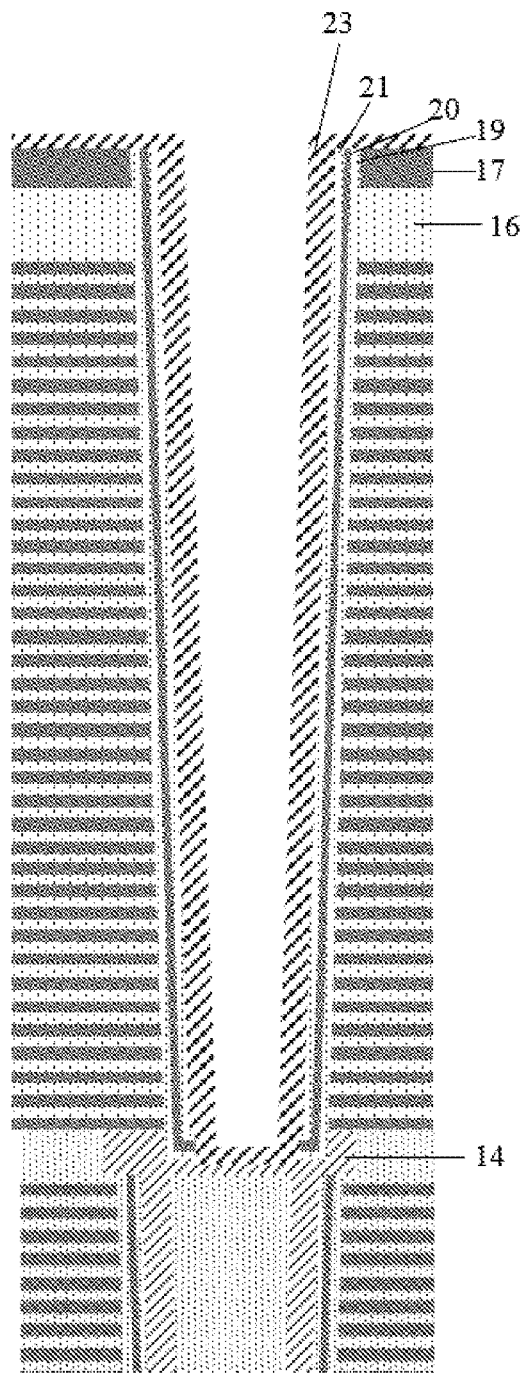

As shown in FIG. 16, a fourth channel layer 23 can be formed to cover the sidewall of the second passivation layer 22 and the bottom surface of the second through hole 18. In some embodiments, the fourth channel layer 23 can also cover the surface of the second insulating connection layer 16, or the surface of the nitride layer of the second mask layer 17. In some embodiments, the fourth channel layer 23 can be an amorphous silicon layer formed by using a deposition process.

Figure 17:
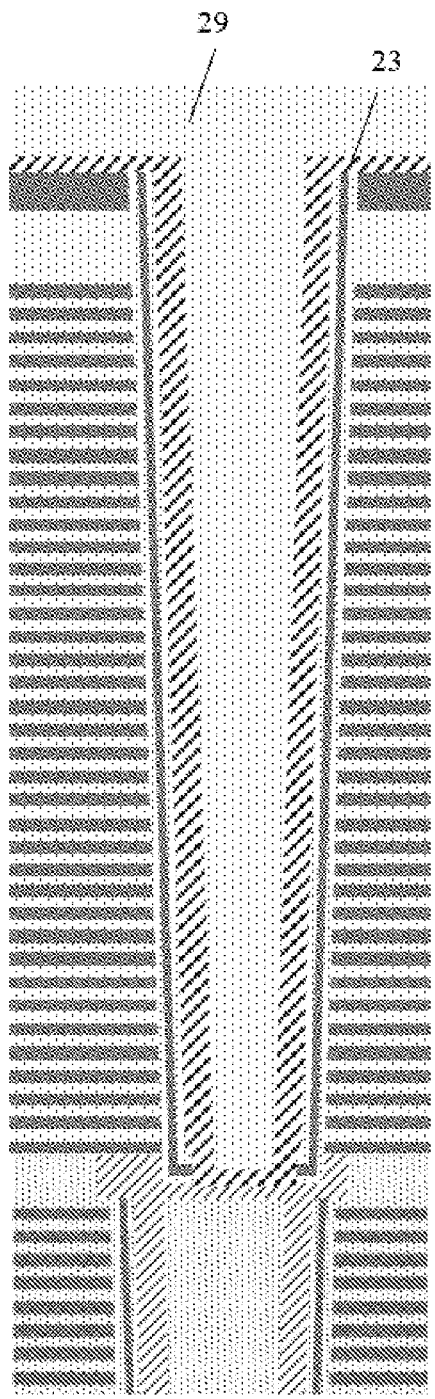

As shown in FIG. 17, a second filling layer 29 can be formed to cover the fourth channel layer 23 and to fill the second through hole 18. In some embodiments, the second filling layer 29 can be an oxide layer formed by using a deposition process.

Figure 18:
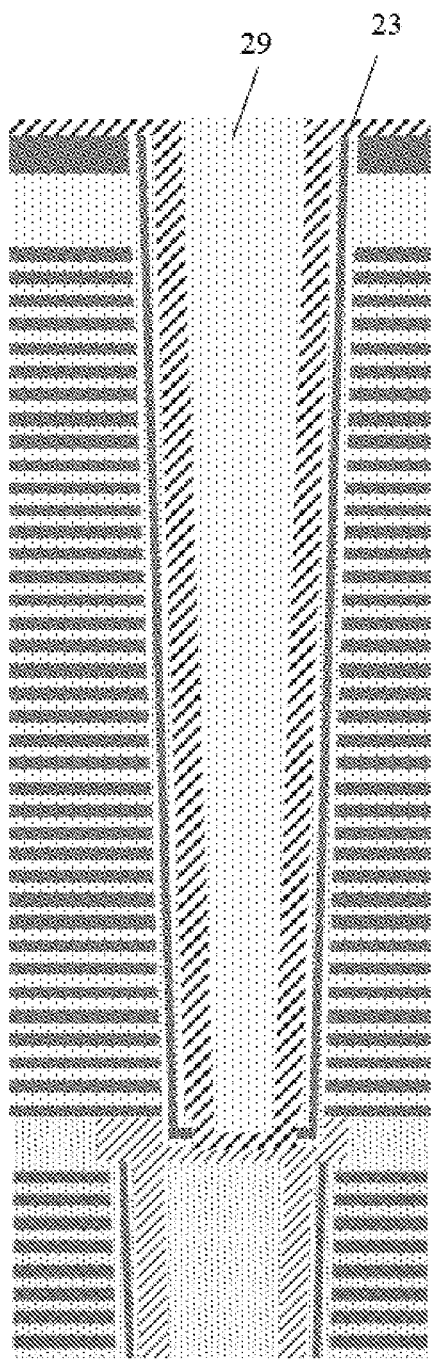

As shown in FIG. 18, a portion of the second filling layer 29 can be removed, such that the surface of the second filling layer 29 is lower than the surface of the second insulating connection layer 16. In some embodiments, the removal process can include an etching process. The remaining portion of the second filling layer 29 in the second through hole 18 can form the second filling structure.

Figure 19:
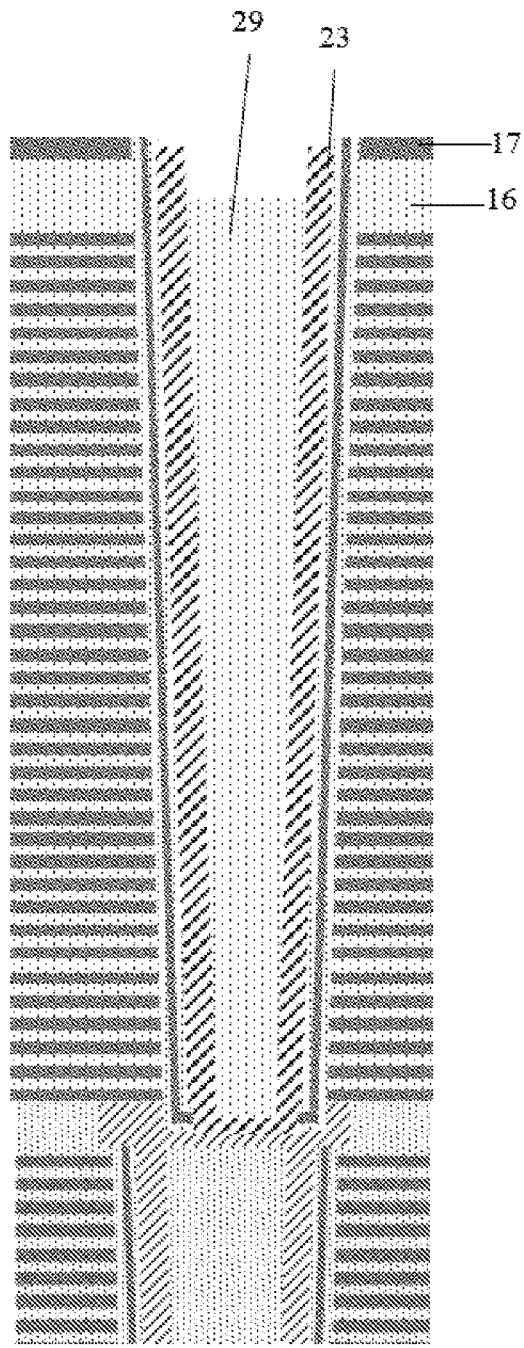

As shown in FIG. 19, the portion of the fourth channel layer 23 located on the surface of the second insulating connection layer 16 or the surface of the second mask layer 17 can be removed. In some embodiments, the removal process can include an etching process. The remaining portion of the fourth channel layer 23 in the second through hole 18 can form the fourth channel structure. The top surface of the fourth channel structure can be higher than the top surface of the second filling structure. As such, a second groove can be formed on the fourth channel structure and the second filling structure, and in the second through hole 18.

It is noted that, the top surface of the fourth channel structure can be higher than the top surface of the second stacked layer 15, or can be lower than the top surface of the second stacked layer 15. The top surface of the fourth channel structure is not lower than the top surface of the top oxide layer in the second stacked layer 15. In some embodiments, the top surface of the fourth channel structure can be in a same plane of the top surface of the top oxide layer in the second stacked layer 15.

Figure 20:
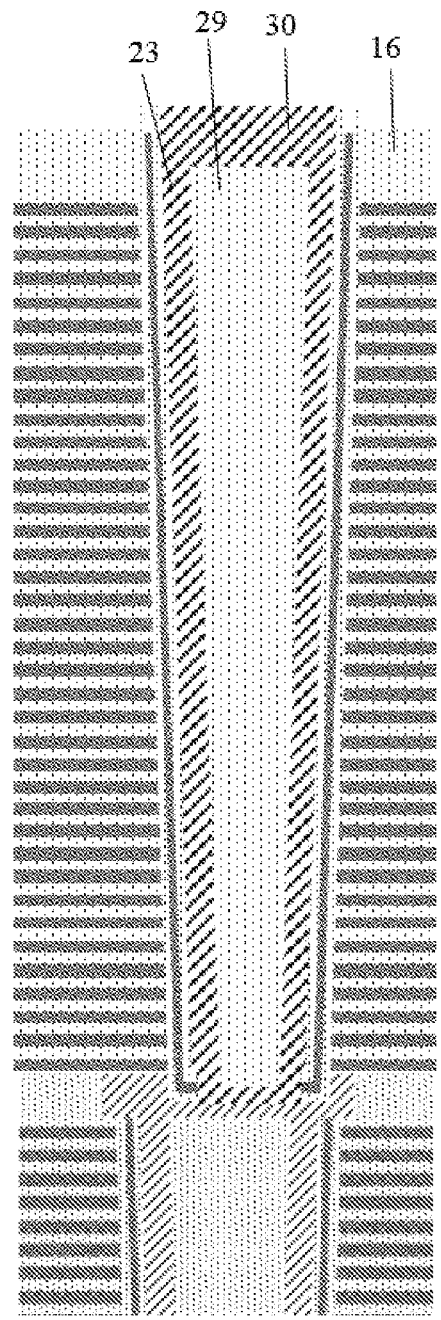

At S1013, a fifth channel structure can be formed in the second groove. The fifth channel structure can be in contact with the fourth channel structure. As shown in FIG. 20, the fifth channel structure 30 can be formed in the second groove that is on the fourth channel structure and the second filling structure and in the second through hole 18. The nitride layer of the second mask layer 17 can be then removed by an etching process.

Figure 21A:
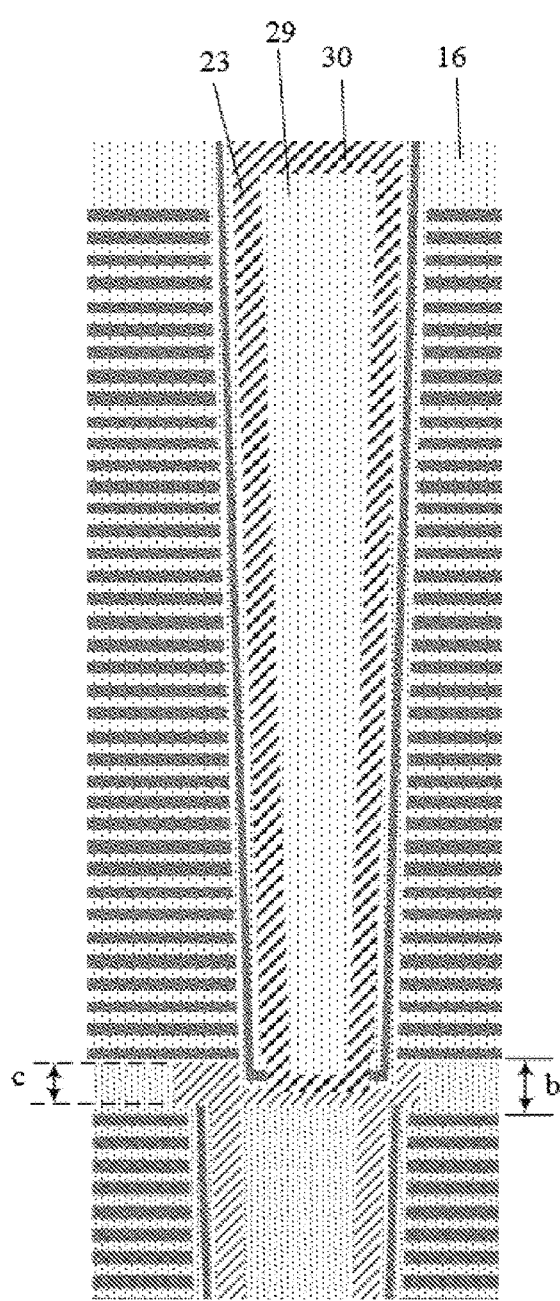
Figure 21B:
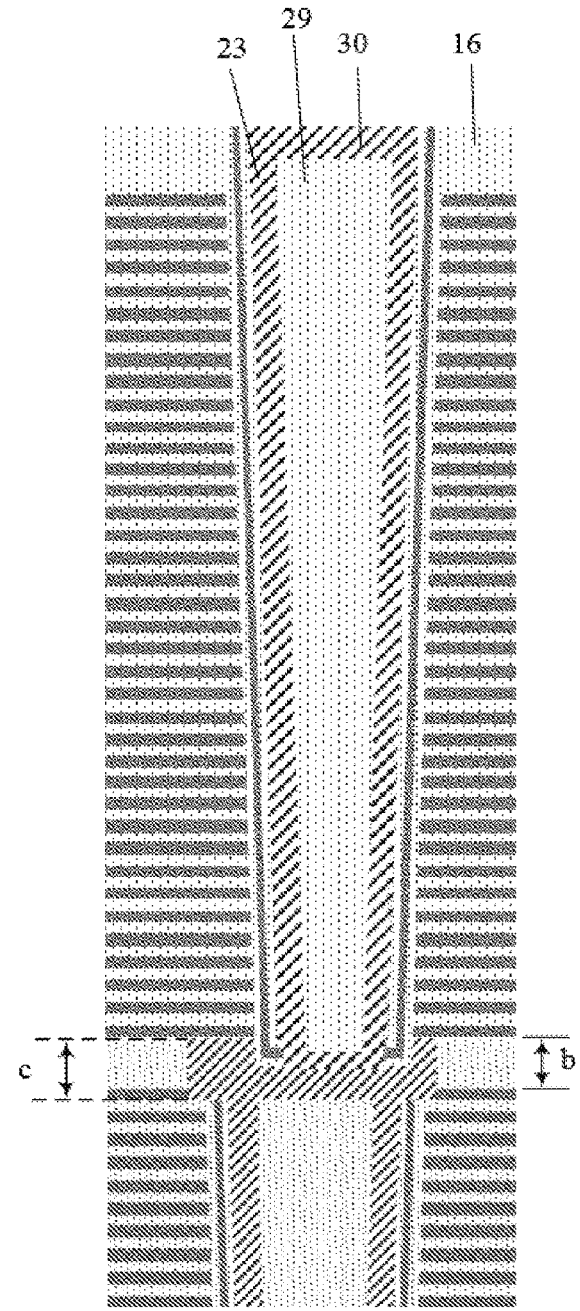

As shown in FIGS. 21A and 21B, the top surface of the second insulating connection layer 16 and the top surface of the fifth channel structure 30 can be planarized by any suitable techniques, such as backside grinding, and/or chemical mechanical polishing (CMP).

Accordingly, the disclosed method as shown in FIGS. 23A and 23B can form a joint opening structure of a three-dimensional (3D) memory device by combining two through hole formation processes. As such, the formed channel hole having the joint opening structure can have a large aspect ratio and a limited top-bottom aperture error. Further, the disclosed method of forming a joint opening structure in a 3D memory device can result in an efficient process capability control, a simplified process complexity, and a reduced cost.

In some embodiments, the present disclosure also provides a three-dimensional memory device formed by using the above disclosed method as shown in FIGS. 23A and 23B. The three-dimensional memory can include the following components described below.

A first stacked layer including a plurality of oxide/nitride layer pairs, such as silicon oxide layer silicon nitride layer pairs, is formed on a substrate. A first insulating connection layer is formed on the first stacked layer. A first through hole penetrates the first stacked layer and the first insulating connection layer, and extends into the surface of the substrate.

A first channel structure is formed on the surface of the substrate exposed by the first through hole. A first functional layer is formed on the sidewall of the first through hole. A second channel structure is formed on the sidewall of the first functional layer and the surface of the first channel structure. A first filling structure is formed on the sidewall and the surface of the second channel structure to fill the first through hole. In some embodiments, an airgap is enclosed in the first filling structure. The top surfaces of the second channel structure and the first filling structure are lower than the top surfaces of the first insulating connection layer.

A first groove is formed in the first insulating connection layer, and above the first functional layer, the second channel structure and the first filling structure. A projection of the first groove on the substrate completely covers a projection of the first through hole on the substrate. A third channel structure in contact with the second channel structure is formed in the first groove.

A second stack layer including a plurality of oxide/nitride layer pairs, such as silicon oxide layer and silicon nitride layer pairs, is formed on the top surfaces of the first insulating connection layer and the third channel structure. A second insulating connection layer is formed on the second stack layer. A second through hole penetrates through the second stacked layer and the second insulating connection layer, and extends into a surface of the third channel structure. A projection of the second through hole on the substrate at least partially overlaps the projection of the first through hole on the substrate.

A second functional layer is formed on the sidewall of the second through hole. A fourth channel structure is formed on the sidewall of the second functional layer and the bottom surface of the second through hole. A second filling structure is formed on the sidewall and the surface of the fourth channel structure to fill the second through hole. In some embodiments, an airgap is enclosed in the second filling structure. The top surface of the fourth channel structure is higher than the top surface of the second filling structure. A fifth channel structure in contact with the fourth channel structure is formed in a second groove that is surrounded by the second functional layer, and above the fourth channel structure and the second filling structure.

In some embodiments, as shown in FIG. 21A, a thickness "b" of the first insulating connection layer, which is the distance between the top nitride layer of the first stacked layer and the bottom nitride layer of the second stacked layer can be in a range between 80 nm and 100 nm, preferably about 90 nm. A thickness "c" of the third channel structure can be in a range between 50 nm and 70 nm, preferably about 60 nm.

In some alternative embodiments, as shown in FIG. 21B, a thickness "b" of the first insulating connection layer, which is the distance between the top nitride layer of the first stacked layer and the bottom nitride layer of the second stacked layer can be in a range between 20 nm and 40 nm, preferably about 30 nm. A thickness "c" of the third channel structure can be in a range between 50 nm and 70 nm, preferably about 60 nm.

Further, the difference between the radiuses of the top aperture and the bottom aperture of the second channel structure, and the difference between the radiuses of the top aperture and the bottom aperture of the fourth channel structure can be within 15 nm. Accordingly, the disclosed channel hole having a joint opening structure can have a large aspect ratio and a limited top-bottom aperture error.

In some embodiments, a replacement process can be performed to replace each of the plurality of nitride layers in the first stacked layer 2 and the second stacked layer 15 with a conductive layer 40, as shown in FIGS. 22A and 22B. The conductive layer can include any suitable material that is electronically conductive, including, but not limited to, W, Co, Cu, Al, doped silicon, silicides, or any combination thereof.

In some embodiments, during the replacement process, a portion of the third channel structure 14 that is adjacent with the bottom nitride layer of the second stacked layer 15, or is adjacent with the top nitride layer of the first stacked layer 2 can be converted to an oxide layer by an oxidation process. For example, an etching process can be performed to remove all nitride layers in the first stacked layer 2 and the second stacked layer 15. Then an oxide process can be formed to oxide the exposed surface of the third channel structure. As a result, a portion of the third channel structure can be converter to the oxide layer as shown in FIGS. 22A and 22B. In some embodiments, a thickness "c" of the third channel structure can be reduced after the replacement process. For example, the thickness "c" of the third channel structure can be reduced to a range between 30 nm and 50 nm, preferably about 40 nm.

Figure 50A:
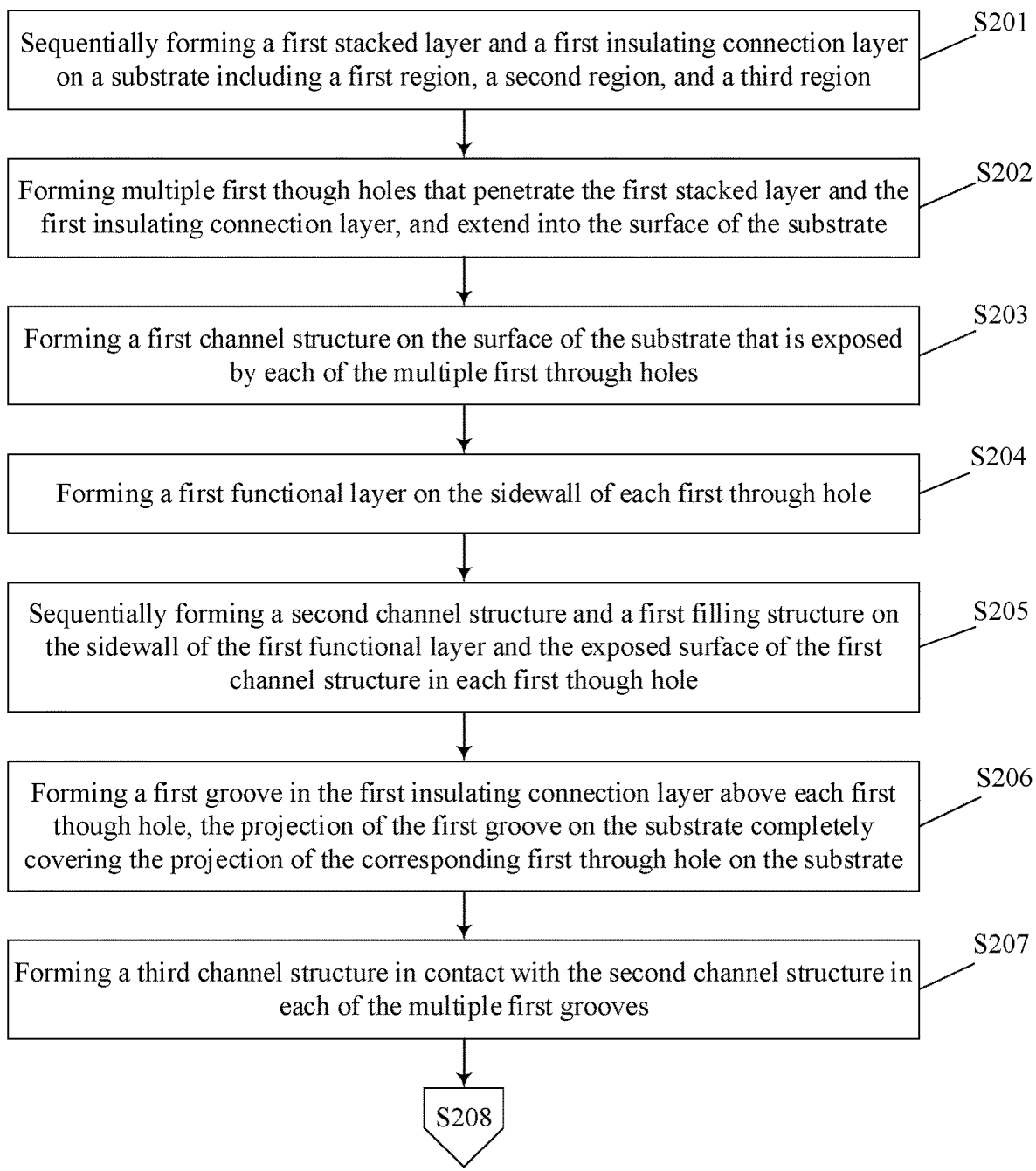
FIGS. 50A and 50B illustrate schematic flow diagrams of another exemplary fabricating process for forming a joint opening structure of three-dimensional (3D) memory device are illustrated in accordance with some embodiments of the present disclosure.
Figure 50B:
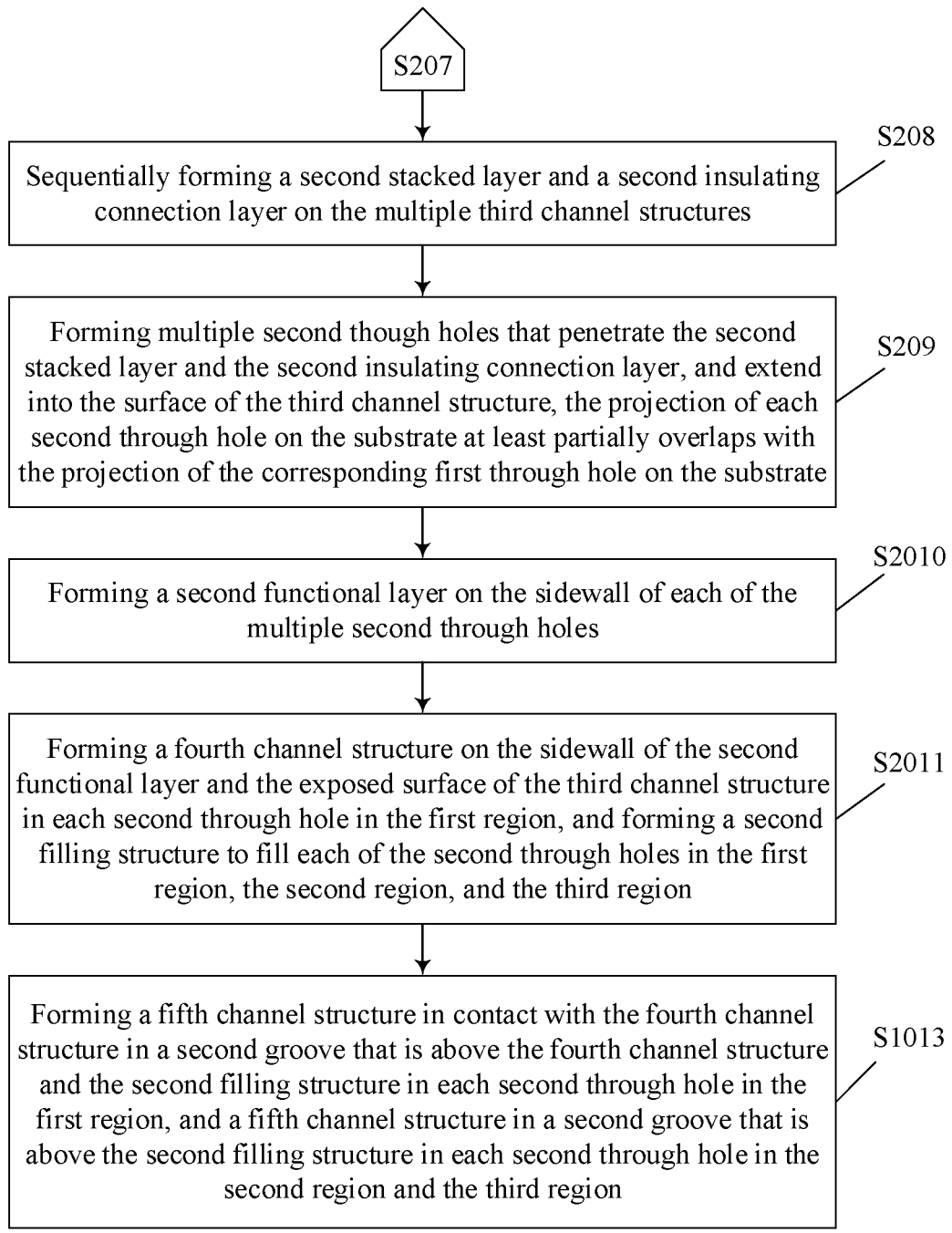

Referring to FIGS. 50A and 50B, schematic flow diagrams of another exemplary fabricating process for forming a joint opening structure of three-dimensional (3D) memory device are illustrated in accordance with some other embodiments of the present disclosure. And FIGS. 24-29, 30A, 30B, 31A, 31B, 32A, 32B, 33A. 33B, 34A, 34B, 35-47, 48A, 48B, 49A and 49B illustrate schematic structural cross-sectional diagrams of an exemplary joint opening structure of three-dimensional (3D) memory device at certain stages of the fabricating process shown in FIGS. 50A and 50B.

Figure 24:
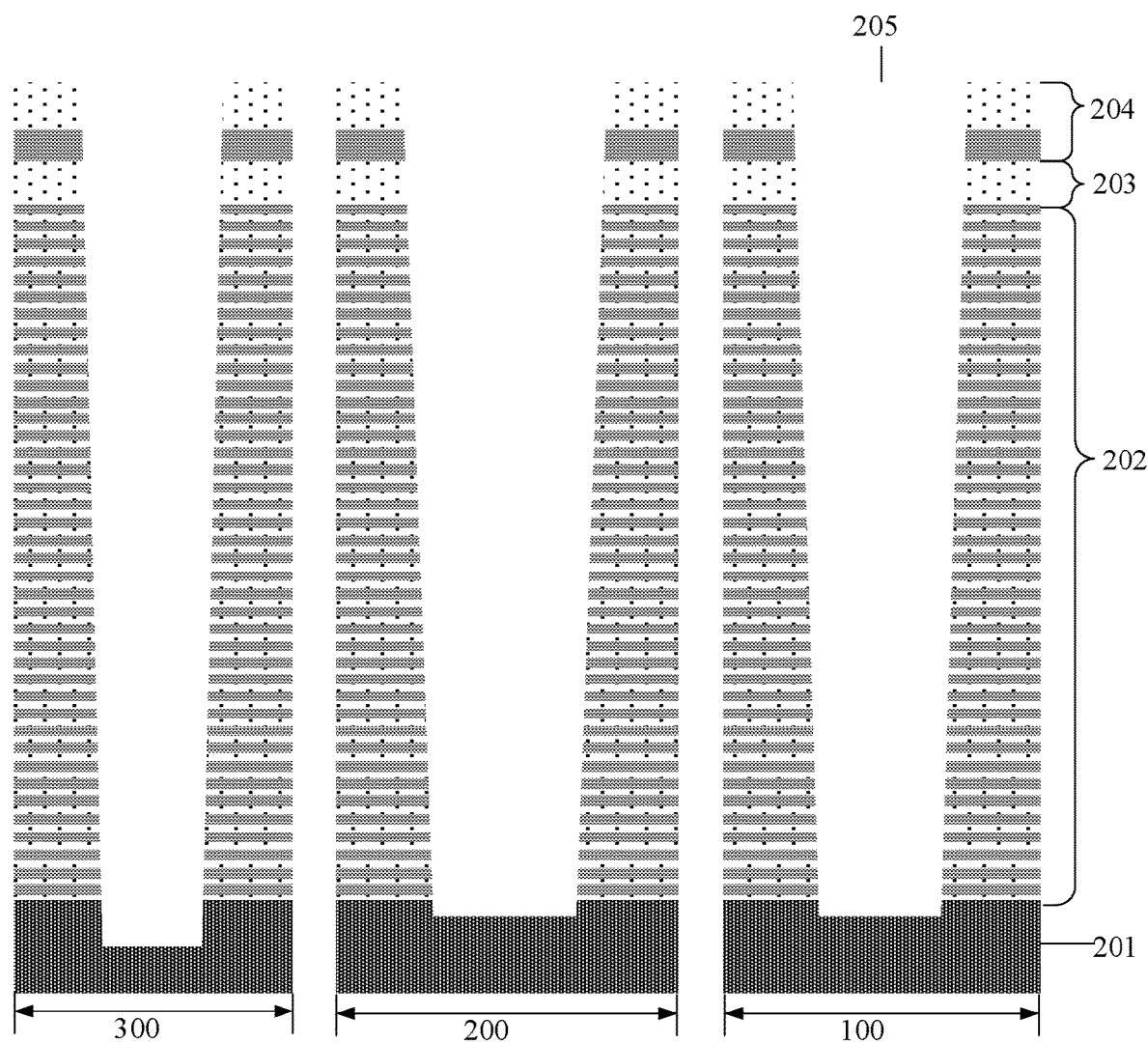
FIGS. 24-29, 30A, 30B, 31A, 31B, 32A, 32B, 33A, 33B, 34A, 34B, 35-47, 48A, 48B, 49A and 49B illustrate schematic structural cross-sectional diagrams of another exemplary joint opening structure of three-dimensional (3D) memory device at certain stages of another fabricating process in accordance with some embodiments of the present disclosure.

As shown in FIG. 50A, at S201, a first stacked layer 202 and a first insulating connection layer 203 can be sequentially formed on the surface of a substrate 201. In some embodiments, the 3D memory device can include a first region 100, a second region 200, and a third region 300, as shown in FIG. 24. The first region 100 can be used to form one or more channel holes, the second region 200 can be used to form one or more staircase structure (SS) dummy holes, while the third region 300 can be used to form one or more through array contact (TAC) barriers.

As shown in FIG. 24, the first stacked layer 202 can be formed on the substrate 201. The first stacked layer 202 can include a plurality of oxide/nitride layer pairs. That is, in the first stacked layer 202, multiple oxide layers (shown in the areas with dotes) and multiple nitride layers (shown in the areas with meshes) alternate in a vertical direction. In other words, except a top and a bottom layer of a given stack, each of the other oxide layers can be sandwiched by two adjacent nitride layers, and each nitride layer can be sandwiched by two adjacent oxide layers.

Oxide layers can each have the same thickness or have different thicknesses. For example, a thickness of each oxide layer can be in a range from 90 nm to 160 nm, preferably about 150 nm. Similarly, nitride layers can each have the same thickness or have different thicknesses. For example, a thickness of each nitride layer can be in a range from 80 nm to 100 nm, preferably about 100 nm. In some embodiments, the oxide layers can be silicon oxide layers, and the nitride layers can be silicon nitride layer.

The first stacked layer 202 can include any suitable number of layers of the oxide layers and the nitride layers. In some embodiments, a total number of layers of the oxide layers and the nitride layers in the first stacked layer 202 is equal to or larger than 64. In some embodiments, alternating conductor/dielectric stack includes more oxide layers or more nitride layers with different materials and/or thicknesses than the oxide/nitride layer pair.

The first insulating connection layer 203 can be formed on the first stacked layer 202. In some embodiments, the first insulating connection layer 203 can be made by any suitable insulating material and/or dielectric material, such as silicon oxide. It is noted that, the material of the first insulating connection layer 203 can be different from the material of the nitride layer in the first stacked layer 202.

Further, in some embodiments, a first mask layer 204 can be formed on the surface of the first insulating connection layer 203. The first mask layer 204 can include a nitride layer on the surface of the first insulating connection layer 203, and an oxide layer on the surface of such nitride layer.

In some embodiments, the first stacked layer 202, the first insulating connection layer 203, and/or the first mask layer 204 can be formed by using one or more deposition processes, such as one or more chemical vapor deposition (CVD) processes, one or more physical vapor deposition (PVD) processes, one or more atomic layer deposition (ALD) processes, and/or any suitable combinations thereof.

At S202, one or more first through holes 205 can be formed in each of the first region 100, the second region 200, and the third region 300. As shown in FIG. 24, each of the one or more first through holes 205 can completely penetrate the first stacked layer 202 and the first insulating connection layer 203, and can extend into the surface of the substrate 201. In some embodiments, when the first mask layer 204 is formed on the surface of the first insulating connection layer 203, the etching process also etch the first mask layer 204 to form the first through holes 205.

In some embodiments, the first through holes 205 can be formed by etching the first stacked layer 202 and the first insulating connection layer 203 and a subsequent cleaning process. The etching process to form the first through holes 205 can be a wet etching, a dry etching, or a combination thereof. It is noted that, in the direction perpendicular to the surface of the substrate 201, the depth of the one or more first through holes 205 in the third region 300 can be larger than the depth of the one or more first through holes 205 in the first region 100.

Figure 25:
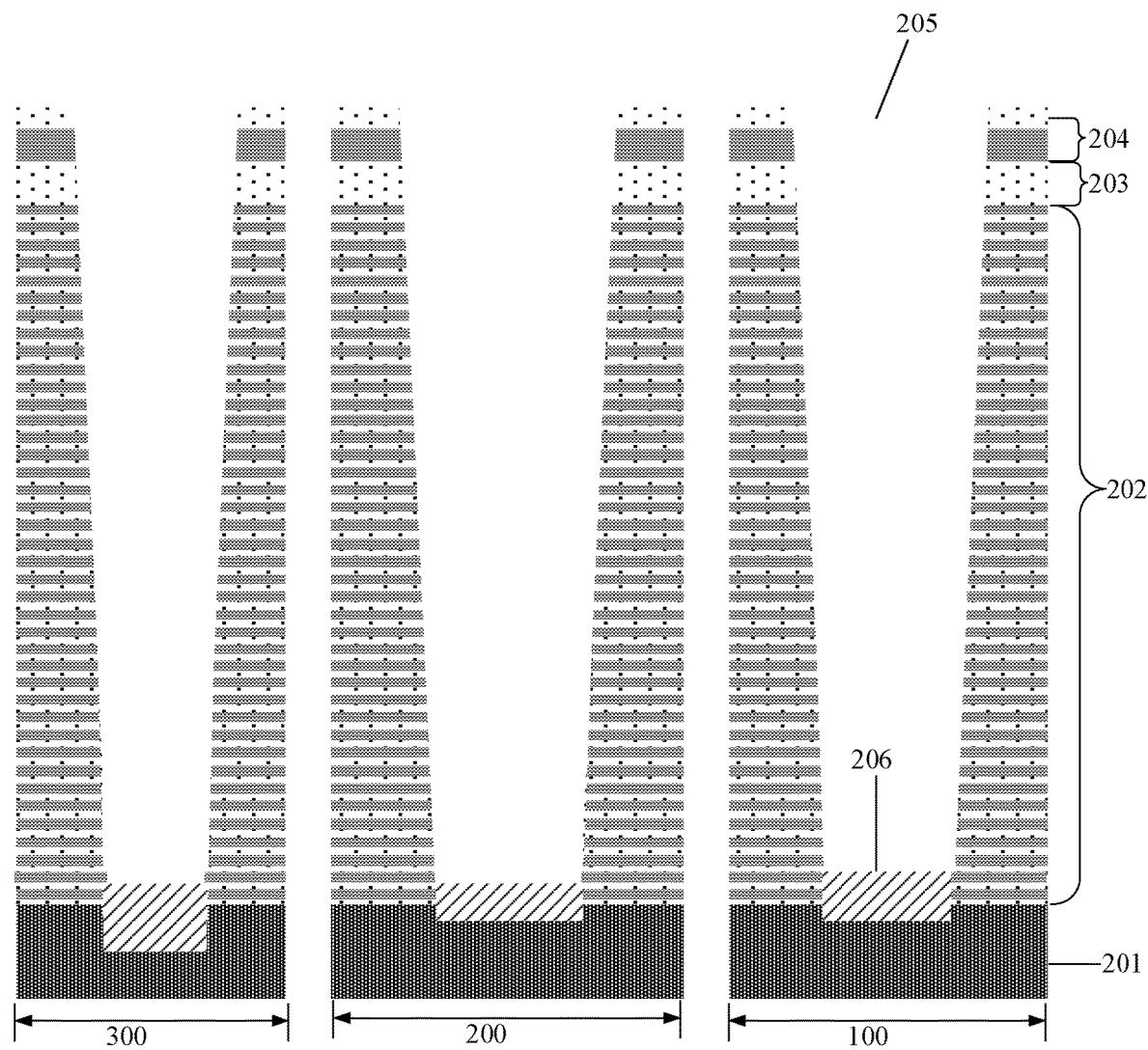

At S203, a first channel structure 206 can be formed on the surface of the substrate 201 that is exposed by each of the plurality of first through holes 205, as shown in FIG. 25. In some embodiments, the first channel structure 206 can be a polycrystalline silicon (polysilicon) layer formed by using a selective epitaxial process.

At S204, a first functional layer can be formed on the sidewall of each of the plurality of first through holes 205. The first functional layer can include a first tunneling layer 207, a first storage layer 208, a first barrier layer 209, and a first passivation layer 210.

Figure 26:
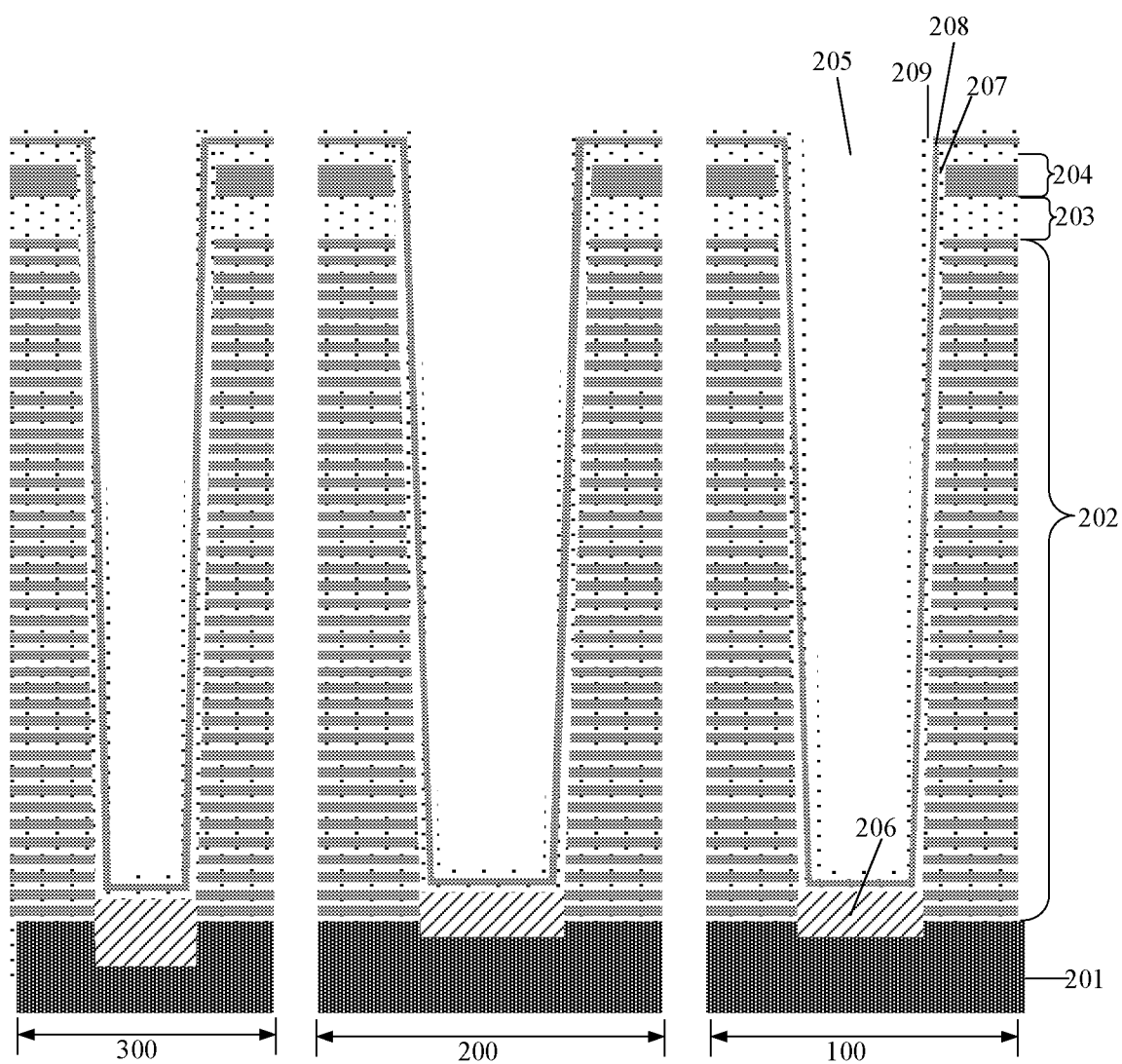

As shown in FIG. 26, the first tunneling layer 207 can be formed on the sidewall of the plurality of first through holes 205 and the exposed surfaces of the first channel structures 206. The first tunneling layer 207 can be used for generating electronic charges (electrons or holes). In some embodiments, the first tunneling layer 207 can be an oxide layer formed by using a deposition process.

The first storage layer 208 can be formed on the surface of the first tunneling layer 207. The first storage layer 208 can be used for storing electronic charges. The storage or removal of charge in the first storage layer 207 can impact the on/off state and/or a conductance of the semiconductor channel. The first storage layer 207 can include polycrystalline silicon (polysilicon) or silicon nitride. In some embodiments, the first storage layer 208 can be a nitride layer formed by using a deposition process.

The first barrier layer 209 can be formed on the surface of the first storage layer 208. The first barrier layer 209 can be used for blocking the outflow of the electronic charges stored in the first storage layer 208. In some embodiments, the first barrier layer 209 can be a silicon oxide layer or a combination of silicon oxide/silicon nitride/silicon oxide (ONO) layers. In some embodiments, the first barrier layer 209 includes high dielectric constant (high-k) dielectrics (e.g., aluminum oxide). In one example, the first barrier layer 209 is an oxide layer formed by using a deposition process.

Figure 27:
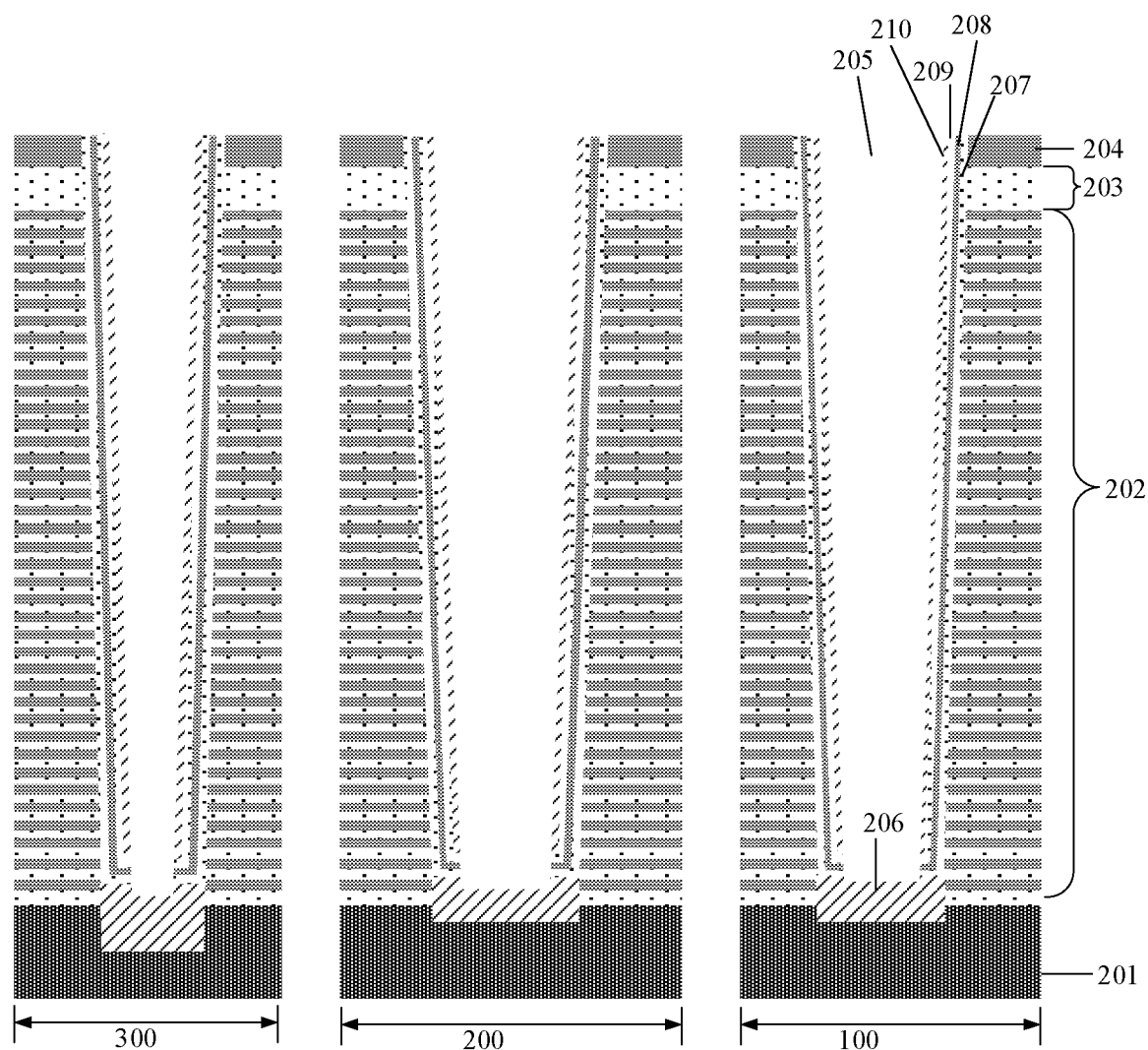

As shown in FIG. 27, a first passivation layer 210 can be formed on the surface of the first barrier layer 209. The first passivation layer 210 can be used for protecting the first barrier layer 209 from being damaged in a subsequent removal process. In some embodiments, the first passivation layer 210 can be an amorphous silicon layer formed by using a deposition process.

The portions of the first passivation layer 210, the first barrier layer 209, the first storage layer 208 and the first tunneling layer 207 located on the surfaces of the plurality of first channel structures 206 on the bottom of the plurality of first through holes 205 can be removed. In some embodiments, the removal process can include an etching process and a cleaning process. As such, the first functional layer can be formed on the sidewalls of the plurality of first through holes 205.

In some embodiment, in the same removal process, the first barrier layer 209, the first storage layer 208, the first tunneling layer 207, and the oxide layer of the first mask layer 204 located on the surface of the nitride layer of first mask layer 204 can also be removed. As such, the nitride layer of first mask layer 204 is remained on the surface of the first insulating connection layer 203.

At S205, a second channel structure and a first filling structure can be sequentially formed on the sidewall of the first functional layer and the exposed surface of the first channel structure 206 in each of the plurality of first through holes 205. The surfaces of the second channel structure and the first filling structure can be lower than the surface of the first insulating connection layer 203.

Figure 28:
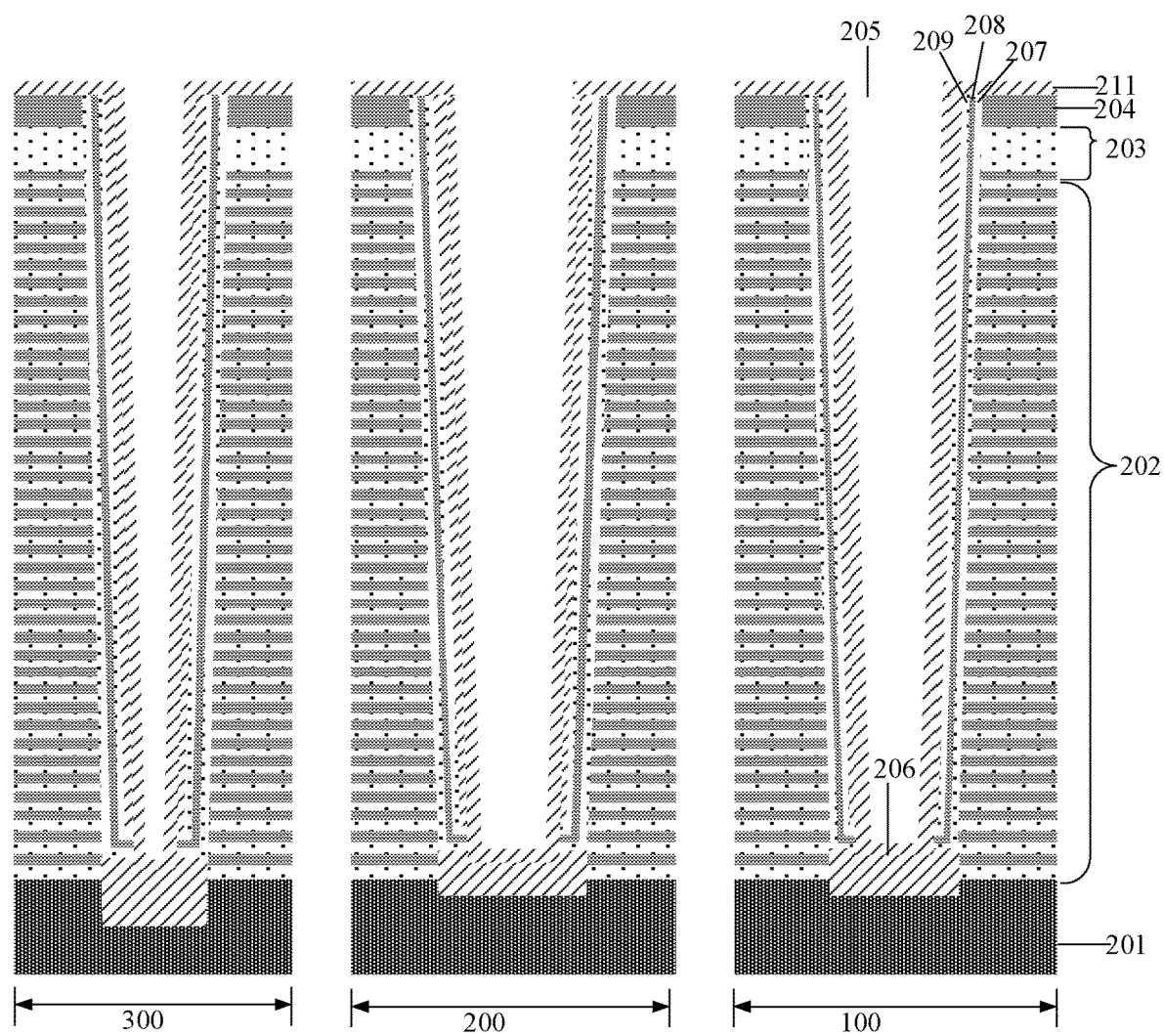

As shown in FIG. 28, a second channel layer 211 can be formed to cover the sidewalls of the first passivation layer 210 and the bottom of each of the plurality of first through holes 205. The second channel layer 211 can also cover the surface of the first insulating connection layer 203, or cover the surface of the nitride layer of the first mask layer 204. In some embodiments, the second channel layer 211 can be an amorphous silicon layer formed by using a deposition process.

Figure 29:
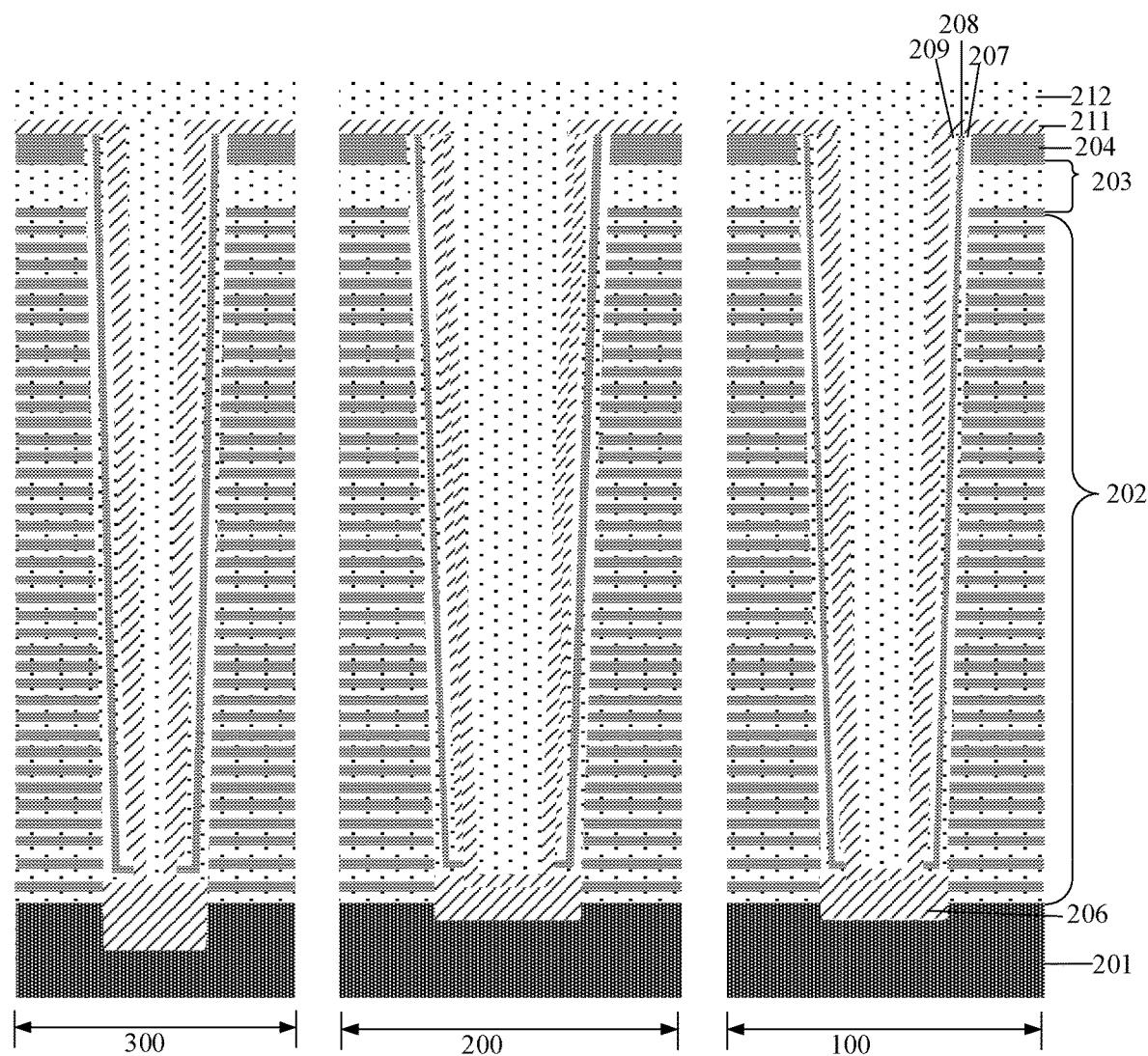

As shown in FIG. 29, a first filling layer 212 can be formed to cover the second channel layer 211 and fill each of the plurality of first through holes 205. In some embodiments, the first filling layer 212 can be an oxide layer formed by using a deposition process.

Figure 30A:
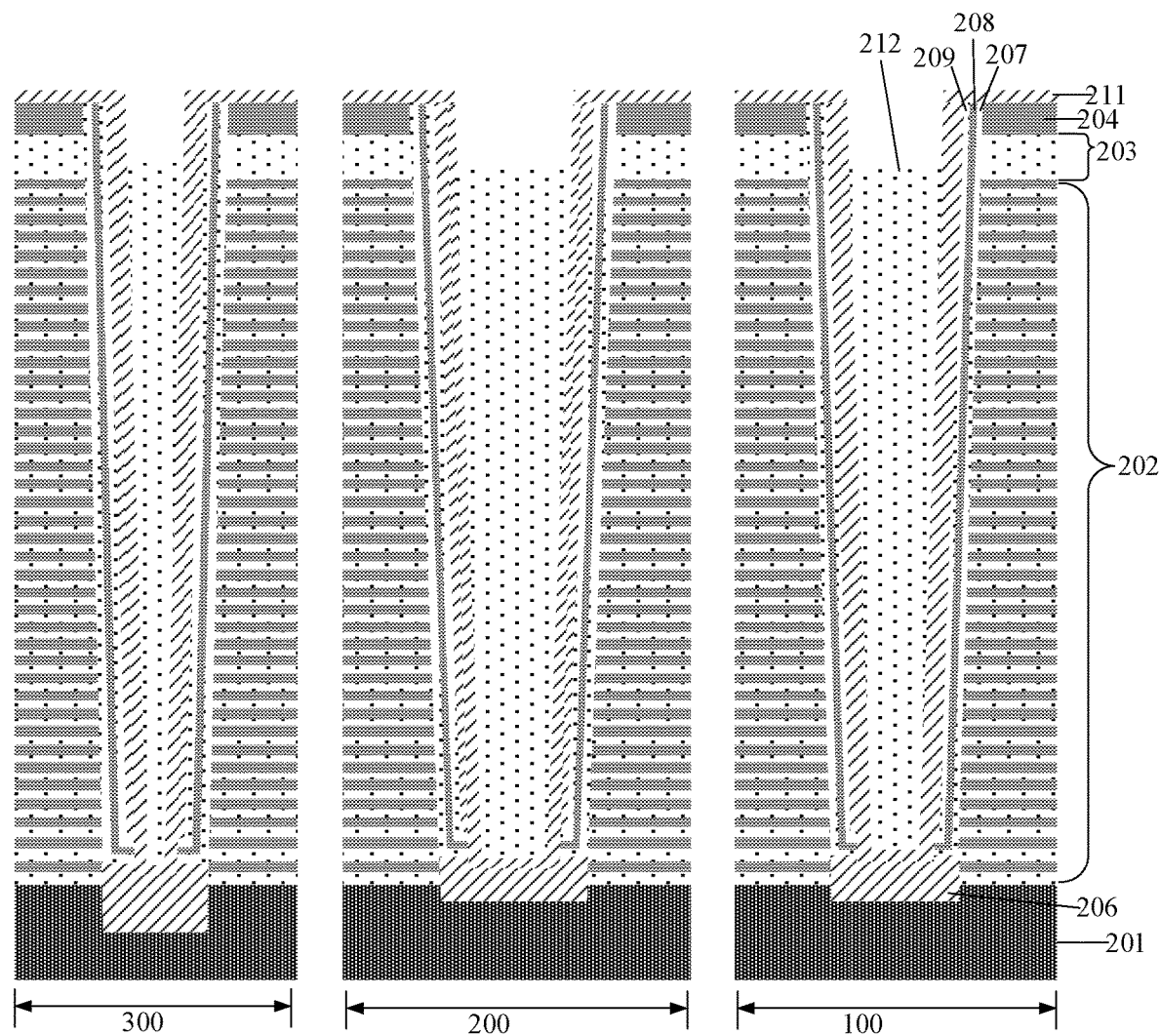
Figure 30B:
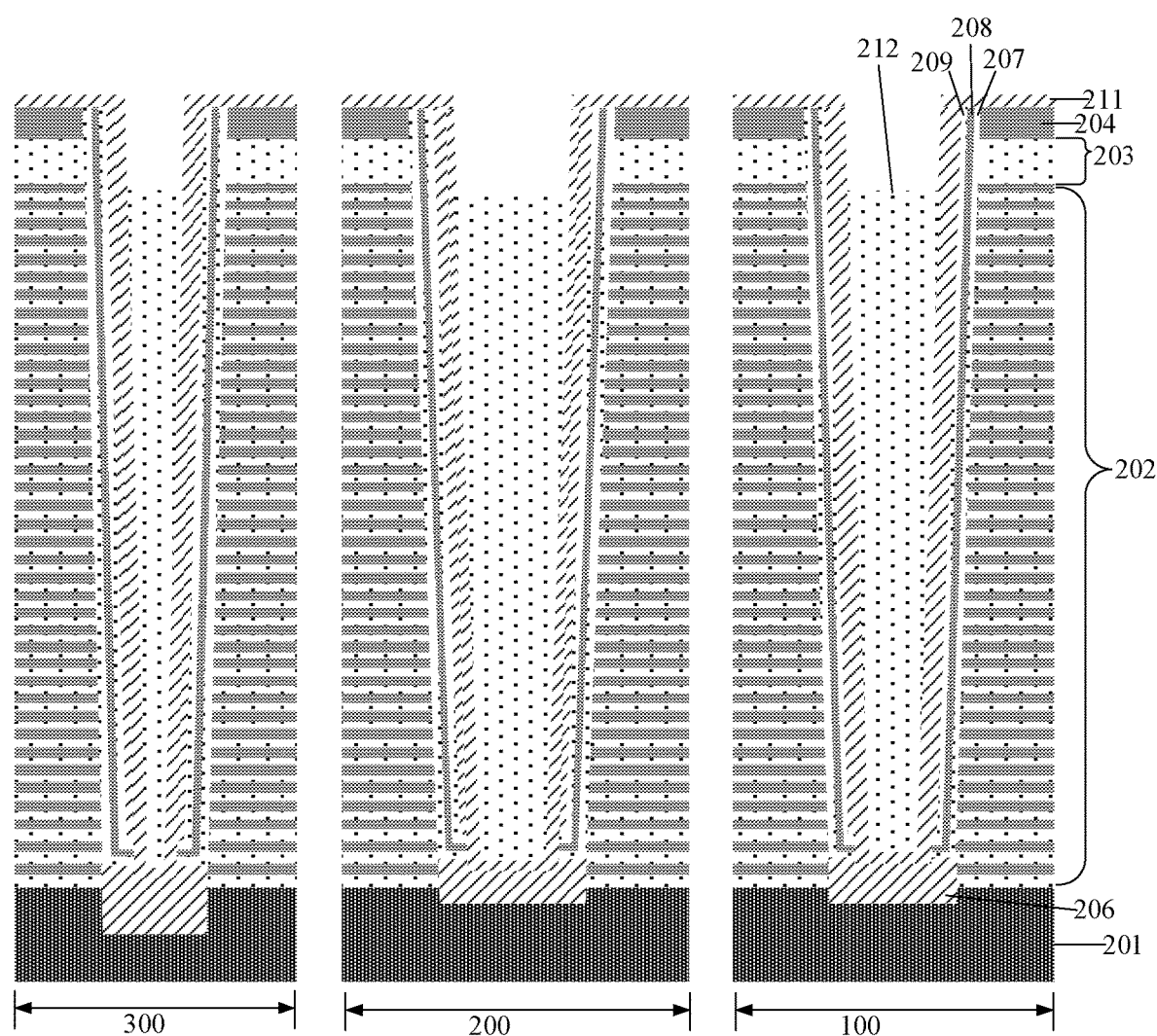

As shown in FIGS. 30A and 30B, a portion of the first filling layer 212 can be removed, such that the top surface of the first filling layer 212 can be lower than the top surface of the first insulating connection layer 203. As such, the remaining portion of the first filling layer 212 in each of the plurality of first through holes 205 can form the first filling structure. In some embodiments, the portion of the first filling layer 212 can be removed by using an etching process, such as a wet etching, a dry etching, or a combination thereof.

In some embodiments, as shown in FIG. 30A, the top surface of the first filling layer 212 can be higher than the top surface of the second stacker layer 202. For example, the top surface of the first filling layer 212 can be 20 nm to 40 nm higher than the top surface of the top nitride layer of the second stacker layer 202. Preferably, the top surface of the first filling layer 212 can be about 30 nm higher than the top surface of the top nitride layer of the second stacker layer 202.

In some alternative embodiments, as shown in FIG. 30B, the top surface of the first filling layer 212 can be lower than the top surface of the second stacker layer 202. For example, the top surface of the first filling layer 212 can be 30 nm to 40 nm lower than the top surface of the top nitride layer of the second stacker layer 202. Preferably, the top surface of the first filling layer 212 can be about 35 nm lower than the top surface of the top nitride layer of the second stacker layer 202.

Figure 31A:
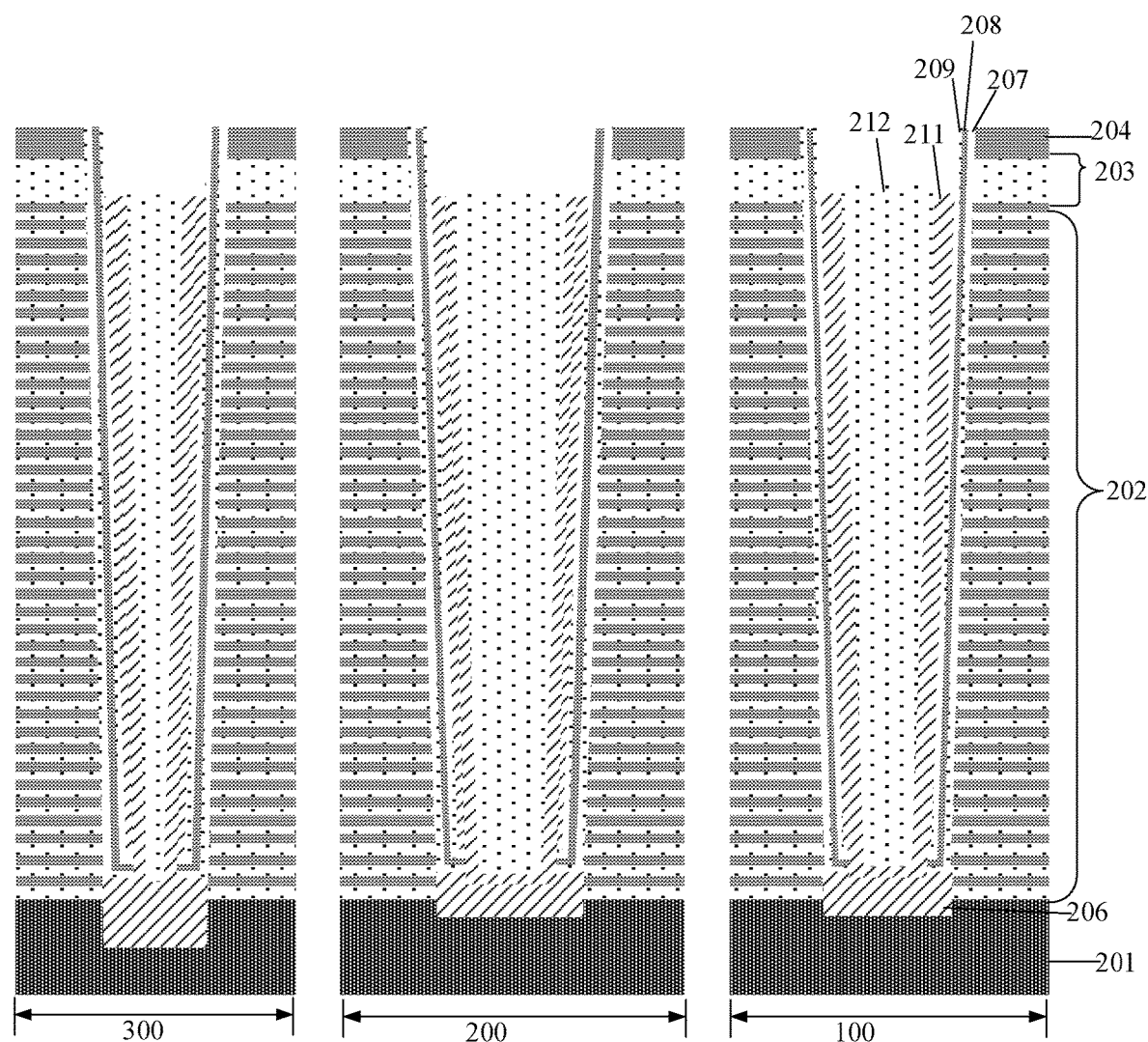
Figure 31B:
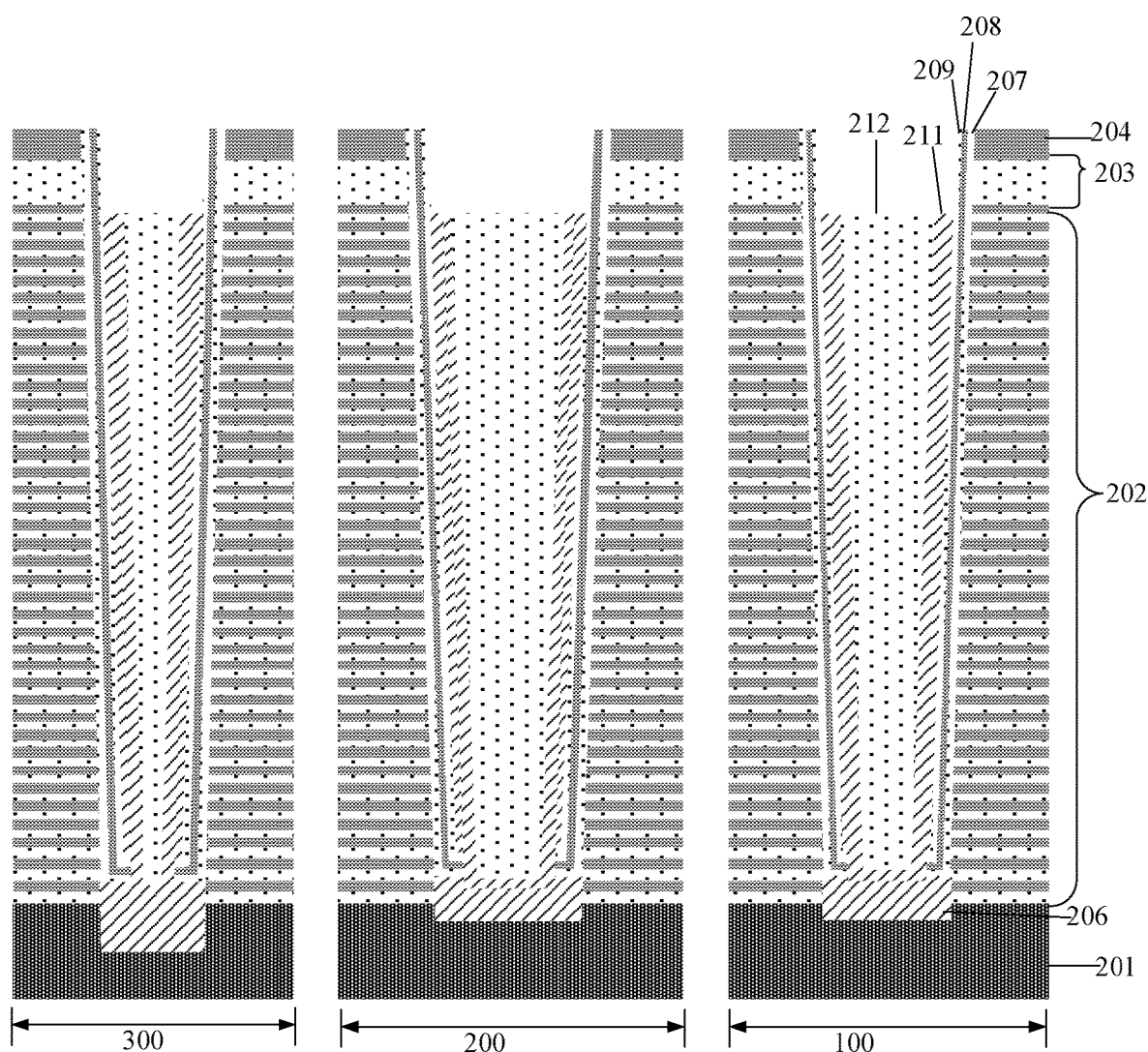

As shown in FIGS. 31A and 31B, a portion of the second channel layer 211 can be removed, such that the surface of the second channel layer 211 is lower than the first insulating connection layer 203. The remaining portion of the second channel layer 211 can form the second channel structure that is in contact with the first channel structure 206. In some embodiments, the portion of the second channel layer 211 can be removed by using an etching process.

It is noted that, in various embodiments, the top surface of the second channel structure can be higher than the top surface of the first stacked layer 202 or lower than the top surface of the first stacked layer 202. However, the top surface of the second channel structure is not lower than the top surface of the top oxide layer in the first stacked layer 202. In some embodiments, the top surface of the second channel structure can be higher than the top nitride layer in the first stacked layer 202, as shown in FIG. 31A. In some alternative embodiments, the top surface of the second channel structure is in a same plane of the top surface of the top oxide layer in the first stacked layer 202, as shown in FIG. 31B.

At S206, a first groove can be formed in the first insulating connection layer 203 above each of the plurality of first through holes 205. In some embodiments, the projection of the first groove on the substrate 201 can completely cover the projection of the corresponding first through hole 205 on the substrate 201.

Figure 32A:
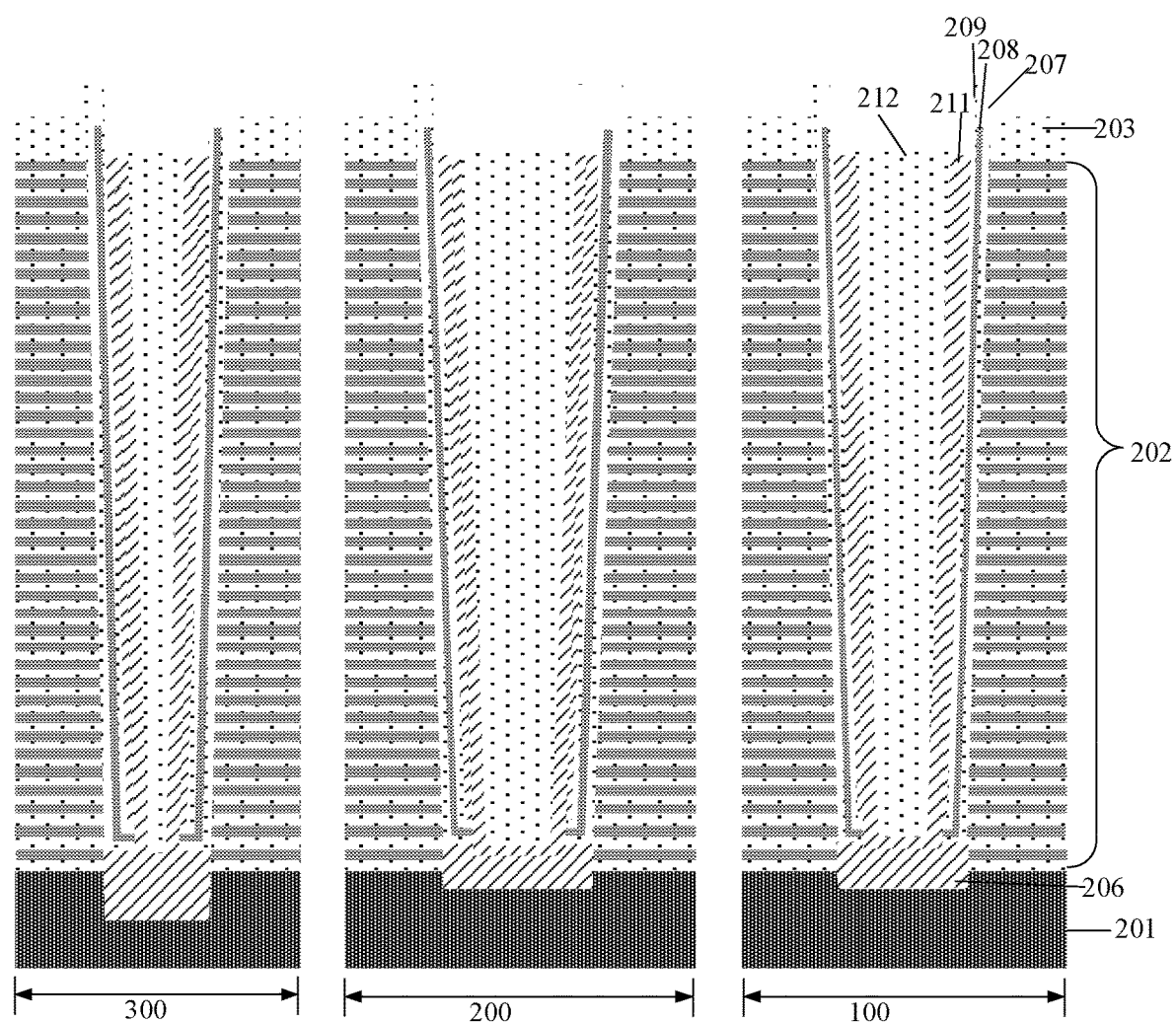
Figure 32B:
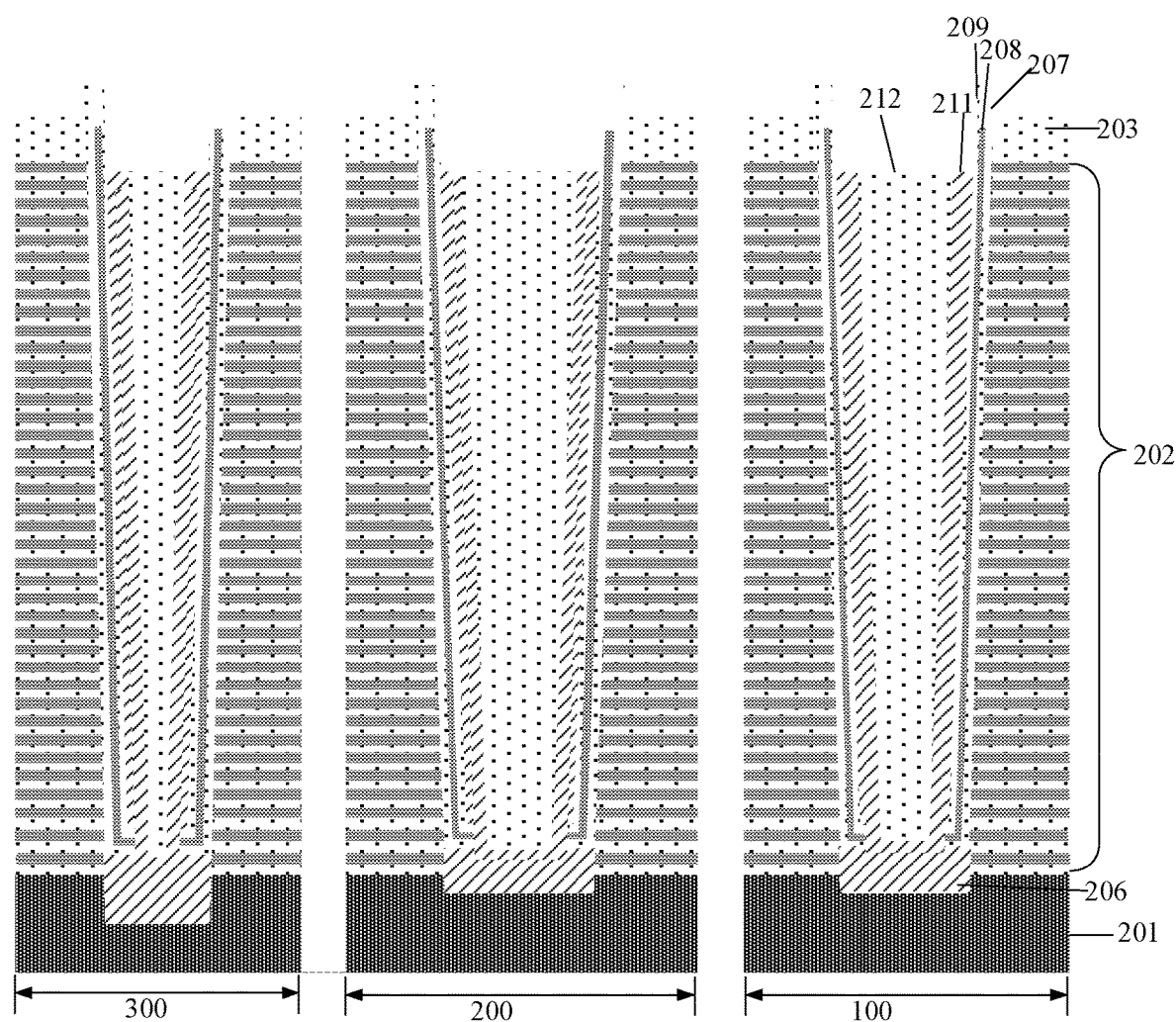

As shown in FIGS. 32A and 32B, the nitride layer of the first mask layer 204 can be removed. In some embodiments, the nitride layer of the first mask layer 204 can be removed by using an etching process.

Figure 33A:
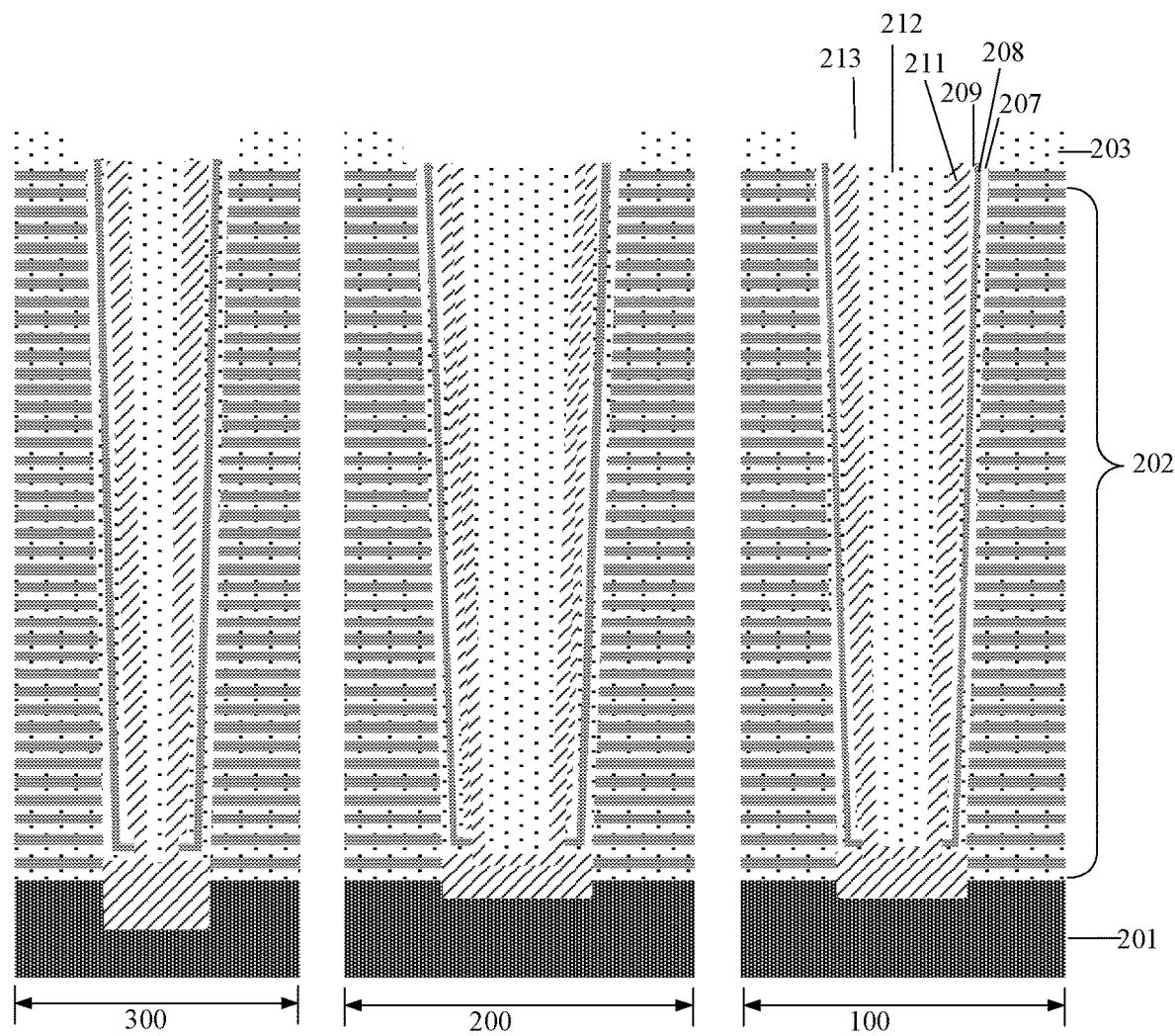
Figure 33B:
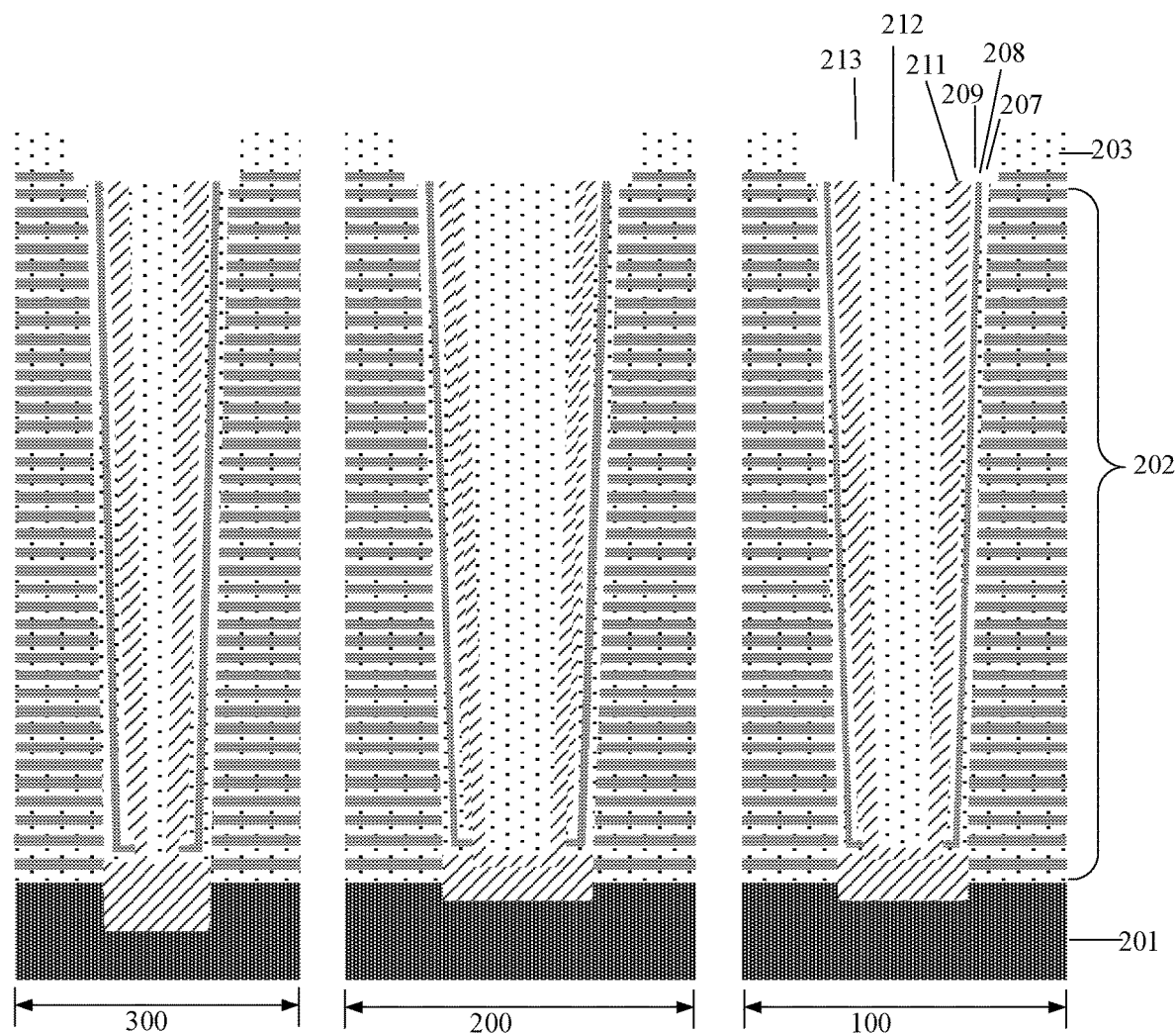

As shown in FIGS. 33A and 33B, the surface of the first insulating connection layer 203 can be planarized by any suitable techniques, such as backside grinding, and/or chemical mechanical polishing (CMP). A portion of the first insulating connection layer 203 can be removed to form a plurality of first grooves that penetrate the first insulating connection layer 203. An area of the projection of each of the plurality of first grooves on the substrate 201 can be larger than an area of the projection of each of the plurality of first through holes 205 on the substrate 201.

In some embodiments, a depth of the first groove can be equal to or less than the thickness of the planarized first insulating connection layer 203, as shown in FIG. 33A. For example, the depth of the first groove can be in a range between 50 nm and 70 nm. In one embodiment, the thickness of the planarized first insulating connection layer 203 is about 90 nm, while the depth of the first groove is about 60 nm.

In some alternative embodiments, the depth of the first groove can be greater than the thickness of the planarized first insulating connection layer 203, as shown in FIG. 33B. That is, a portion of the top nitride layer in the first stacked layer 202 can also be removed to form the first groove. For example, the depth of the first groove can be in a range between 50 nm and 70 nm. In one embodiment, the thickness of the planarized first insulating connection layer 203 is about 30 nm, while the depth of the first groove is about 60 nm.

Figure 34A:
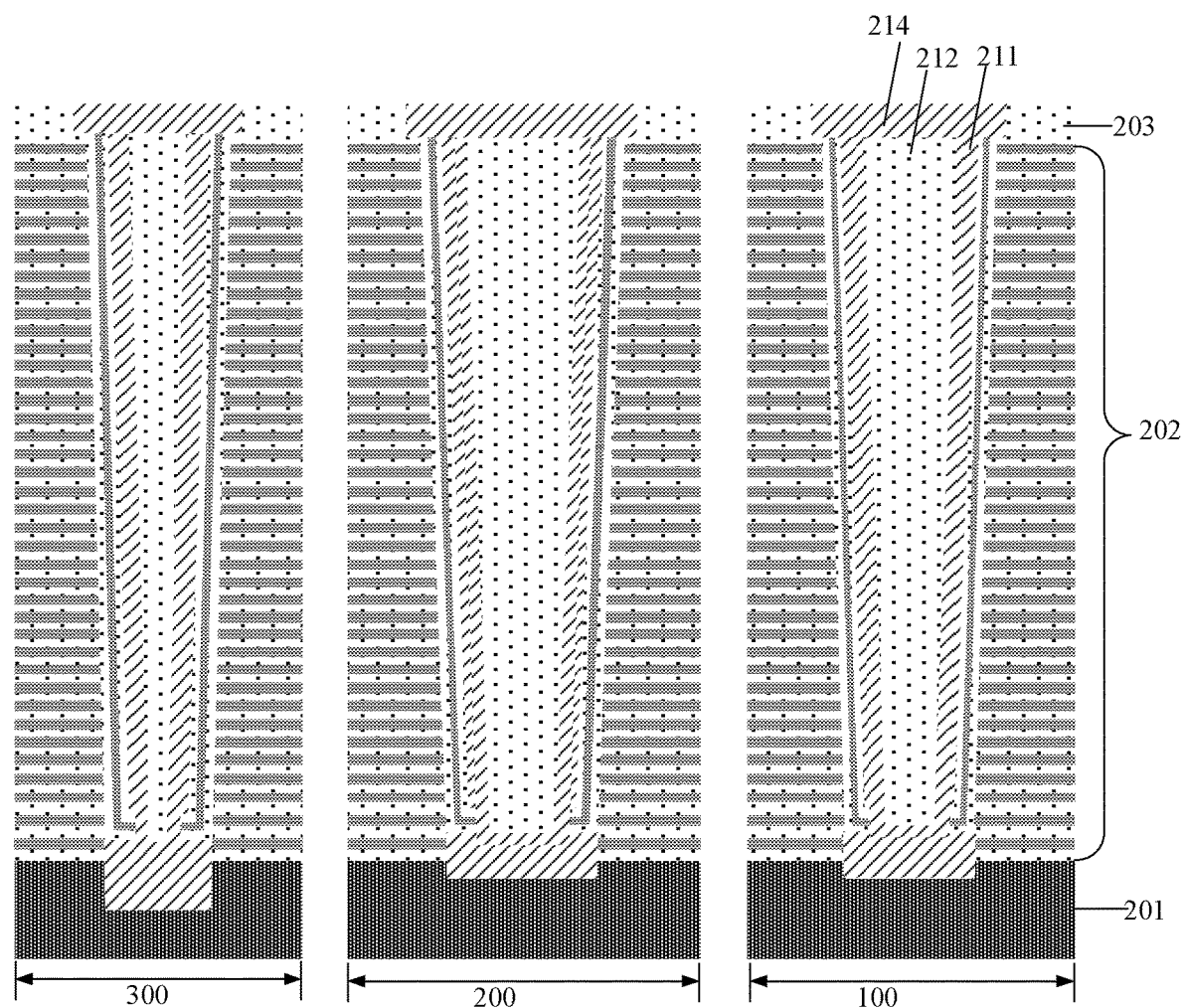
Figure 34B:
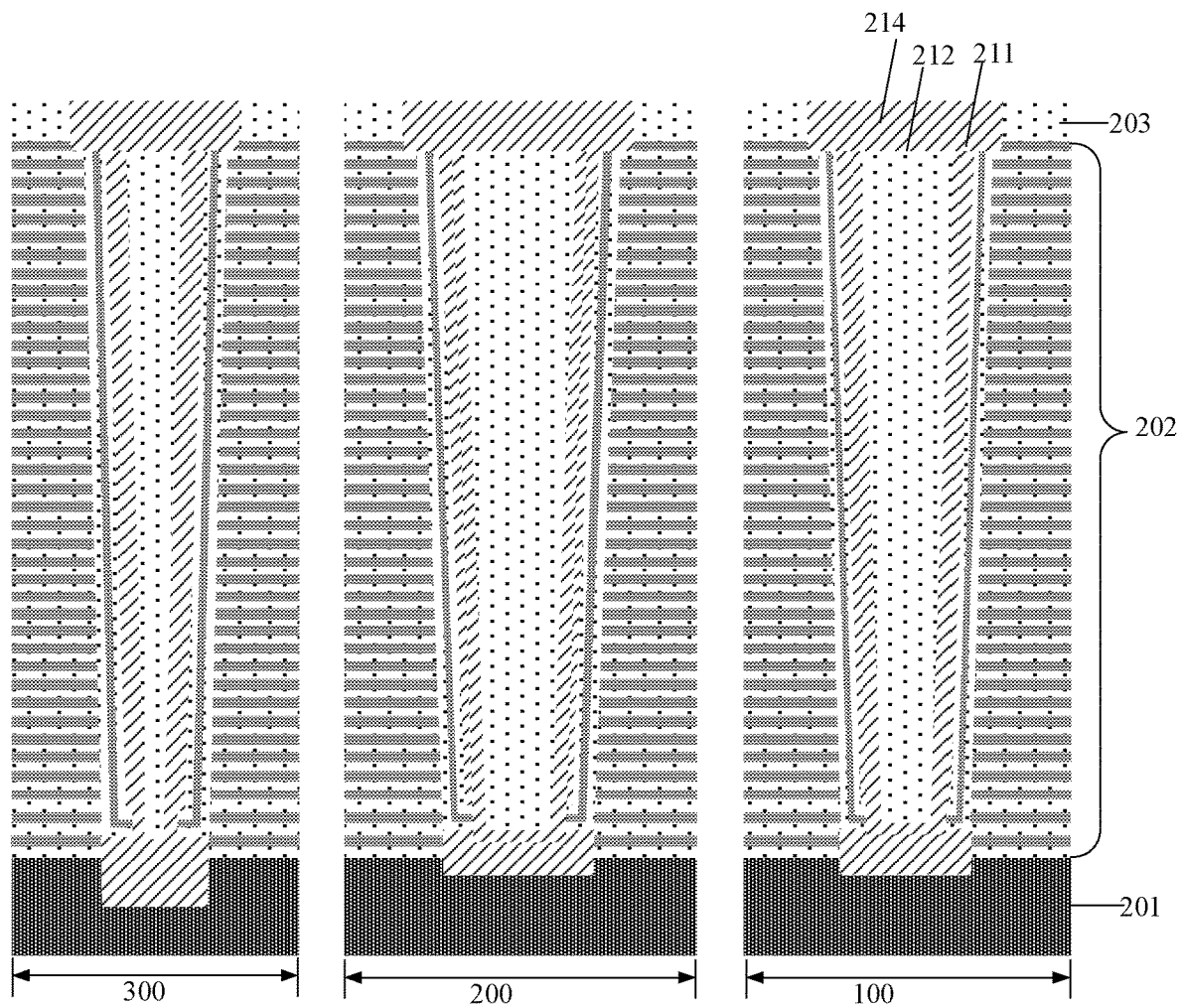

At S207, a third channel structure 214 can be formed in each of the plurality of first grooves 213. As shown in FIGS. 34A and 34B, the third channel structure 214 can be in contact with the second channel structure in each of the plurality of first through holes 205. In some embodiments, the third channel structure can be a polycrystalline silicon player formed by using a deposition process.

A thickness of each third channel structure 214 can be equal to the depth of each first groove 213. As described above, in some embodiments, a thickness of each third channel structure 214 can be equal to or less than the thickness of the planarized first insulating connection layer 203, as shown in FIG. 34A. For example, the thickness of each third channel structure 214 can be in a range between 50 nm and 70 nm, preferably about 60 nm. In some alternative embodiments, the thickness of each third channel structure 214 can be greater than the thickness of the planarized first insulating connection layer 203, as shown in FIG. 34B. For example, the thickness of each third channel structure 214 can be in a range between 60 nm and 80 nm, preferably about 70 nm.

Figure 35:
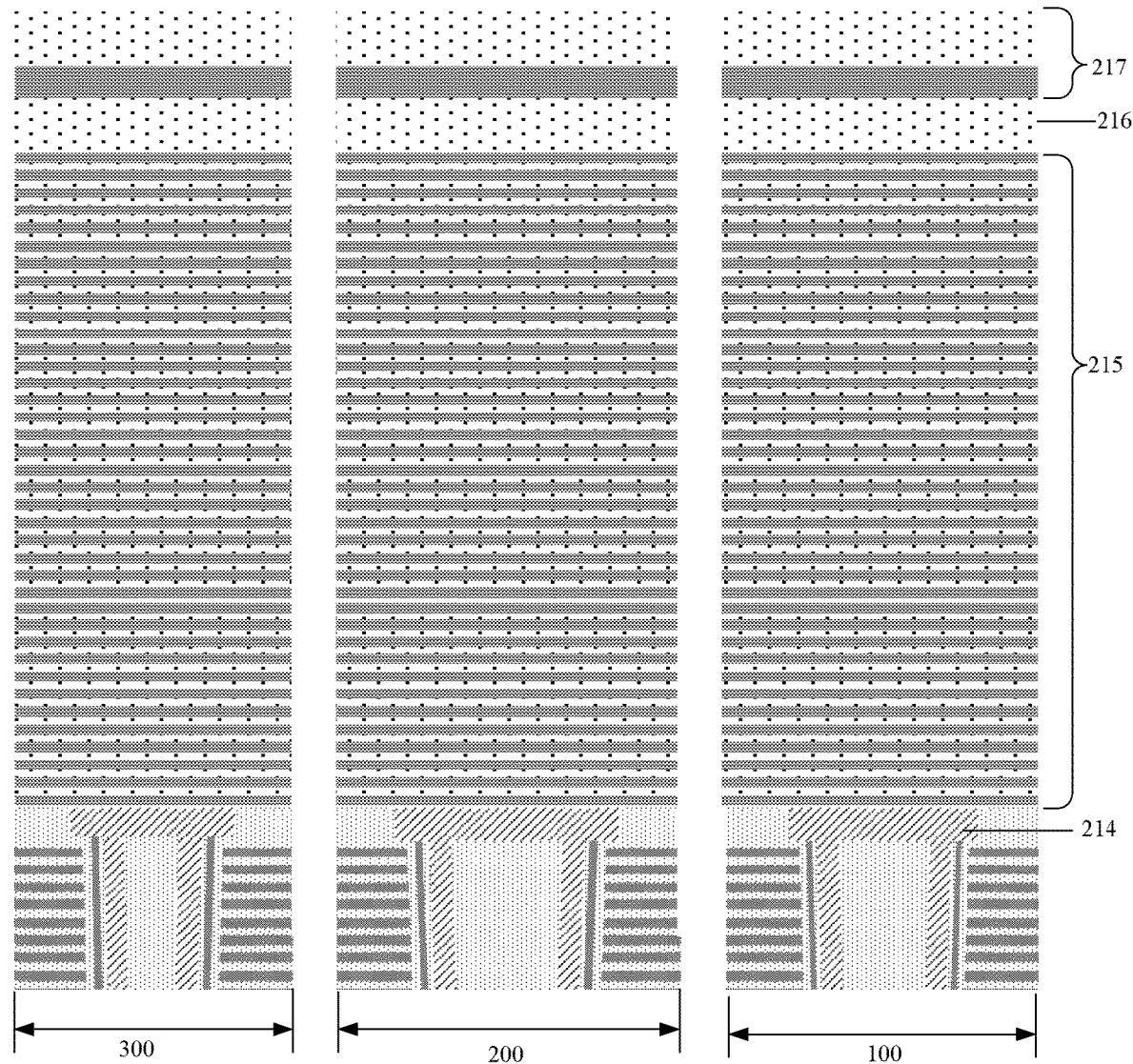

Referring to FIG. 50B, at S208, a second stacked layer 215 and a second insulating connection layer 216 can be sequentially formed on the plurality of third channel structures 214. As shown in FIG. 35, the second stacked layer 215 can include a plurality of oxide/nitride layer pairs, such as silicon oxide layers and silicon nitride layers. Similar to the first stacked layer 202 as described above, the multiple oxide layers (shown in the areas with dotes) and multiple nitride layers (shown in the areas with meshes) in the second stacked layer 215 alternate in a vertical direction. The second stacked layer 215 can include any suitable number of layers of the oxide layers and the nitride layers. In some embodiments, a total number of layers of the oxide layers and the nitride layers in the second stacked layer 215 is equal to or larger than 64.

In some embodiments, the second insulating connection layer 216 can be made by any suitable insulating material and/or dielectric material, such as silicon oxide. It is noted that, the material of the second insulating connection layer 216 can be different from the material of the nitride layer in the second stacked layer 215.

Further, in some embodiments, a second mask layer 217 can be formed on the surface of the second insulating connection layer 216. The second mask layer 217 can include a nitride layer on the surface of the second insulating connection layer 216, and an oxide layer on the surface of such nitride layer.

Figure 36:
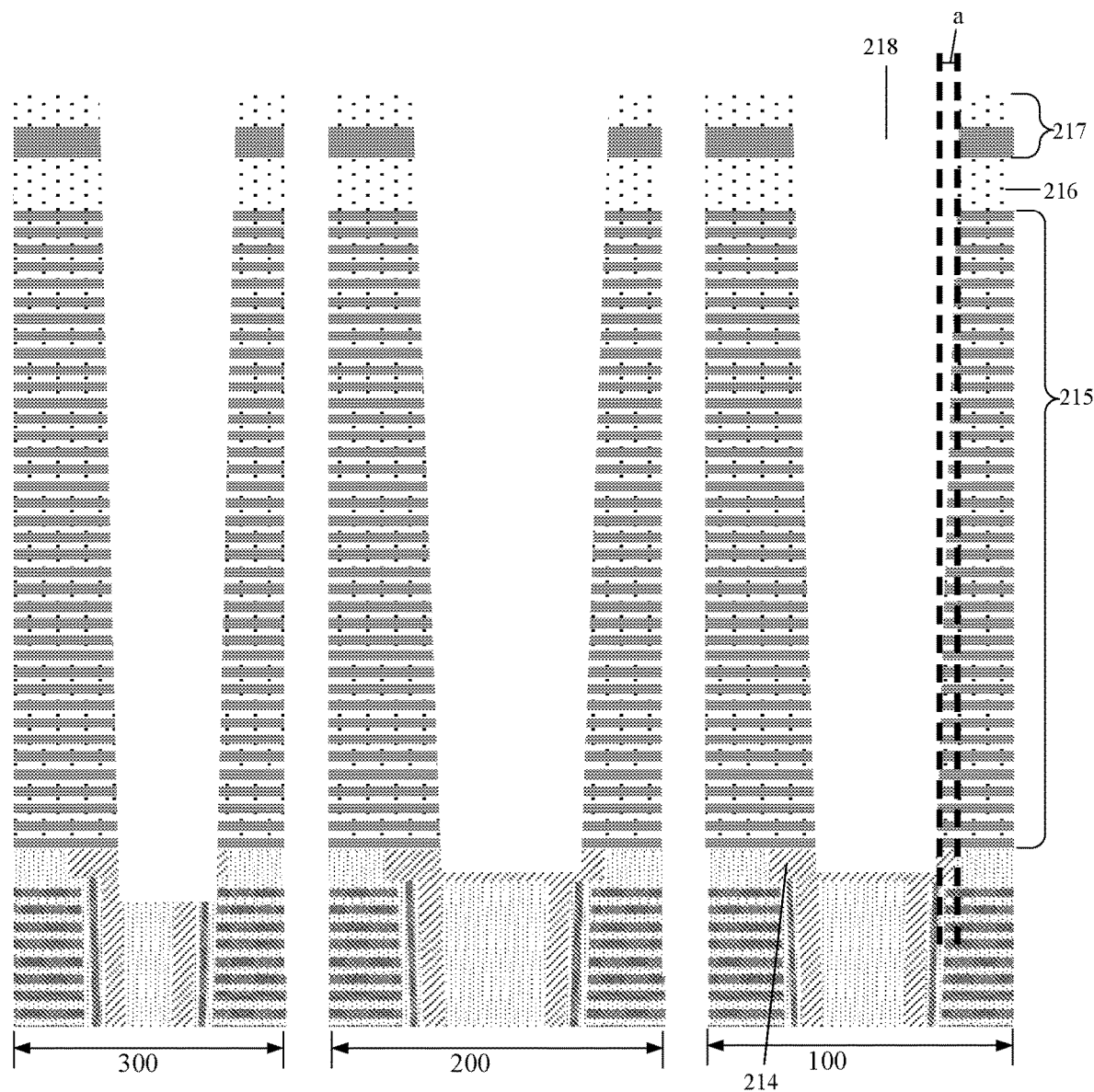

At S209, one or more second through holes 218 are formed in each of the first region 100, the second region 200, and the third region 300. As shown in FIG. 36, each of the plurality of second through holes 218 can completely penetrate the second stacked layer 215, the second insulating connection layer 216, and the second mask layer 217, and can extend into the surface of the corresponding third channel structure 214. The projection of each second through hole 218 on the substrate 201 can at least partially overlap with the projection of the corresponding first through hole 205 on the substrate 201.

In some embodiments, the second stacked layer 215, the second insulating connection layer 216, the second mask layer 217, and the third channel structures 214 can be etched to form the plurality of second through holes 218 that penetrate the second stacked layer 215 and the second insulating connection layer 216. The second stacked layer 215, the second insulating connection layer 216, the second mask layer 217, and/or the third channel structure 214 can be etched by using a dry etching process, a wet etching process, or a combination thereof. A cleaning process can then be performed to clean the plurality of second through holes 218.

It is noted that, each second through hole 218 can extend to the surface of the corresponding third channel structure 214, or can extend into the corresponding third channel structure 214. As such, a fourth channel structure formed subsequently in each second through hole 218 can directly contact the corresponding third channel structure. It is also noted that, the one or more second through holes 218 in the third region 300 can also completely penetrate the corresponding third channel structures 214, as shown in FIG. 36. However, the one or more third channel structures 214 in the first region 100 are not completely penetrated by the one or more second through holes 218.

In some embodiments, a maximum difference between the radius of the top aperture of each second through hole 218 and the radius of the bottom aperture of the second through hole 218 can be 15 nm. That is, as shown in FIG. 36, a distance "a" between the boundary line of the top surface of each second through hole 218 and the boundary of the bottom surface of the second through hole 218 can be no more than 15 nm.

At S2010, a second functional layer can be formed on the sidewall of each second through hole 218. In some embodiments, the second functional layer can include a second tunneling layer 219, a second storage layer 220, a second barrier layer 221, and a second passivation layer 222.

Figure 37:
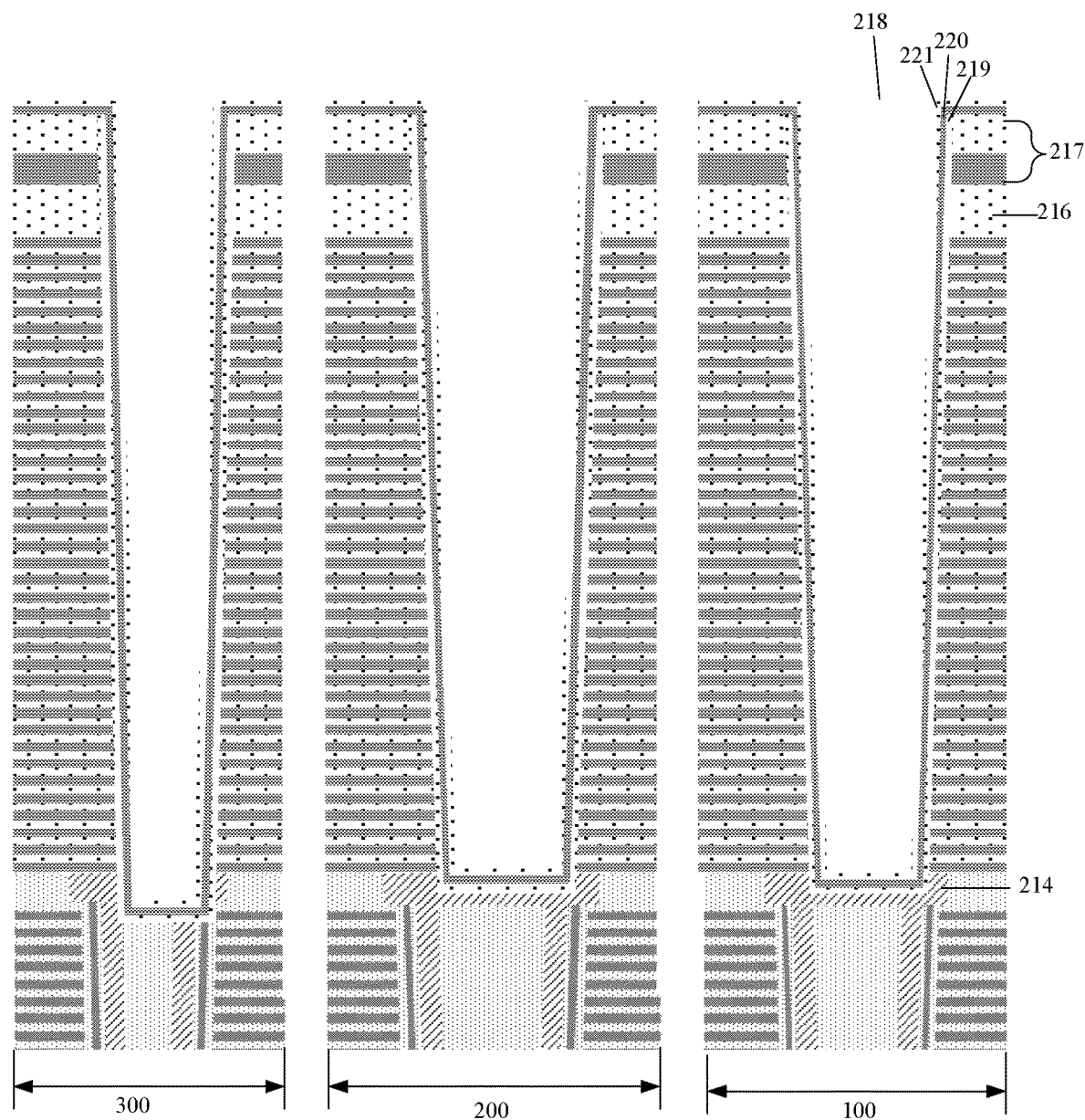

As shown in FIG. 37, the second tunneling layer 219 can be formed on the sidewall of each second through hole 218 and the surface of the corresponding third channel structure 214. The second tunneling layer 219 can be used for generating electronic charges. In some embodiments, the second tunneling layer 219 can be an oxide layer formed by using a deposition process.

The second storage layer 220 can be formed on the surface of the second tunneling layer 219. The second storage layer 220 can be used for storing electronic charges. In some embodiments, the second storage layer 220 can be a nitride layer formed by using a deposition process.

The second barrier layer 221 can be formed on the surface of the second storage layer 220. The second barrier layer 221 can be used for blocking the outflow of the electronic charges in the second storage layer 220. In some embodiments, the second barrier layer 221 can be an oxide layer formed by using a deposition process.

Figure 38:
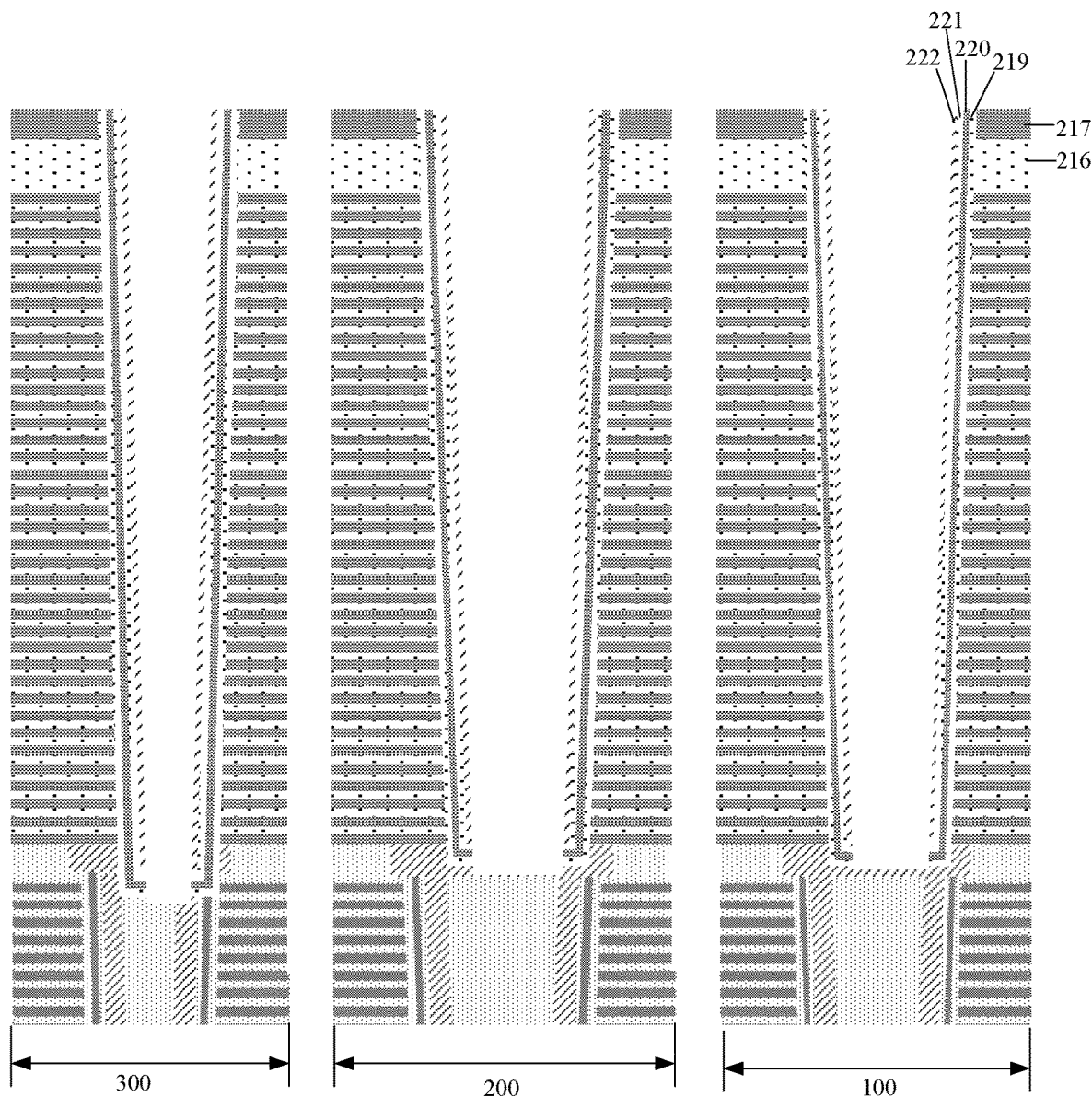

As shown in FIG. 38, a second passivation layer 222 can be formed on the surface of the second barrier layer 221. The second passivation layer 222 can be used for protecting the second barrier layer 221 from being damaged in a subsequent removal process. In some embodiments, the second passivation layer 222 can be an amorphous silicon layer formed by using a deposition process.

As shown in FIG. 38, the portions of the second passivation layer 222, the second barrier layer 221, the second storage layer 220 and the second tunneling layer 219 that are located on the surface of each third channel structure 214 can be removed. In some embodiments, the removal process can include an etching process and a cleaning process. In some embodiments, the portions of the second passivation layer 222, the second barrier layer 221, the second storage layer 220, the second tunneling layer 219, the oxide layer of the second mask layer 217 that are located on the nitride layer of the second mask layer 217 can also be removed by using an etching process. As such, the second functional layer can be formed on the sidewall of each second through hole 218.

At S2011, a fourth channel structure can be formed on the sidewall of the second functional layer and the exposed surface of the third channel structure in each second through hole 218 in the first region 100. Further, a second filling structure can be formed in each of the plurality of second through holes 218 in the first region 100, the second region 200, and the third region 300. In some embodiments, the top surface of the fourth channel structure can be higher than the top surface of the second filling structure.

Figure 39:
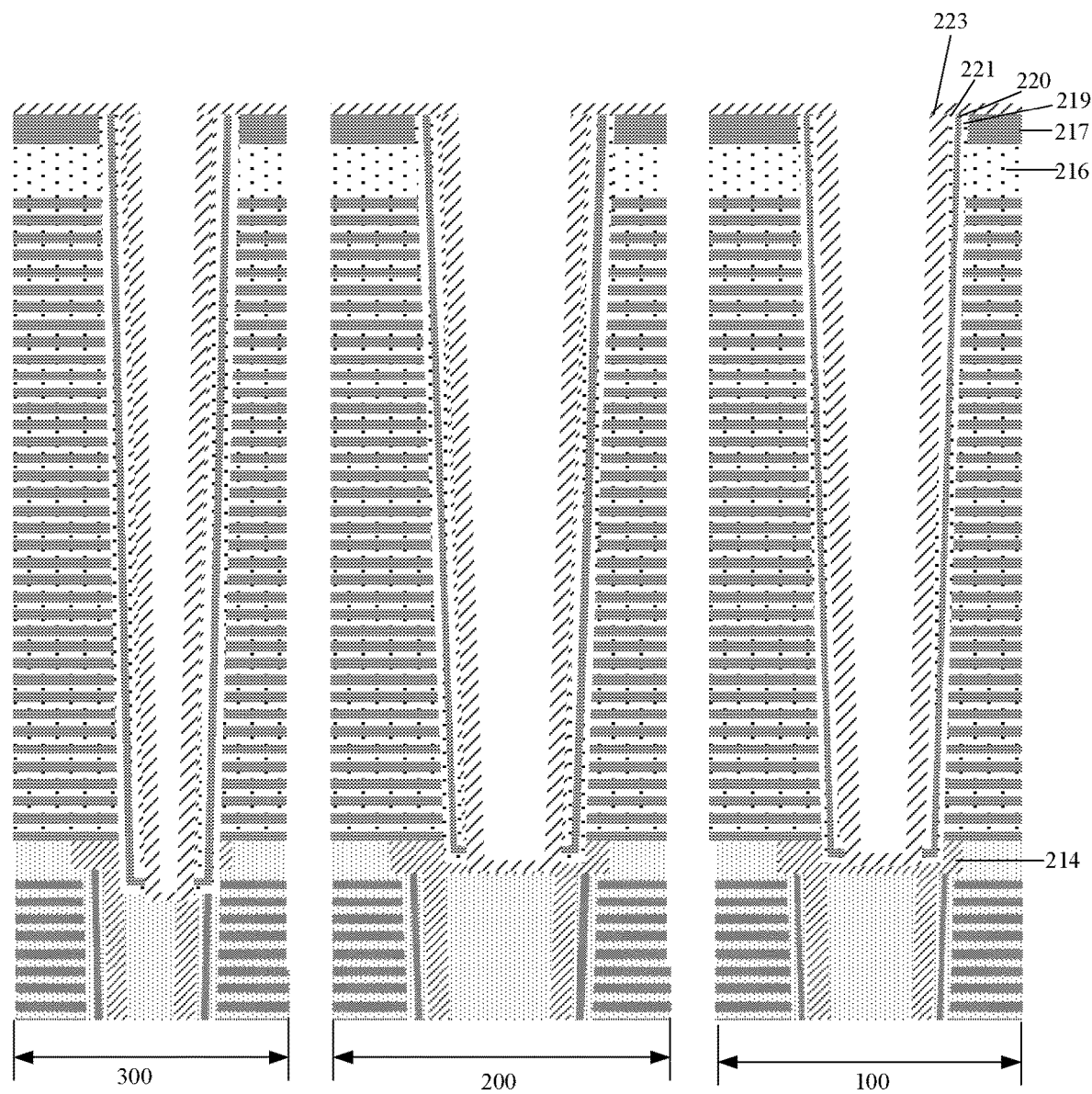

As shown in FIG. 39, a fourth channel layer 223 can be formed to cover the sidewall of the second passivation layer 222 and the bottom surface of each of the plurality of second through holes 218 in the first region 100, the second region 200, and the third region 300. In some embodiments, the fourth channel layer 223 can also cover the top surface of the second insulating connection layer 216, or the top surface of the nitride layer of the second mask layer 217. In some embodiments, the fourth channel layer 223 can be an amorphous silicon layer formed by using a deposition process.

Figure 40:
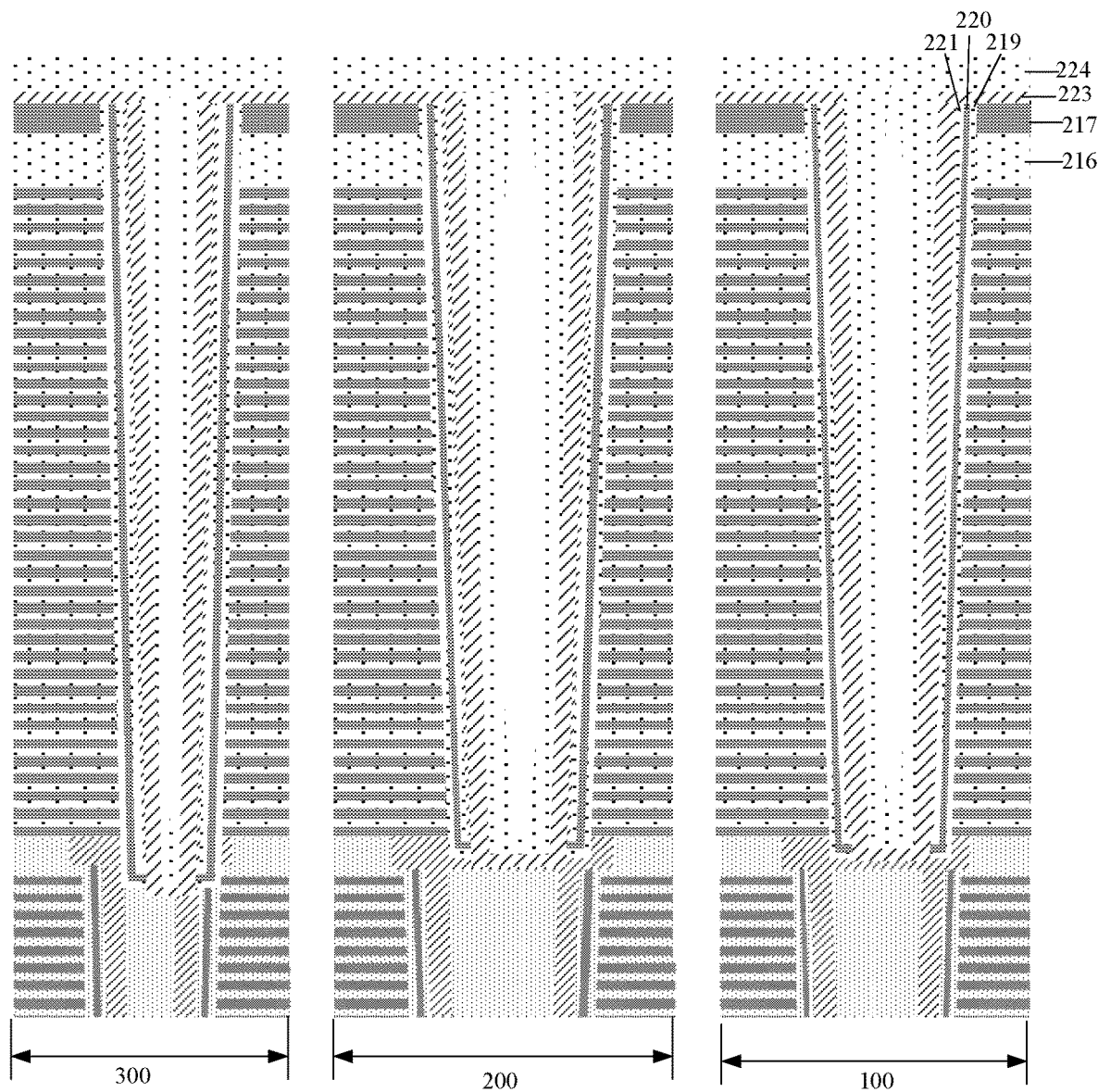

As shown in FIG. 40, a third filling layer 224 can be formed to cover the fourth channel layer 223. In some embodiments, the third filling layer 224 can include one or more airgaps in each second through hole 218. In some embodiments, the third filling layer 224 can be an oxide layer formed by using a deposition process.

Figure 41:
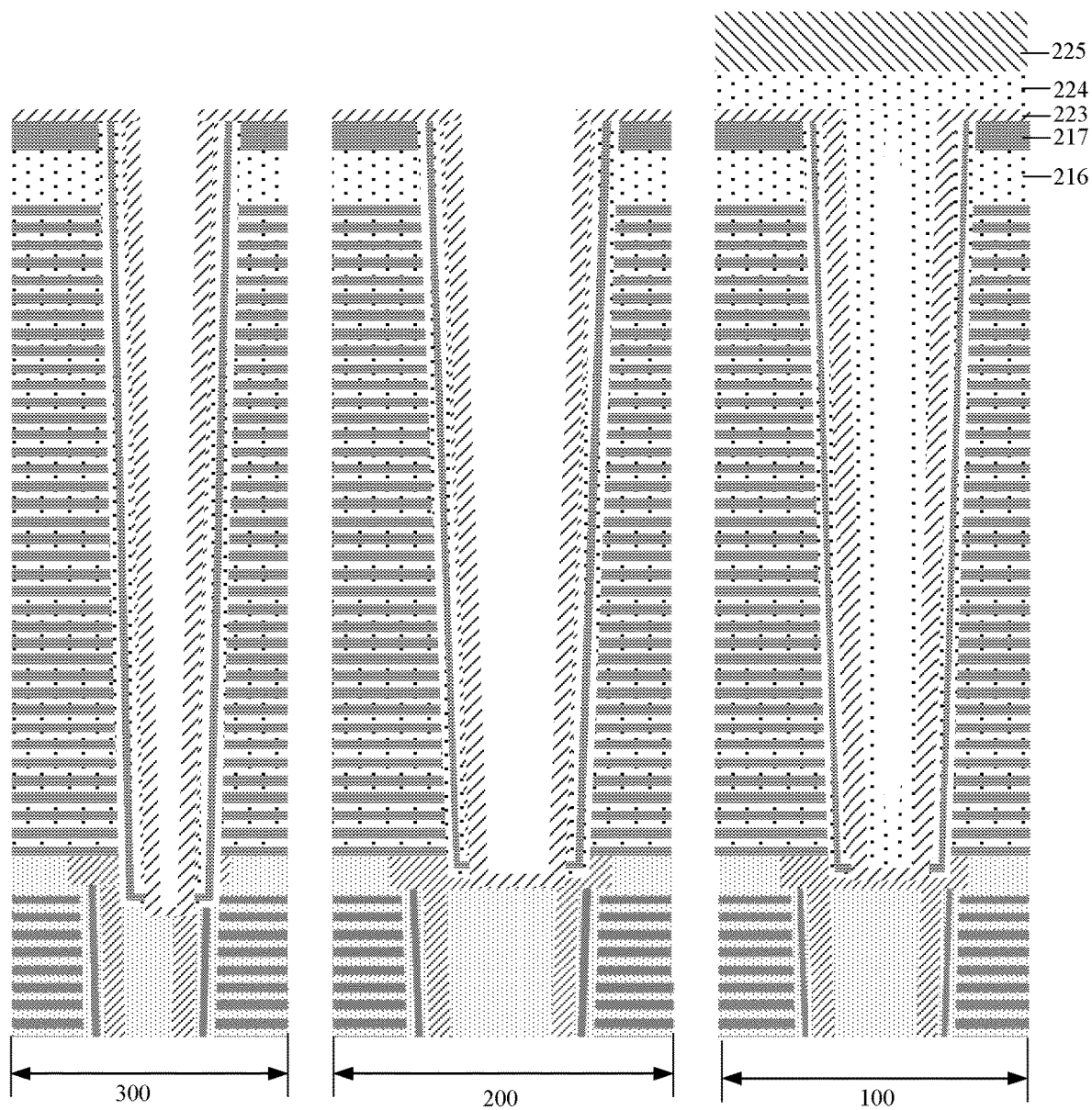

As shown in FIG. 41, a third mask layer 25 can be formed on the top surface of the third filling layer 224 in the first region 100. Using the third mask layer 225 as a mask, the portions of the third filling layer 224 located in the second region 200 and the third region 300 can be removed by using an etching process.

Figure 42:
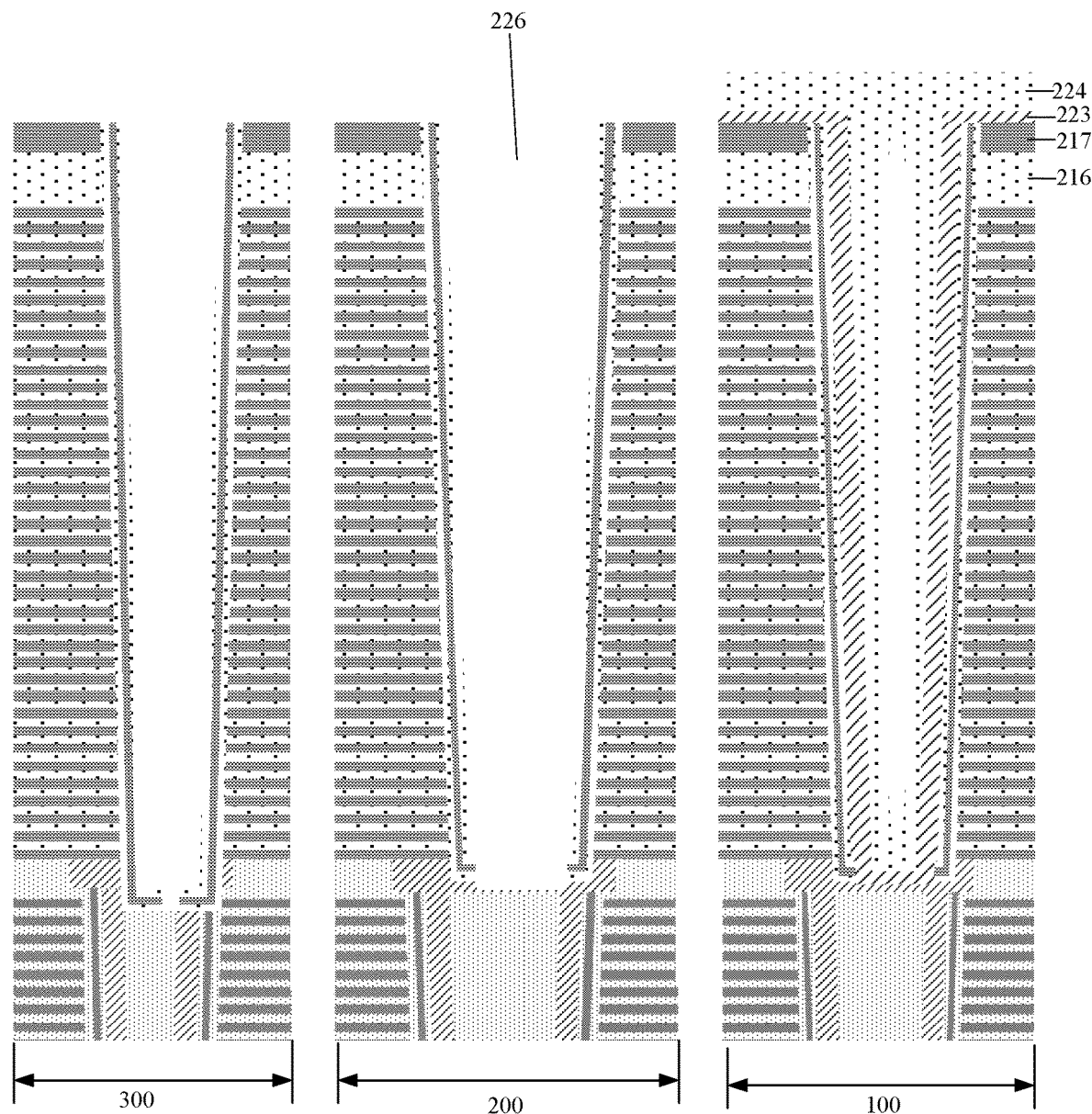

As shown in FIG. 42, the third mask layer 225 can be removed. Using the remaining third filling layer 224 in the first region 100 as a mask, the fourth channel layer 223 located in the second region 200 and the third region 300 can be removed by using an etching process.

Figure 43:
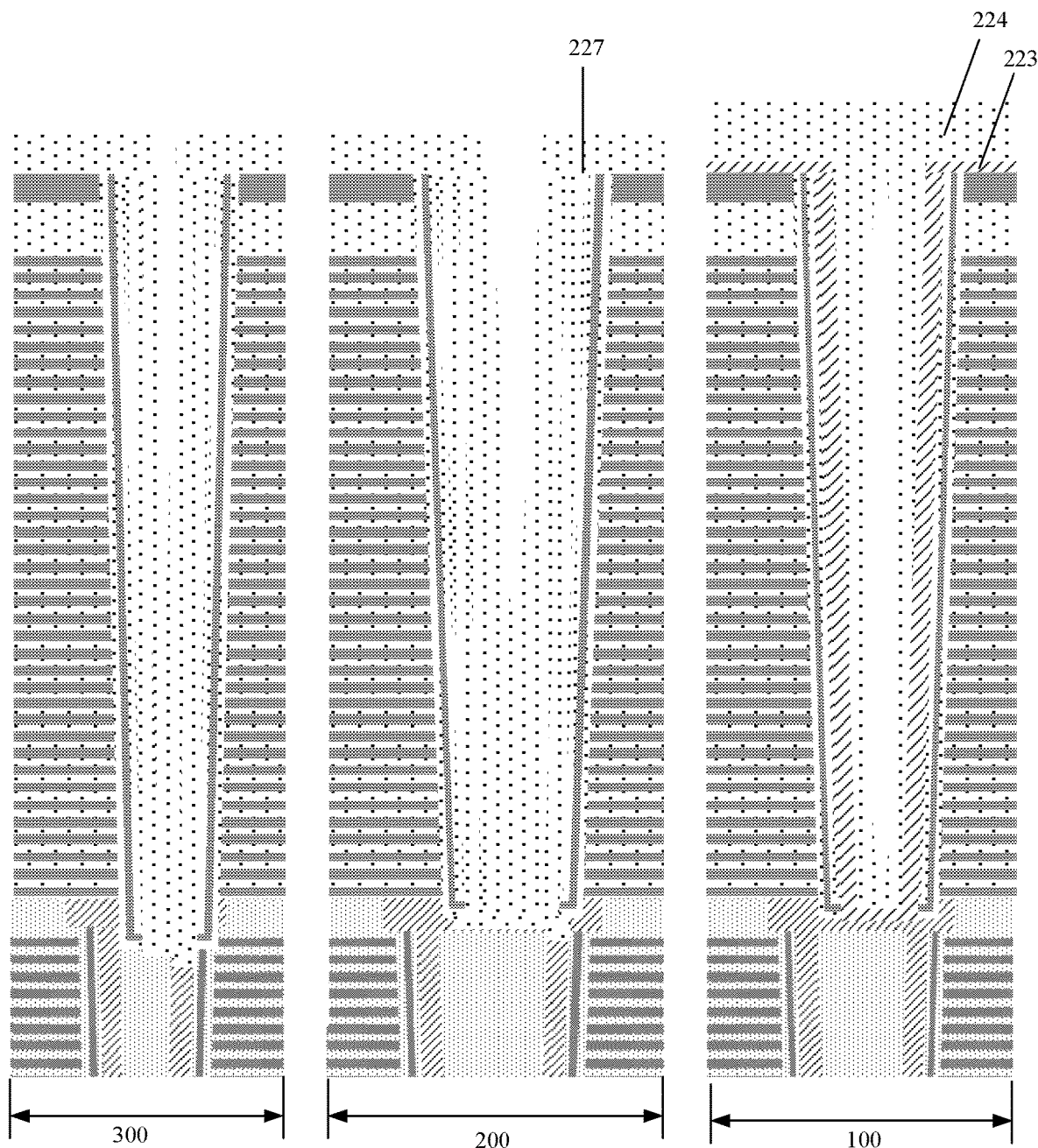

As shown in FIG. 43, a fourth filling layer 227 can be formed on the surface of the second functional layer located in the second region 200 and the third region 300. In some embodiments, the filling performance of the fourth filling layer 227 can be better than the filling performance of the third filling layer 224. That is, in a same removing process, the removal rate of the fourth filling layer 227 can be less than the removal rate of the third filling layer 224.

Figure 44:
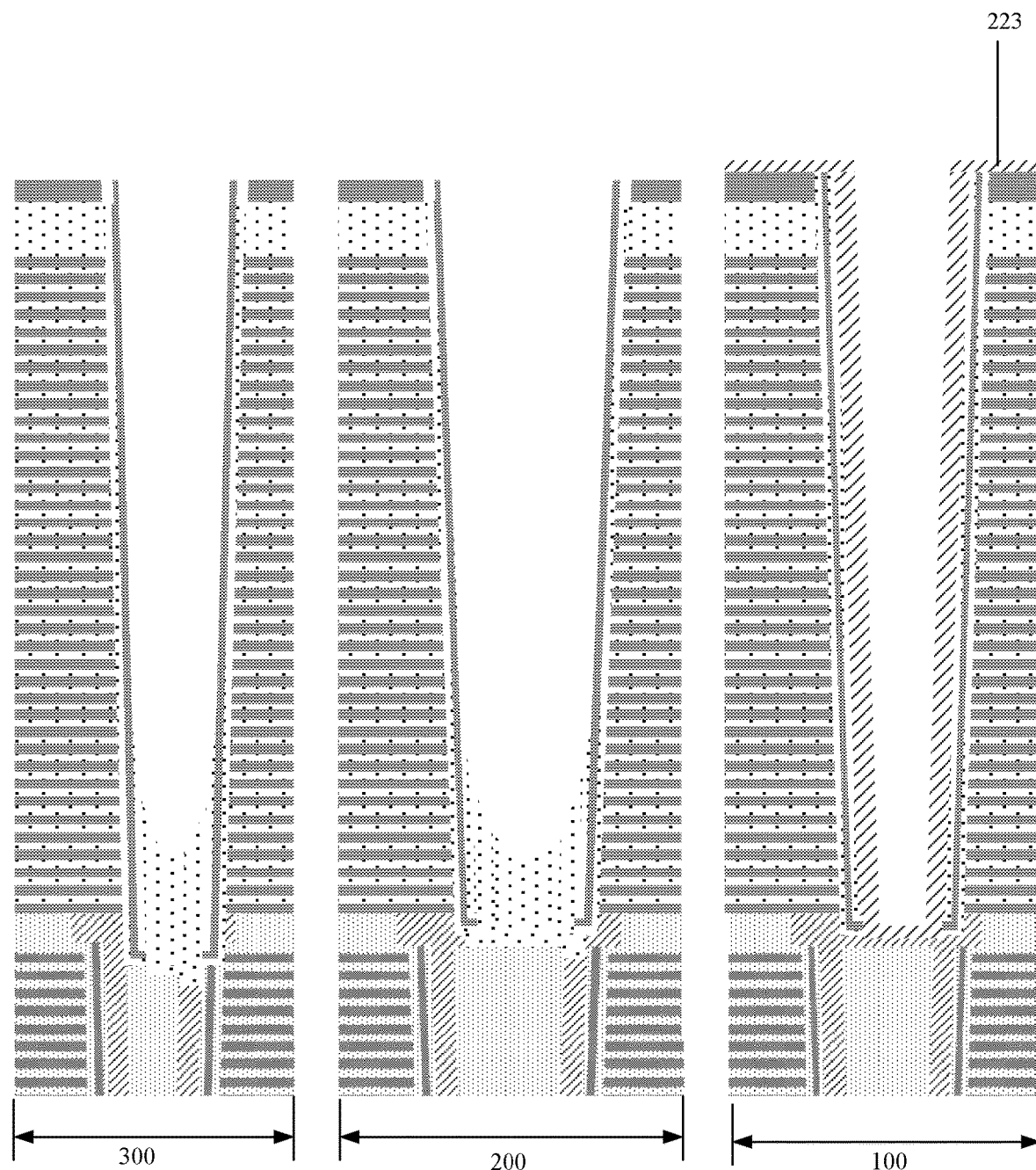

As shown in FIG. 44, the third filling layer 224 on the surface of the fourth channel layer 223 in the first region 100 can be removed by using an etching process. It is noted that, a portion of the fourth filling layer 227 can also be removed by the same etching process.

Figure 45:
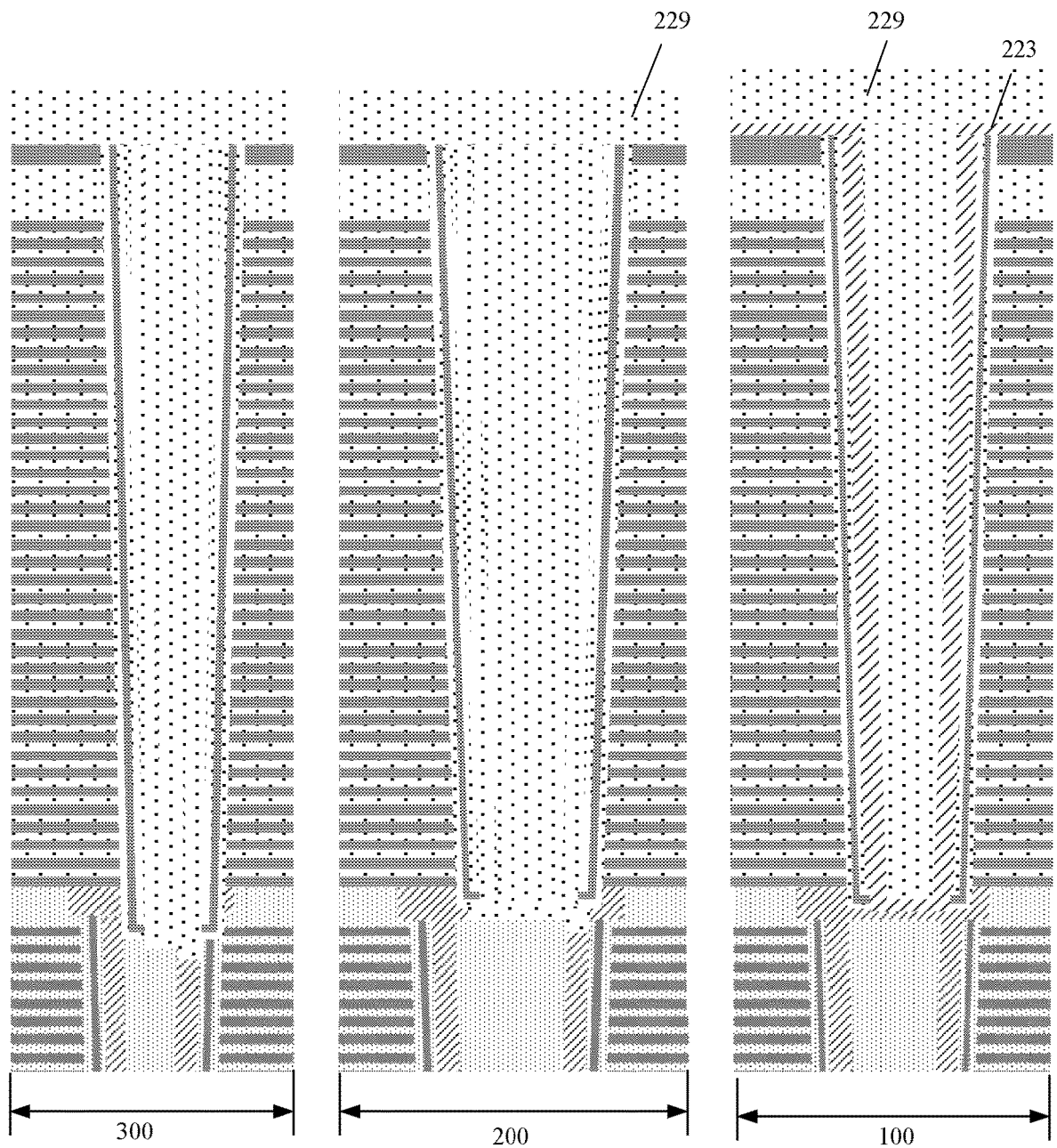

As shown in FIG. 45, a second filling layer 229 can be formed in each second through hole 218 in the first region 100, the second region 200 and the third region 300. The material of the second filling layer 229 can be the same material of the fourth filling layer 227.

Figure 46:
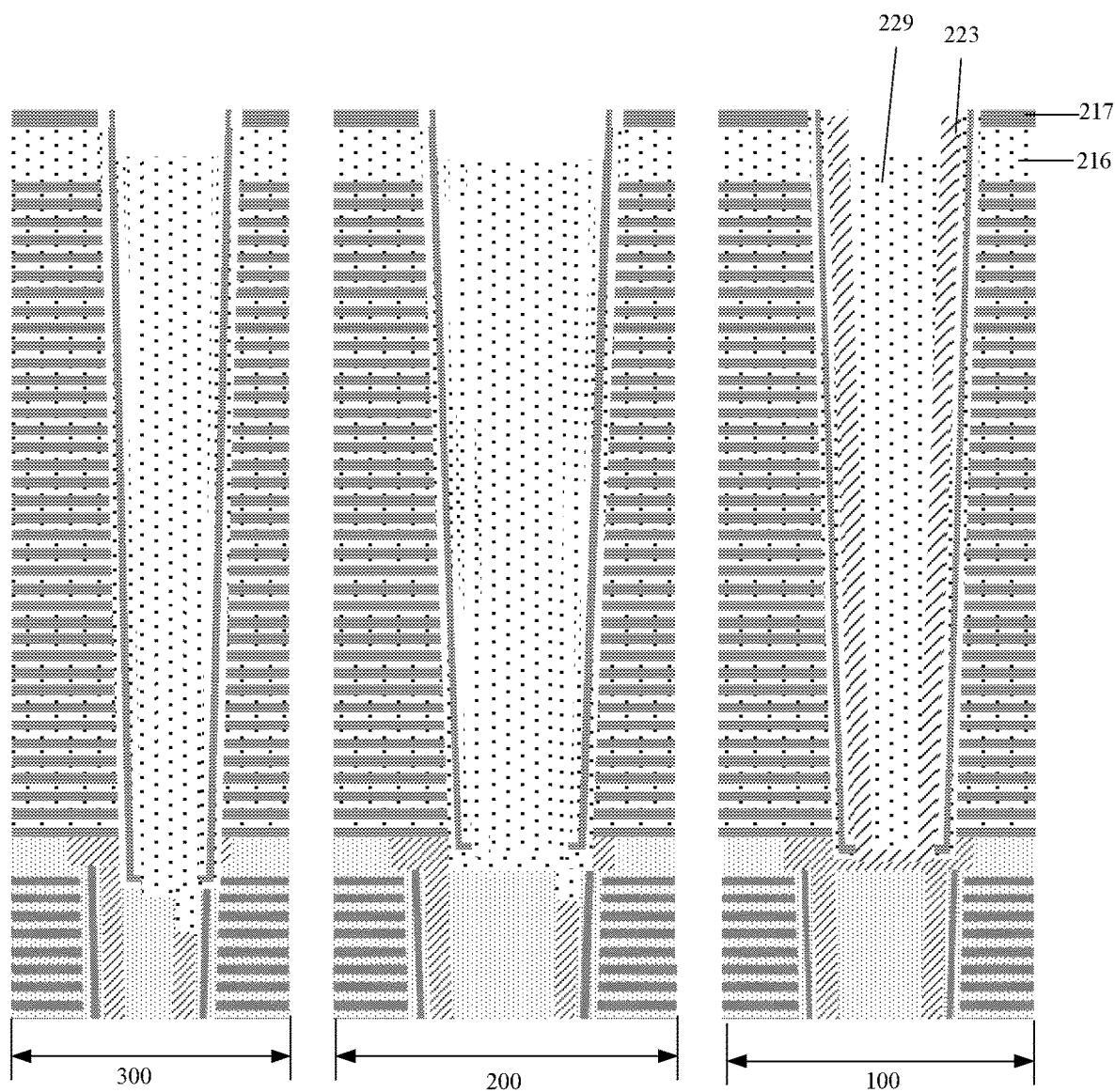

As shown in FIG. 46, a portion of the second filling layer 29 can be removed by using an etching process, such that the top surface of the second filling layer 229 in each second through hole 218 is lower than the top surface of the second insulating connection layer 216. The remaining portion of the second filling layer 29 in each second through hole 218 can form the second filling structure.

Further, the portion of the fourth channel layer 223 located on the surface of the second insulating connection layer 216 or the surface of the second mask layer 217 can be removed by using an etching process. The remaining portion of the fourth channel layer 223 in each second through hole 218 can form the fourth channel structure. The top surface of the fourth channel structure can be higher than the top surface of the second filling structure. As such, a second groove can be formed on the fourth channel structure and the second filling structure in each second through hole 218 in the first region 100, and on the second filling structure in each second through hole 218 in the second region 200 and the third region 300.

It is noted that, the top surface of the fourth channel structure can be higher than the top surface of the second stacked layer 215, or can be lower than the top surface of the second stacked layer 215. The top surface of the fourth channel structure is not lower than the top surface of the top oxide layer in the second stacked layer 215. In some embodiments, the top surface of the fourth channel structure can be in a same plane of the top surface of the top oxide layer in the second stacked layer 215.

At S2012, a fifth channel structure can be formed in the second groove of each second through hole 218 in the first region 100. The fifth channel structure can be in contact with the fourth channel structure.

Figure 47:
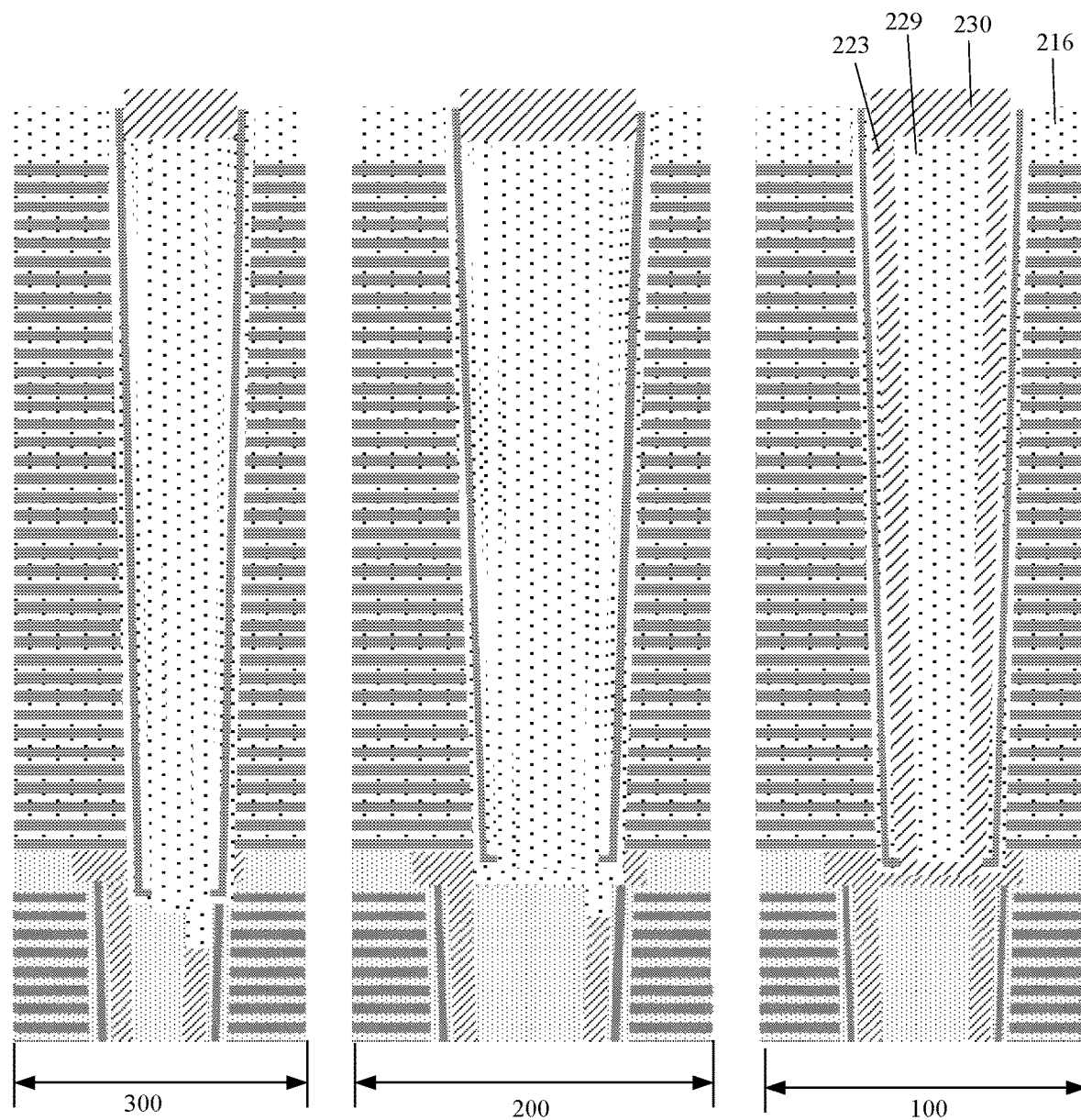

As shown in FIG. 47, the fifth channel structure 230 can be formed in the second groove that is on the fourth channel structure and the second filling structure in each second through hole 218 in the first region 100. The fifth channel structure 230 can also be formed in the second groove that is on the second filling structure in each second through hole 218 in the second region 200 and the third region 300. The nitride layer of the second mask layer 217 can be then removed by an etching process.

Figure 48A:
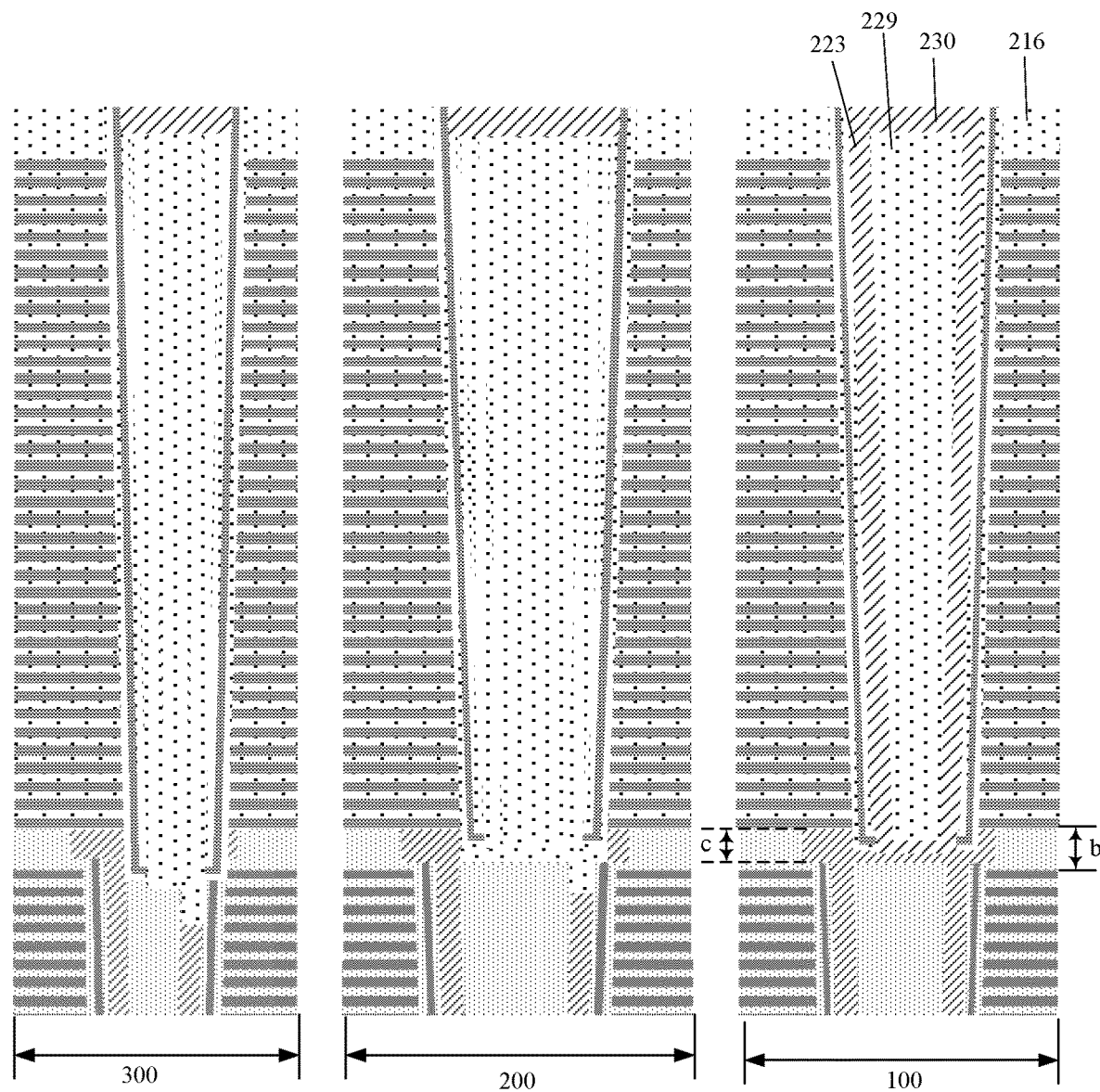
Figure 48B:
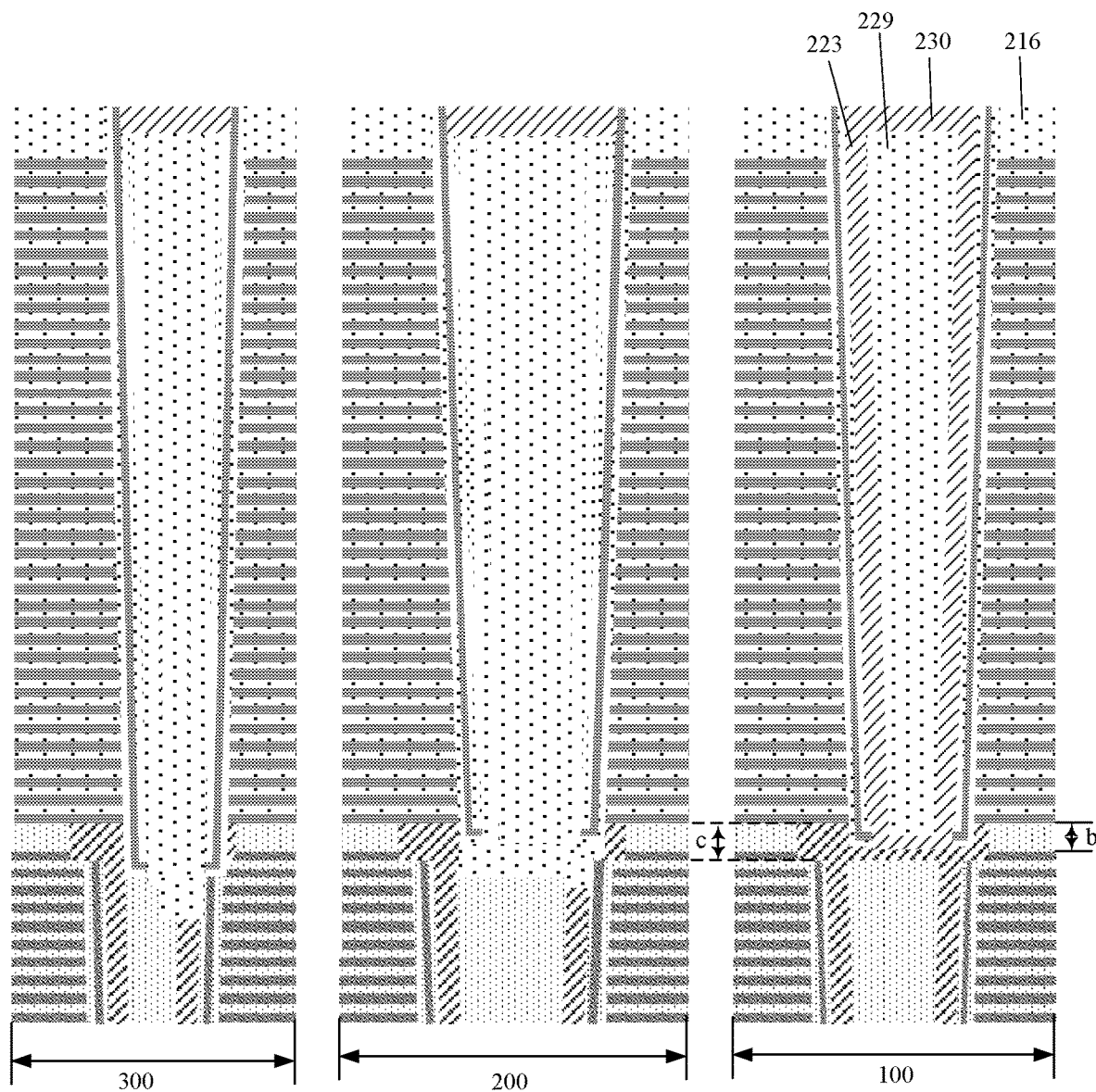

As shown in FIGS. 48A and 48B, the top surface of the second insulating connection layer 216 and the top surface of the plurality of fifth channel structures 230 can be planarized by any suitable techniques, such as backside grinding, and/or chemical mechanical polishing (CMP).

Accordingly, the disclosed method as shown in FIGS. 50A and 50B can form another joint opening structure of a three-dimensional (3D) memory device by combining two through hole formation processes. As such, the formed channel holes having the joint opening structure can have a large aspect ratio and a limited top-bottom aperture error. Further, the disclosed method of forming a joint opening structure in a 3D memory device can simultaneously form a plurality of channel holes, staircase dummy holes, and through array contact barriers, resulting in an efficient process capability control, a simplified process complexity, and a reduced cost.

In some embodiments, the present disclosure also provides another three-dimensional memory device formed by using the above disclosed method as shown in FIGS. 50A and 50B. The three-dimensional memory device can include a first region for forming a plurality of channel holes, a second region for forming a plurality of staircase structure (SS) dummy holes, and a third region for forming a plurality of through array contact (TAC) barriers. Along a direction perpendicular to the surface of the three-dimensional memory device, the three-dimensional memory device can include the following components.

A first stacked layer including a plurality of oxide/nitride layer pairs, such as silicon oxide layer and silicon nitride layer pairs, is formed on a substrate. A first insulating connection layer is formed on the first stacked layer. A plurality of first through holes penetrating the first stacked layer and the first insulating connection layer and extending into the surface of the substrate are formed in the first region, the second region, and the third region.

A first channel structure is formed on the surface of the substrate exposed by each first through hole. A first functional layer is formed on the sidewall of each first through hole. A second channel structure is formed on the sidewall of the first functional layer and the surface of the first channel structure in each first through hole. A first filling structure is formed on the sidewall and the surface of the second channel structure to fill each of the plurality of first through holes. In some embodiments, an airgap can be enclosed in the first filling structure in each first through hole. The top surfaces of the second channel structure and the first filling structure are lower than the top surfaces of the first insulating connection layer.

A first groove is formed in the first insulating connection layer, and above the first functional layer, the second channel structure and the first filling structure in each first through hole. A projection of each of the plurality of first grooves on the substrate completely covers a projection of the corresponding first through hole on the substrate. A third channel structure in contact with the second channel structure in the corresponding first through hole is formed in each first groove.

A second stack layer including a plurality of oxide/nitride layer pairs, such as silicon oxide layer and silicon nitride layer pairs, is formed on the top surfaces of the first insulating connection layer and the plurality of third channel structures. A second insulating connection layer is formed on the second stack layer. A plurality of second through holes penetrating through the second stacked layer and the second insulating connection layer and extending into a surface of the third channel structure are formed in the first region, the second region, and the third region. A projection of each of the plurality of second through holes on the substrate at least partially overlaps the projection of the corresponding first through hole on the substrate.

A second functional layer is formed on the sidewall of each second through hole. A fourth channel structure is formed on the sidewall of the second functional layer and the bottom surface of each second through hole in the first region. A second filling is formed to fill each of the plurality of second through holes in the first region, the second region, and the third region. In some embodiments, an airgap can be enclosed in the second filling structure. The top surface of the fourth channel structure is higher than the top surface of the second filling structure in each second through hole in the first region.

In the first region, a fifth channel structure in contact with the fourth channel structure is formed in a second groove in each second through hole that is surrounded by the second functional layer, and above the fourth channel structure and the second filling structure. And in the second region and the third region, a fifth channel structure is formed in a second groove in each second through hole that is surrounded by the second functional layer, and above the second filling structure.

Due to the fourth channel structures being formed in the second through holes in the first region rather than the third region, the fifth channel structure in each second through hole in the first region can be electronically connected with the first channel structure in the corresponding first through hole, while the fifth channel structure in each second through hole in the third region can be electronically insulated with the first channel structure in the corresponding first through hole. Thus, in the three-dimensional memory device, a plurality of channel holes can be formed in the first region, the second region, and the third region. The plurality of staircase structure dummy holes in the second region can have a supporting function of the staircase structure.

In some embodiments, as shown in FIG. 48A, in each channel hole in the first region, a thickness "b" of the first insulating connection layer, which is the distance between the top nitride layer of the first stacked layer and the bottom nitride layer of the second stacked layer can be in a range between 80 nm and 100 nm, preferably about 90 nm. A thickness "c" of the third channel structure can be in a range between 50 nm and 70 nm, preferably about 60 nm.

In some alternative embodiments, as shown in FIG. 47B, in each channel hole in the first region, a thickness "b" of the first insulating connection layer, which is the distance between the top nitride layer of the first stacked layer and the bottom nitride layer of the second stacked layer can be in a range between 20 nm and 40 nm, preferably about 30 nm. A thickness "c" of the third channel structure can be in a range between 50 nm and 70 nm, preferably about 60 nm.

Further, the difference between the radiuses of the top aperture and the bottom aperture of the second channel structure, and the difference between the radiuses of the top aperture and the bottom aperture of the fourth channel structure can be within 15 nm. Accordingly, the disclosed channel hole having a joint opening structure can have a large aspect ratio and a limited top-bottom aperture error.

Figure 49A:
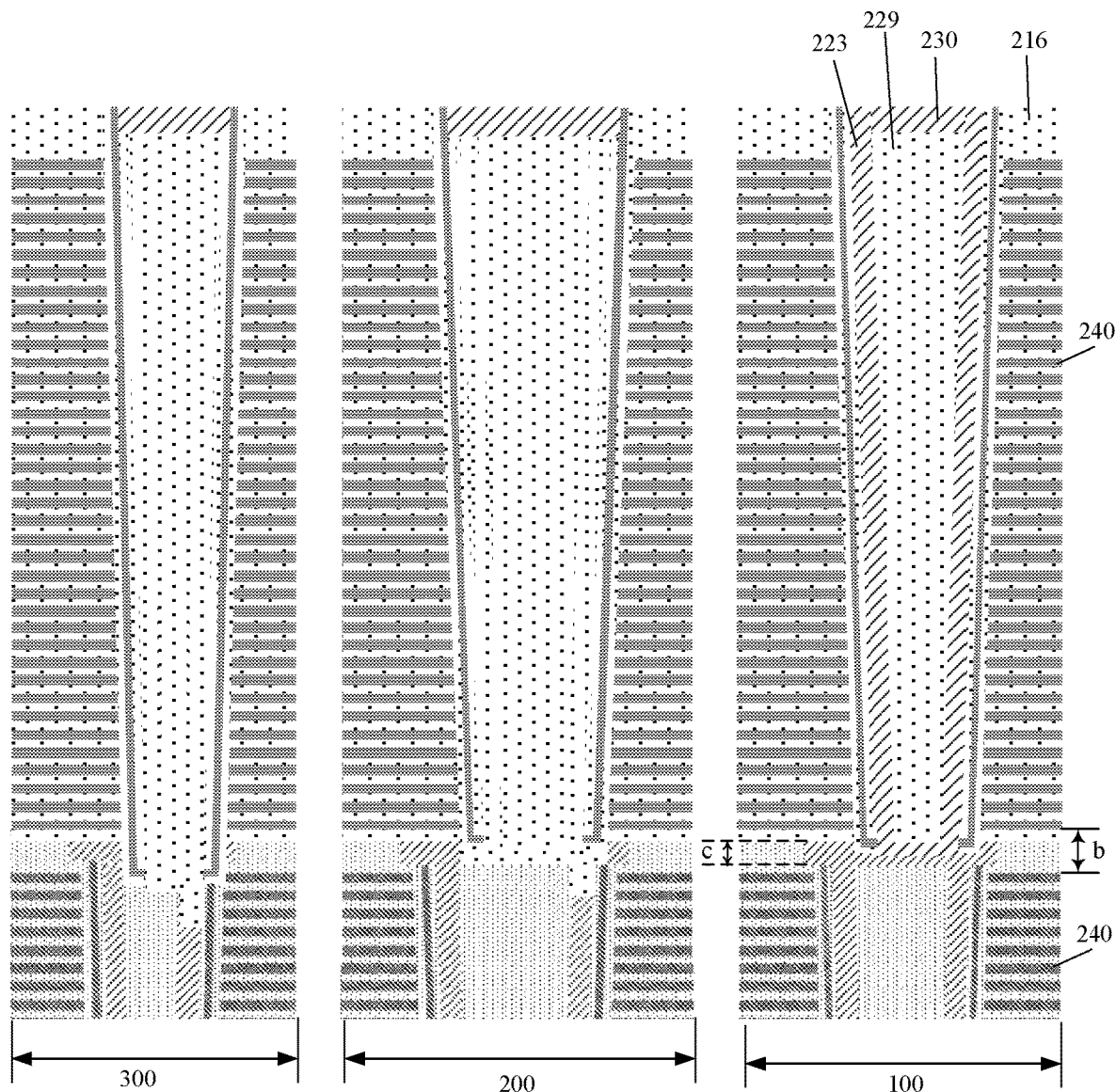
Figure 49B:
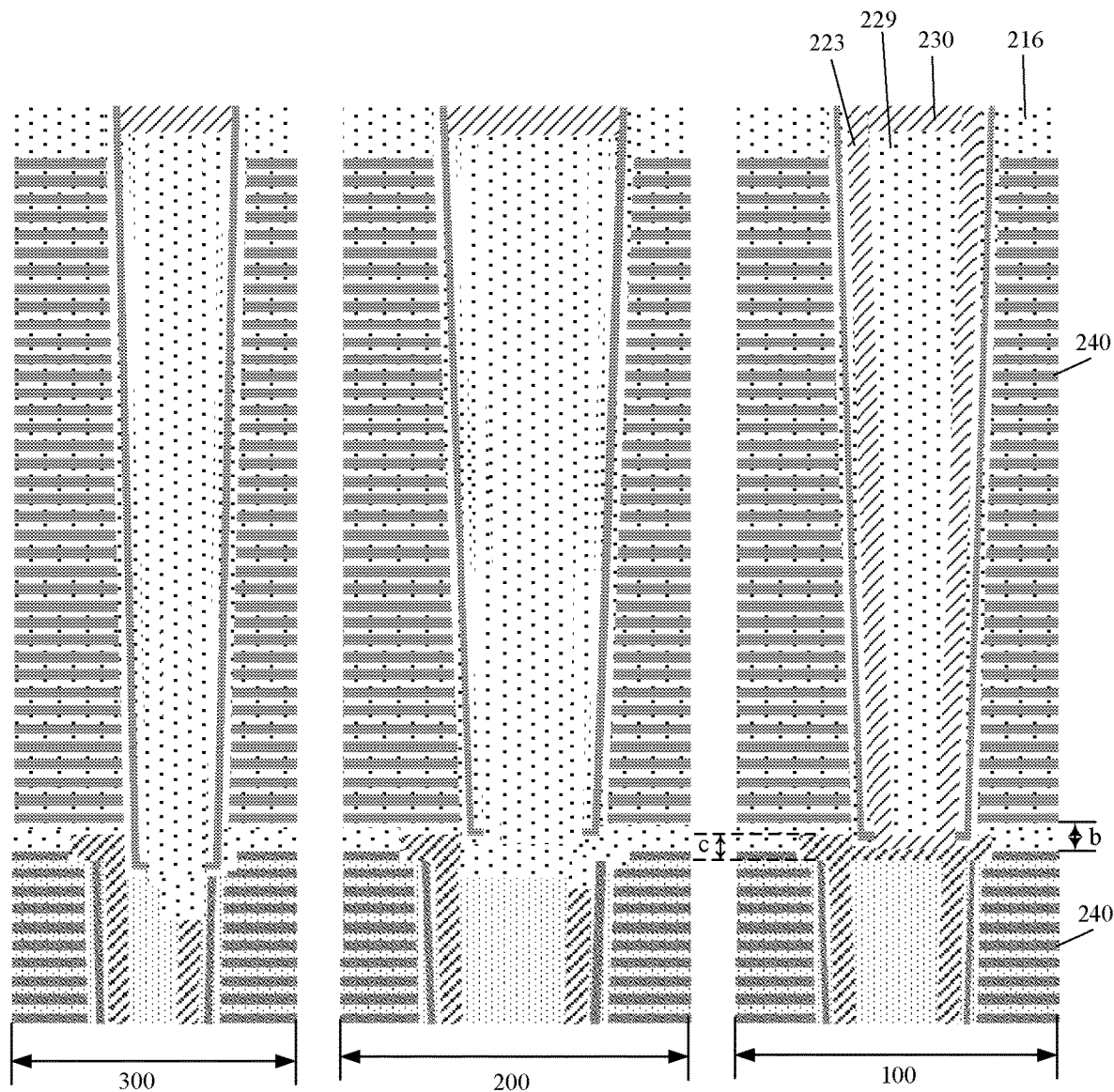

In some embodiments, a replacement process can be performed to replace each of the plurality of nitride layers in the first stacked layer 202 and the second stacked layer 215 with a conductive layer 240, as shown in FIGS. 49A and 49B. The conductive layer can include any suitable material that is electronically conductive, including, but not limited to, W, Co, Cu, Al, doped silicon, silicides, or any combination thereof.

In some embodiments, the replacement process can be performed in one or more of the first region 100, the second region 200, and the third region 300. In one embodiments, the replacement process is performed in the first region 100 and the second region 200, but not in the third region 300. That is, the first stacked layer and the second stacked layer in the first region and the second region can be alternating conductive/dielectric stack, while the first stacked layer and the second stacked layer in the third region can be alternating oxide/nitride stack.

In some embodiments, during the replacement process, a portion of the third channel structure 214 that is adjacent with the bottom nitride layer of the second stacked layer 215, or is adjacent with the top nitride layer of the first stacked layer 202 can be converted to an oxide layer by an oxidation process. That is, as shown in FIGS. 49A and 49B, a thickness "c" of the third channel structure can be reduced after the replacement process. For example, the thickness "c" of the third channel structure can be reduced to a range between 30 nm and 50 nm, preferably about 40 nm.

Figure 74A:
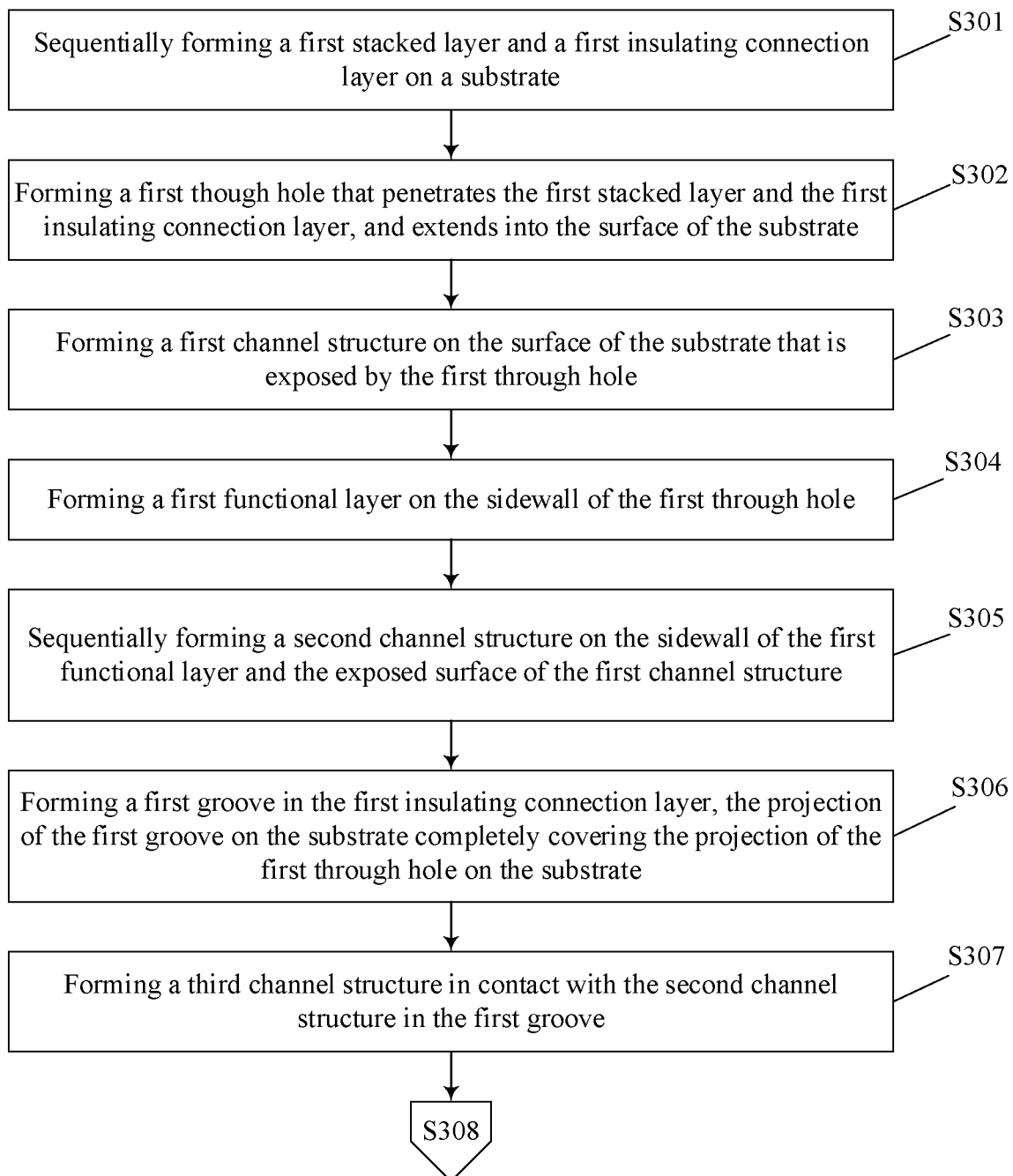
FIGS. 74A and 74B illustrate schematic flow diagrams of another exemplary fabricating process for forming a joint opening structure of three-dimensional (3D) memory device are illustrated in accordance with some embodiments of the present disclosure.
Figure 74B:
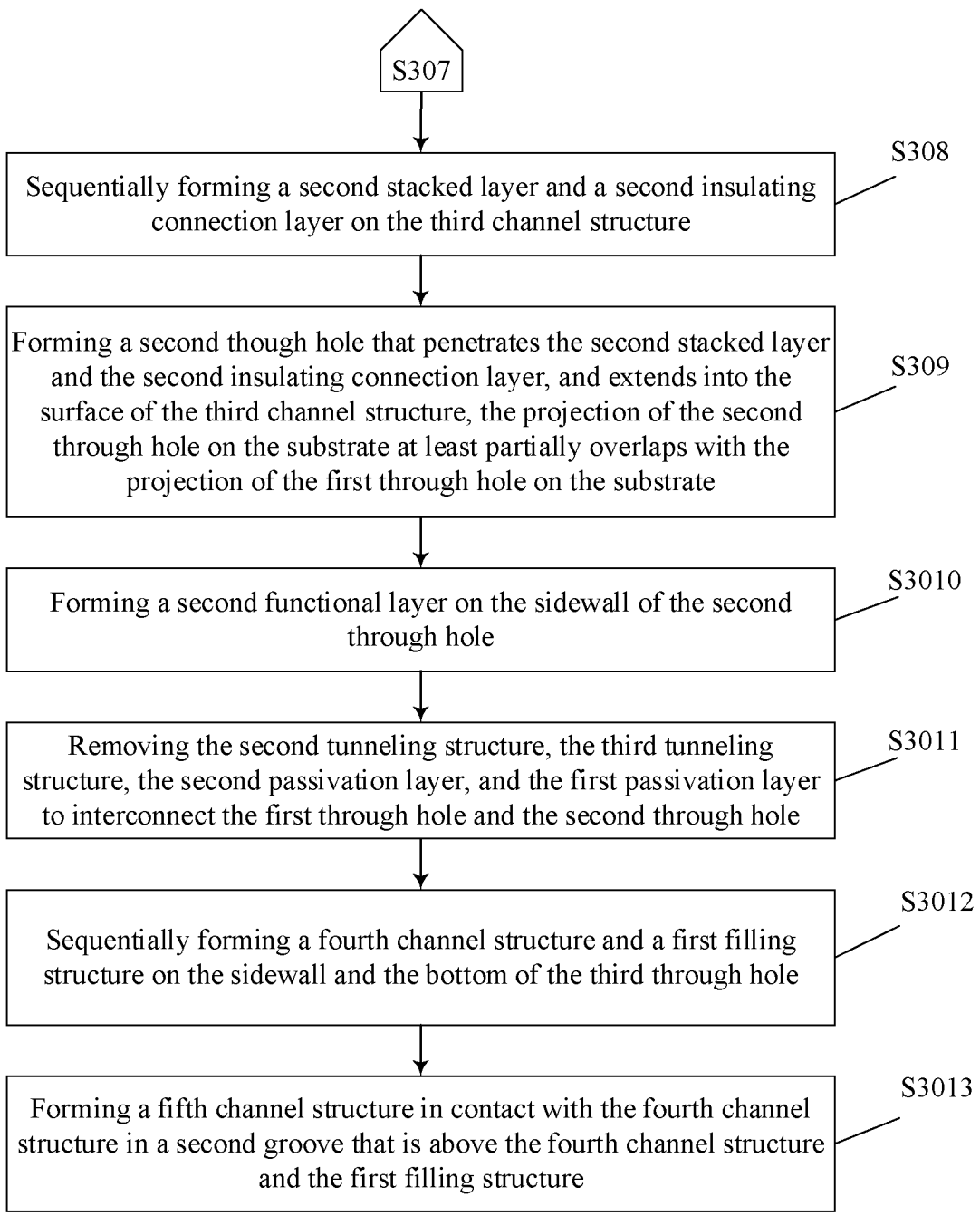

Referring to FIGS. 74A and 74B, schematic flow diagrams of another exemplary method for forming a joint opening structure of three-dimensional (3D) memory device are illustrated in accordance with some embodiments of the present disclosure. And FIGS. 51-55, 56A, 56B, 57A, 57B, 58A, 58B, 59A, 59B, 60-71, 72A. 72B. 73A and 73B illustrate schematic structural cross-sectional diagrams of an exemplary joint opening structure of three-dimensional (3D) memory device at certain stages of the fabricating process shown in FIGS. 74A and 74B.

Figure 51:
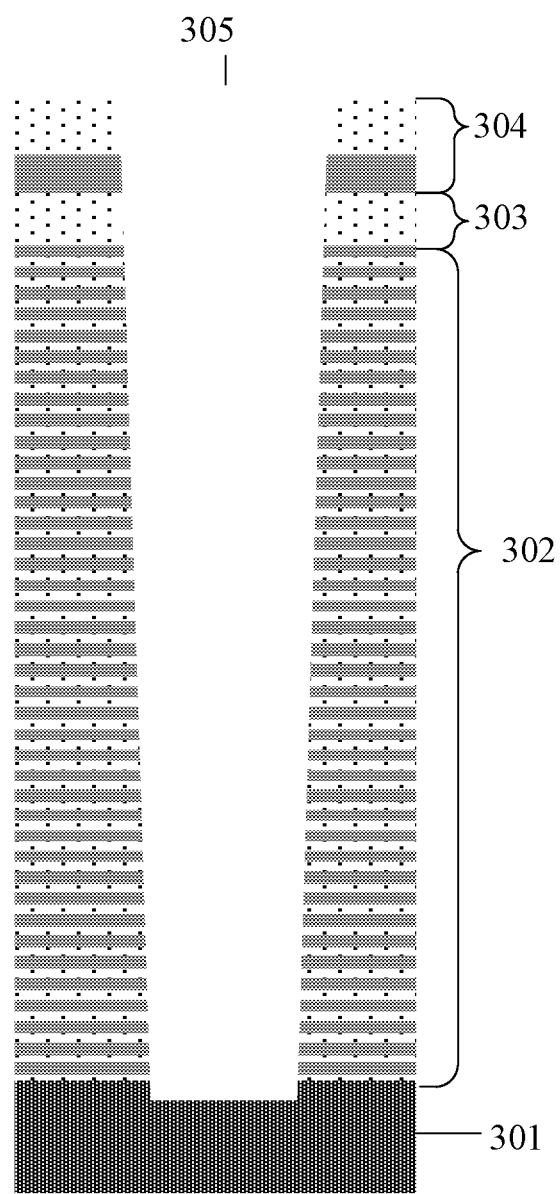
FIGS. 51-55, 56A, 56B, 57A, 57B, 58A, 58B, 59A, 59B, 60-71, 72A, 72B, 73A and 73B illustrate schematic structural cross-sectional diagrams of another exemplary joint opening structure of three-dimensional (3D) memory device at certain stages of another fabricating process in accordance with some embodiments of the present disclosure.

At S301, a substrate 301 can be provided, a first stacked layer 302 and a first insulating connection layer 303 can be formed on the surface of the substrate 301. As shown in FIG. 51, the first stacked layer 302 can include a plurality of oxide/nitride layer pairs, such as silicon oxide layer and silicon nitride layer pairs. The multiple oxide layers (shown in the areas with dotes) and multiple nitride layers (shown in the areas with meshes) in the first stacked layer 302 alternate in a vertical direction. The first stacked layer 302 can include any suitable number of layers of the oxide layers and the nitride layers. In some embodiments, a total number of layers of the oxide layers and the nitride layers in the first stacked layer 302 is equal to or larger than 64.

In some embodiments, the first insulating connection layer 303 can be made by any suitable insulating material and/or dielectric material, such as silicon oxide. It is noted that, the material of the first insulating connection layer 303 can be different from the material of the nitride layer in the first stacked layer 302.

Further, in some embodiments, a first mask layer 304 can be formed on the surface of the first insulating connection layer 303. The first mask layer 304 can include a nitride layer on the surface of the first insulating connection layer 303, and an oxide layer on the surface of such nitride layer.

At S302, a first through hole 305 can be formed. As shown in FIG. 51, the first through hole 305 can completely penetrate the first stacked layer 302 and the first insulating connection layer 303, and can extend into the surface of the substrate 301.

In some embodiments, the first through hole 305 can be formed by etching the first stacked layer 302 and the first insulating connection layer 303 and a subsequent cleaning process. The etching process to form the first through hole 305 can be a wet etching, a dry etching, or a combination thereof.

In some embodiments, when the first mask layer 304 is formed on the surface of the first insulating connection layer 303, the etching process also etch the first mask layer 304 to form the first through holes 305.

Figure 52:
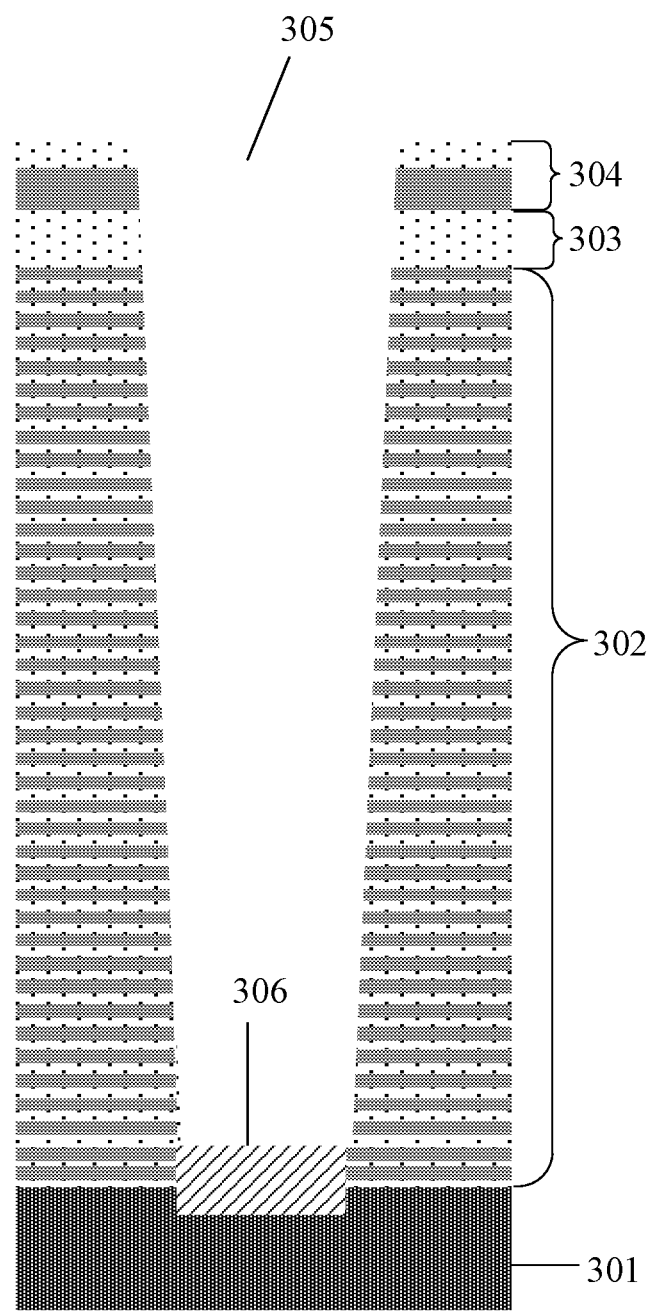

At S303, a first channel structure 306 can be formed on the surface of the substrate 301 that is exposed by the first through hole 305, as shown in FIG. 52. In some embodiments, the first channel structure 306 can be a polycrystalline silicon layer formed by using a selective epitaxial process.

At S304, a first functional layer can be formed on the sidewall of the first through hole 305. The first functional layer can include a first tunneling layer 307, a first storage layer 308, a first barrier layer 309, and a first passivation layer 310.

Figure 53:
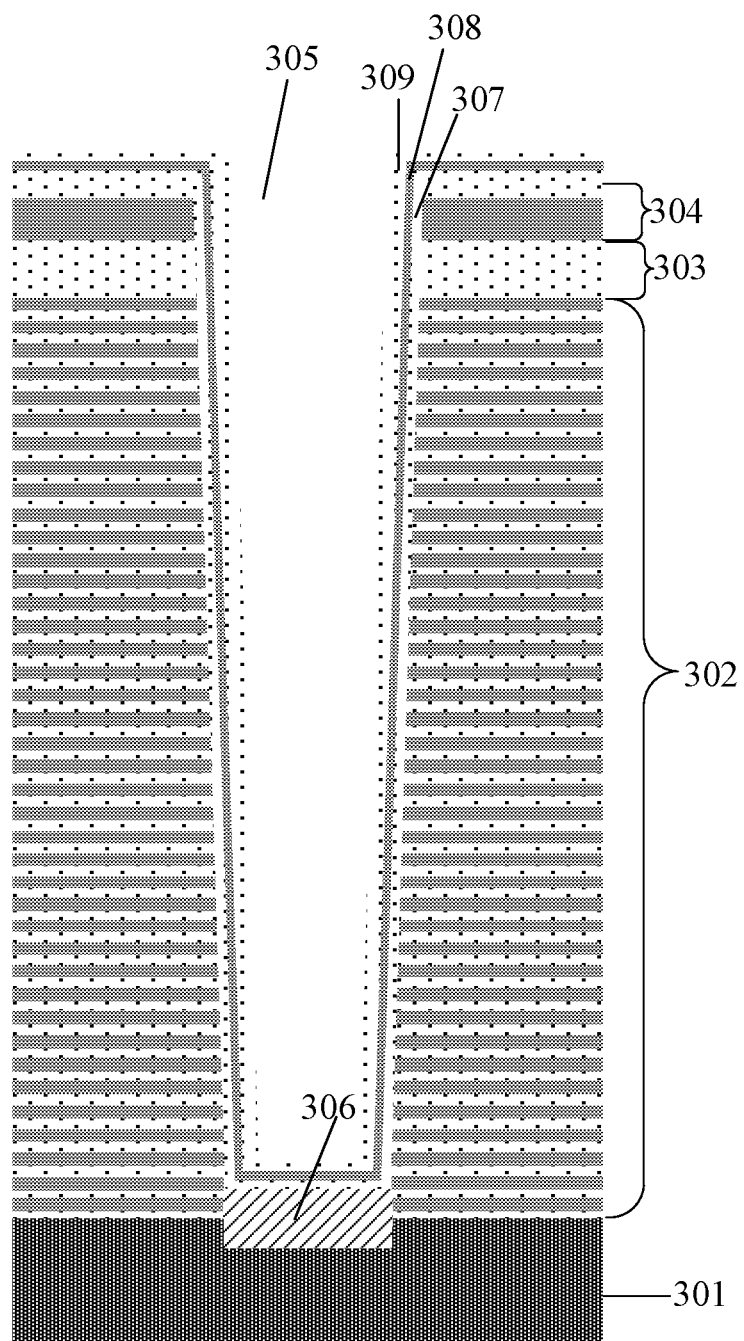

As shown in FIG. 53, the first tunneling layer 307 can be formed on the sidewall of the first through hole 305 and the surface of the first channel structure 306. The first tunneling layer can be used for generating electronic charges. In some embodiments, the first tunneling layer 307 can be an oxide layer formed by using a deposition process.

The first storage layer 308 can be formed on the surface of the first tunneling layer 307. The first storage layer 308 can be used for storing electronic charges. In some embodiments, the first storage layer 308 can be a nitride layer formed by using a deposition process.

The first barrier layer 309 can be formed on the surface of the first storage layer 308. The first barrier layer 309 can be used for blocking the outflow of the electronic charges stored in the first storage layer 308. In some embodiments, the first barrier layer 309 can be an oxide layer formed by using a deposition process.

Figure 54:
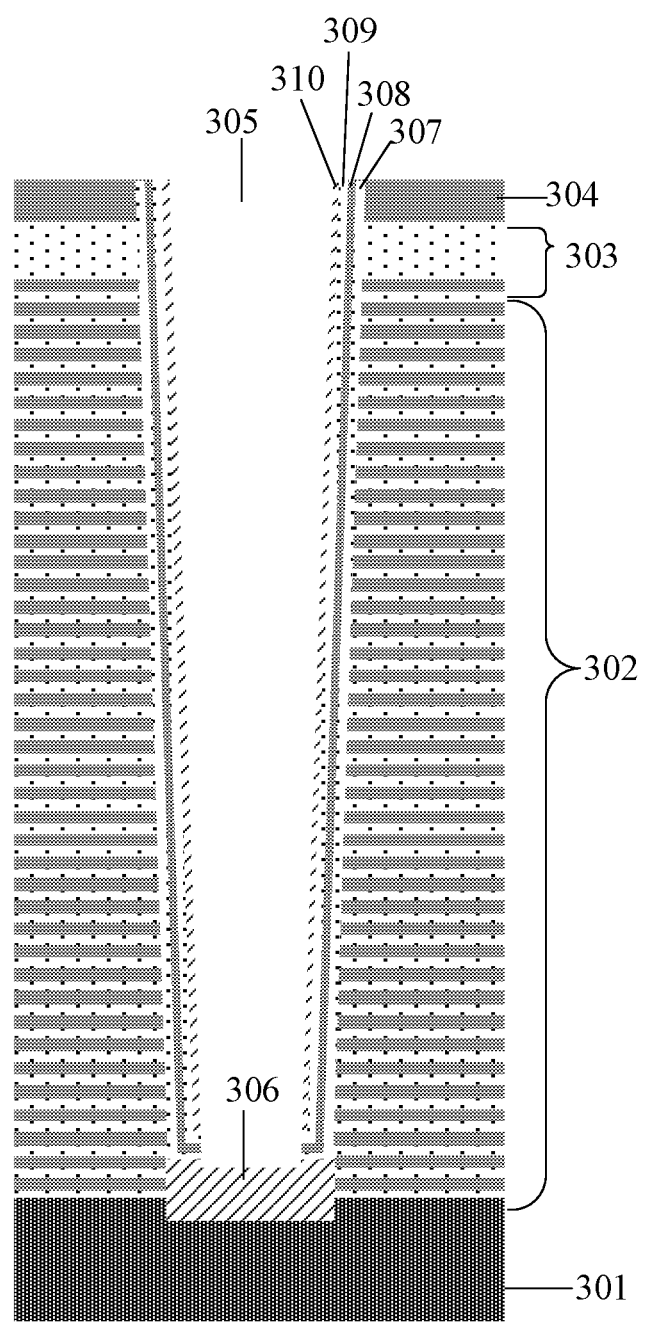

As shown in FIG. 54, a first passivation layer 310 can be formed on the surface of the first barrier layer 309. The first passivation layer 310 can be used for protecting the first barrier layer 309 from being damaged in a subsequent removal process. In some embodiments, the first passivation layer 310 can be an amorphous silicon layer formed by using a deposition process.

The portions of the first passivation layer 310, the first barrier layer 309, the first storage layer 308 and the first tunneling layer 307 located on the surface of the first channel structure 306 on the bottom of the first through hole 305 can be removed. In some embodiments, the removal process can include an etching process and a cleaning process. As such, the first functional layer can be formed on the sidewall of the first through hole 305.

In some embodiment, in the same removal process, the first barrier layer 309, the first storage layer 308, the first tunneling layer 307, and the oxide layer of the first mask layer 304 located on the surface of the nitride layer of first mask layer 304 can also be removed. As such, the nitride layer of first mask layer 304 is remained on the surface of the first insulating connection layer 303.

At S305, a second channel structure can be formed on the sidewall of the first functional layer sidewall and the surface of the first channel structure 306. The surfaces of the second channel structure can be lower than the surface of the first insulating connection layer 303.

Figure 55:
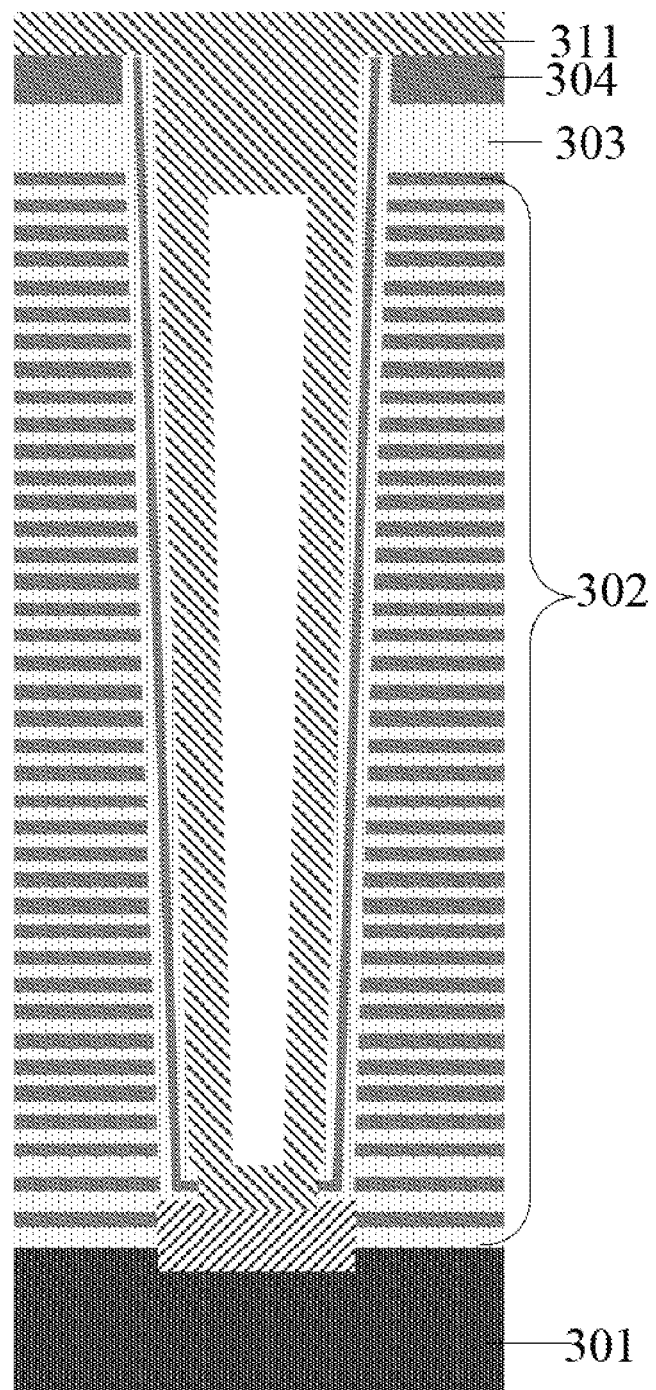

As shown in FIG. 55, a second channel layer 311 can be formed to cover the sidewall of the first passivation layer 310, the bottom of the first through hole 305. The second channel layer 311 can also cover the surface of the first insulating connection layer 303, or cover the surface of the nitride layer of the first mask layer 304. In some embodiments, the second channel layer 311 can be an amorphous silicon layer formed by using a deposition process.

Figure 56A:
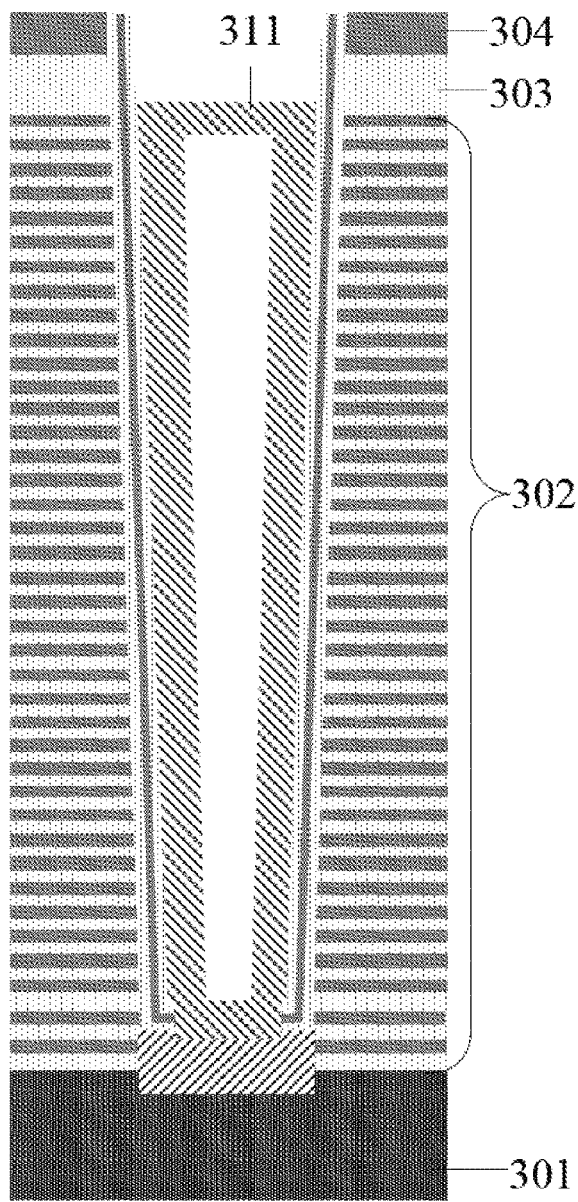
Figure 56B:
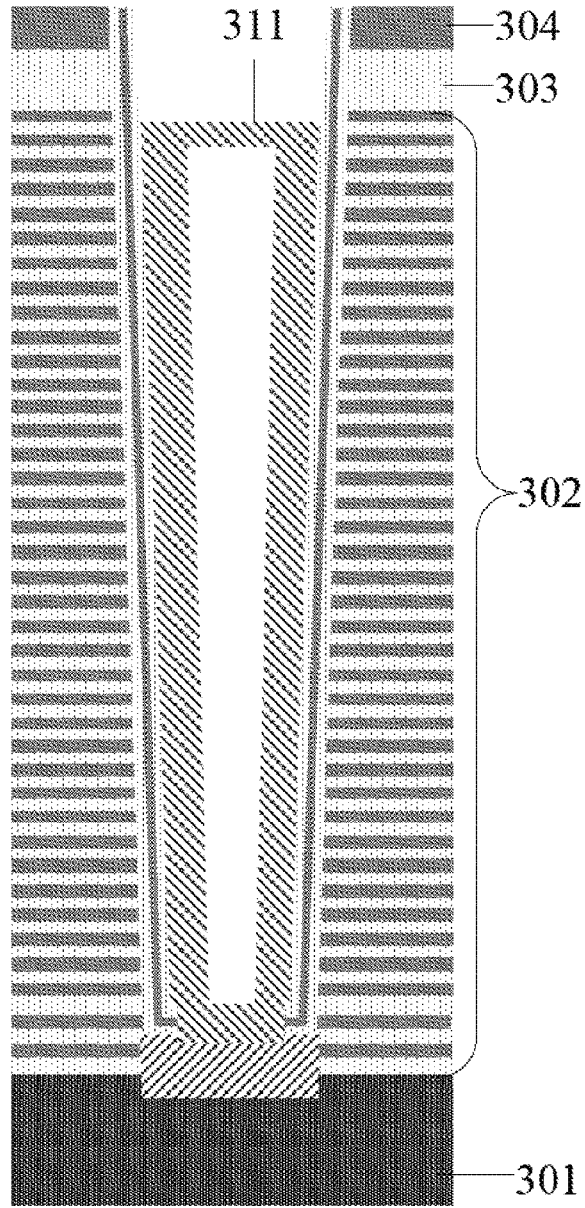

As shown in FIGS. 56A and 56B, a portion of the second channel layer 311 can be removed, such that the surface of the second channel layer 311 is lower than the first insulating connection layer 303. The remaining portion of the second channel layer 311 can form the second channel structure that is in contact with the first channel structure 306. In some embodiments, an airgap can be enclosed by the second channel structure, as shown in FIGS. 56A and 56B. In some embodiments, the portion of the second channel layer 311 can be removed by using an etching process.

It is noted that, in various embodiments, the top surface of the second channel structure can be higher than the top surface of the first stacked layer 302 or lower than the top surface of the first stacked layer 302. However, the top surface of the second channel structure is not lower than the top surface of the top oxide layer in the first stacked layer 302. In some embodiments, the top surface of the second channel structure can be higher than the top nitride layer in the first stacked layer 302, as shown in FIG. 56A. In some alternative embodiments, the top surface of the second channel structure is in a same plane of the top surface of the top oxide layer in the first stacked layer 302, as shown in FIG. 56B.

At S306, a first groove 312 can be formed in the first insulating connection layer 303. In some embodiments, the projection of the first groove 312 on the substrate 301 can completely cover the projection of the first through hole 305 on the substrate 301.

Figure 57A:
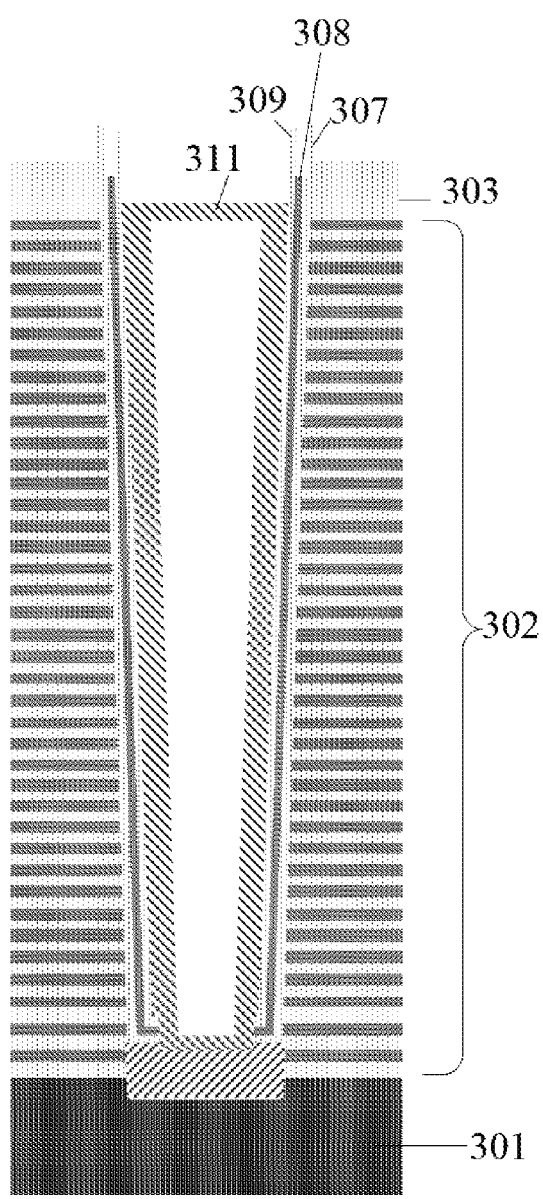
Figure 57B:
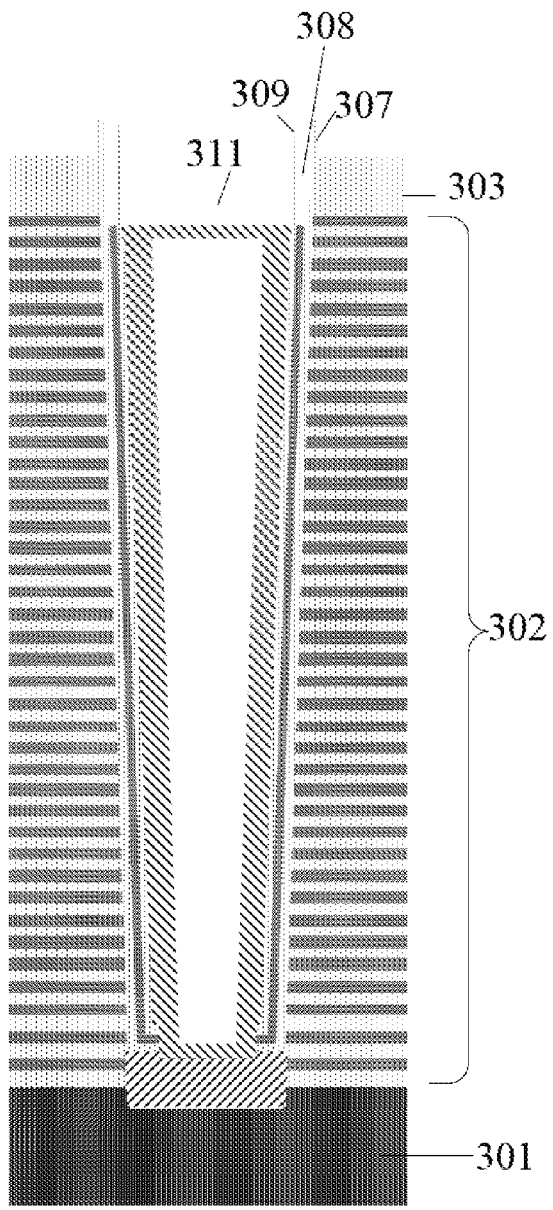
Figure 58A:
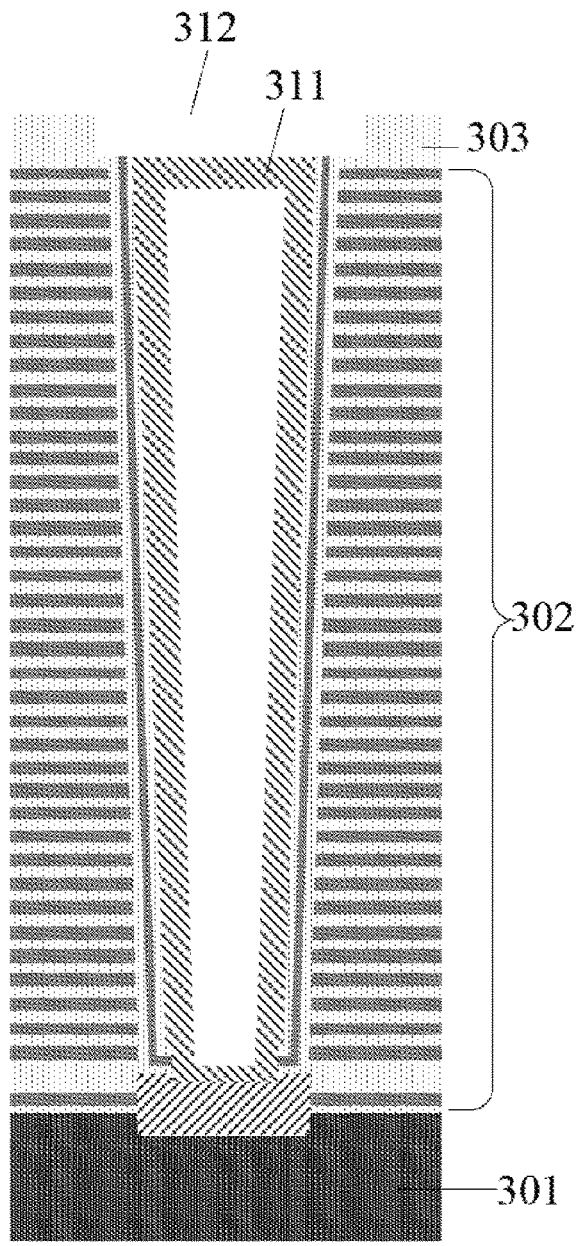
Figure 58B:
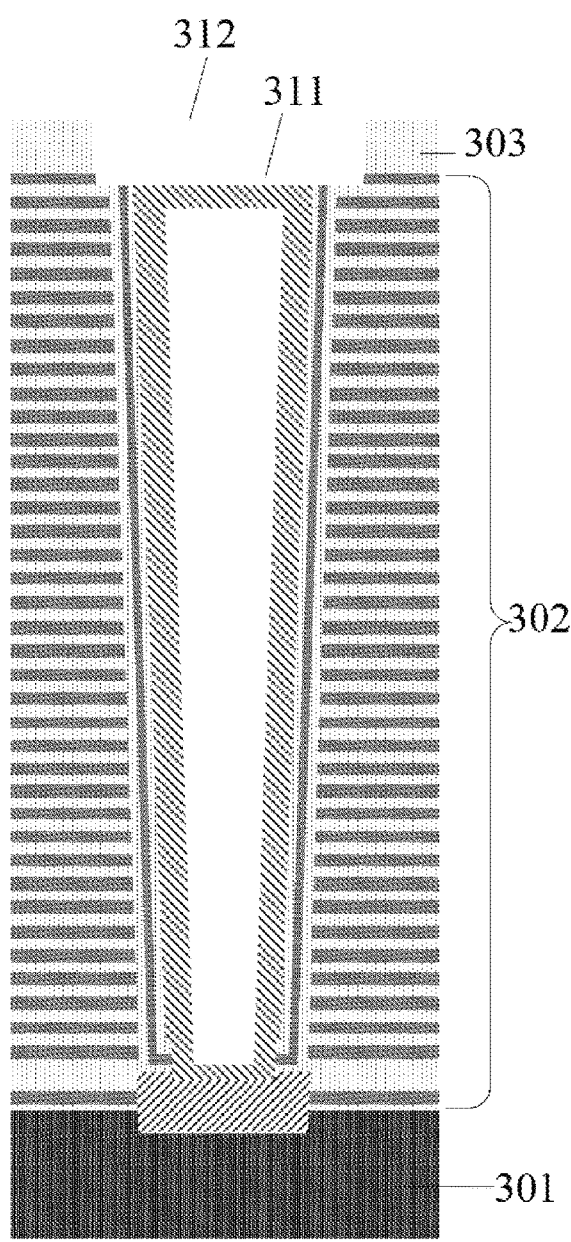

As shown in FIGS. 57A and 57B, the nitride layer of the first mask layer 304 can be removed by using an etching process. As shown in FIGS. 58A and 58B, the surface of the first insulating connection layer 303 can be planarized. A portion of the first insulating connection layer 303 can be removed to form the first groove 312 that penetrates the first insulating connection layer 303. An area of the projection of the first groove 312 on the substrate 301 can be larger than an area of the projection of the first through hole 305 on the substrate 301.

In some embodiments, a depth of the first groove can be equal to or less than the thickness of the planarized first insulating connection layer 303, as shown in FIG. 58A. For example, the depth of the first groove can be in a range between 50 nm and 70 nm. In one embodiment, the thickness of the planarized first insulating connection layer 303 is about 90 nm, while the depth of the first groove is about 60 nm.

In some alternative embodiments, the depth of the first groove can be greater than the thickness of the planarized first insulating connection layer 303, as shown in FIG. 58B. That is, a portion of the top nitride layer in the first stacked layer 302 can also be removed to form the first groove. For example, the depth of the first groove can be in a range between 50 nm and 70 nm. In one embodiment, the thickness of the planarized first insulating connection layer 303 is about 30 nm, while the depth of the first groove is about 60 nm.

Figure 59A:
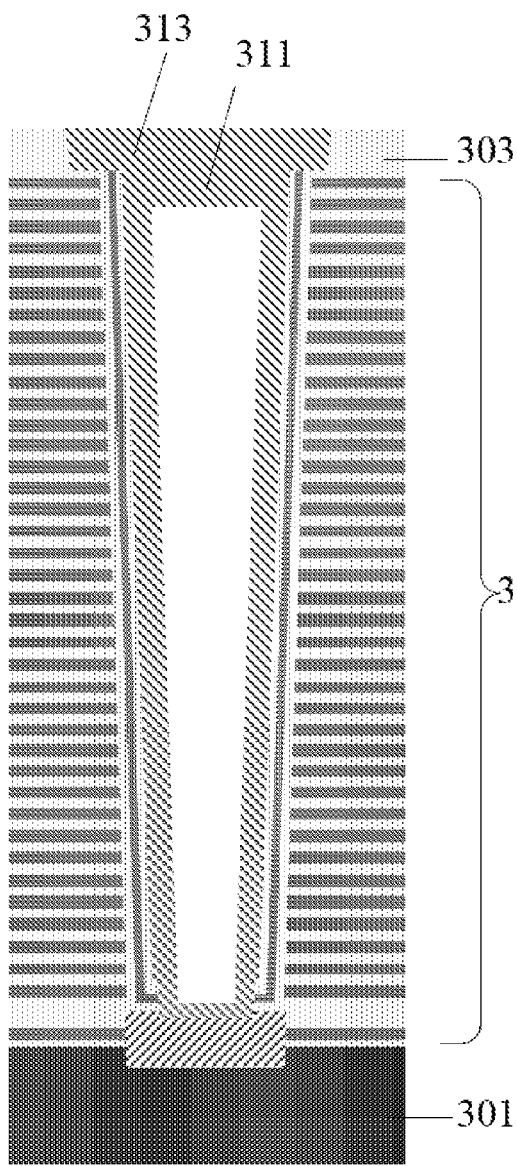
Figure 59B:
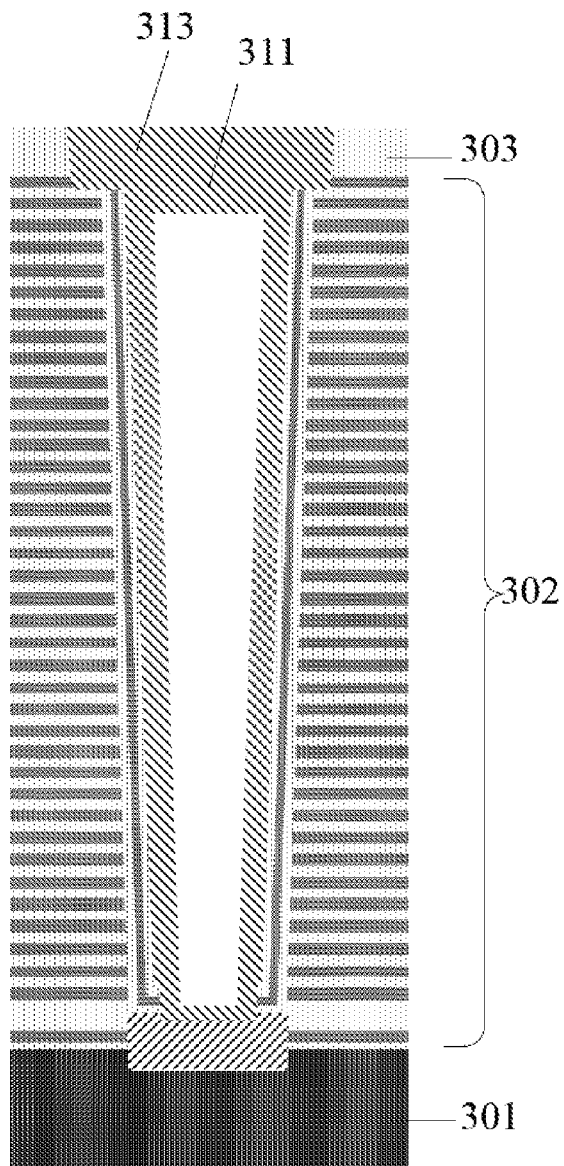

At S307, a third channel structure 313 can be formed in the first groove 312. As shown in FIGS. 59A and 59B, the third channel structure 313 can be in contact with the second channel structure. In some embodiments, the third channel structure can be a polycrystalline silicon player formed by using a deposition process.

A thickness of the third channel structure 313 can be equal to the depth of the first groove 312. As described above, in some embodiments, a thickness of the third channel structure 313 can be equal to or less than the thickness of the planarized first insulating connection layer 303, as shown in FIG. 59A. For example, the thickness of the third channel structure 313 can be in a range between 50 nm and 70 nm, preferably about 60 nm. In some alternative embodiments, the thickness of the third channel structure 313 can be greater than the thickness of the planarized first insulating connection layer 303, as shown in FIG. 59B. For example, the thickness of the third channel structure 313 can be in a range between 60 nm and 80 nm, preferably about 70 nm.

Figure 60:
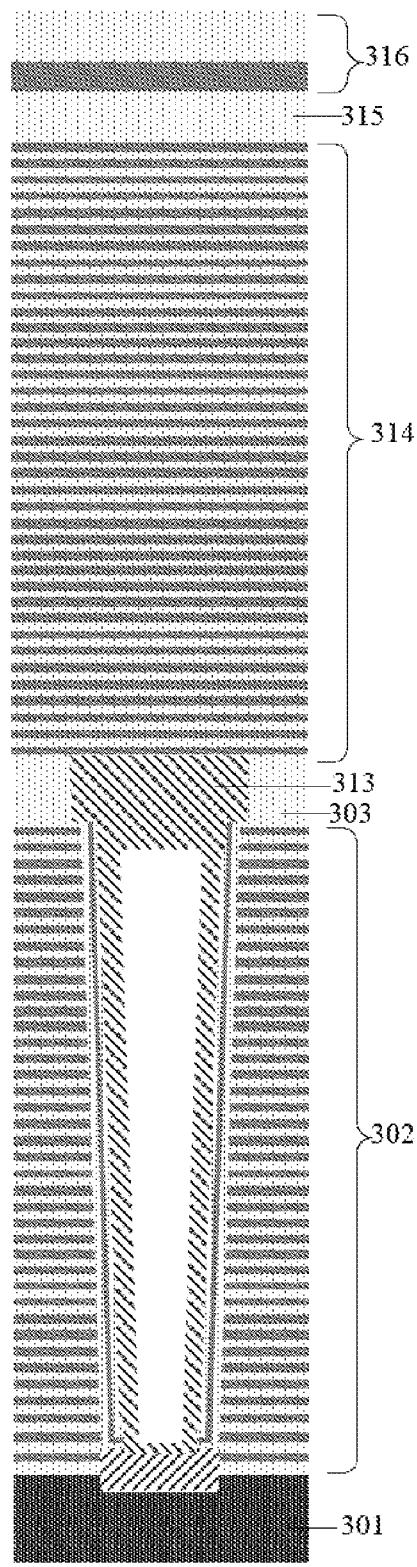

At S308, a second stacked layer 314 and a second insulating connection layer 315 can be sequentially formed on the third channel structure 313. As shown in FIG. 60, the second stacked layer 315 can include a plurality of oxide/nitride layer pairs, such as silicon oxide layer and silicon nitride layer pairs. Similar to the first stacked layer 302 as described above, the multiple oxide layers (shown in the areas with dotes) and multiple nitride layers (shown in the areas with meshes) in the second stacked layer 314 alternate in a vertical direction. The second stacked layer 314 can include any suitable number of layers of the oxide layers and the nitride layers. In some embodiments, a total number of layers of the oxide layers and the nitride layers in the second stacked layer 314 is equal to or larger than 64.

In some embodiments, the second insulating connection layer 315 can be made by any suitable insulating material and/or dielectric material, such as silicon oxide. It is noted that, the material of the second insulating connection layer 315 can be different from the material of the nitride layer in the second stacked layer 314.

Further, in some embodiments, a second mask layer 316 can be formed on the surface of the second insulating connection layer 315. The second mask layer 316 can include a nitride layer on the surface of the second insulating connection layer 315, and an oxide layer on the surface of such nitride layer.

Figure 61:
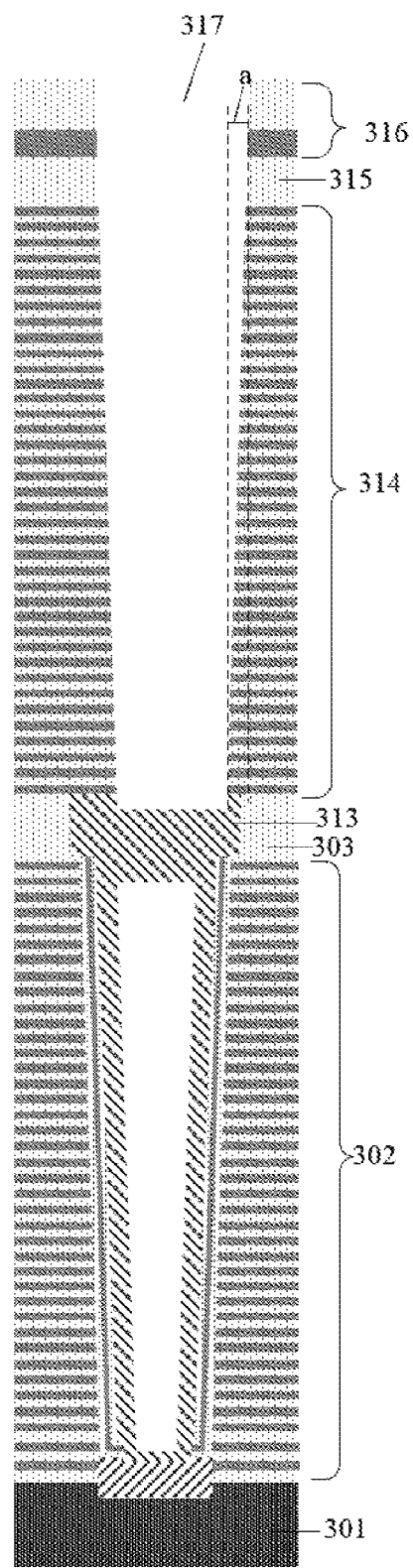

At S309, a second through hole 317 can be formed. As shown in FIG. 61, the second through hole 317 can completely penetrate the second stacked layer 314 and the second insulating connection layer 315, and can extend into the surface of the third channel structure 313. The projection of the second through hole 317 on the substrate 301 can at least partially overlap with the projection of the first through hole 305 on the substrate 301.

In some embodiments, the second stacked layer 314, the second insulating connection layer 315, the second mask layer 316, and a portion of the third channel structure 314 can be etched to form the second through hole 317. The second stacked layer 314, the second insulating connection layer 315, the second mask layer 316, and/or the third channel structure 314 can be etched by using a dry etching process, a wet etching process, or a combination thereof. A cleaning process can then be performed to clean the second through hole 317.

In some embodiments, a maximum difference between the radius of the top aperture of each second through hole 317 and the radius of the bottom aperture of the second through hole 317 can be 15 nm. That is, as shown in FIG. 61, a distance "a" between the boundary line of the top surface of the second through hole 317 and the boundary of the bottom surface of the second through hole 317 can be no more than 15 nm.

At S3010, a second functional layer can be formed on the sidewall of the second through hole 317. In some embodiments, the second functional layer can include a second tunneling layer 318, a second storage layer 319, a second barrier layer 320, and a second passivation layer 321.

Figure 62:
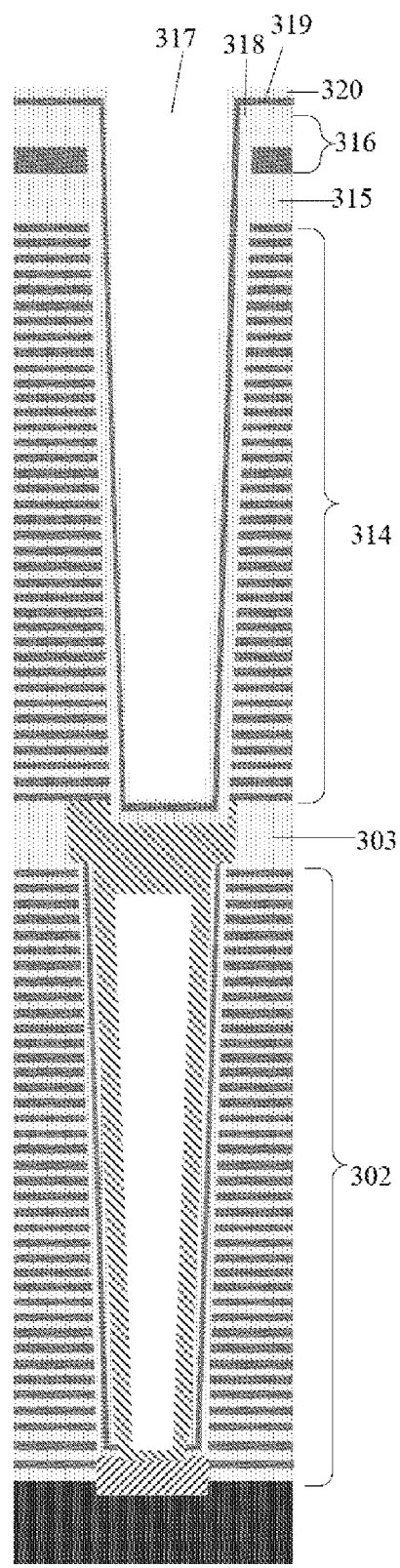

As shown in FIG. 62, the second tunneling layer 318 can be formed on the sidewall of the second through hole 317 and the surface of the second channel structure 313. The second tunneling layer 318 can be used for generating electronic charges. In some embodiments, the second tunneling layer 318 can be an oxide layer formed by using a deposition process.

The second storage layer 319 can be formed on the surface of the second tunneling layer 318. The second storage layer 319 can be used for storing electronic charges. In some embodiments, the second storage layer 319 can be a nitride layer formed by using a deposition process.

The second barrier layer 320 can be formed on the surface of the second storage layer 319. The second barrier layer 320 can be used for blocking the outflow of the electronic charges in the second storage layer 319. In some embodiments, the second barrier layer 320 can be an oxide layer formed by using a deposition process.

Figure 63:
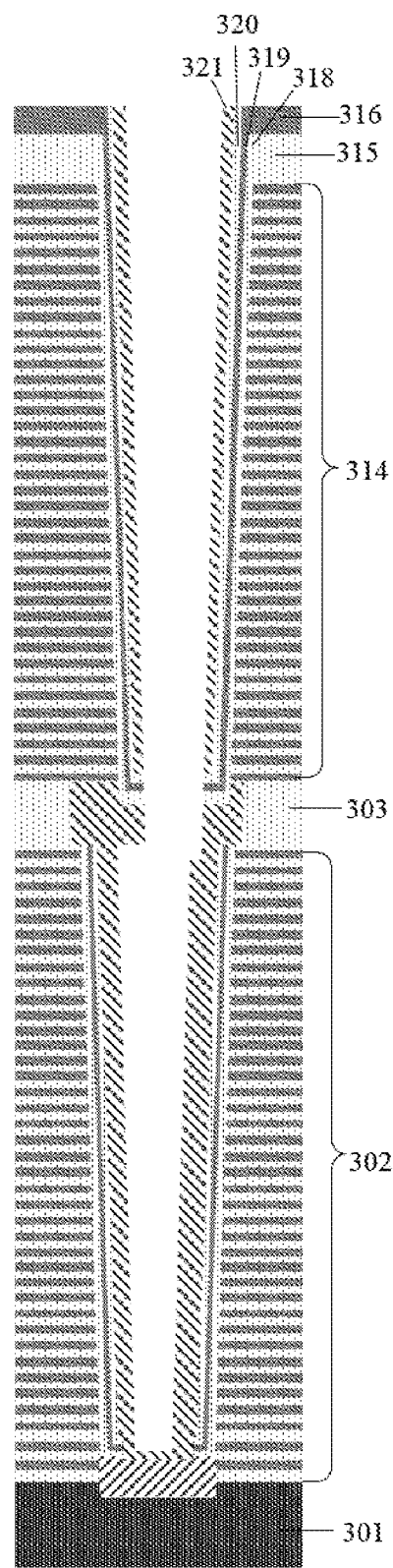

As shown in FIG. 63, a second passivation layer 321 can be formed on the surface of the second barrier layer 320. The second passivation layer 321 can be used for protecting the second barrier layer 320 from being damaged in a subsequent removal process. In some embodiments, the second passivation layer 322 can be an amorphous silicon layer formed by using a deposition process.

As shown in FIG. 63, the portions of the second passivation layer 321, the second barrier layer 320, the second storage layer 319, the second tunneling layer 318, and the third channel structure 313 that are located at the bottom of the second through hole 317 and the top of the first through hole 305 can be removed. In some embodiments, the removal process can include an etching process and a cleaning process.

In some embodiments, the portions of the second passivation layer 321, the second barrier layer 320, the second storage layer 319, the second tunneling layer 318, and the oxide layer of the second mask layer 316 that are located on the nitride layer of the second mask layer 316 can also be removed by using an etching process. As such, the second functional layer can be formed on the sidewall of the second through hole 318, and the second through hole 317 and the first through hole 305 can be interconnected with each other, as shown in FIG. 63.

Figure 64:
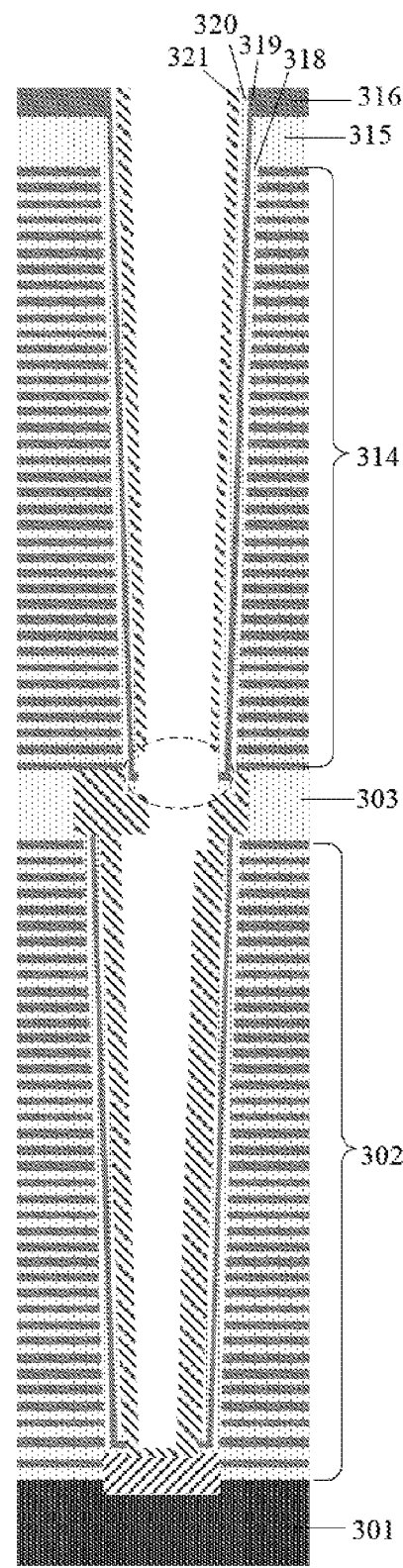

In some embodiments, the portions of the second barrier layer 320, the second storage layer 319, and the second tunneling layer 318 that are located under the second passivation layer 321, as shown in the dashed circle in FIG. 64, can also be removed by using an etching process.

Figure 65:
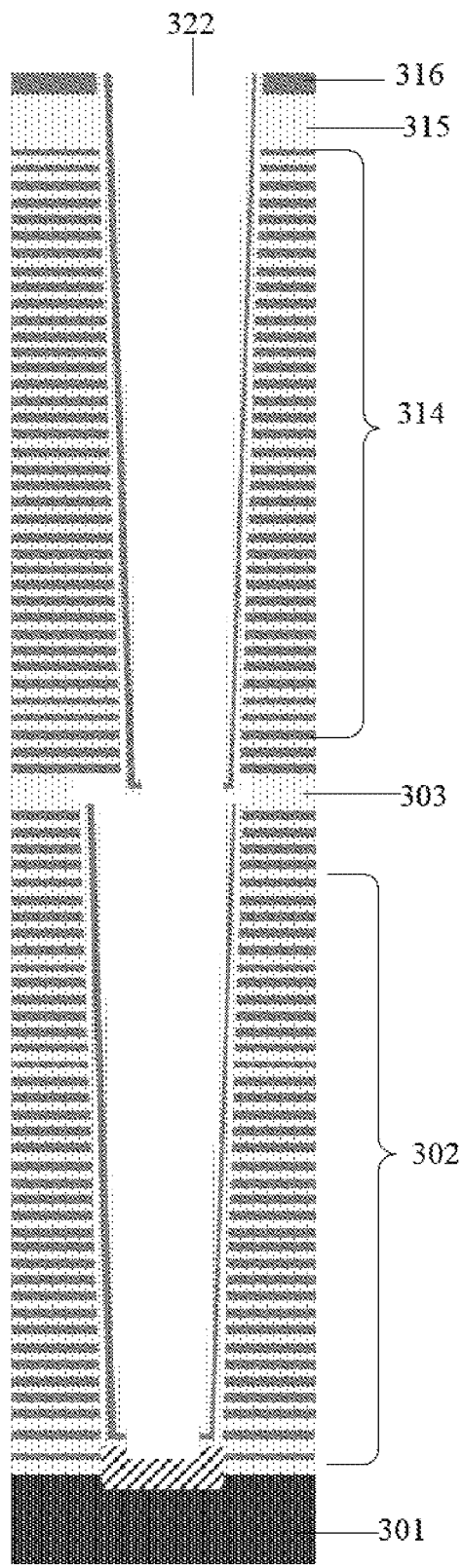

At S3011, the second tunneling structure, the third tunneling structure, the second passivation layer 321, and the first passivation layer 310 can be removed. In some embodiments, the second tunneling structure, the third tunneling structure, the second passivation layer 321, and the first passivation layer 310 can be removed by using one or more etching processes. As such, a third through hole 322 can be formed by interconnecting the first through hole and the second through hole, as shown in FIG. 65.

At S3012, a fourth channel structure and a first filling structure can be sequentially formed on the sidewall and the bottom of the third through hole 322. In some embodiments, the surface of the fourth channel structure can be higher than the surface of the first filling structure. In some embodiments, the fourth channel structure includes a joint channel structure that is sandwiched between the first stacked layer 302 and the second stacked layer 314, and covers the exposed surface of the first insulating connection layer 303.

Figure 66:
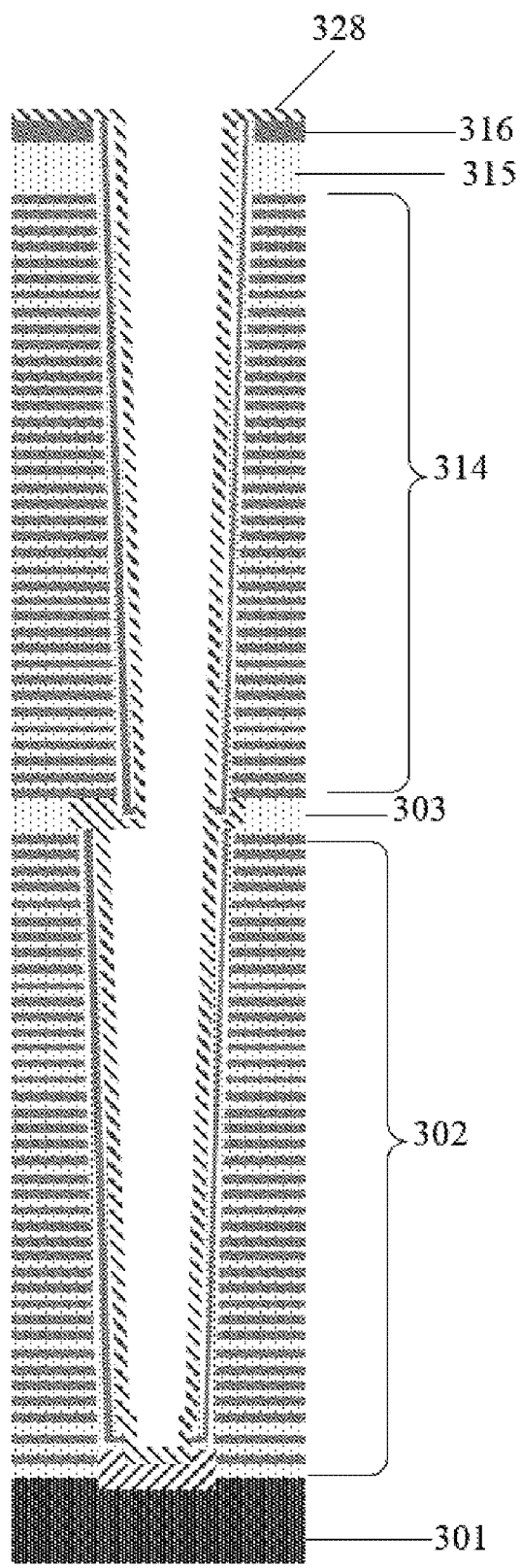

As shown in FIG. 66, a fourth channel layer 328 can be formed to cover the sidewall and bottom of the third through hole 322 and the exposed surface of the third insulating connection layer 303. In some embodiments, the fourth channel layer 323 can also cover the surface of the second insulating connection layer 315, or the surface of the nitride layer of the second mask layer 316. In some embodiments, the fourth channel layer 328 can be an amorphous silicon layer formed by using a deposition process.

Figure 67:
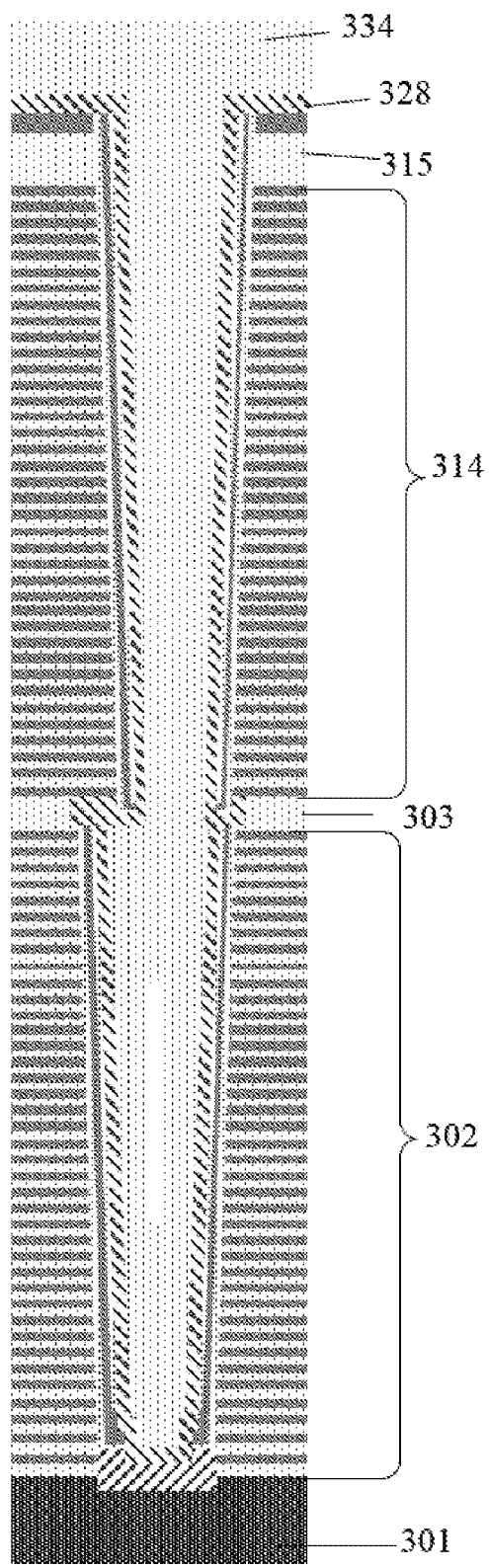

As shown in FIG. 67, a first filling layer 334 can be formed to cover the fourth channel layer 328 and to fill the third through hole 322. In some embodiments, the first filling layer 334 can be an oxide layer formed by using a deposition process.

Figure 68:
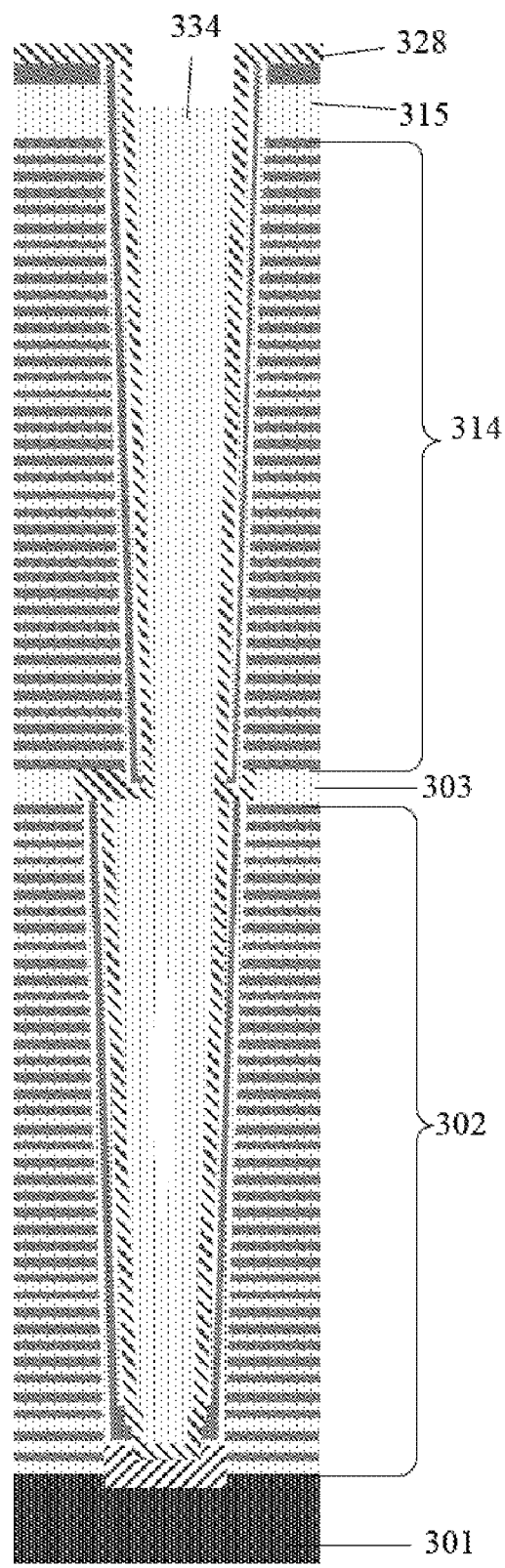

As shown in FIG. 68, a portion of the first filling layer 334 can be removed, such that the surface of the first filling layer 334 is lower than the top surface of the second insulating connection layer 315. In some embodiments, the removal process can include an etching process. The remaining portion of the second filling layer 334 in the third through hole 322 can form the second filling structure.

Figure 69:
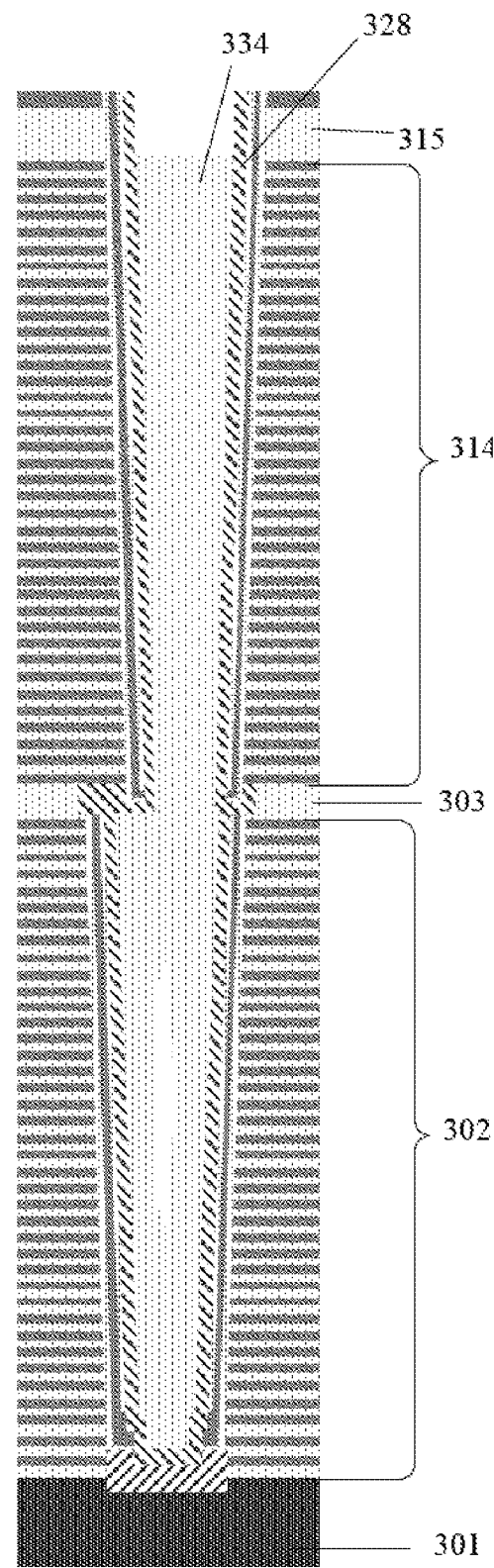

As shown in FIG. 69, the portion of the fourth channel layer 328 located on the top surface of the second insulating connection layer 315 or the top surface of the second mask layer 316 can be removed. In some embodiments, the removal process can include an etching process. The remaining portion of the fourth channel layer 328 in the third through hole 322 can form the fourth channel structure. The top surface of the fourth channel structure can be higher than the top surface of the second filling structure. As such, a second groove can be formed on the fourth channel structure and the second filling structure, and in the third through hole 322.

It is noted that, the top surface of the fourth channel structure can be higher than the top surface of the second stacked layer 314, or can be lower than the top surface of the second stacked layer 314. The top surface of the fourth channel structure is not lower than the top surface of the top oxide layer in the second stacked layer 314. In some embodiments, the top surface of the fourth channel structure can be in a same plane of the top surface of the top oxide layer in the second stacked layer 314.

Figure 70:
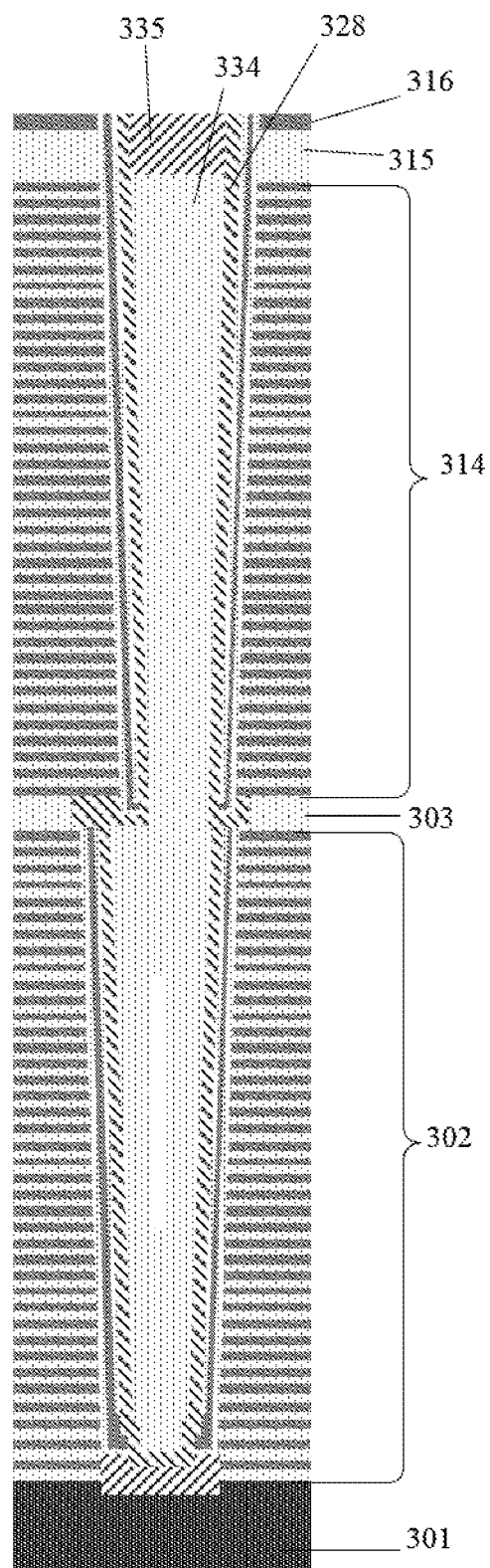

At S3013, a fifth channel structure can be formed in the second groove. The fifth channel structure can be in contact with the fourth channel structure. As shown in FIG. 70, the fifth channel structure 335 can be formed in the second groove that is on the fourth channel structure and the second filling structure and in the third through hole 322.

Figure 71:
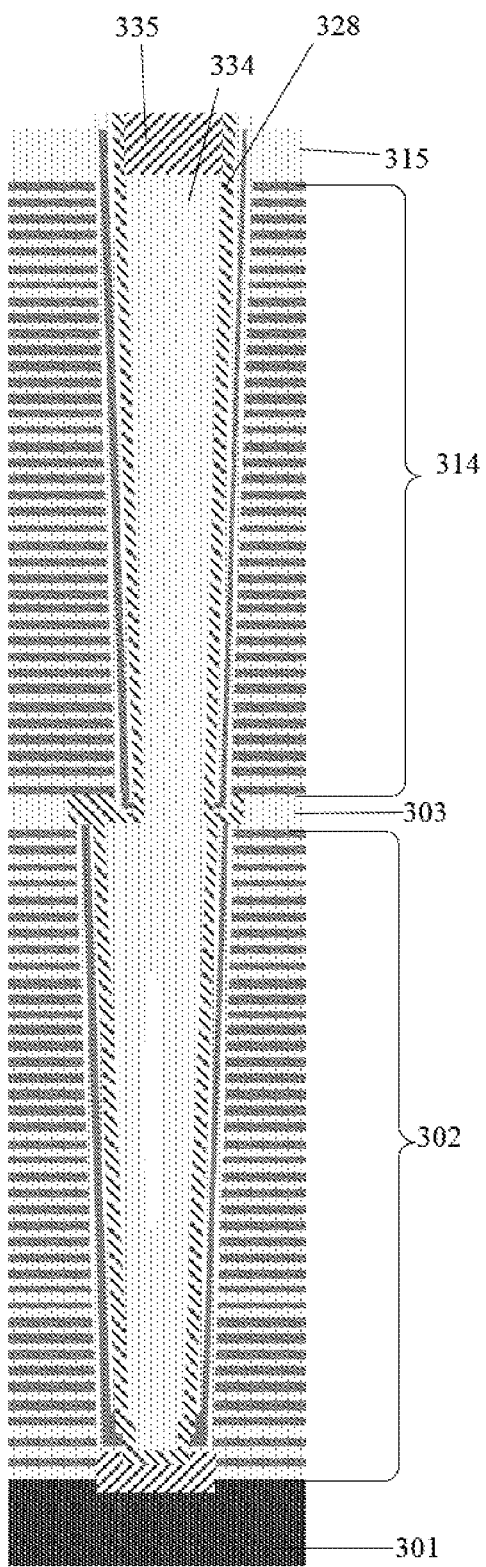
Figure 72A:
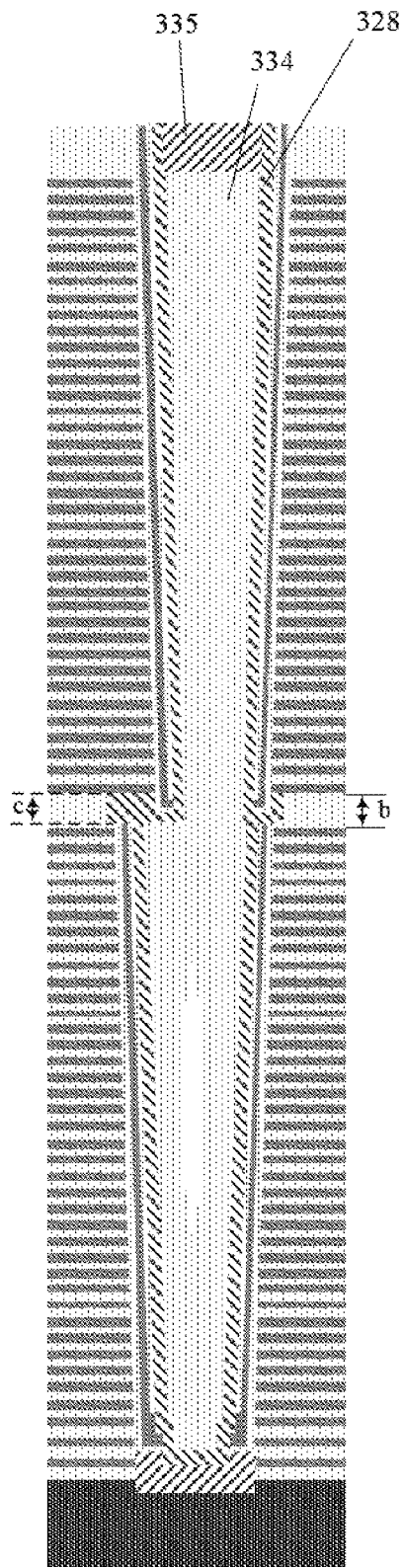
Figure 72B:
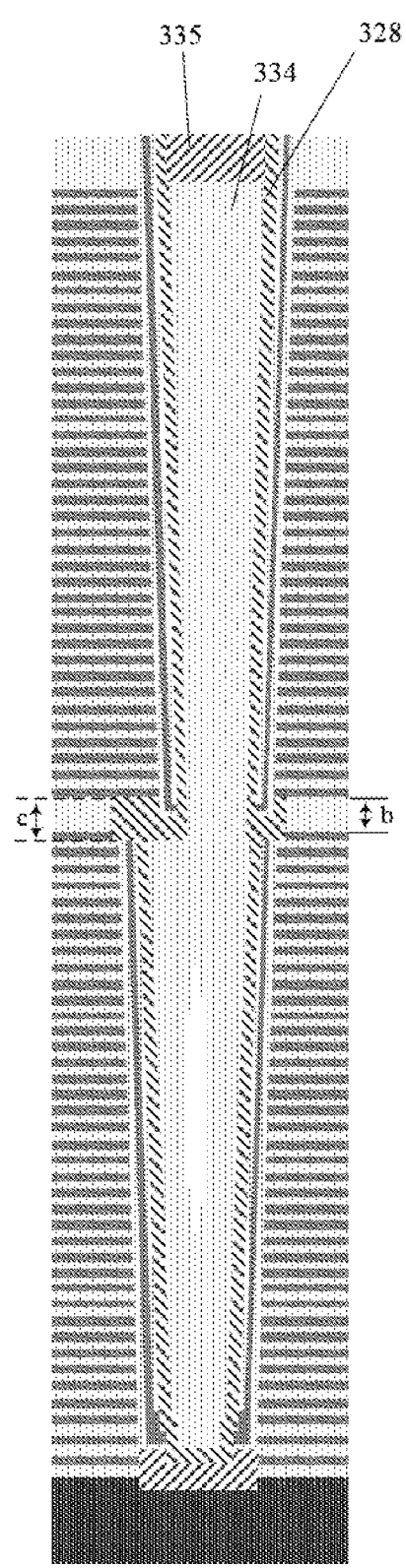

As shown in FIG. 71, the nitride layer of the second mask layer 316 can be removed by an etching process. As shown in FIGS. 72A and 72B, the top surface of the second insulating connection layer 315 and the top surface of the fifth channel structure 335 can be planarized.

Accordingly, the disclosed method as shown in FIGS. 74A and 74B can form a joint opening structure of a three-dimensional (3D) memory device by combining two through hole formation processes. As such, the formed channel hole having the joint opening structure can have a large aspect ratio and a limited top-bottom aperture error. Further, the disclosed method of forming a joint opening structure in a 3D memory device can result in an efficient process capability control, a simplified process complexity, and a reduced cost.

In some embodiments, the present disclosure also provides a three-dimensional memory device formed by using the above disclosed method as shown in FIGS. 74A and 74B. The three-dimensional memory can include the following components described below.

A first stacked layer including a plurality of oxide/nitride layer pairs, such as silicon oxide layer silicon nitride layer pairs, is formed on a substrate. A first insulating connection layer is formed on the first stacked layer. A first through hole penetrates the first stacked layer and the first insulating connection layer, and extends into the surface of the substrate. A first channel structure is formed on the surface of the substrate exposed by the first through hole. A first functional layer is formed on the sidewall of the first through hole.

A second stack layer including a plurality of oxide/nitride layer pairs, such as silicon oxide layer and silicon nitride layer pairs, is formed on the top surfaces of the first insulating connection layer. A second insulating connection layer is formed on the second stack layer. A second through hole penetrates through the second stacked layer and the second insulating connection layer, and is interconnected with the first through hole. A second functional layer is formed on the sidewall of the second through hole.

The first through hole and the second through hole constitute the third through hole. A fourth channel structure being contact with the first channel structure is formed on the sidewall and the bottom of the third through hole. A first filling structure is formed on the sidewall and the surface of the fourth channel structure to fill the third through hole. In some embodiments, an airgap is enclosed in the first filling structure. The top surface of the fourth channel structure is higher than the top surface of the first filling structure. A fifth channel structure in contact with the fourth channel structure is formed in a second groove that is surrounded by the second functional layer, and above the fourth channel structure and the first filling structure.

In some embodiments, as shown in FIG. 72A, a thickness "b" of the first insulating connection layer, which is the distance between the top nitride layer of the first stacked layer and the bottom nitride layer of the second stacked layer can be in a range between 80 nm and 100 nm, preferably about 90 nm. A thickness "c" of the third channel structure can be in a range between 50 nm and 70 nm, preferably about 60 nm.

In some alternative embodiments, as shown in FIG. 72B, a thickness "b" of the first insulating connection layer, which is the distance between the top nitride layer of the first stacked layer and the bottom nitride layer of the second stacked layer can be in a range between 20 nm and 40 nm, preferably about 30 nm. A thickness "c" of the third channel structure can be in a range between 50 nm and 70 nm, preferably about 60 nm.

Further, the error the radius of the aperture of different positions of the third through hole can be within 15 nm. That is, a difference between a maximum radius of the third through hole and a minimum radius of the third through hole is less than or equal to 15 nm. Accordingly, the disclosed channel hole having a joint opening structure can have a large aspect ratio and a limited top-bottom aperture error.

Figure 73A:
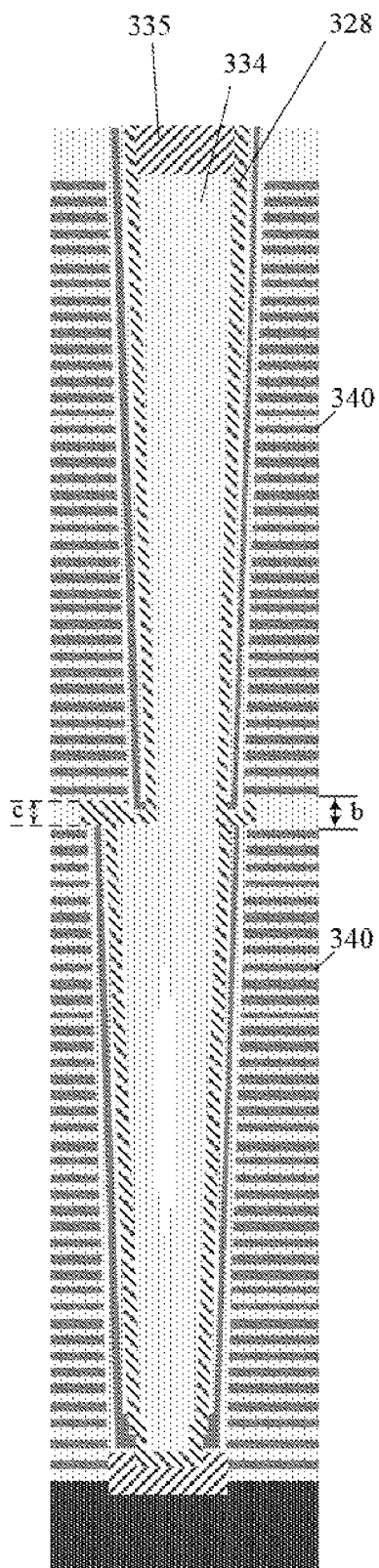
Figure 73B:
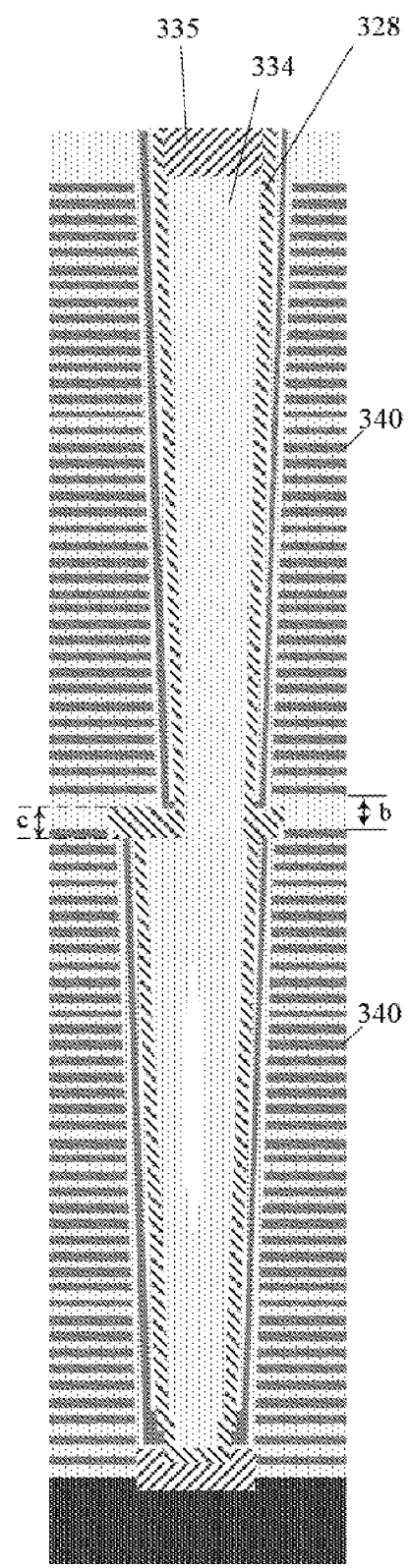

In some embodiments, a replacement process can be performed to replace each of the plurality of nitride layers in the first stacked layer 302 and the second stacked layer 314 with a conductive layer 440, as shown in FIGS. 73A and 73B. The conductive layer can include any suitable material that is electronically conductive, including, but not limited to, W, Co, Cu, Al, doped silicon, silicides, or any combination thereof.

In some embodiments, during the replacement process, a portion of the third channel structure 313 that is adjacent with the bottom nitride layer of the second stacked layer 314, or is adjacent with the top nitride layer of the first stacked layer 302 can be converted to an oxide layer by an oxidation process. That is, as shown in FIGS. 73A and 73B, a thickness "c" of the third channel structure can be reduced after the replacement process. For example, the thickness "c" of the third channel structure can be reduced to a range between 30 nm and 50 nm, preferably about 40 nm.

Figure 102A:
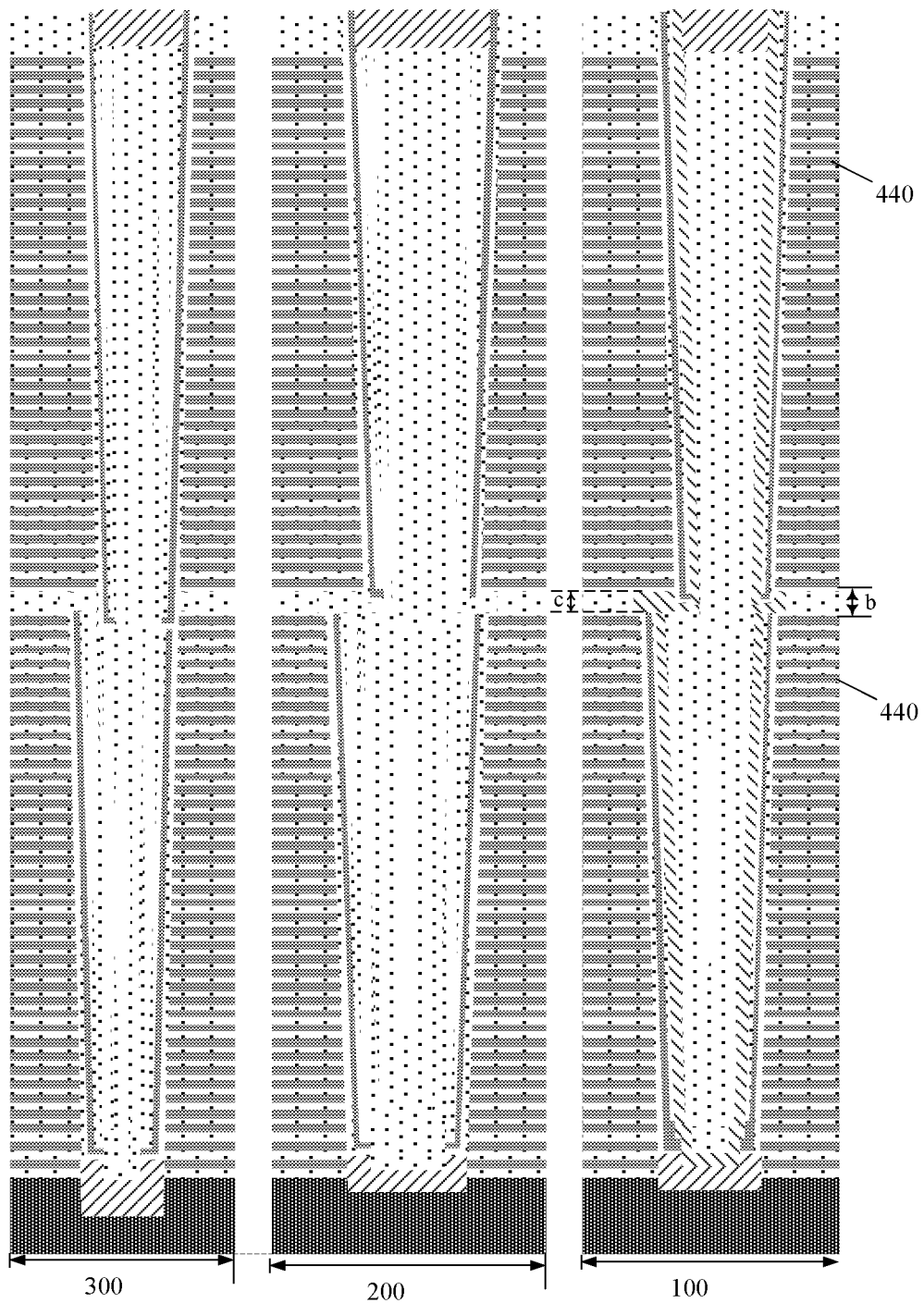
Figure 102B:
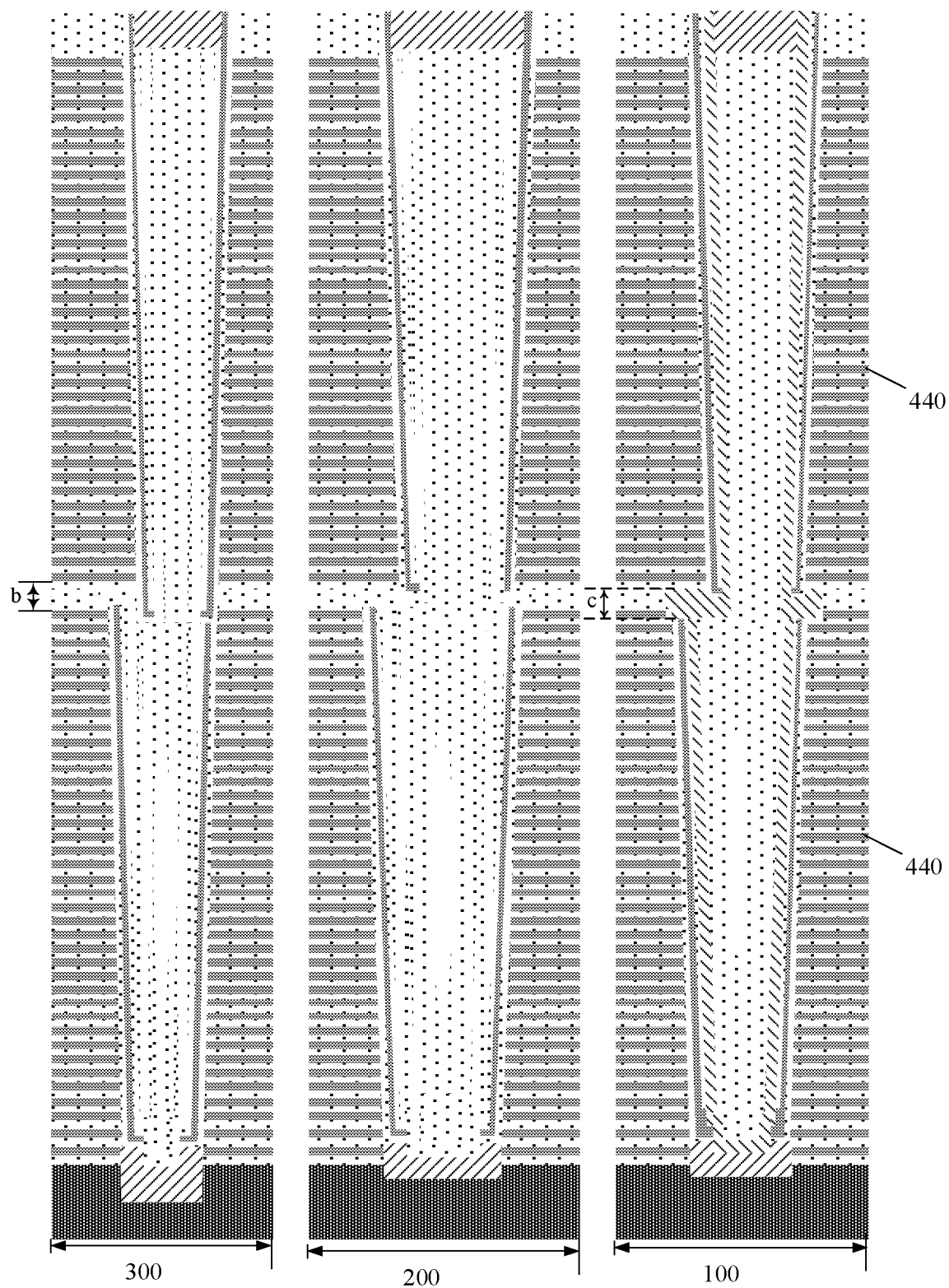
Figure 103A:
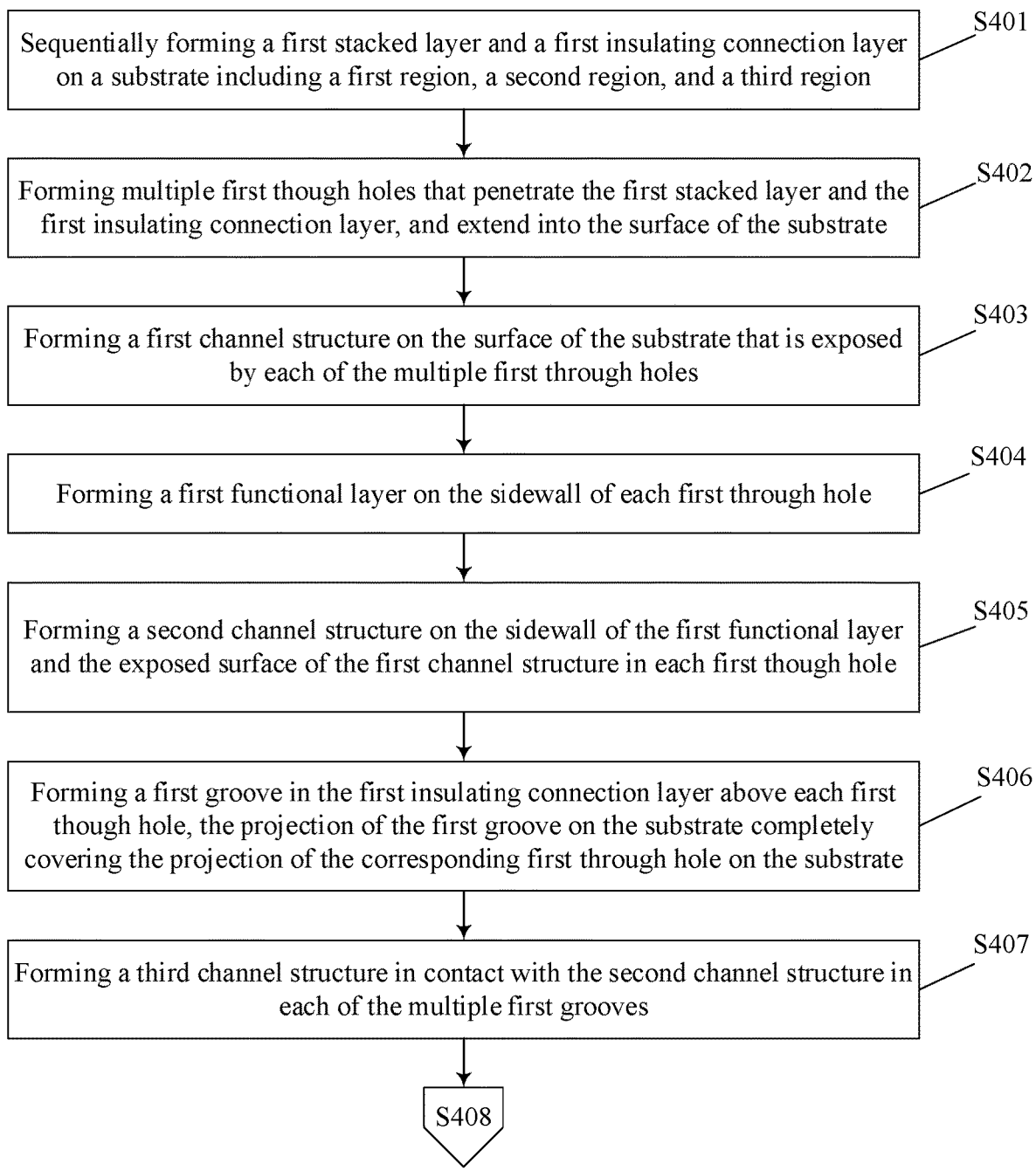
FIGS. 103A and 103B illustrate schematic flow diagrams of another exemplary fabricating process for forming a joint opening structure of three-dimensional (3D) memory device are illustrated in accordance with some embodiments of the present disclosure.
Figure 103B:
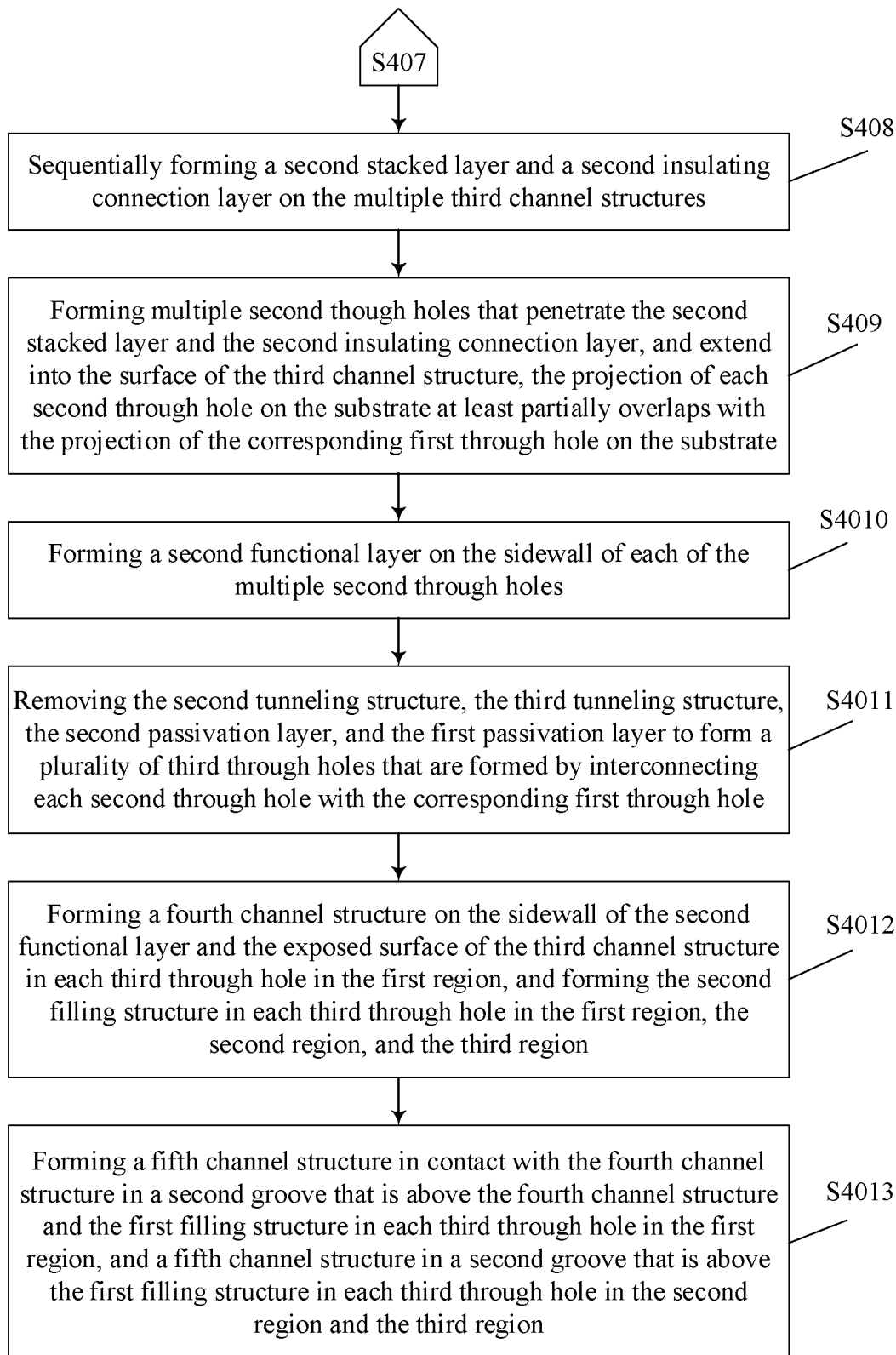

Referring to FIGS. 103A and 103B, schematic flow diagrams of another exemplary fabricating process for forming a joint opening structure of three-dimensional (3D) memory device are illustrated in accordance with some other embodiments of the present disclosure. And FIGS. 75-79, 80A, 80B, 81A, 81B, 82A, 82B, 83A, 83B, 84-100, 101A, 101B, 102A and 102B illustrate schematic structural cross-sectional diagrams of an exemplary joint opening structure of three-dimensional (3D) memory device at certain stages of the fabricating process shown in FIGS. 103A and 103B.

Figure 75:
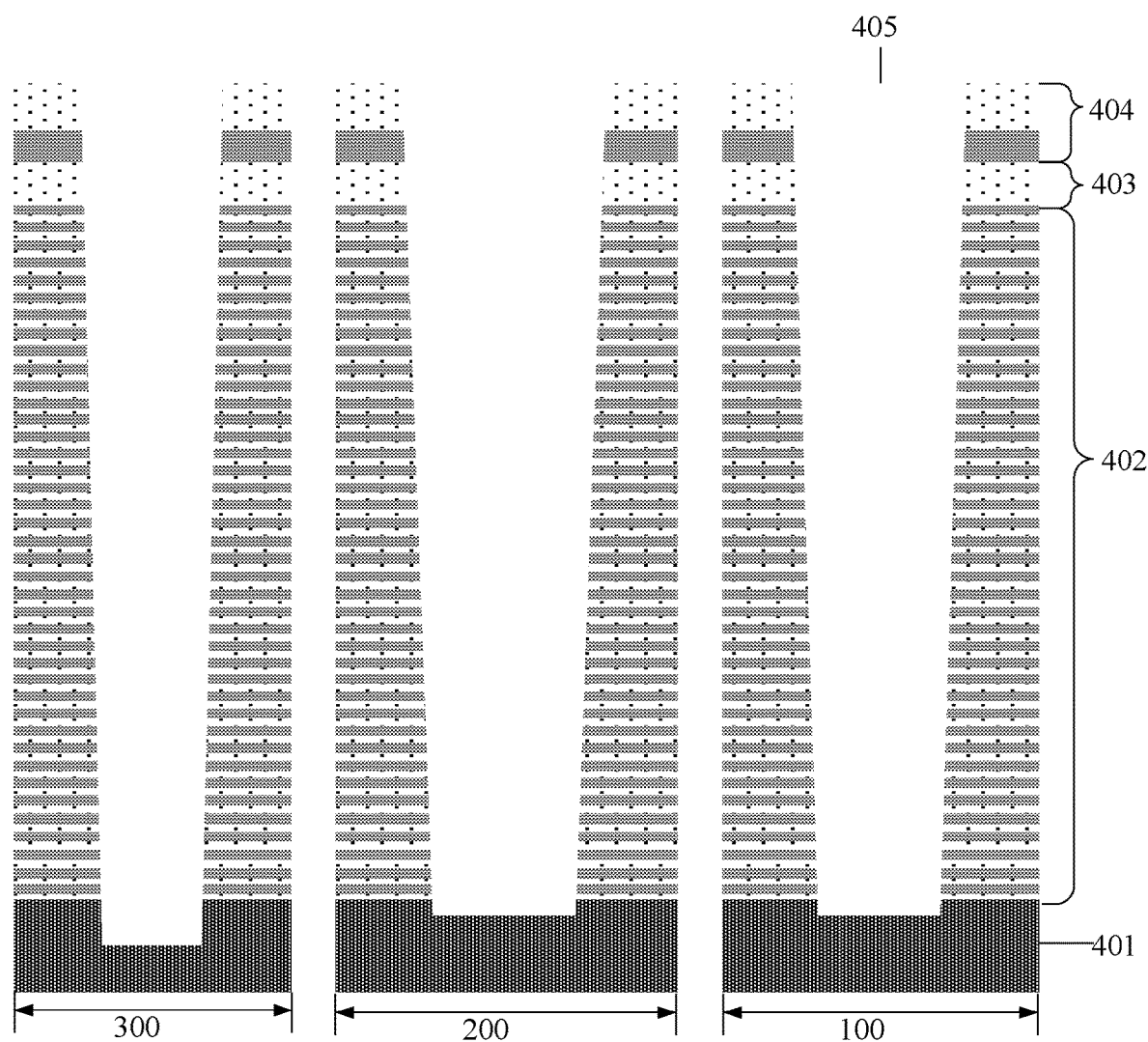
FIGS. 75-79, 80A, 80B, 81A, 81B, 82A, 82B, 83A, 83B, 84-100, 101A, 101B, 102A and 102B illustrate schematic structural cross-sectional diagrams of another exemplary joint opening structure of three-dimensional (3D) memory device at certain stages of another fabricating process in accordance with some embodiments of the present disclosure.

As shown in FIG. 103A, at S401, a first stacked layer 402 and a first insulating connection layer 403 can be sequentially formed on the surface of a substrate 401. In some embodiments, the 3D memory device can include a first region 100, a second region 200, and a third region 300, as shown in FIG. 75. The first region 100 can be used to form one or more channel holes, the second region 200 can be used to form one or more staircase structure (SS) dummy holes, while the third region 300 can be used to form one or more through array contact (TAC) barriers.

As shown in FIG. 75, the first stacked layer 402 can be formed on the substrate 401. The first stacked layer 402 can include a plurality of oxide/nitride layer pairs. That is, in the first stacked layer 402, multiple oxide layers (shown in the areas with dotes) and multiple nitride layers (shown in the areas with meshes) alternate in a vertical direction. In other words, except a top and a bottom layer of a given stack, each of the other oxide layers can be sandwiched by two adjacent nitride layers, and each nitride layer can be sandwiched by two adjacent oxide layers.

Oxide layers can each have the same thickness or have different thicknesses. For example, a thickness of each oxide layer can be in a range from 90 nm to 160 nm, preferably about 150 nm. Similarly, nitride layers can each have the same thickness or have different thicknesses. For example, a thickness of each nitride layer can be in a range from 80 nm to 110 nm, preferably about 100 nm. In some embodiments, the oxide layers can be silicon oxide layers, and the nitride layers can be silicon nitride layer.

The first stacked layer 402 can include any suitable number of layers of the oxide layers and the nitride layers. In some embodiments, a total number of layers of the oxide layers and the nitride layers in the first stacked layer 402 is equal to or larger than 64. In some embodiments, alternating conductor/dielectric stack includes more oxide layers or more nitride layers with different materials and/or thicknesses than the oxide/nitride layer pair.

The first insulating connection layer 403 can be formed on the first stacked layer 402. In some embodiments, the first insulating connection layer 403 can be made by any suitable insulating material and/or dielectric material, such as silicon oxide. It is noted that, the material of the first insulating connection layer 403 can be different from the material of the nitride layer in the first stacked layer 402.

Further, in some embodiments, a first mask layer 404 can be formed on the surface of the first insulating connection layer 403. The first mask layer 404 can include a nitride layer on the surface of the first insulating connection layer 403, and an oxide layer on the surface of such nitride layer.

In some embodiments, the first stacked layer 402, the first insulating connection layer 403, and/or the first mask layer 404 can be formed by using one or more deposition processes, such as one or more chemical vapor deposition (CVD) processes, one or more physical vapor deposition (PVD) processes, one or more atomic layer deposition (ALD) processes, and/or any suitable combinations thereof.

At S402, one or more first through holes 405 can be formed in each of the first region 100, the second region 200, and the third region 300. As shown in FIG. 75, each of the one or more first through holes 405 can completely penetrate the first stacked layer 402 and the first insulating connection layer 403, and can extend into the surface of the substrate 401. In some embodiments, when the first mask layer 404 is formed on the surface of the first insulating connection layer 403, the etching process also etch the first mask layer 404 to form the first through holes 405.

In some embodiments, the first through holes 405 can be formed by etching the first stacked layer 402 and the first insulating connection layer 403 and a subsequent cleaning process. The etching process to form the first through holes 405 can be a wet etching, a dry etching, or a combination thereof. It is noted that, in the direction perpendicular to the surface of the substrate 201, the depth of the one or more first through holes 405 in the third region 300 can be larger than the depth of the one or more first through holes 405 in the first region 100.

Figure 76:
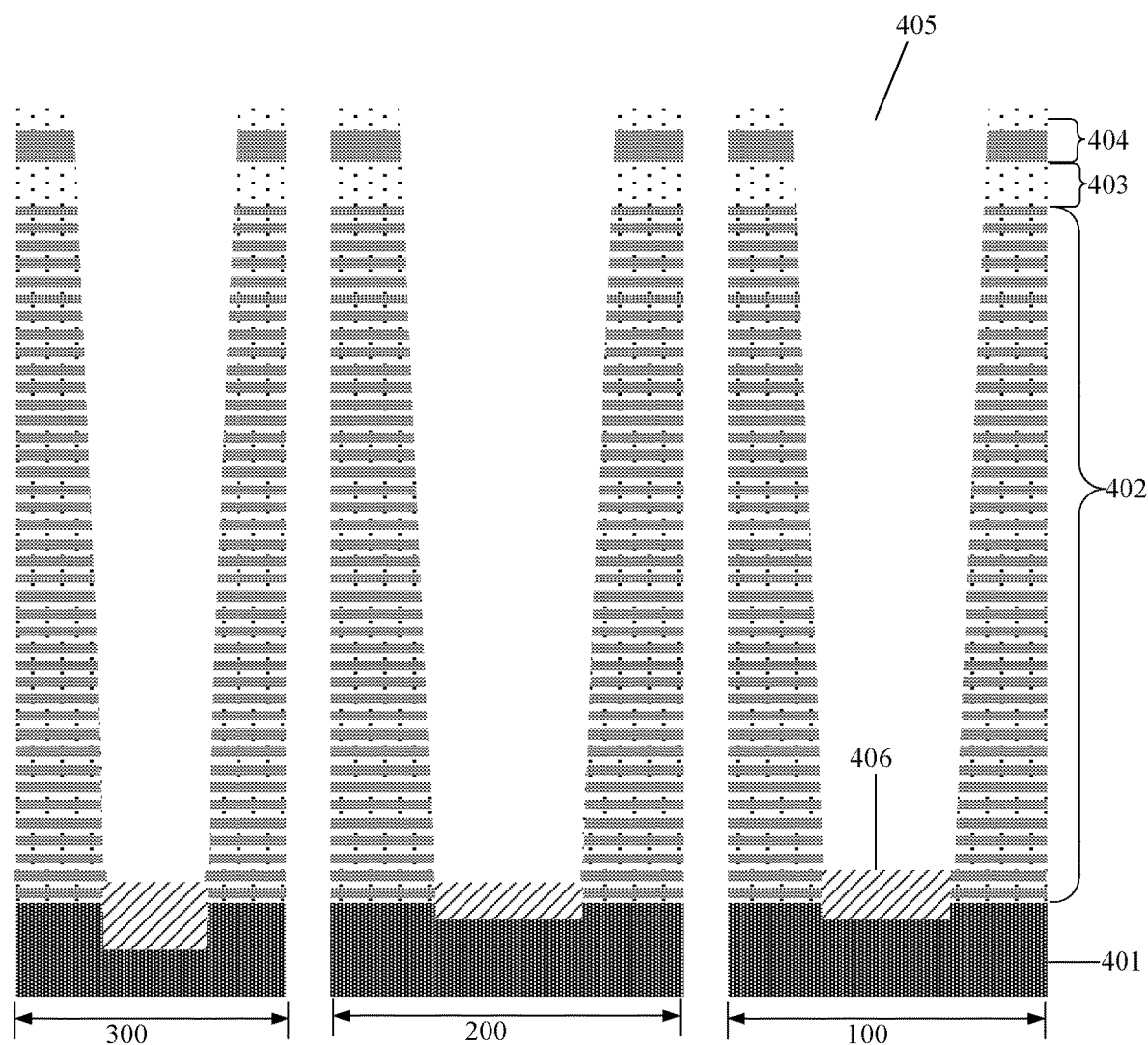

At S403, a first channel structure 406 can be formed on the surface of the substrate 401 that is exposed by each of the plurality of first through holes 405, as shown in FIG. 76. In some embodiments, the first channel structure 406 can be a polycrystalline silicon (polysilicon) layer formed by using a selective epitaxial process.

At S404, a first functional layer can be formed on the sidewall of each of the plurality of first through holes 405. The first functional layer can include a first tunneling layer 407, a first storage layer 408, a first barrier layer 409, and a first passivation layer 410.

Figure 77:
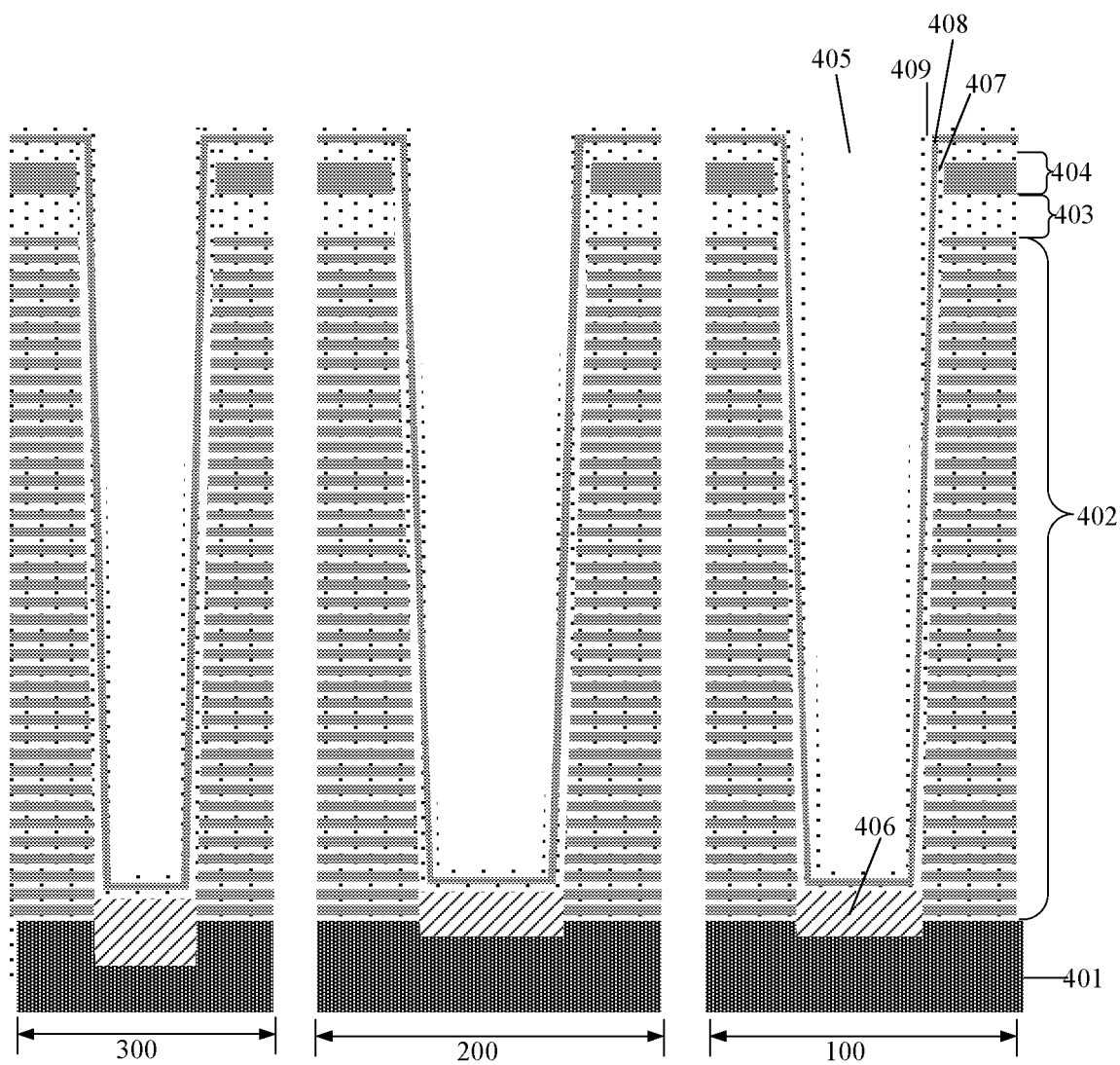

As shown in FIG. 77, the first tunneling layer 407 can be formed on the sidewall of the plurality of first through holes 405 and the exposed surfaces of the first channel structures 406. The first tunneling layer 407 can be used for generating electronic charges (electrons or holes). In some embodiments, the first tunneling layer 407 can be an oxide layer formed by using a deposition process.

The first storage layer 408 can be formed on the surface of the first tunneling layer 407. The first storage layer 408 can be used for storing electronic charges. The storage or removal of charge in the first storage layer 407 can impact the on/off state and/or a conductance of the semiconductor channel. The first storage layer 407 can include polycrystalline silicon (polysilicon) or silicon nitride. In some embodiments, the first storage layer 408 can be a nitride layer formed by using a deposition process.

The first barrier layer 409 can be formed on the surface of the first storage layer 408. The first barrier layer 409 can be used for blocking the outflow of the electronic charges stored in the first storage layer 408. In some embodiments, the first barrier layer 409 can be a silicon oxide layer or a combination of silicon oxide/silicon nitride/silicon oxide (ONO) layers. In some embodiments, the first barrier layer 409 includes high dielectric constant (high-k) dielectrics (e.g., aluminum oxide). In one example, the first barrier layer 409 is an oxide layer formed by using a deposition process.

Figure 78:
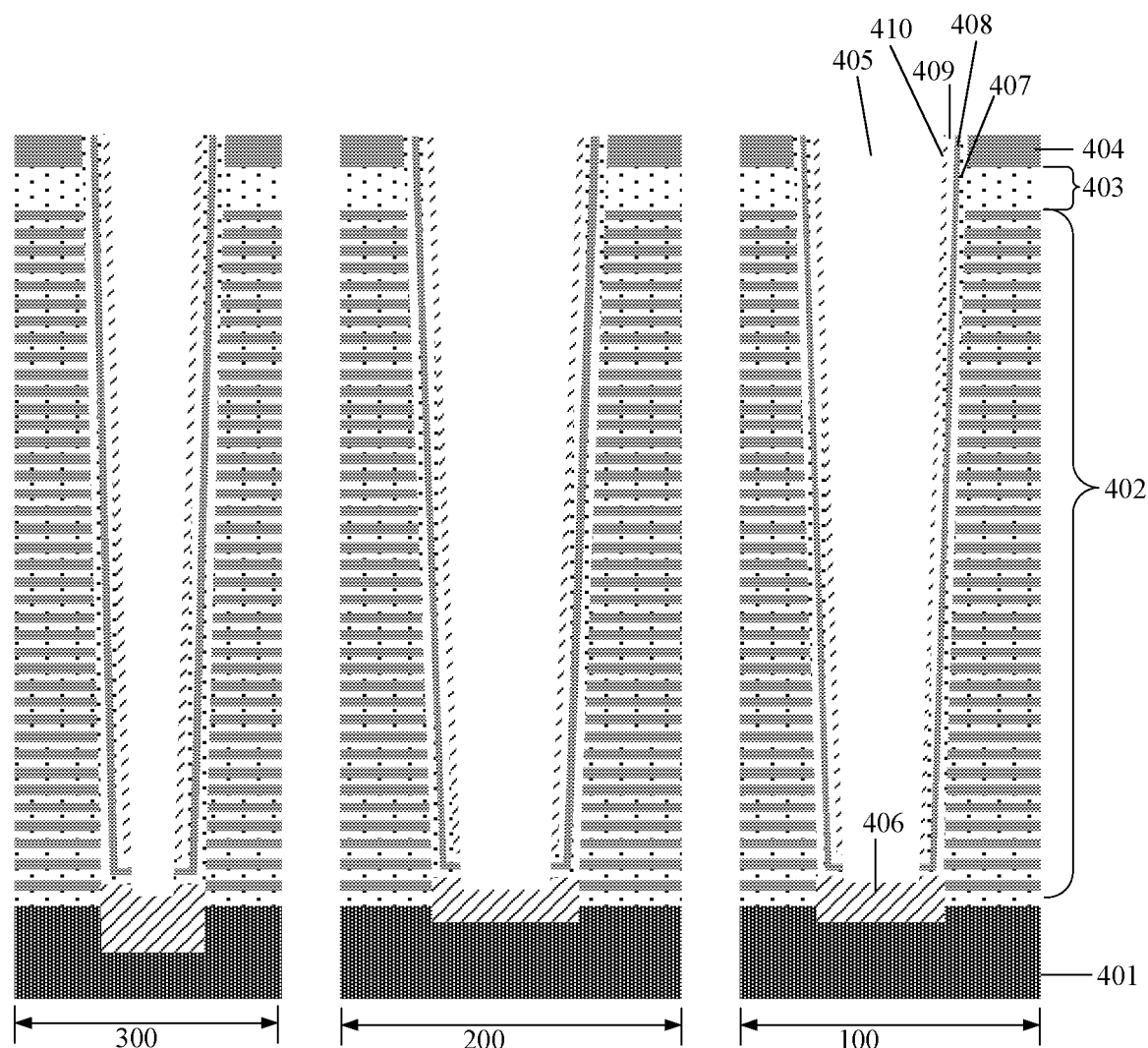

As shown in FIG. 78, a first passivation layer 410 can be formed on the surface of the first barrier layer 409. The first passivation layer 410 can be used for protecting the first barrier layer 409 from being damaged in a subsequent removal process. In some embodiments, the first passivation layer 410 can be an amorphous silicon layer formed by using a deposition process.

The portions of the first passivation layer 410, the first barrier layer 409, the first storage layer 408 and the first tunneling layer 407 located on the surfaces of the plurality of first channel structures 406 on the bottom of the plurality of first through holes 405 can be removed. In some embodiments, the removal process can include an etching process and a cleaning process. As such, the first functional layer can be formed on the sidewalls of the plurality of first through holes 405.

In some embodiment, in the same removal process, the first barrier layer 409, the first storage layer 408, the first tunneling layer 407, and the oxide layer of the first mask layer 404 located on the surface of the nitride layer of first mask layer 404 can also be removed. As such, the nitride layer of first mask layer 404 is remained on the surface of the first insulating connection layer 403.

At S405, a second channel structure can be formed on the sidewall of the first functional layer and the exposed surface of the first channel structure 406 in each of the plurality of first through holes 405. The second channel structure can be in contact with the first channel structure 406 in each first through hole 405. The surface of the second channel structure in each first through hole 405 can be lower than the top surface of the first insulating connection layer 403.

Figure 79:
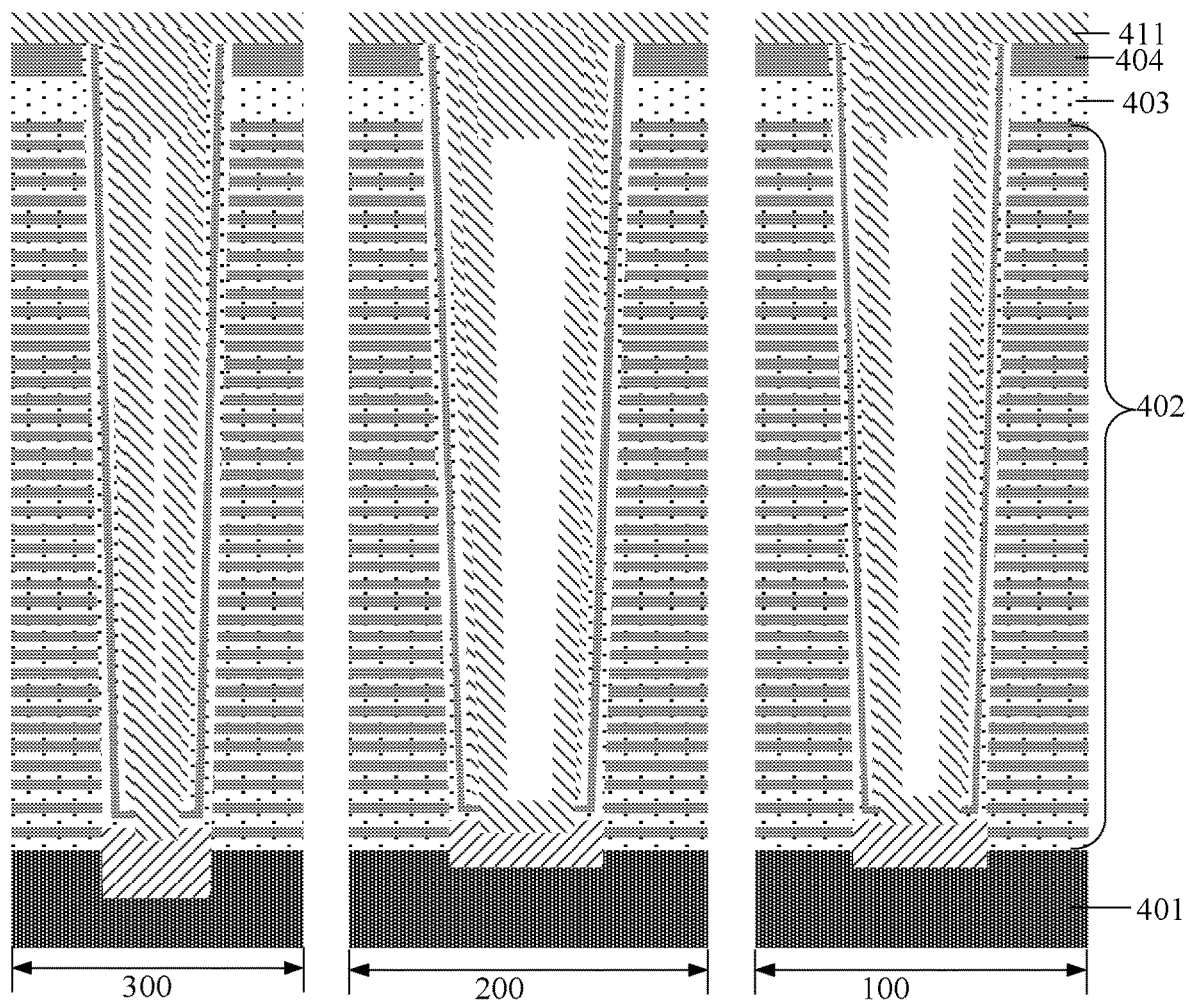

As shown in FIG. 79, a second channel layer 411 can be formed to cover the sidewalls of the first passivation layer 410 and the bottom of each of the plurality of first through holes 405. The second channel layer 411 can also cover the surface of the first insulating connection layer 403, or cover the surface of the nitride layer of the first mask layer 404. In some embodiments, the second channel layer 411 can be an amorphous silicon layer formed by using a deposition process.

Figure 80A:
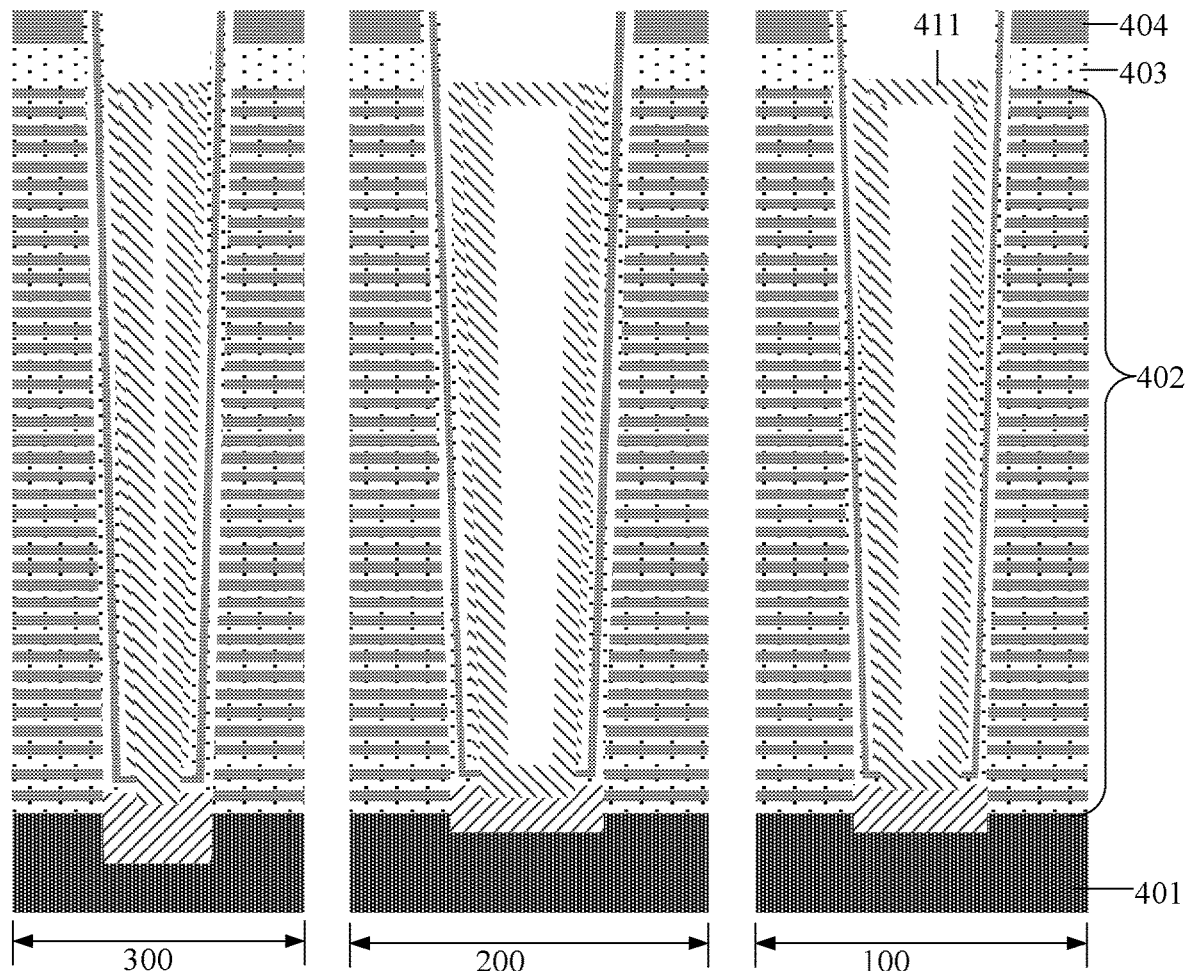
Figure 80B:
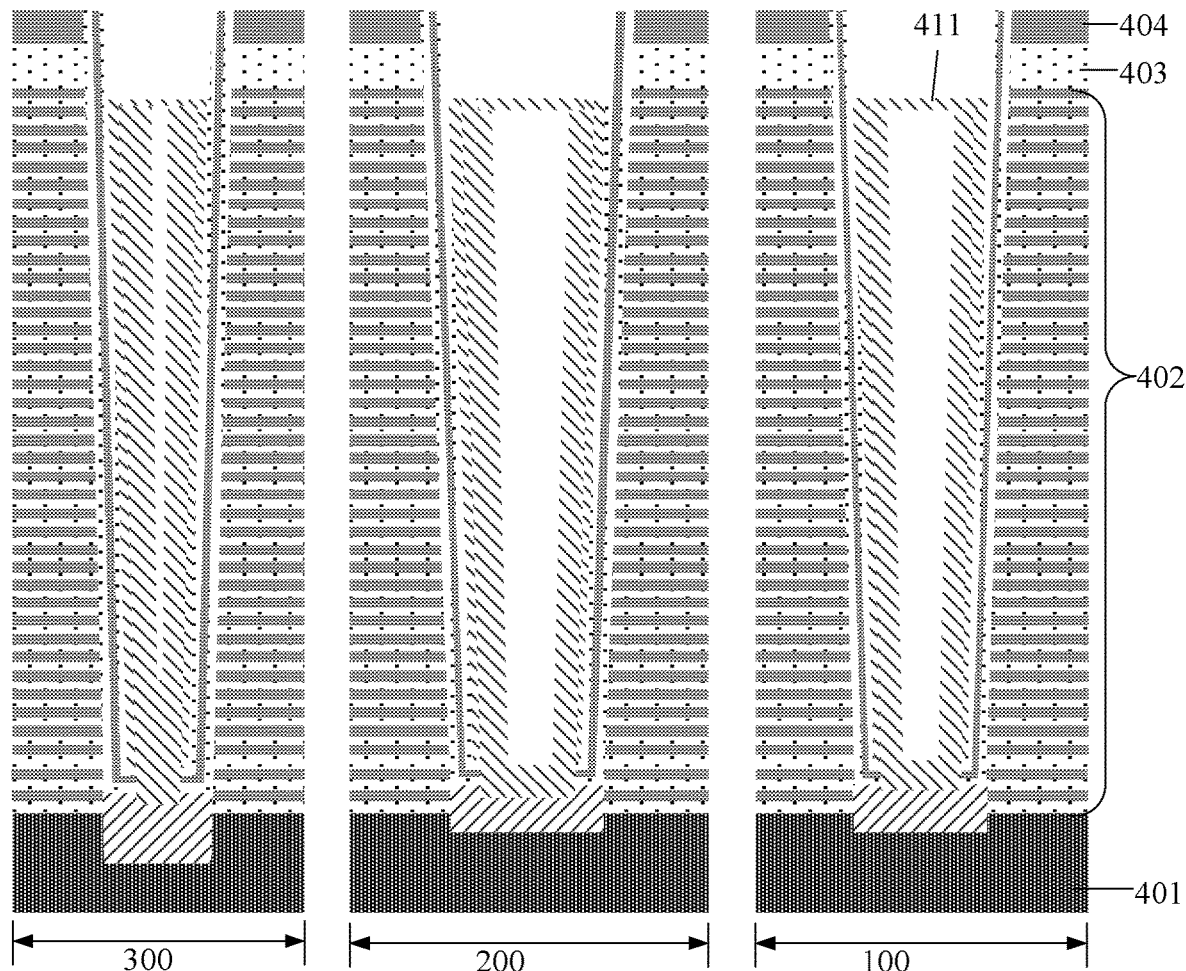

As shown in FIGS. 80A and 80B, a portion of the second channel layer 411 can be removed, such that the top surface of the second channel layer 411 can be lower than the top surface of the first insulating connection layer 403. The remaining portion of the second channel layer 411 can form the second channel structure that is in contact with the first channel structure 406. In some embodiments, the portion of the second channel layer 411 can be removed by using an etching process.

It is noted that, in various embodiments, the top surface of the second channel structure can be higher than the top surface of the first stacked layer 402 or lower than the top surface of the first stacked layer 402. However, the top surface of the second channel structure is not lower than the top surface of the top oxide layer in the first stacked layer 402. In some embodiments, the top surface of the second channel structure can be higher than the top nitride layer in the first stacked layer 402, as shown in FIG. 80A. In some alternative embodiments, the top surface of the second channel structure is in a same plane of the top surface of the top oxide layer in the first stacked layer 402, as shown in FIG. 80B.

At S406, a first groove can be formed above the first insulating connection layer 403 above each of the plurality of first through holes 405. In some embodiments, the projection of the first groove on the substrate 401 can completely cover the projection of the corresponding first through hole 405 on the substrate 401.

Figure 81A:
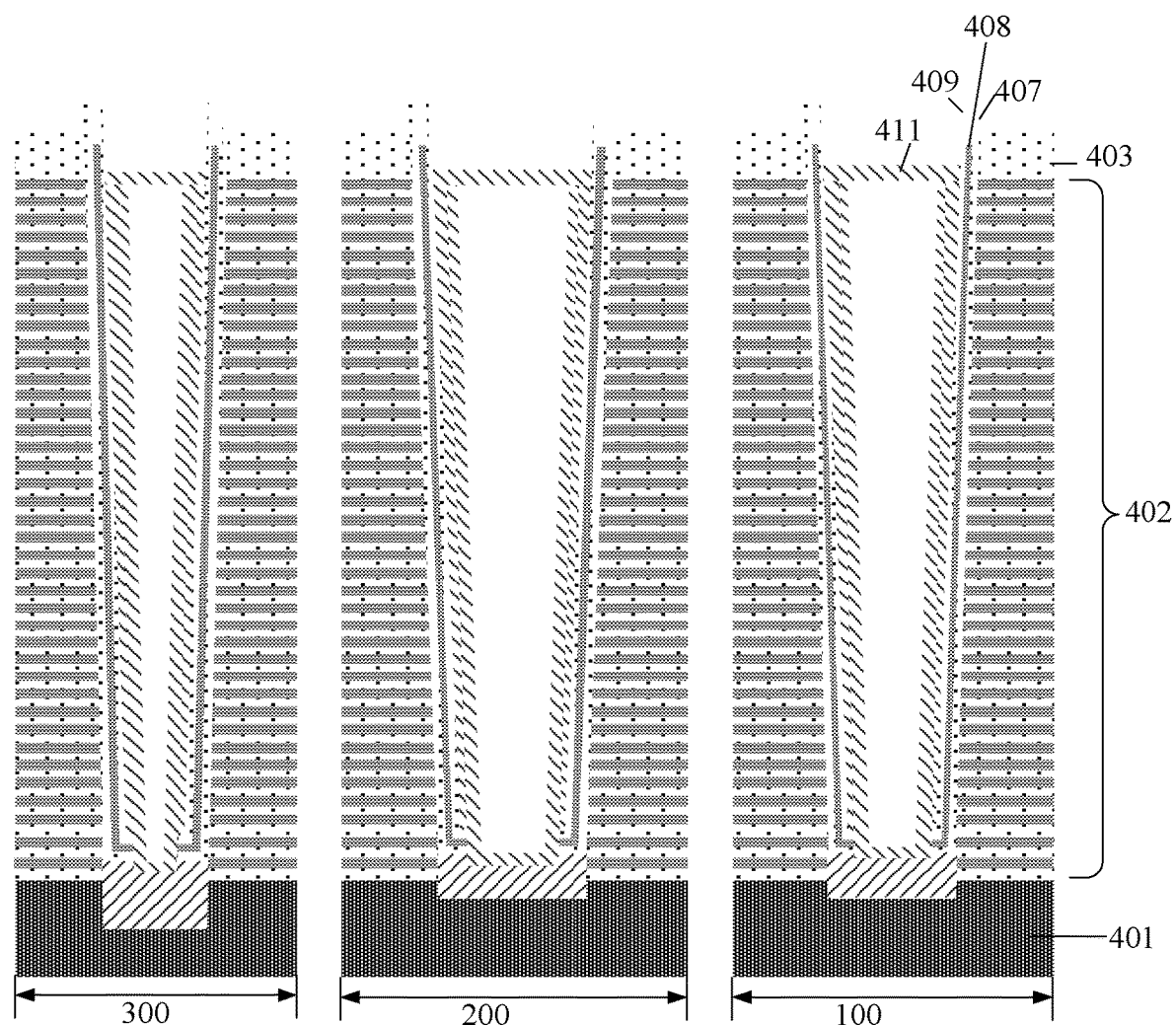
Figure 81B:
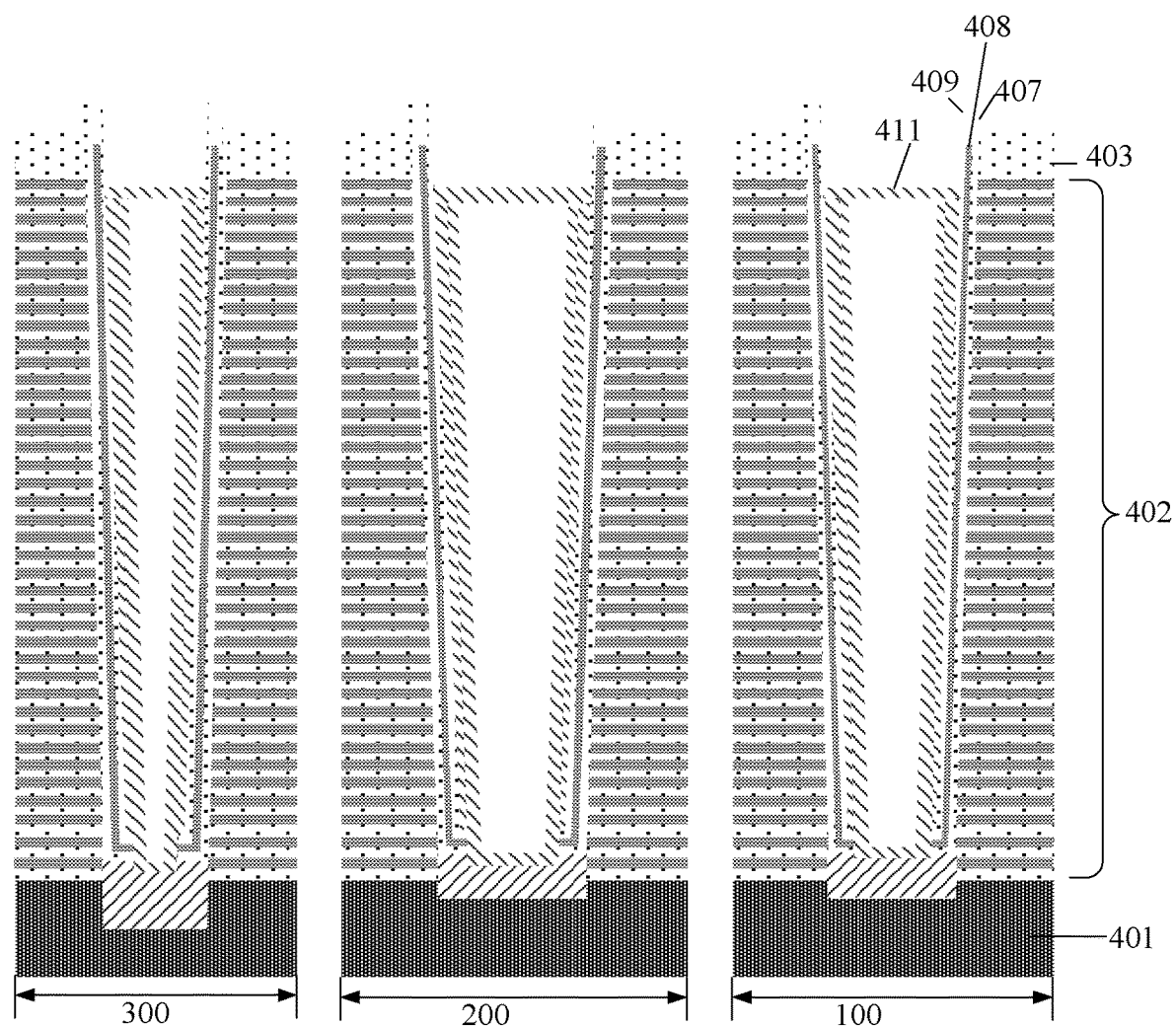

As shown in FIGS. 81A and 81B, the nitride layer of the first mask layer 404 can be removed. In some embodiments, the nitride layer of the first mask layer 404 can be removed by using an etching process.

Figure 82A:
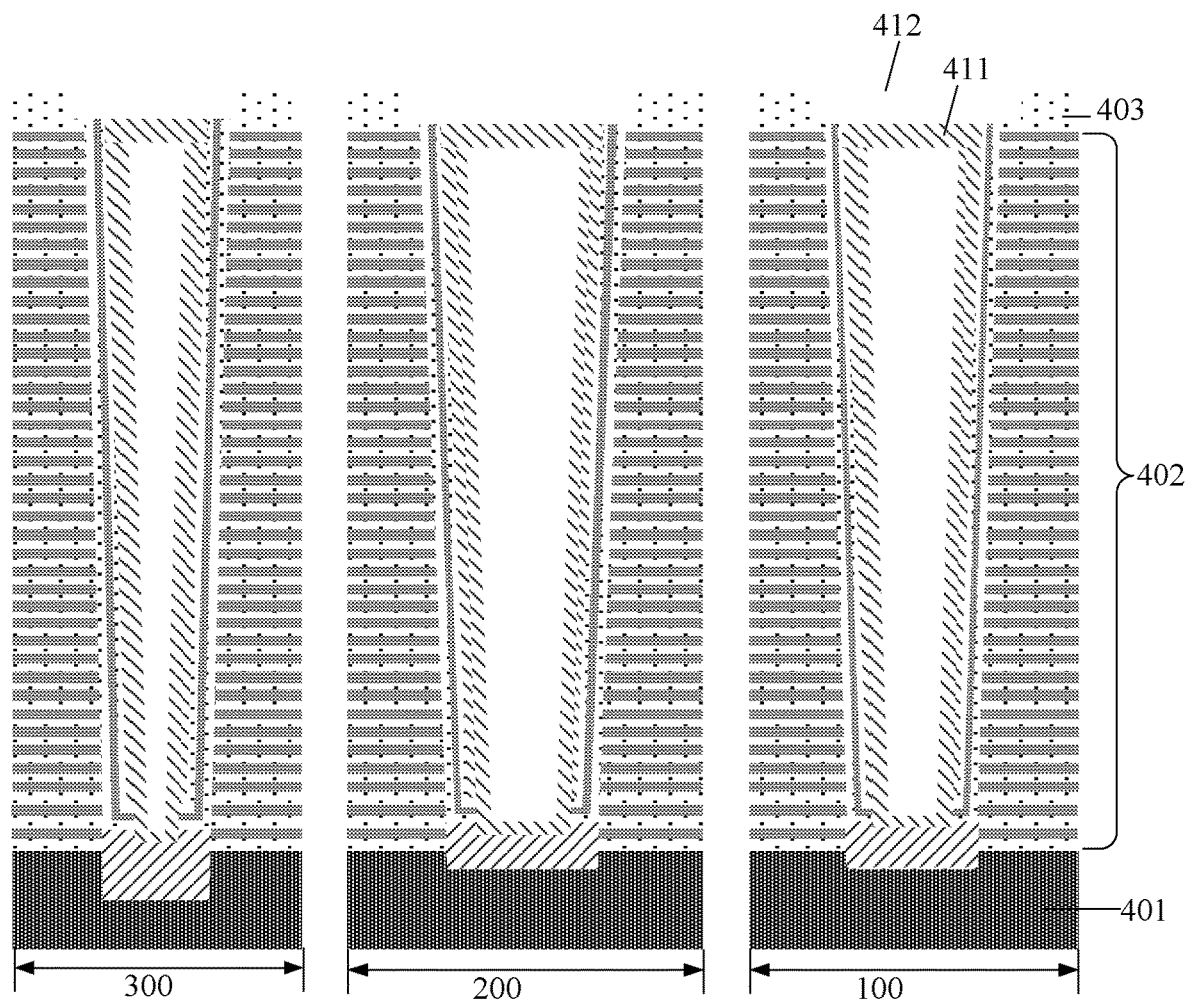
Figure 82B:
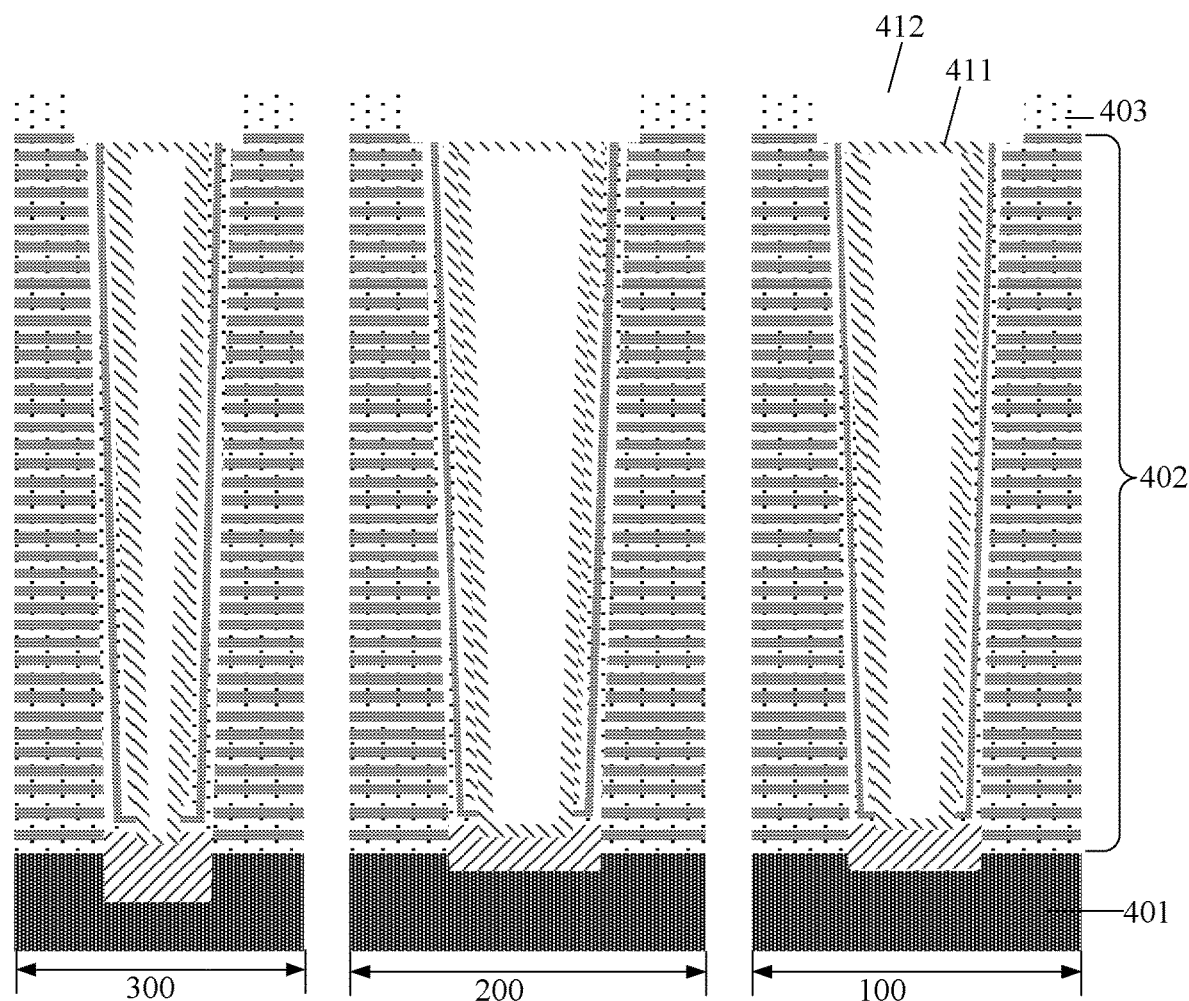

As shown in FIGS. 82A and 82B, the surface of the first insulating connection layer 403 can be planarized by any suitable techniques, such as backside grinding, and/or chemical mechanical polishing (CMP). A portion of the first insulating connection layer 403 can be removed to form a plurality of first grooves that penetrate the first insulating connection layer 403. An area of the projection of each of the plurality of first grooves on the substrate 401 can be larger than an area of the projection of each of the plurality of first through holes 405 on the substrate 401.

In some embodiments, a depth of the first groove 412 can be equal to or less than the thickness of the planarized first insulating connection layer 403, as shown in FIG. 82A. For example, the depth of the first groove 412 can be in a range between 50 nm and 70 nm. In one embodiment, the thickness of the planarized first insulating connection layer 403 is about 90 nm, while the depth of the first groove is about 60 nm.

In some alternative embodiments, the depth of the first groove 412 can be greater than the thickness of the planarized first insulating connection layer 403, as shown in FIG. 82B. That is, a portion of the top nitride layer in the first stacked layer 402 can also be removed to form the first groove. For example, the depth of the first groove 412 can be in a range between 50 nm and 70 nm. In one embodiment, the thickness of the planarized first insulating connection layer 403 is about 30 nm, while the depth of the first groove is about 60 nm.

Figure 83A:
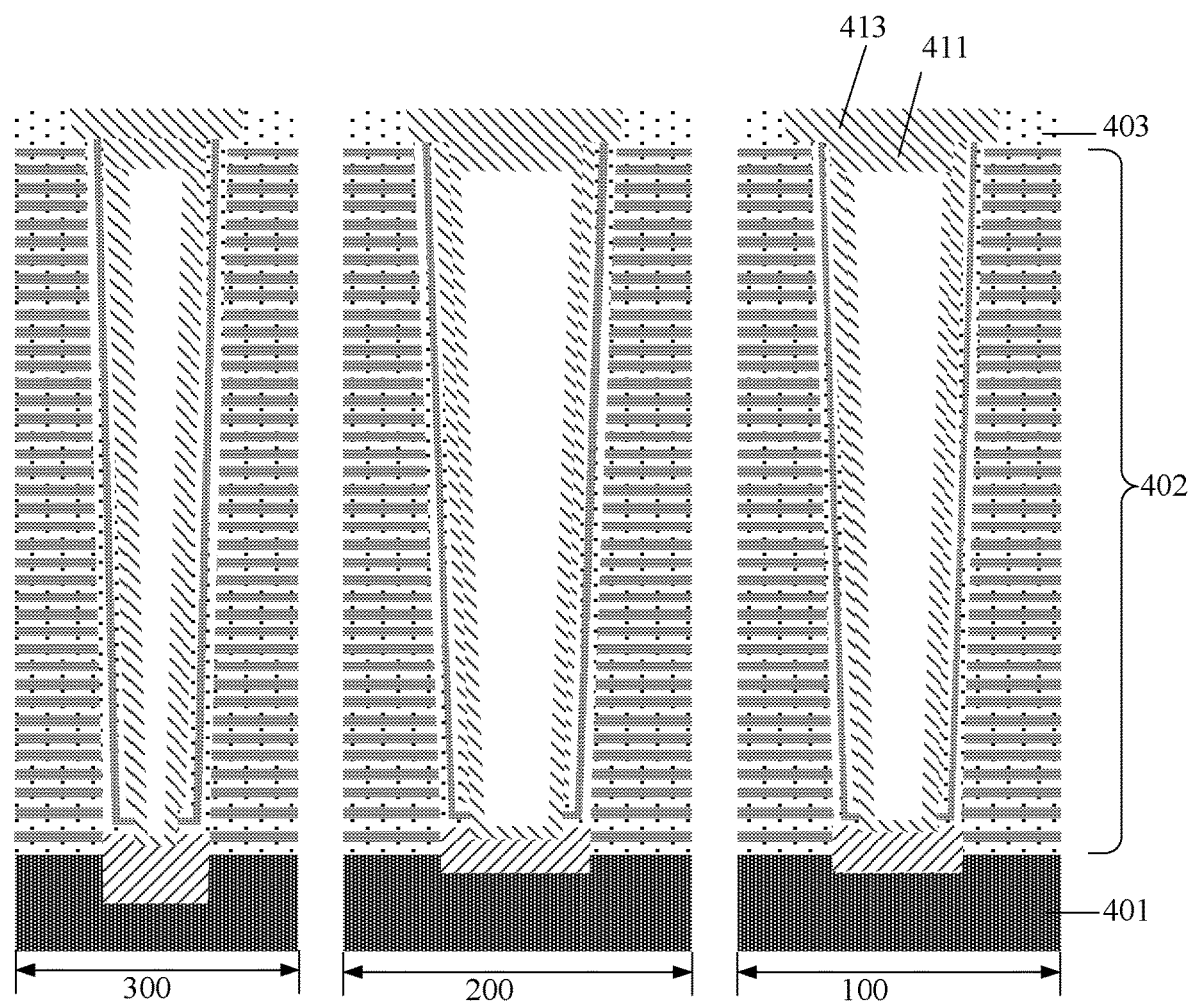
Figure 83B:
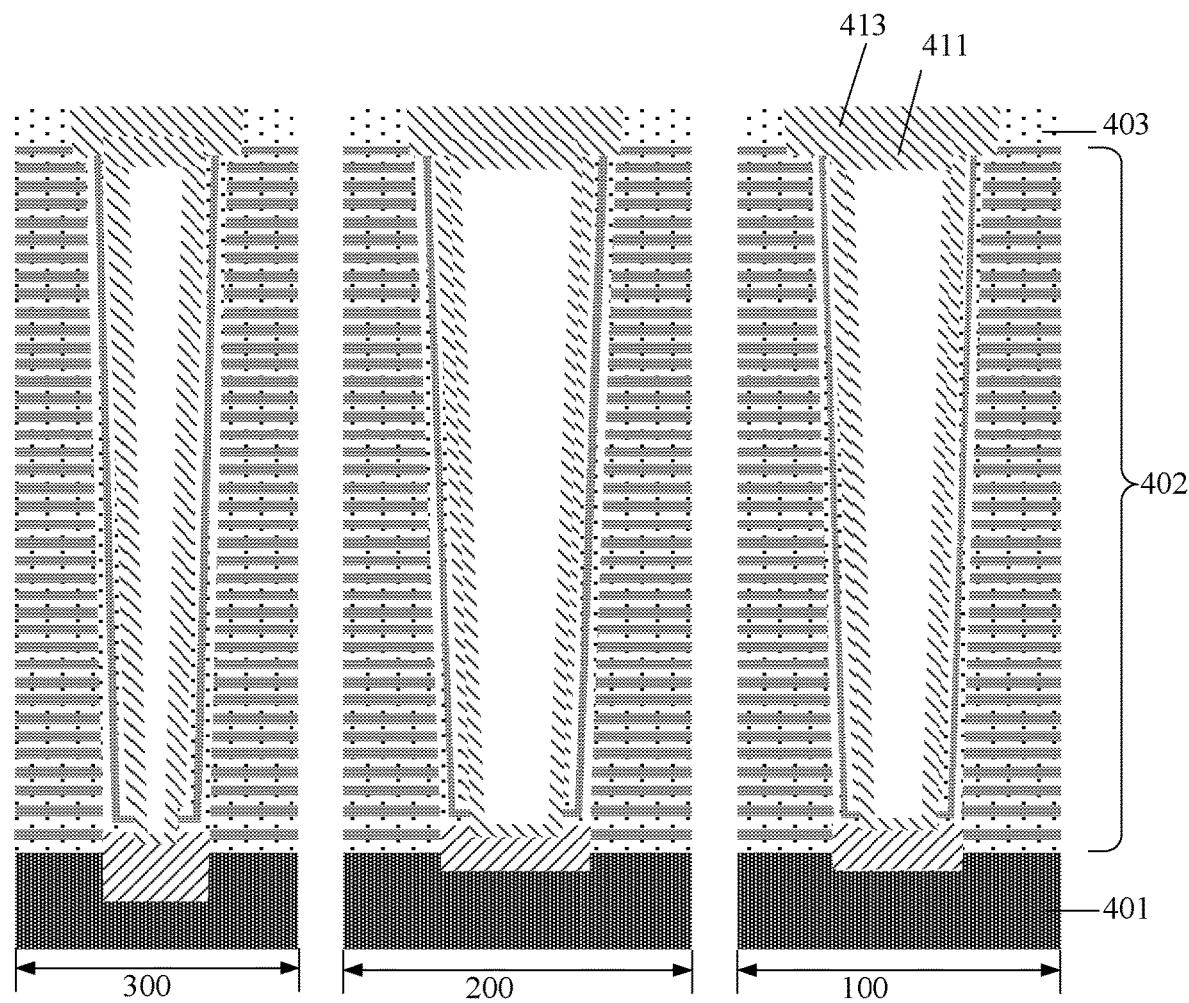

At S407, a third channel structure 413 can be formed in each of the plurality of first grooves 412. As shown in FIGS. 83A and 83B, the third channel structure 413 can be in contact with the second channel structure in each of the plurality of first through holes 405. In some embodiments, the third channel structure 413 can be a polycrystalline silicon player formed by using a deposition process.

A thickness of each third channel structure 413 can be equal to the depth of each first groove 412. As described above, in some embodiments, a thickness of each third channel structure 413 can be equal to or less than the thickness of the planarized first insulating connection layer 403, as shown in FIG. 83A. For example, the thickness of each third channel structure 413 can be in a range between 50 nm and 70 nm, preferably about 60 nm. In some alternative embodiments, the thickness of each third channel structure 413 can be greater than the thickness of the planarized first insulating connection layer 403, as shown in FIG. 83B. For example, the thickness of each third channel structure 413 can be in a range between 60 nm and 80 nm, preferably about 70 nm.

Figure 84:
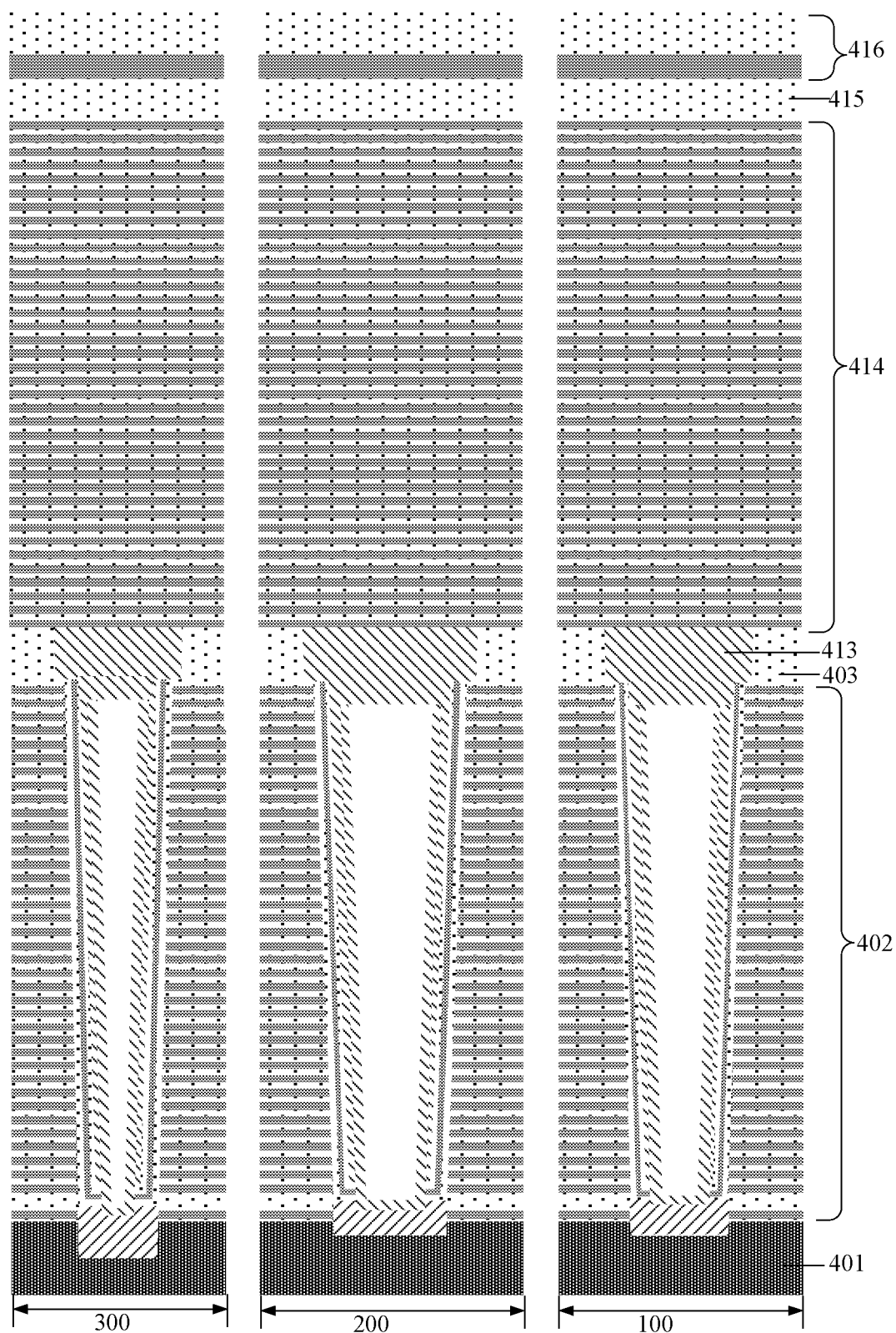

Referring to FIG. 103B, at S408, a second stacked layer 414 and a second insulating connection layer 415 can be sequentially formed on the plurality of third channel structures 413. As shown in FIG. 84, the second stacked layer 414 can include a plurality of oxide/nitride layer pairs, such as silicon oxide layers and silicon nitride layers. Similar to the first stacked layer 402 as described above, the multiple oxide layers (shown in the areas with dotes) and multiple nitride layers (shown in the areas with meshes) in the second stacked layer 414 alternate in a vertical direction. The second stacked layer 414 can include any suitable number of layers of the oxide layers and the nitride layers. In some embodiments, a total number of layers of the oxide layers and the nitride layers in the second stacked layer 414 is equal to or larger than 64.

In some embodiments, the second insulating connection layer 415 can be made by any suitable insulating material and/or dielectric material, such as silicon oxide. It is noted that, the material of the second insulating connection layer 415 can be different from the material of the nitride layer in the second stacked layer 414.

Further, in some embodiments, a second mask layer 416 can be formed on the surface of the second insulating connection layer 415. The second mask layer 416 can include a nitride layer on the surface of the second insulating connection layer 415, and an oxide layer on the surface of such nitride layer.

Figure 85:
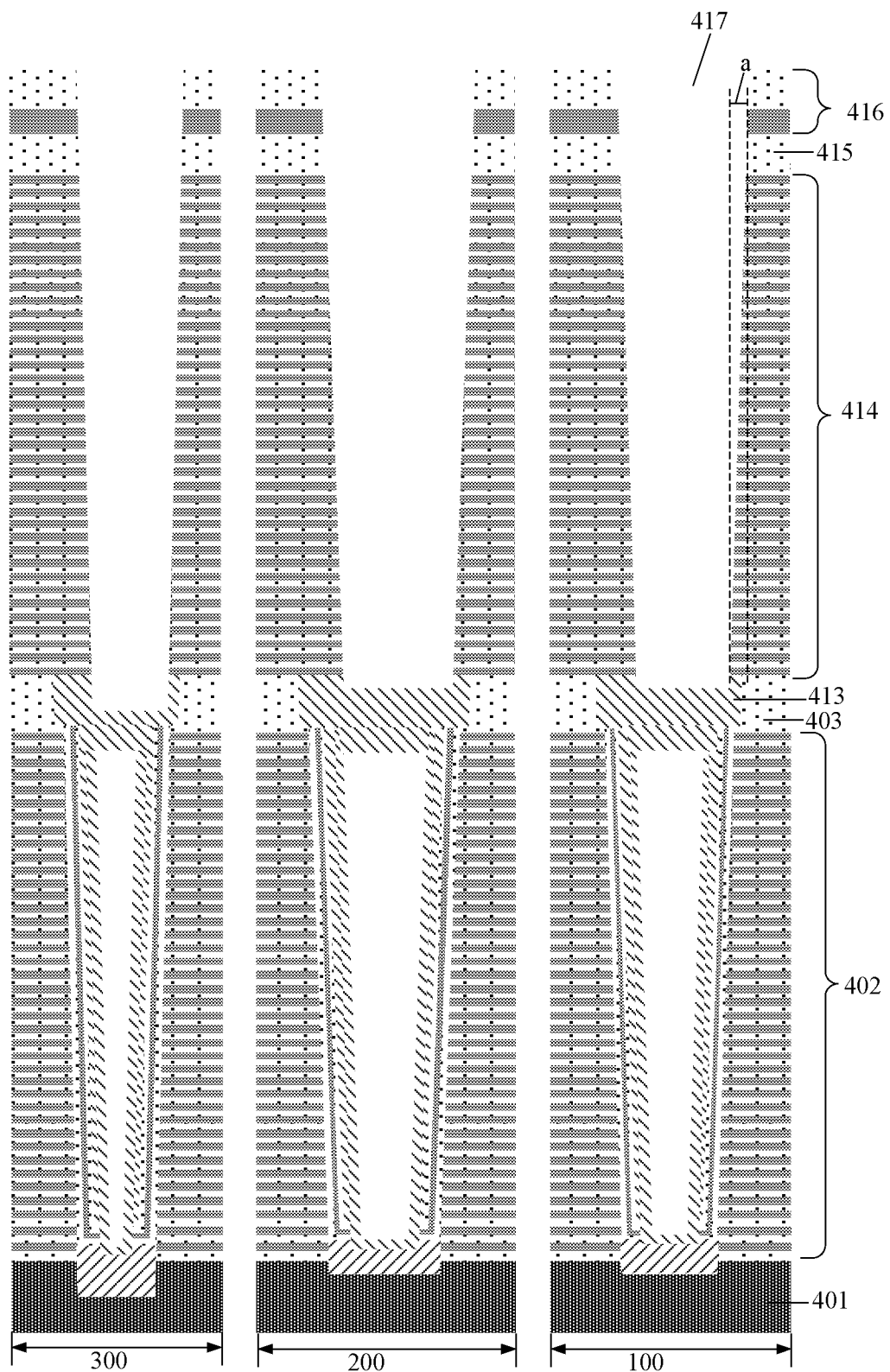

At S409, one or more second through holes 417 are formed in each of the first region 100, the second region 200, and the third region 300. As shown in FIG. 85, each of the plurality of second through holes 417 can completely penetrate the second stacked layer 414, the second insulating connection layer 415, and the second mask layer 416, and can extend into the surface of the corresponding third channel structure 413. The projection of each second through hole 417 on the substrate 401 can at least partially overlap with the projection of the corresponding first through hole 405 on the substrate 401.

In some embodiments, the second stacked layer 414, the second insulating connection layer 415, the second mask layer 416, and the third channel structures 413 can be etched to form the plurality of second through holes 417 that penetrate the second stacked layer 414 and the second insulating connection layer 415. The second stacked layer 414, the second insulating connection layer 415, the second mask layer 416, and/or the third channel structure 413 can be etched by using a dry etching process, a wet etching process, or a combination thereof. A cleaning process can then be performed to clean the plurality of second through holes 417.

It is noted that, each second through hole 417 can extend to the surface of the corresponding third channel structure 413, or can extend into the corresponding third channel structure 413. As such, a fourth channel structure formed subsequently in each second through hole 417 can directly contact the corresponding third channel structure.

In some embodiments, a maximum difference between the radius of the top aperture of each second through hole 417 and the radius of the bottom aperture of the second through hole 417 can be 15 nm. That is, as shown in FIG. 85, a distance "a" between the boundary line of the top surface of each second through hole 417 and the boundary of the bottom surface of the second through hole 417 can be no more than 15 nm.

At S4010, a second functional layer can be formed on the sidewall of each second through hole 417. In some embodiments, the second functional layer can include a second tunneling layer 418, a second storage layer 419, a second barrier layer 420, and a second passivation layer 421.

Figure 86:
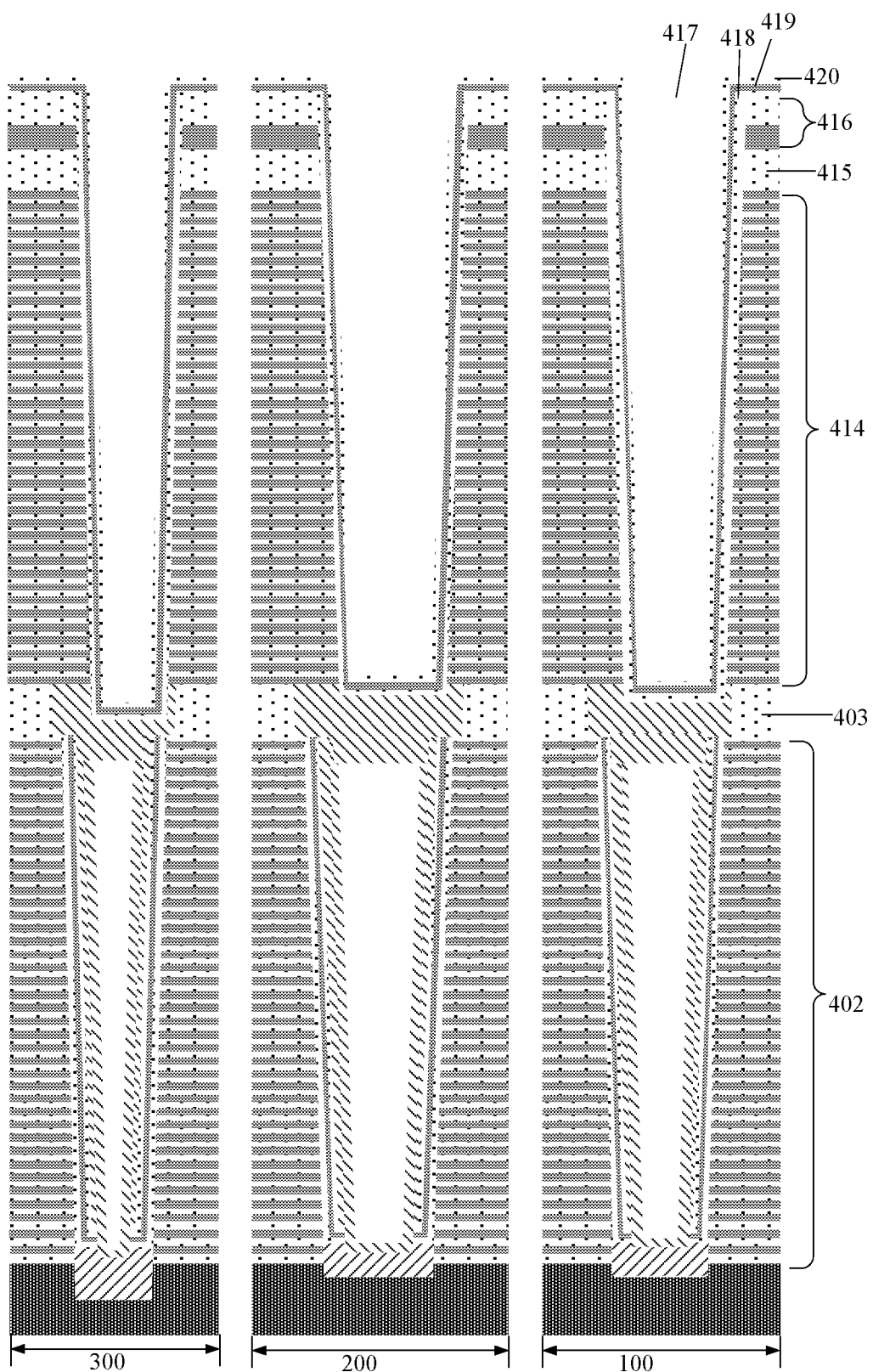

As shown in FIG. 86, the second tunneling layer 418 can be formed on the sidewall of each second through hole 417 and the surface of the corresponding third channel structure 413. The second tunneling layer 418 can be used for generating electronic charges. In some embodiments, the second tunneling layer 418 can be an oxide layer formed by using a deposition process.

The second storage layer 419 can be formed on the surface of the second tunneling layer 418. The second storage layer 419 can be used for storing electronic charges. In some embodiments, the second storage layer 419 can be a nitride layer formed by using a deposition process.

The second barrier layer 420 can be formed on the surface of the second storage layer 419. The second barrier layer 420 can be used for blocking the outflow of the electronic charges in the second storage layer 419. In some embodiments, the second barrier layer 420 can be an oxide layer formed by using a deposition process.

Figure 87:
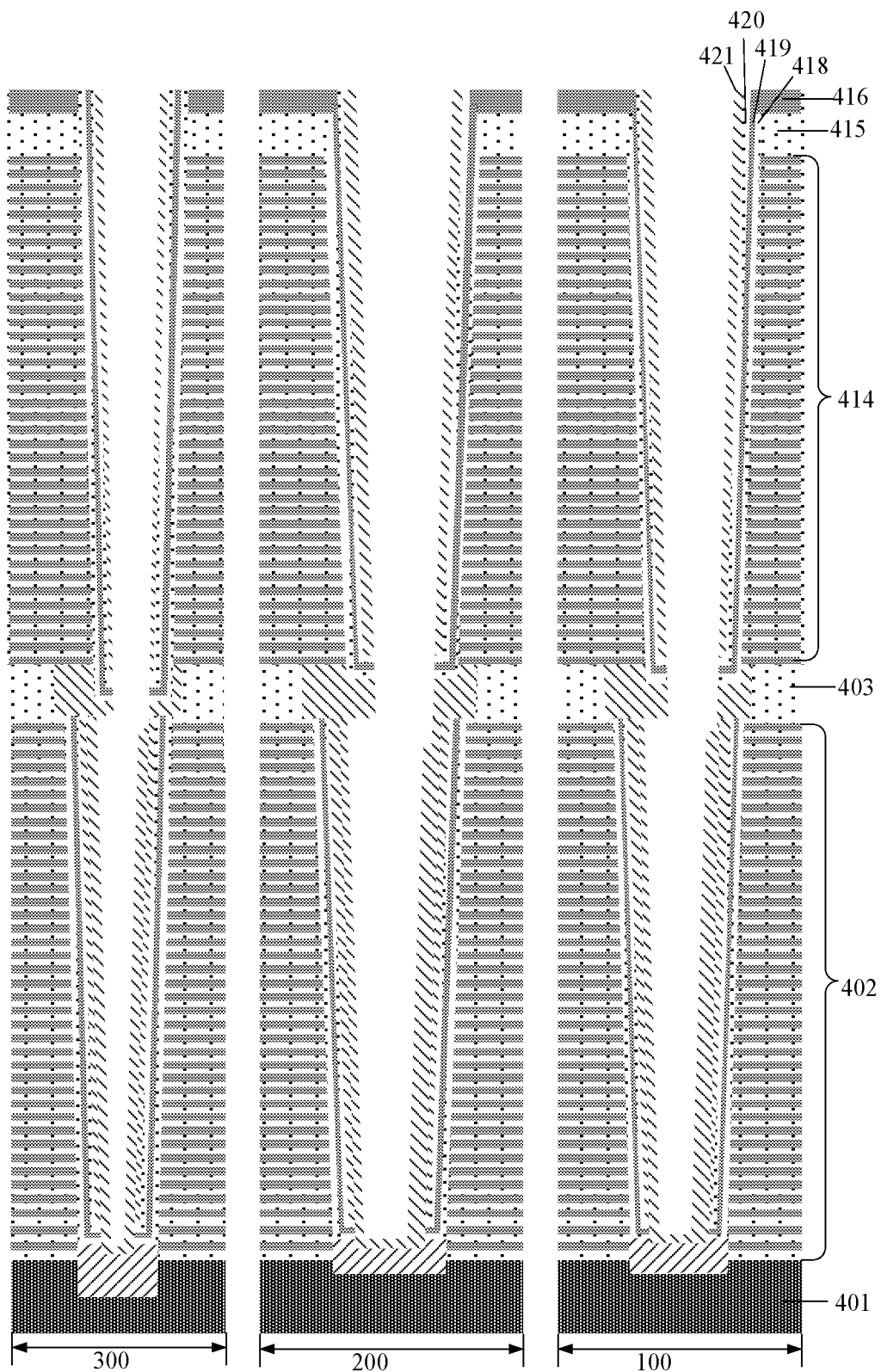

As shown in FIG. 87, a second passivation layer 421 can be formed on the surface of the second barrier layer 420. The second passivation layer 421 can be used for protecting the second barrier layer 420 from being damaged in a subsequent removal process. In some embodiments, the second passivation layer 421 can be an amorphous silicon layer formed by using a deposition process.

As shown in FIG. 87, the portions of the second passivation layer 421, the second barrier layer 420, the second storage layer 419, the second tunneling layer 418, and the third channel structure 413 between each second through hole 417 and the corresponding first through hole 405 can be removed. In some embodiments, the removal process can include an etching process and a cleaning process. In some embodiments, the portions of the second passivation layer 421, the second barrier layer 420, the second storage layer 419, the second tunneling layer 418, the oxide layer of the second mask layer 416 that are located on the nitride layer of the second mask layer 416 can also be removed by the same removal process. As such, the second functional layer can be formed on the sidewall of each second through hole 417, and each second through hole 417 and the corresponding first through hole 405 can be interconnected with each other.

Figure 88:
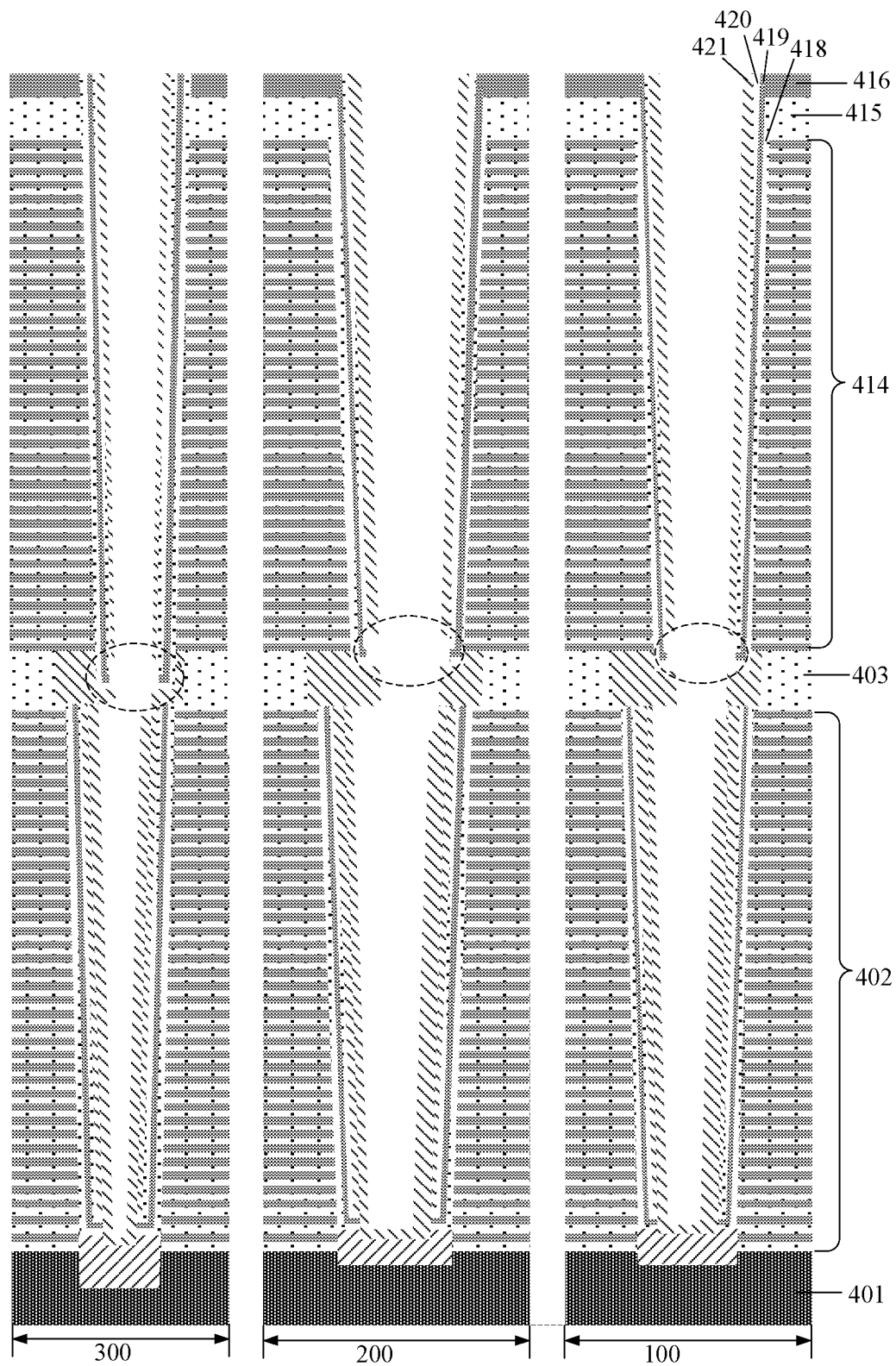

In some embodiments, the portions of the second barrier layer 420, the second storage layer 419, and the second tunneling layer 418 that are located under the second passivation layer 421, as shown in the dashed circle in FIG. 88, can also be removed by using an etching process.

Figure 89:
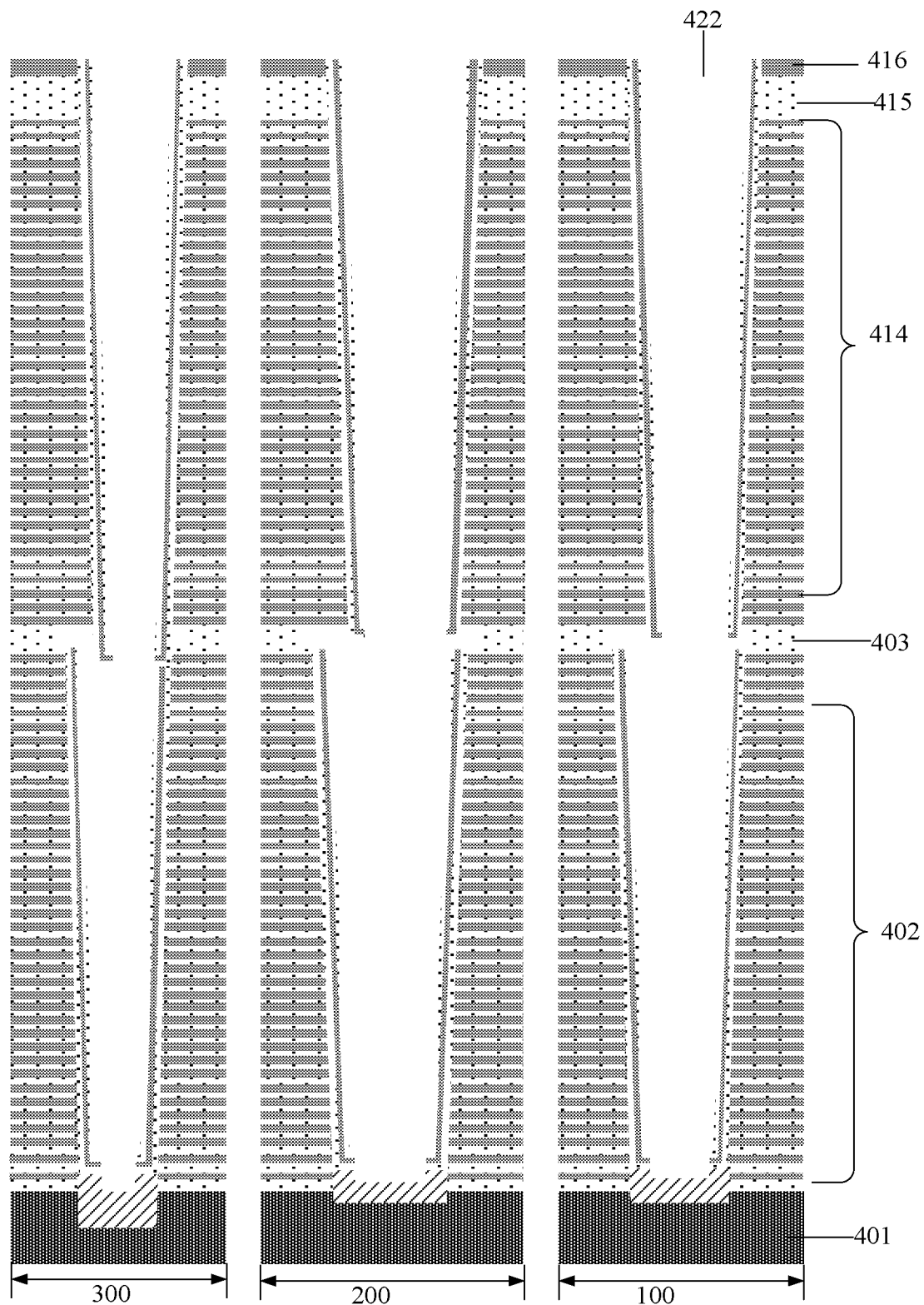

At S4011, the second tunneling structure, the third tunneling structure, the second passivation layer 421, and the first passivation layer 410 can be removed. In some embodiments, the second tunneling structure, the third tunneling structure, the second passivation layer 421, and the first passivation layer 410 can be removed by using one or more etching processes. As such, a plurality of third through holes 422 can be formed in the first region 100, the second region 200, and the third region 300 by interconnecting each first through hole and the corresponding second through hole, as shown in FIG. 89.

At S4012, a fourth channel structure can be formed on the sidewall of the second functional layer and the exposed surface of the third channel structure in each third through hole 422 in the first region 100. Further, a first filling structure can be formed in each of the plurality of third through holes 422 in the first region 100, the second region 200, and the third region 300. In some embodiments, the top surface of the fourth channel structure can be higher than the top surface of the first filling structure.

Figure 90:
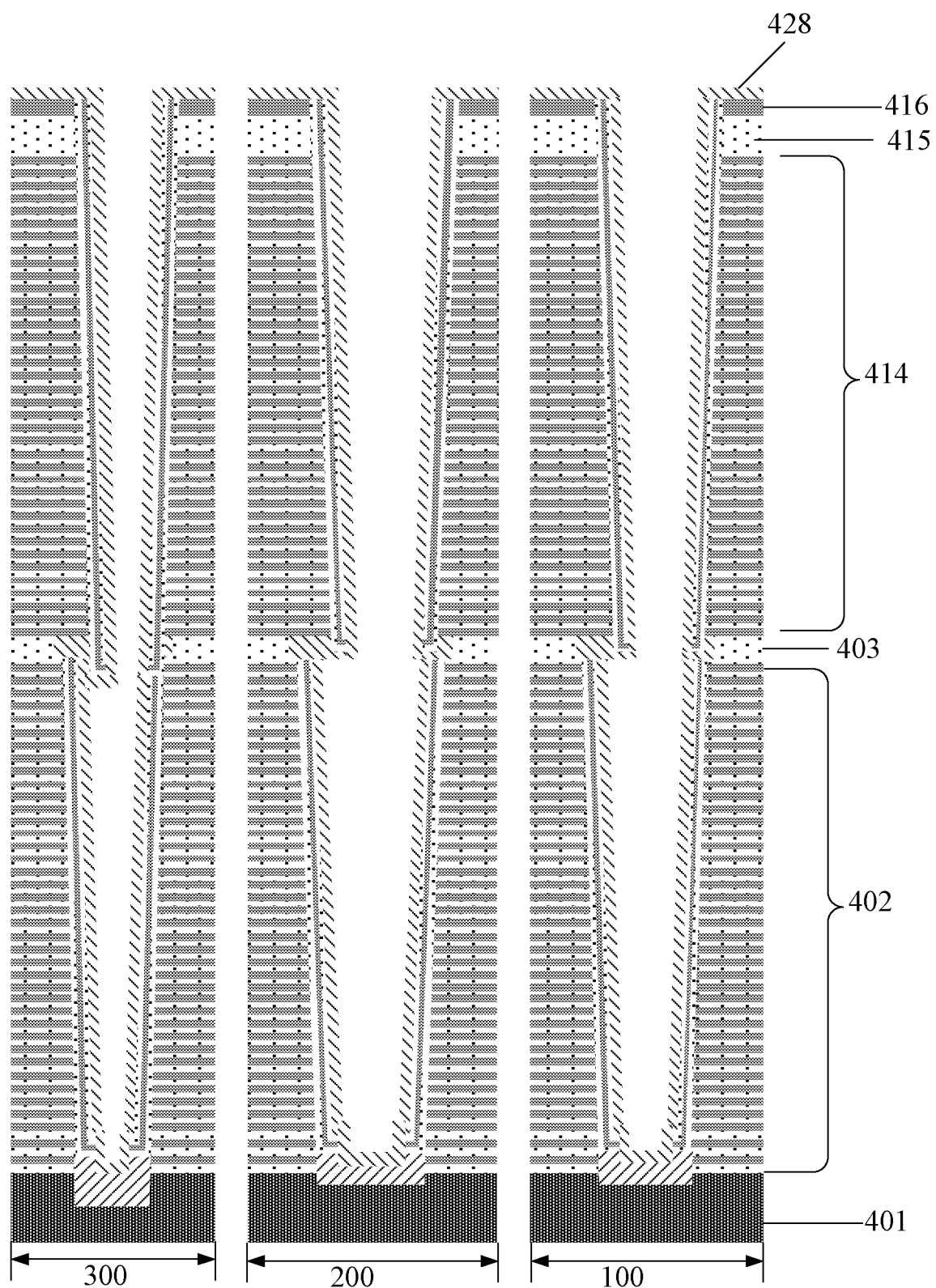

As shown in FIG. 90, a fourth channel layer 428 can be formed to cover the sidewall and the bottom surface of each of the plurality of third through holes 422 in the first region 100, the second region 200, and the third region 300. In some embodiments, the fourth channel layer 428 can also cover the top surface of the nitride layer of the second mask layer 416. In some embodiments, the fourth channel layer 428 can be an amorphous silicon layer formed by using a deposition process. In some embodiments, the fourth channel structure 428 includes a joint channel structure that is sandwiched between the first stacked layer 402 and the second stacked layer 414, and covers the exposed surface of the first insulating connection layer 403.

Figure 91:
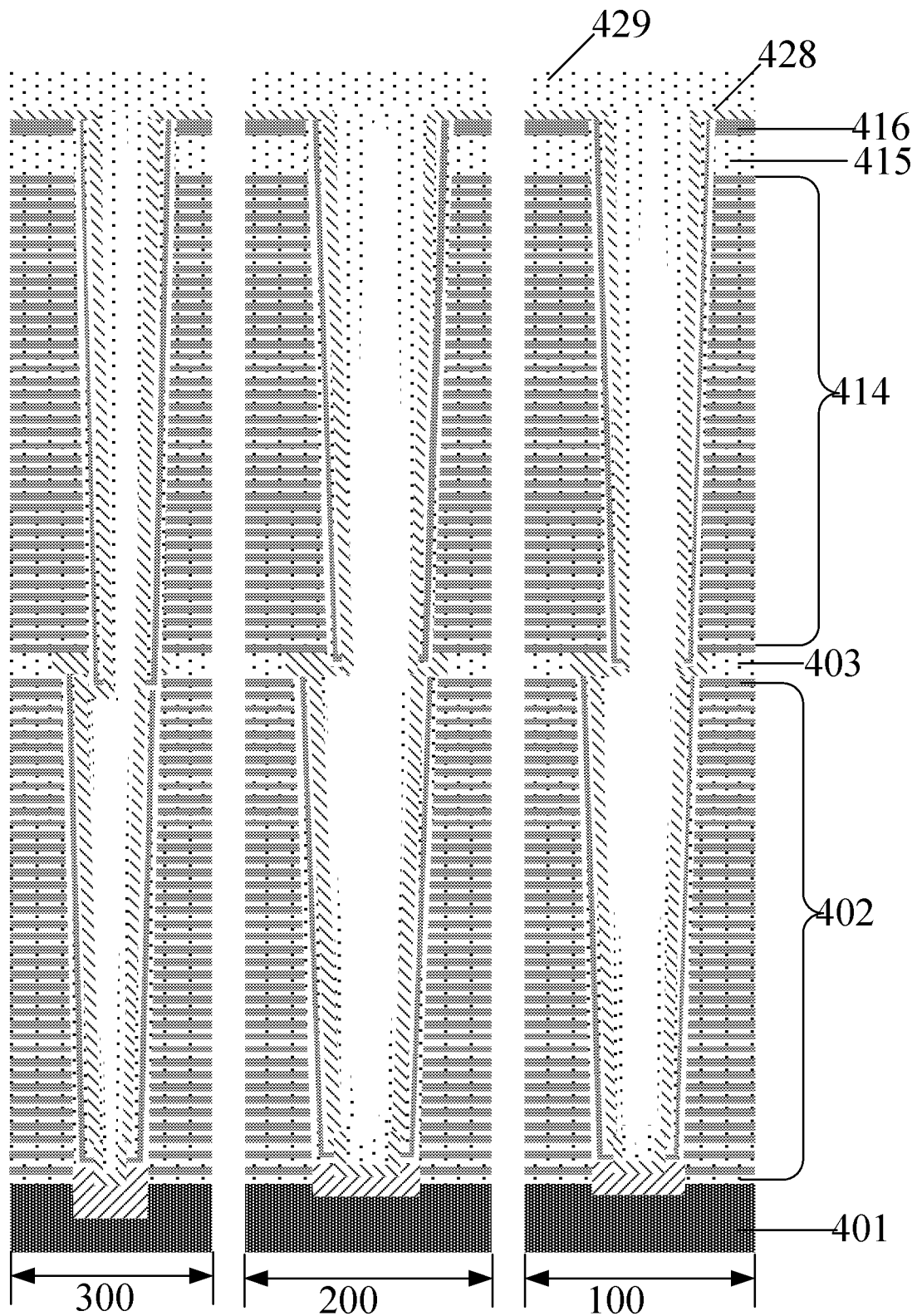

As shown in FIG. 91, a second filling layer 429 can be formed to cover the fourth channel layer 428. In some embodiments, the second filling layer 429 can include one or more airgaps in each third through hole 417. In some embodiments, the second filling layer 429 can be an oxide layer formed by using a deposition process.

Figure 92:
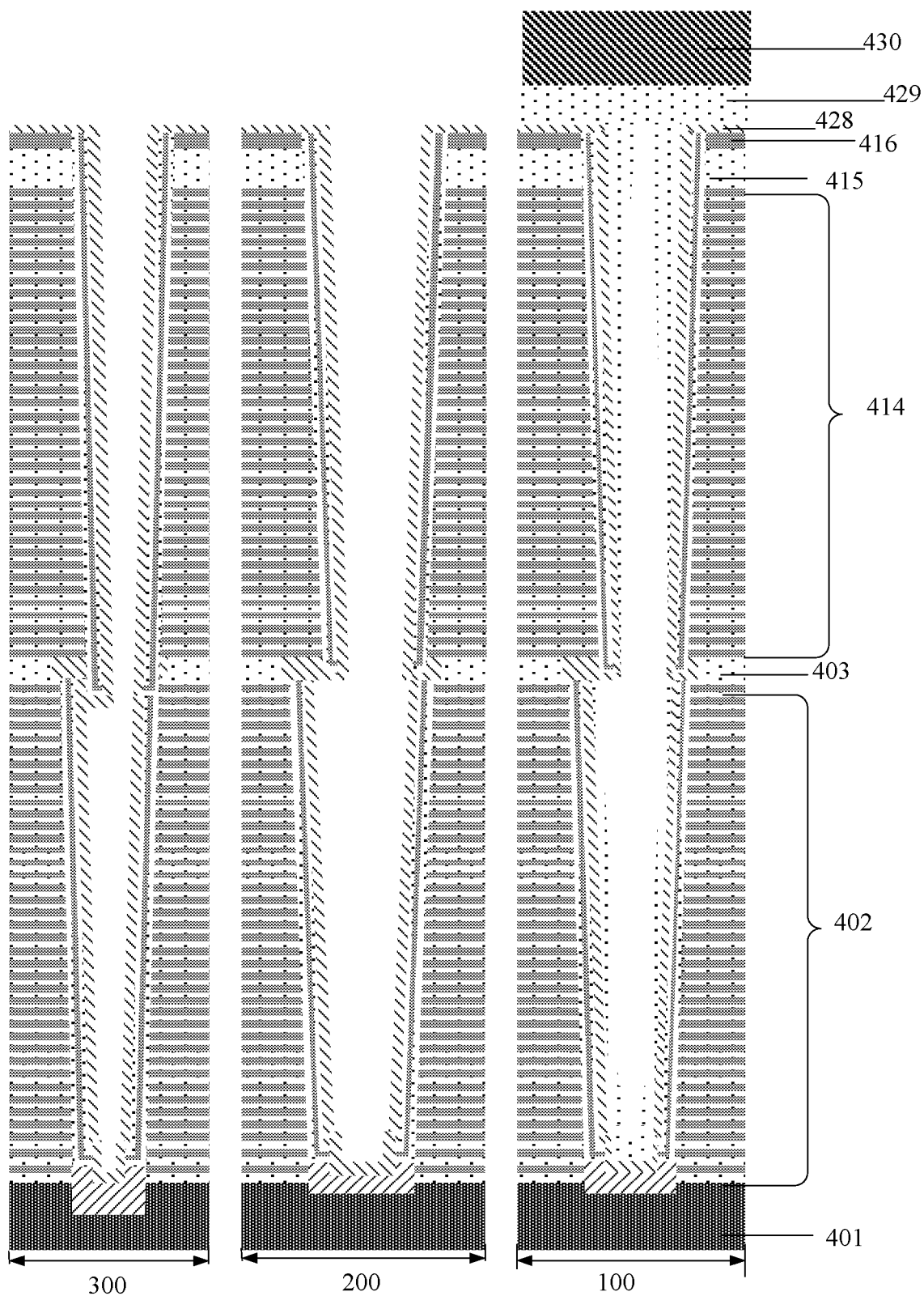

As shown in FIG. 92, a third mask layer 430 can be formed on the top surface of the second filling layer 429 in the first region 100. Using the third mask layer 430 as a mask, the portions of the second filling layer 429 located in the second region 200 and the third region 300 can be removed by using an etching process.

Figure 93:
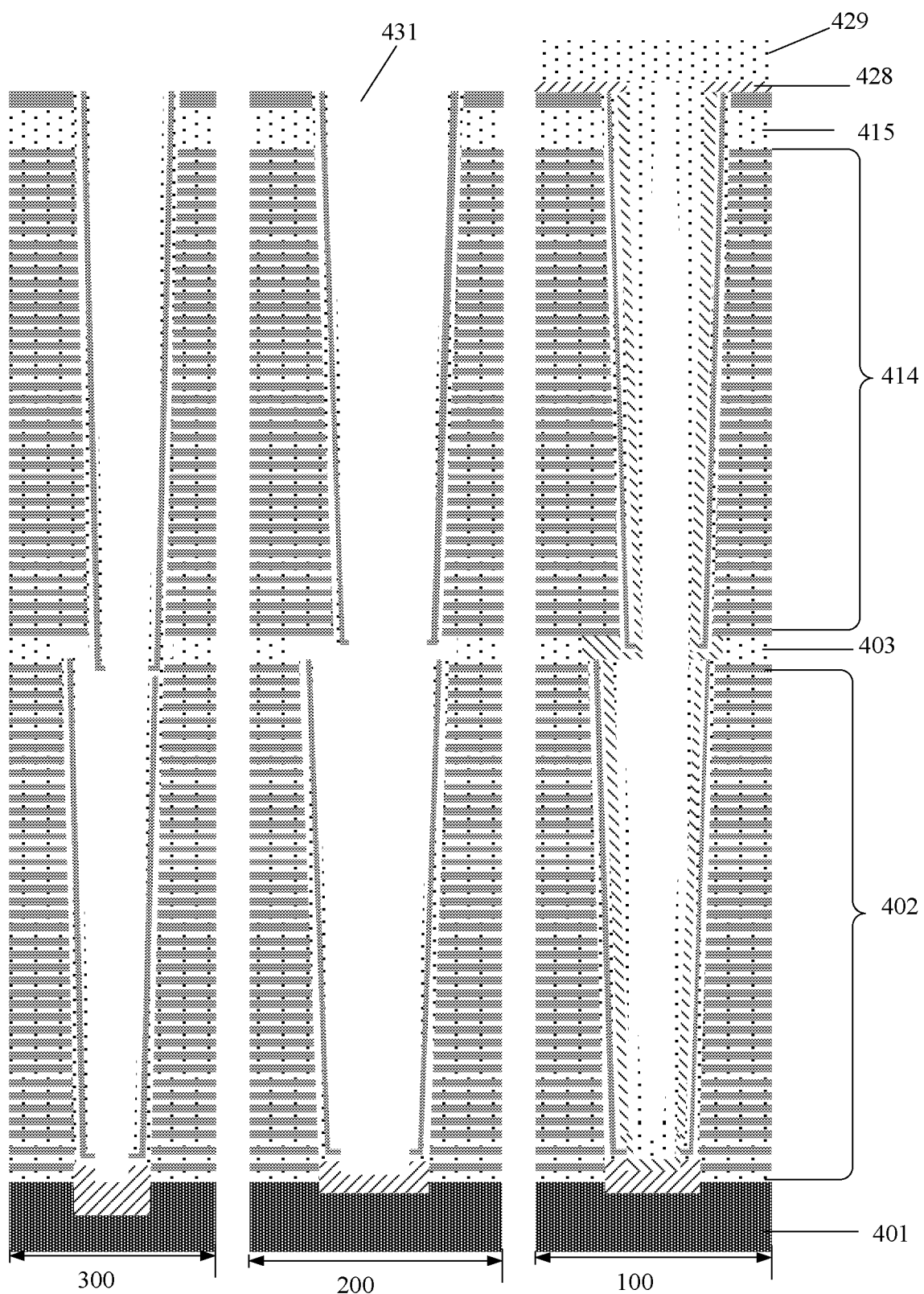

As shown in FIG. 93, the third mask layer 430 can be removed. Using the remaining second filling layer 429 in the first region 100 as a mask, the fourth channel layer 428 located in the second region 200 and the third region 300 can be removed by using an etching process. As such, one or more fourth through holes 431 can be formed in the second region 200 and the third region 300.

Figure 94:
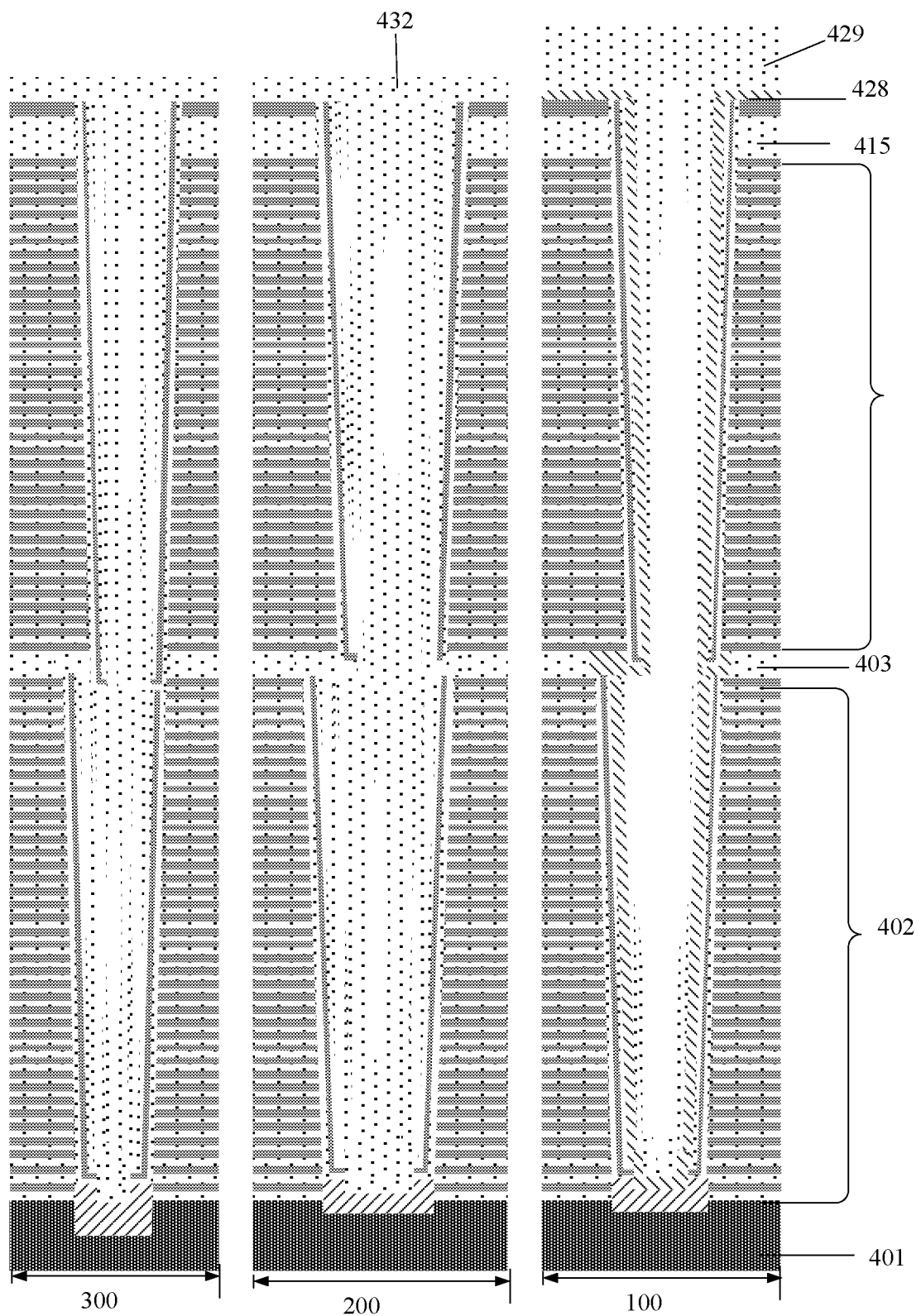

As shown in FIG. 94, a third filling layer 432 can be formed to cover the sidewall and the bottom of the one or more fourth through holes 431 in the second region 200 and the third region 300. The third filling layer 432 can also cover the exposed surface of the first insulating connection layer 403 in each fourth through hole 431 in the second region 200 and the third region 300. In some embodiments, the third filling layer 432 can enclose one or more airgap in one or more fourth through holes 431. In some embodiments, the filling performance of the third filling layer 432 can be better than the filling performance of the second filling layer 429. That is, in a same removing process, the removal rate of the third filling layer 432 can be less than the removal rate of the second filling layer 429.

Figure 95:
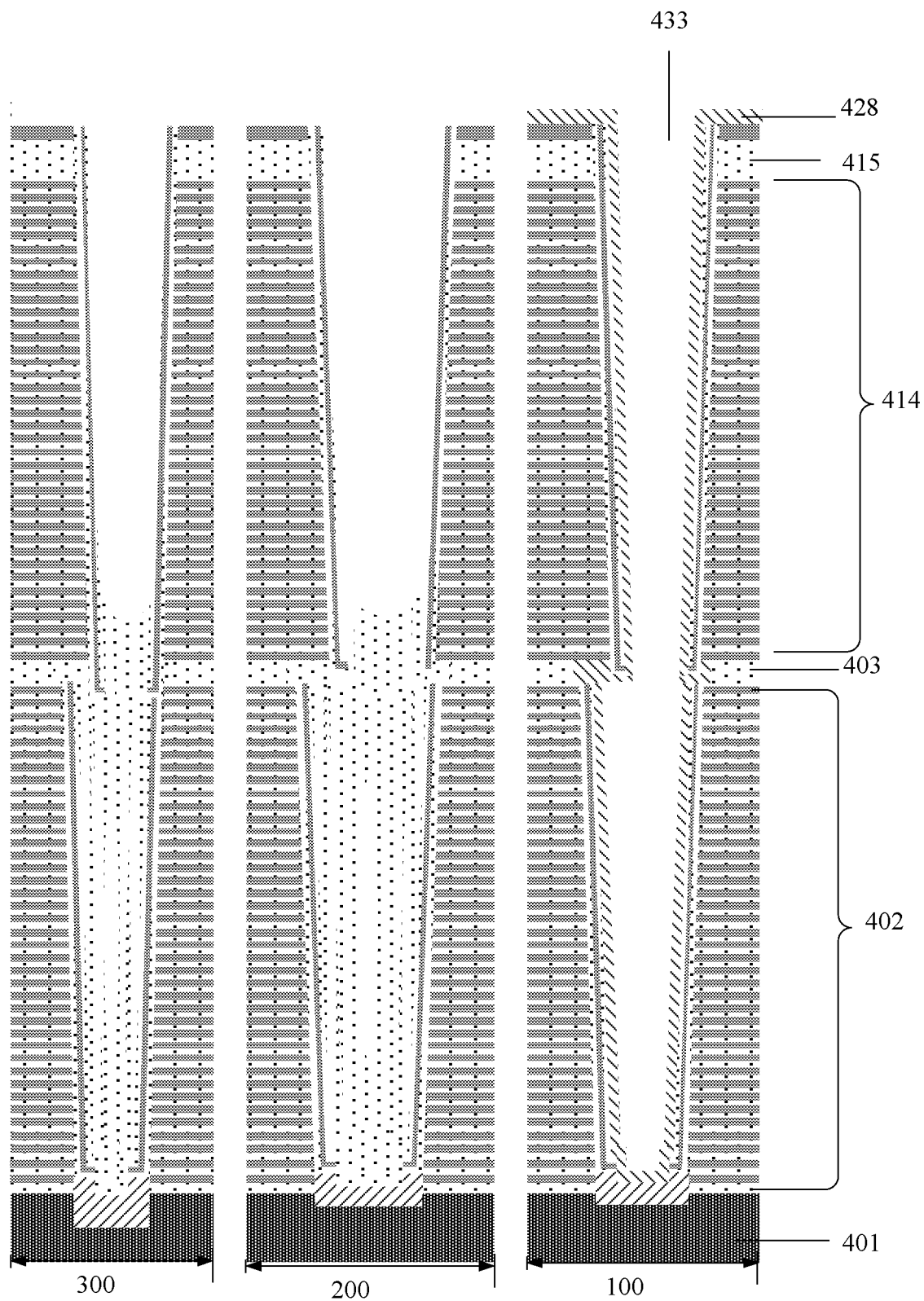

As shown in FIG. 95, the second filling layer 429 on the surface of the fourth channel layer 428 in the first region 100 can be removed by using an etching process. As such, one or more fifth through holes 433 can be formed in the first region 100. It is noted that, a portion of the third filling layer 432 can also be removed by the same etching process.

Figure 96:
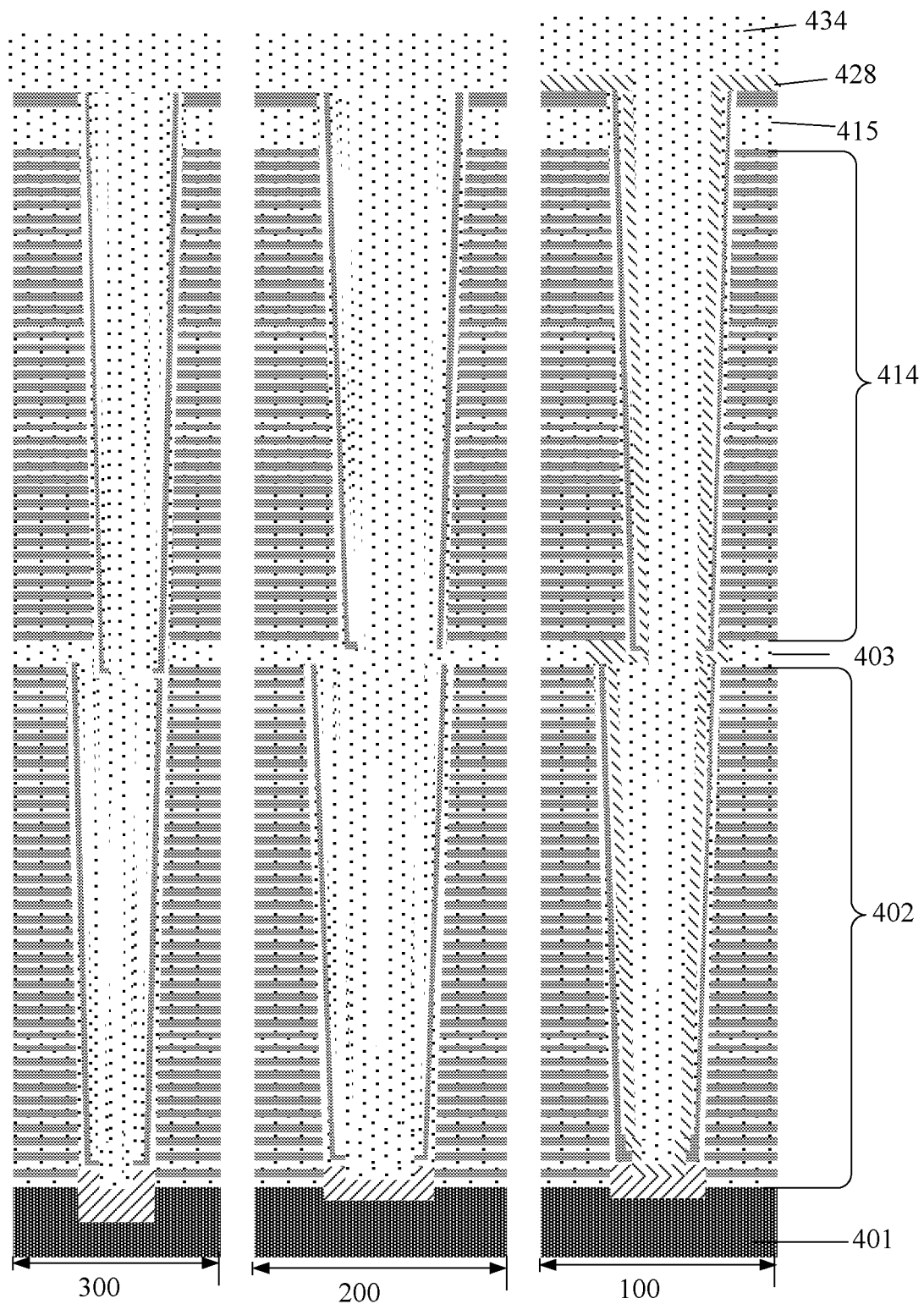

1 As shown in FIG. 96, a first filling layer 434 can be formed in each fifth through hole 433 in the first region 100, and in each fourth through hole 431 in the second region 200 and the third region 300. The material of the first filling layer 434 can be the same material of the third filling layer 432.

Figure 97:
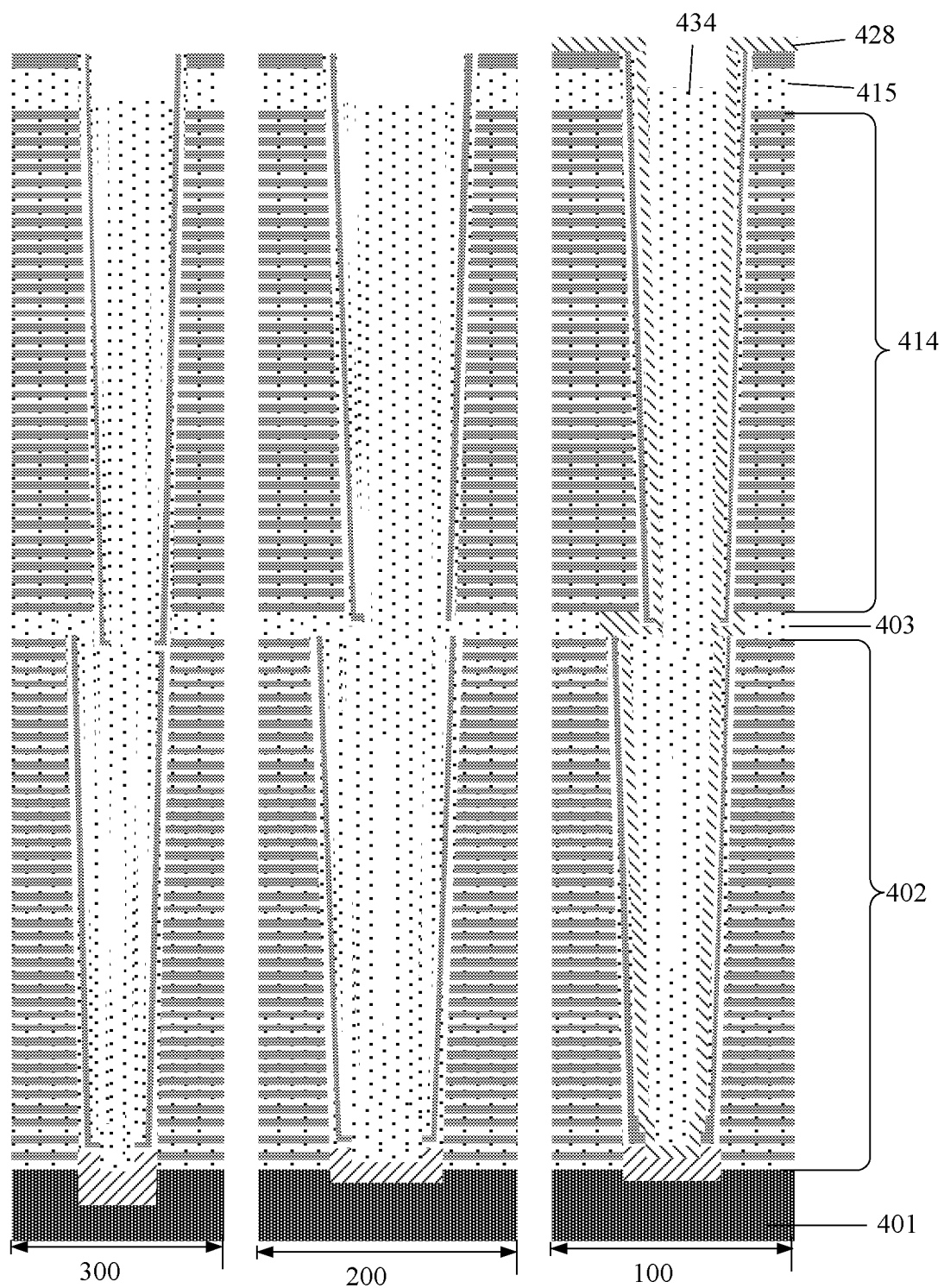
Figure 98:
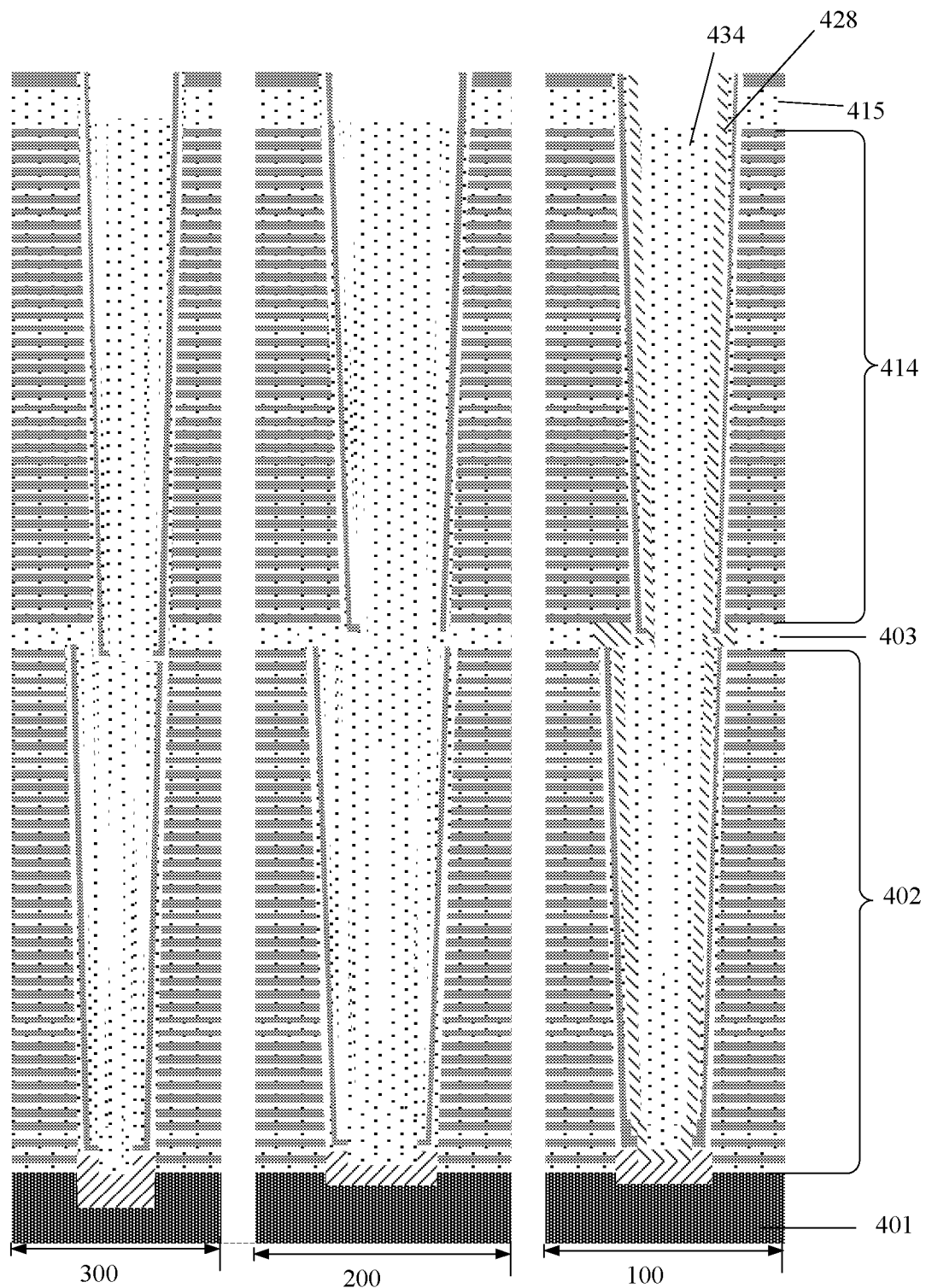

As shown in FIG. 97, a portion of the first filling layer 434 can be removed by using an etching process, such that the top surface of the first filling layer 434 in each fifth through hole 433 or fourth through hole 431 is lower than the top surface of the second insulating connection layer 415. The remaining portion of the first filling layer 434 in each fourth through hole 431 or fifth through hole 433 can form the first filling structure.

Further, the portion of the fourth channel layer 428 located on the surface of the second insulating connection layer 415 or the surface of the second mask layer 416 can be removed by using an etching process. The remaining portion of the fourth channel layer 428 in each fifth through hole 433 can form the fourth channel structure. The top surface of the fourth channel structure can be higher than the top surface of the first filling structure. As such, a second groove can be formed on the fourth channel structure and the first filling structure in each fifth through hole 433 in the first region 100, and on the first filling structure in each fourth through hole 431 in the second region 200 and the third region 300.

It is noted that, the top surface of the fourth channel structure can be higher than the top surface of the second stacked layer 414, or can be lower than the top surface of the second stacked layer 414. The top surface of the fourth channel structure is not lower than the top surface of the top oxide layer in the second stacked layer 414. In some embodiments, the top surface of the fourth channel structure can be in a same plane of the top surface of the top oxide layer in the second stacked layer 414.

At S4013, a fifth channel structure can be formed in the second groove of each fifth through hole 433 in the first region 100 and each fourth 431 in the second region 200 and third region 300. The fifth channel structure can be in contact with the fourth channel structure in each fifth through hole 433 in the first region 100.

Figure 99:
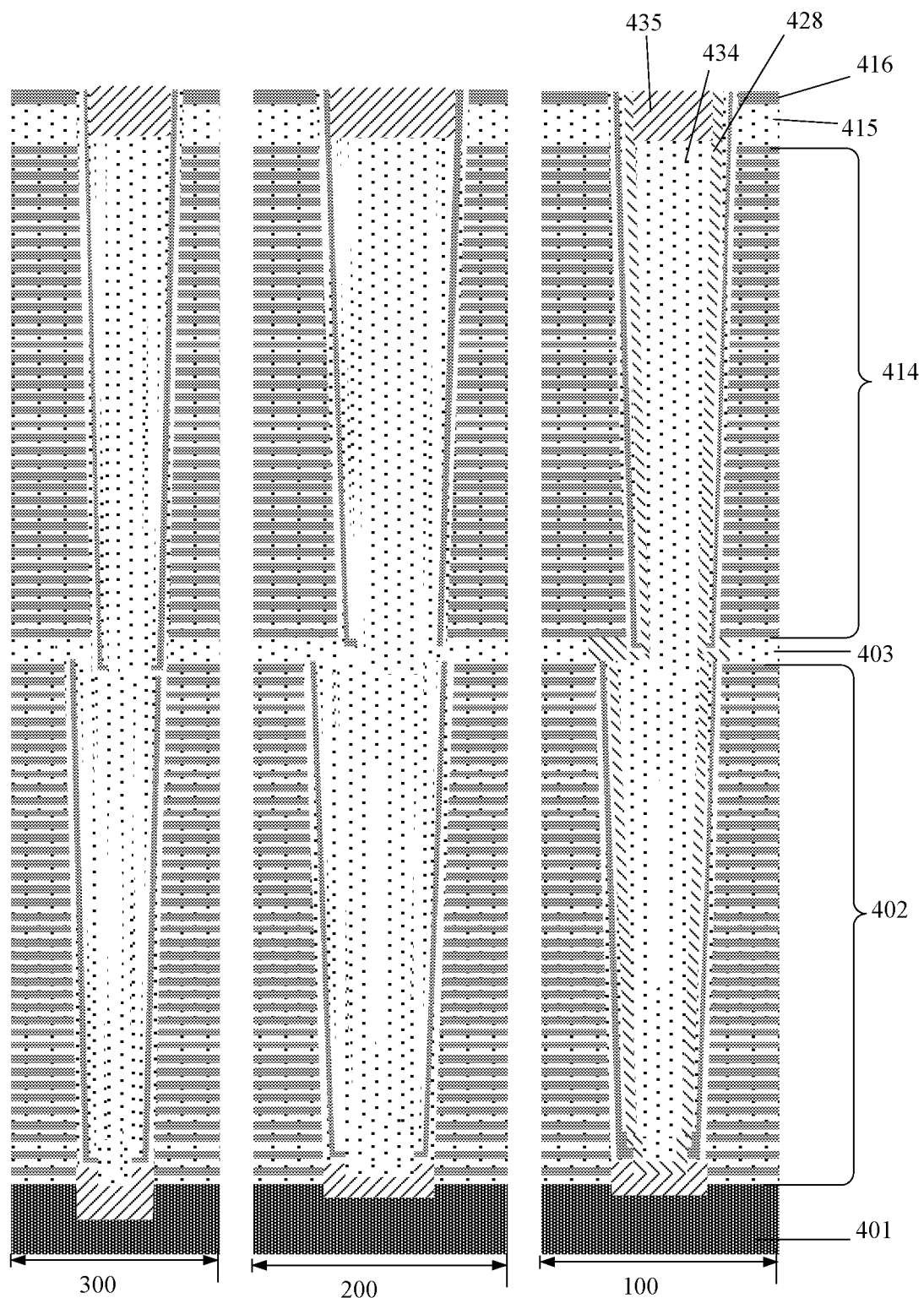

As shown in FIG. 99, the fifth channel structure 435 can be formed in the second groove that is on the fourth channel structure and the first filling structure in each fifth through hole 433 in the first region 100. The fifth channel structure 435 can also be formed in the second groove that is on the first filling structure in each fourth through hole 431 in the second region 200 and the third region 300.

Figure 100:
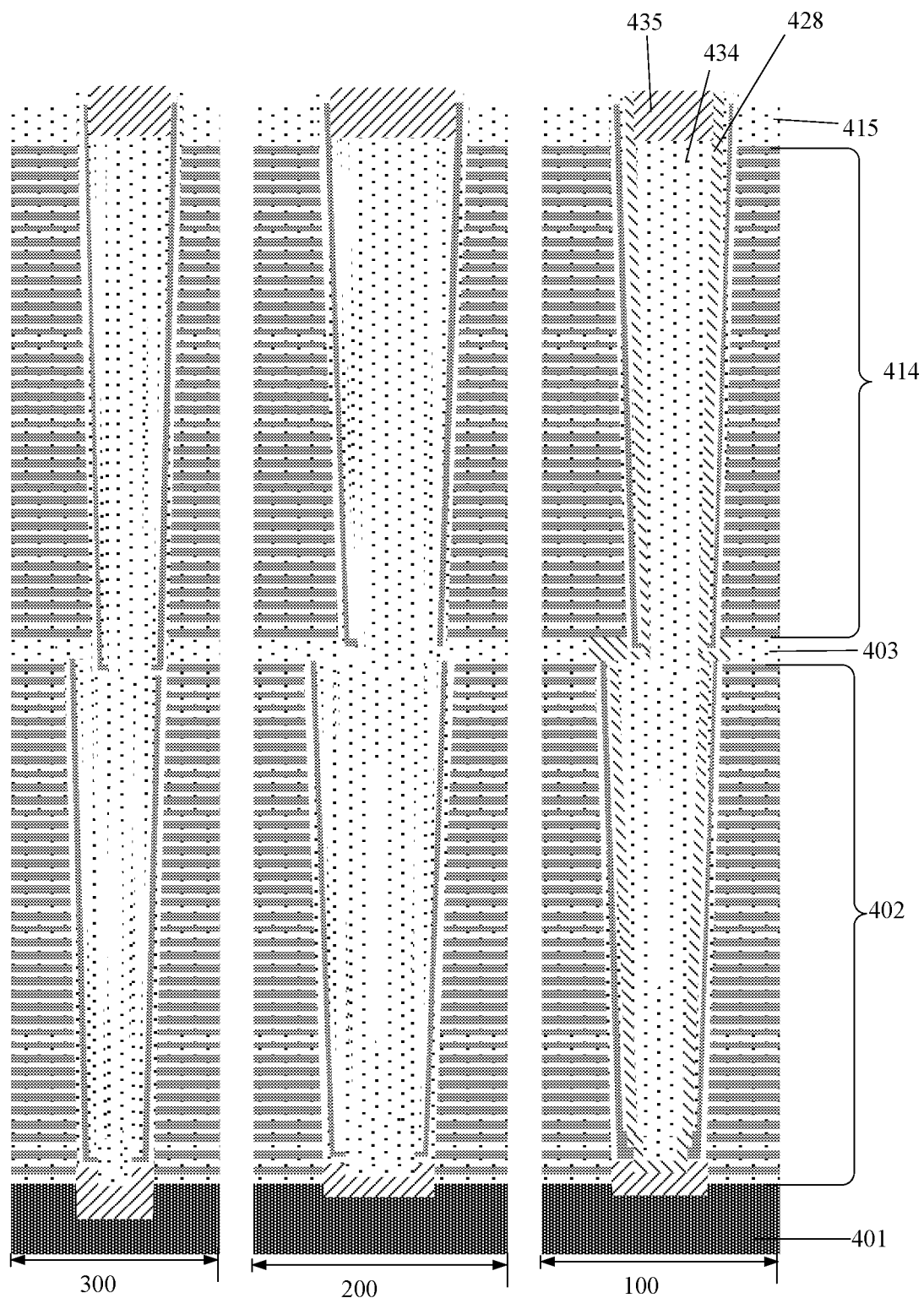
Figure 101A:
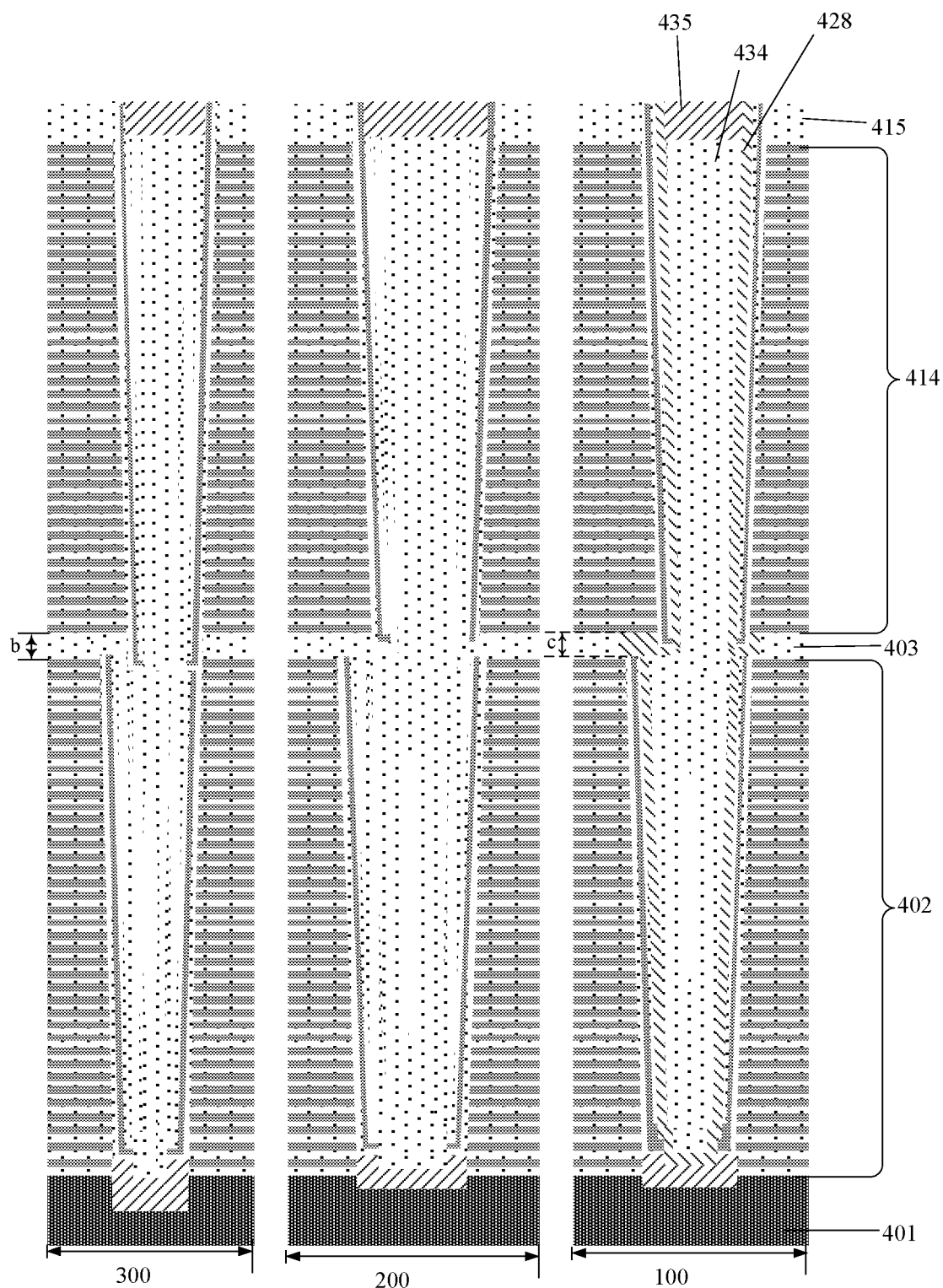
Figure 101B:
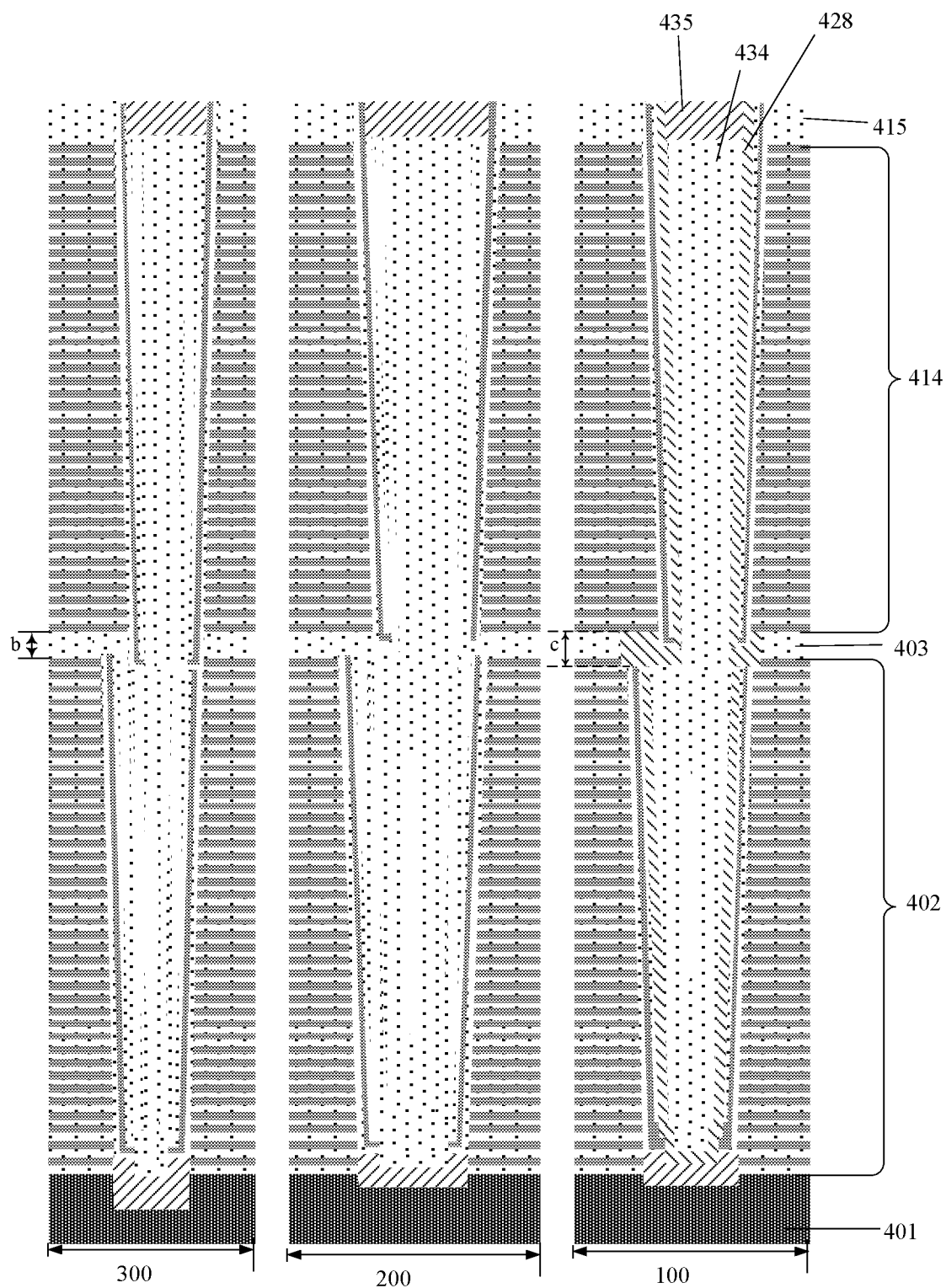

As shown in FIG. 100, the nitride layer of the second mask layer 416 can be then removed by an etching process. As shown in FIGS. 101A and 101B, the top surface of the second insulating connection layer 415 and the top surface of the plurality of fifth channel structures 435 can be planarized by any suitable techniques, such as backside grinding, and/or chemical mechanical polishing (CMP).

Accordingly, the disclosed method as shown in FIGS. 101A and 101B can form another joint opening structure of a three-dimensional (3D) memory device by combining two through hole formation processes. As such, the formed channel holes having the joint opening structure can have a large aspect ratio and a limited top-bottom aperture error. Further, the disclosed method of forming a joint opening structure in a 3D memory device can simultaneously form a plurality of channel holes, staircase dummy holes, and through array contact barriers, resulting in an efficient process capability control, a simplified process complexity, and a reduced cost.

In some embodiments, the present disclosure also provides another three-dimensional memory device formed by using the above disclosed method as shown in FIGS. 101A and 101B. The three-dimensional memory device can include a first region for forming a plurality of channel holes, a second region for forming a plurality of staircase structure (SS) dummy holes, and a third region for forming a plurality of through array contact (TAC) barriers. Along a direction perpendicular to the surface of the three-dimensional memory device, the three-dimensional memory device can include the following components.

A first stacked layer including a plurality of oxide/nitride layer pairs, such as silicon oxide layer and silicon nitride layer pairs, is formed on a substrate. A first insulating connection layer is formed on the first stacked layer. A plurality of first through holes penetrating the first stacked layer and the first insulating connection layer and extending into the surface of the substrate are formed in the first region, the second region, and the third region.

A first channel structure is formed on the surface of the substrate exposed by each first through hole. A first functional layer is formed on the sidewall of each first through hole. A second channel structure is formed on the sidewall of the first functional layer and the surface of the first channel structure in each first through hole. A first filling structure is formed on the sidewall and the surface of the second channel structure to fill each of the plurality of first through holes. In some embodiments, an airgap can be enclosed in the first filling structure in each first through hole. The top surfaces of the second channel structure and the first filling structure are lower than the top surfaces of the first insulating connection layer.

A first groove is formed in the first insulating connection layer, and above the first functional layer, the second channel structure and the first filling structure in each first through hole. A projection of each of the plurality of first grooves on the substrate completely covers a projection of the corresponding first through hole on the substrate. A third channel structure in contact with the second channel structure in the corresponding first through hole is formed in each first groove.

A second stack layer including a plurality of oxide/nitride layer pairs, such as silicon oxide layer and silicon nitride layer pairs, is formed on the top surfaces of the first insulating connection layer and the plurality of third channel structures. A second insulating connection layer is formed on the second stack layer. A plurality of second through holes penetrating through the second stacked layer and the second insulating connection layer and extending into a surface of the third channel structure are formed in the first region, the second region, and the third region. A projection of each of the plurality of second through holes on the substrate at least partially overlaps the projection of the corresponding first through hole on the substrate.

A second functional layer is formed on the sidewall of each second through hole. A fourth channel structure is formed on the sidewall of the second functional layer and the bottom surface of each second through hole in the first region. A second filling is formed to fill each of the plurality of second through holes in the first region, the second region, and the third region. In some embodiments, an airgap can be enclosed in the second filling structure. The top surface of the fourth channel structure is higher than the top surface of the second filling structure in each second through hole in the first region.

In the first region, a fifth channel structure in contact with the fourth channel structure is formed in a second groove in each second through hole that is surrounded by the second functional layer, and above the fourth channel structure and the second filling structure. And in the second region and the third region, a fifth channel structure is formed in a second groove in each second through hole that is surrounded by the second functional layer, and above the second filling structure.

Due to the fourth channel structures being formed in the second through holes in the first region rather than the third region, the fifth channel structure in each second through hole in the first region can be electronically connected with the first channel structure in the corresponding first through hole, while the fifth channel structure in each second through hole in the third region can be electronically insulated with the first channel structure in the corresponding first through hole. Thus, in the three-dimensional memory device, a plurality of channel holes can be formed in the first region, and a plurality of through array contact (TAC) barriers can be formed in the third region. The plurality of staircase structure dummy holes in the second region can have a supporting function of the staircase structure.

In some embodiments, as shown in FIG. 101A, in each channel hole in the first region, a thickness "b" of the first insulating connection layer, which is the distance between the top nitride layer of the first stacked layer and the bottom nitride layer of the second stacked layer can be in a range between 80 nm and 100 nm, preferably about 90 nm. A thickness "c" of the third channel structure can be in a range between 50 nm and 70 nm, preferably about 60 nm.

In some alternative embodiments, as shown in FIG. 101B, in each channel hole in the first region, a thickness "b" of the first insulating connection layer, which is the distance between the top nitride layer of the first stacked layer and the bottom nitride layer of the second stacked layer can be in a range between 20 nm and 40 nm, preferably about 30 nm. A thickness "c" of the third channel structure can be in a range between 50 nm and 70 nm, preferably about 60 nm.

Further, the difference between the radiuses of the top aperture and the bottom aperture of the second channel structure, and the difference between the radiuses of the top aperture and the bottom aperture of the fourth channel structure can be within 15 nm. Accordingly, the disclosed channel hole having a joint opening structure can have a large aspect ratio and a limited top-bottom aperture error.

In some embodiments, a replacement process can be performed to replace each of the plurality of nitride layers in the first stacked layer 402 and the second stacked layer 414 with a conductive layer 440, as shown in FIGS. 102A and 102B. The conductive layer can include any suitable material that is electronically conductive, including, but not limited to, W, Co, Cu, Al, doped silicon, silicides, or any combination thereof.

In some embodiments, the replacement process can be performed in one or more of the first region 100, the second region 200, and the third region 300. In one embodiments, the replacement process is performed in the first region 100 and the second region 200, but not in the third region 300. That is, the first stacked layer and the second stacked layer in the first region and the second region can be alternating conductive/dielectric stack, while the first stacked layer and the second stacked layer in the third region can be alternating oxide/nitride stack.

In some embodiments, during the replacement process, a portion of the third channel structure 413 that is adjacent with the bottom nitride layer of the second stacked layer 414, or is adjacent with the top nitride layer of the first stacked layer 402 can be converted to an oxide layer by an oxidation process. That is, as shown in FIGS. 102A and 102B, a thickness "c" of the third channel structure can be reduced after the replacement process. For example, the thickness "c" of the third channel structure can be reduced to a range between 30 nm and 50 nm, preferably about 40 nm.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Further, the words "first", "second" and the like used in this disclosure do not denote any order, quantity or importance, but are merely intended to distinguish between different constituents. The words "comprise" or "include" and the like mean that the elements or objects preceding the word can cover the elements or objects listed after the word and their equivalents, without excluding other elements or objects. The words "connect" or "link" and the like are not limited to physical or mechanical connections, but can include electrical connections, either directly or indirectly.

Although the present disclosure has been described and illustrated in the foregoing illustrative embodiments, it is understood that the present disclosure has been made only by way of example, and that numerous changes in the details of embodiment of the present disclosure can be made without departing from the spirit and scope of the present disclosure, which is only limited by the claims which follow. Features of the disclosed embodiments can be combined and rearranged in various ways. Without departing from the spirit and scope of the present disclosure, modifications, equivalents, or improvements to the present disclosure are understandable to those skilled in the art and are intended to be encompassed within the scope of the present disclosure.

What is claimed is:

1. A method of forming a joint opening structure in a three-dimensional (3D) memory device, comprising:
    forming a first stacked layer and forming a first insulating connection layer on the first stacked layer;
    forming a first through hole that penetrates the first stacked layer and the first insulating connection layer;
    forming a first channel structure overlaying the surface of the substrate that is exposed by the first through hole;
    forming a first functional layer on the sidewall of the first through hole;
    forming a second channel structure and forming a first filling structure on the sidewall of the first functional layer and the exposed surface of the first channel structure;
    forming a third channel structure in contact with the second channel structure above the first through hole, wherein a projection of the third channel structure on the substrate covers a projection of the first through hole on the substrate;
    forming a second stacked layer and forming a second insulating connection layer on the first insulating connection layer;
    forming a second through hole that penetrates the second stacked layer and the second insulating connection layer, wherein a projection of the second through hole on the substrate at least partially overlaps with the projection of the first through hole on the substrate;
    forming a second functional layer on the sidewall of the second through hole;
    forming a fourth channel structure and forming a second filling structure on the sidewall of the second functional layer and the exposed surface of the third channel structure; and
    forming a fifth channel structure in contact with the fourth channel structure above the second through hole.

2. The method of claim 1, wherein:
    the first stacked layer includes a first number of oxide/nitride layer pairs; and
    the second stacked layer includes a second number of oxide/nitride layer pairs.

3. The method of claim 2, wherein:
    the first number and the second number are not less than 32.

4. The method of claim 1, wherein forming the first functional layer comprises:
    forming a first tunneling layer on the sidewall of the first through hole and the exposed surface of the first channel structure, wherein the first tunneling layer is configured, in operation, to generate charges;
    forming a first storage layer on the surface of the first tunneling layer to store the charges generated by the first tunneling layer;
    forming a first barrier layer on the surface of the first storage layer to block the outflow of charges in the first storage layer;
    forming a first passivation layer on the surface of the first barrier layer to protect the first barrier layer from being damaged in a subsequent removal process; and
    removing portions of the first passivation layer, the first barrier layer, the first storage layer, and the first tunneling layer on the surface of the first channel structure, wherein remaining portions of the first passivation layer, the first barrier layer, the first storage layer, and the first tunneling layer on the sidewall of the first through hole to form the first functional layer.

5. The method of claim 4, wherein forming the second channel structure and the first filling structure comprises:
    forming a second channel layer that covers the sidewall of the first passivation layer and the exposed surface of the first channel layer;
    forming the first filling layer that covers the surface of the second channel layer;
    removing a portion of the first filling layer to form the first filling structure, wherein the top surface of the first filling structure is lower than the top surface of the first insulating connection layer; and
    removing a portion of the second channel layer to form the second channel structure, wherein a top surface of the second channel structure is lower than a top surface of the first insulating connection layer.

6. The method of claim 1, wherein forming the third channel structure comprises:
    etching the first insulating connection layer to form a first groove, wherein a projection of the first groove on the substrate covers the projection of the first through hole on the substrate;
    forming a third channel layer in the first groove, wherein the third channel layer is in contact with the second channel structure; and
    planarizing the top surfaces of the first insulating connection layer and the third channel layer to form the third channel structure.

7. The method of claim 1, wherein forming the third channel structure comprises:
- etching the first insulating connection layer and at least a portion of the top nitride layer of the first stacked layer to form a first groove, wherein a projection of the first groove on the substrate covers the projection of the first through hole on the substrate;
- forming the third channel structure in the first groove, wherein the third channel structure is in contact with the second channel structure; and
- planarizing the top surfaces of the first insulating connection layer and the third channel structure.

8. The method of claim 1, further comprising:
- forming a first mask layer overlaying the first insulating connection layer before forming the first through hole; and
- removing the first mask layer after forming the first filling structure;
- forming a second mask layer on the second insulating connection layer before forming the second through hole; and
- removing the second mask layer after forming the second filling structure.

9. The method of claim 1, wherein forming the fourth channel structure and the second filling structure comprises:
- forming a fourth channel layer that covers the sidewall of a second functional layer and the exposed surface of the third channel layer;
- forming a second filling layer that covers the surface of the fourth channel layer;
- removing a portion of the second filling layer to form the second filling structure, wherein the top surface of the second filling structure is lower than the top surface of the second insulating connection layer; and
- removing a portion of the fourth channel layer to form the fourth channel structure, wherein a top surface of the fourth channel structure is lower than a top surface of the second insulating connection layer.

10. The method of claim 1, wherein forming the fifth channel structure comprises:
- etching the second insulating connection layer to form a second groove, wherein a projection of the second groove on the substrate covers the projection of the second through hole on the substrate;
- forming a fifth channel layer in the second groove, wherein the fifth channel layer is in contact with the fourth channel structure; and
- planarizing the top surfaces of the second insulating connection layer and the fifth channel layer to form the fifth channel structure.

11. A joint opening structure of a three-dimensional (3D) memory device, comprising:
- a first stacked layer disposed overlaying a substrate;
- a first insulating connection layer disposed on the first stacked layer;
- a first through hole penetrating the first stacked layer and the first insulating connection layer;
- a first channel structure disposed at the bottom of the first through hole and overlaying the substrate;
- a first functional layer disposed on the sidewall of the first through hole;
- a second channel structure in contact with the first channel structure disposed on the sidewall of the first functional layer;
- a third channel structure in contact with the second channel structure disposed over the first through hole, wherein a projection of the third channel structure on the substrate covers a projection of the first through hole on the substrate;
- a second stacked layer disposed on the third channel structure;
- a second insulating connection layer disposed on the second stacked layer;
- a second through hole penetrating the second stacked layer and the second insulating connection layer, wherein a projection of the second through hole on the substrate at least partially overlaps with the projection of the first through hole on the substrate;
- a second functional layer disposed on the sidewall of the second through hole;
- a fourth channel structure in contact with the third channel structure disposed on the sidewall of the second functional layer; and
- a fifth channel structure in contact with the fourth channel structure disposed over the second through hole.

12. The joint opening structure of claim 11, further comprising:
- a first filling structure covering the surface of the second channel structure; and
- a second filling structure covering the surface of the fourth channel structure;
- wherein the first through hole is non-interconnected with the second through hole.

13. The joint opening structure of claim 11, further comprising:
- a first filling structure covering the surfaces of the second channel structure and the fourth channel structure;
- wherein the first through hole is interconnected with the second through hole.

14. The joint opening structure of claim 11, wherein:
- the first stacked layer includes a first number of conductor/dielectric layer pairs; and
- the second stacked layer includes a second number of conductor/dielectric layer pairs.

15. The joint opening structure of claim 14, wherein:
- the first number and the second number are not less than 32.

16. The joint opening structure of claim 11, wherein:
- the first stacked layer includes a first number of oxide/nitride layer pairs; and
- the second stacked layer includes a second number of oxide/nitride layer pairs.

17. The joint opening structure of claim 16, wherein:
- the first number and the second number are not less than 32.

18. The joint opening structure of claim 11, wherein:
- a thickness of the third channel structure is in a range between 30 nm and 70 nm.

19. The joint opening structure of claim 11, wherein:
- a size difference between a top aperture and a bottom aperture of the first through hole is equal to or less than 30 nm; and
- a size difference between a top aperture and a bottom aperture of the second through hole is equal to or less than 30 nm.

20. A joint opening structure of a three-dimensional (3D) memory device, comprising:
- a first stacked layer disposed overlaying a substrate;
- a first insulating connection layer disposed on the first stacked layer;
- a second stacked layer disposed on the first insulating connection layer;

a second insulating connection layer disposed on the second stacked layer;

a plurality of channel holes in a first region of the 3D memory device;

a plurality of staircase structure dummy holes in a second region of the 3D memory device; and a plurality of through array contact barriers in a third region of the 3D memory device;

wherein each of the plurality of channel holes includes:
- a first through hole penetrating the first stacked layer and the first insulating connection layer,
- a first channel structure disposed at the bottom of the first through hole and overlaying the substrate,
- a first functional layer disposed on the sidewall of the first through hole,
- a second channel structure in contact with the first channel structure disposed on the sidewall of the first functional layer,
- a third channel structure in contact with the second channel structure disposed over the first through hole, wherein a projection of the third channel structure on the substrate covers a projection of the first through hole on the substrate,
- a second through hole penetrating the second stacked layer and the second insulating connection layer, wherein a projection of the second through hole on the substrate at least partially overlaps with the projection of the first through hole on the substrate,
- a second functional layer disposed on the sidewall of the second through hole,
- a fourth channel structure in contact with the third channel structure disposed on the sidewall of the second functional layer, and
- a fifth channel structure in contact with the fourth channel structure disposed over the second through hole.

* * * * *